(12) United States Patent
Inasaki et al.

(10) Patent No.: US 9,235,116 B2
(45) Date of Patent: *Jan. 12, 2016

(54) ACTINIC-RAY- OR RADIATION SENSITIVE RESIN COMPOSITION, ACTINIC-RAY- OR RADIATION-SENSITIVE FILM THEREFROM AND METHOD OF FORMING PATTERN

(71) Applicant: FUJIFILM Corporation, Minato-ku, Tokyo (JP)

(72) Inventors: Takeshi Inasaki, Shizuoka (JP); Takeshi Kawabata, Shizuoka (JP); Tomotaka Tsuchimura, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 43 days.

This patent is subject to a terminal disclaimer.

(21) Appl. No.: 14/104,821

(22) Filed: Dec. 12, 2013

(65) Prior Publication Data

US 2014/0099572 A1    Apr. 10, 2014

Related U.S. Application Data

(63) Continuation of application No. PCT/JP2012/065797, filed on Jun. 14, 2012.

(30) Foreign Application Priority Data

Jun. 14, 2011  (JP) .................................. 2011-132620
Mar. 29, 2012  (JP) .................................. 2012-077484

(51) Int. Cl.
| | | |
|---|---|---|
| *G03F 1/20* | (2012.01) | |
| *G03F 1/22* | (2012.01) | |
| *G03F 1/78* | (2012.01) | |
| *G03F 7/004* | (2006.01) | |
| *G03F 7/38* | (2006.01) | |
| *C08F 257/00* | (2006.01) | |
| *C08F 8/00* | (2006.01) | |
| *C09D 125/18* | (2006.01) | |
| *G03F 7/20* | (2006.01) | |
| *G03F 7/039* | (2006.01) | |
| *G03F 1/56* | (2012.01) | |
| *C08F 12/26* | (2006.01) | |
| *C08F 12/30* | (2006.01) | |
| *C08F 212/14* | (2006.01) | |

(52) U.S. Cl.
CPC . *G03F 7/004* (2013.01); *C08F 8/00* (2013.01); *C09D 125/18* (2013.01); *G03F 1/20* (2013.01); *G03F 1/22* (2013.01); *G03F 1/56* (2013.01); *G03F 7/0045* (2013.01); *G03F 7/0392* (2013.01); *G03F 7/0397* (2013.01); *G03F 7/2004* (2013.01); *G03F 7/2039* (2013.01); *C08F 12/26* (2013.01); *C08F 12/30* (2013.01); *C08F 212/14* (2013.01); *C08F 257/00* (2013.01); *G03F 1/78* (2013.01)

(58) Field of Classification Search
CPC ............... G03F 1/20; G03F 1/22; G03F 1/78; G03F 7/0392; G03F 7/0397; C08F 257/00
USPC .............. 430/4, 5, 270.1, 326, 905, 910, 942; 525/219, 359.2, 359.3, 359.4, 359.6, 525/385, 390, 451
See application file for complete search history.

(56) References Cited

U.S. PATENT DOCUMENTS

| | | | |
|---|---|---|---|
| 5,861,231 A | 1/1999 | Barclay et al. | |
| 6,042,997 A | 3/2000 | Barclay et al. | |
| 7,026,098 B2 | 4/2006 | Komatsu et al. | |
| 8,735,048 B2 * | 5/2014 | Inasaki et al. ............... | 430/270.1 |
| 2004/0091817 A1 | 5/2004 | Komatsu et al. | |
| 2007/0105042 A1 | 5/2007 | Takeda et al. | |
| 2010/0183975 A1 | 7/2010 | Takahashi et al. | |
| 2010/0248144 A1 | 9/2010 | Iwai et al. | |
| 2011/0003251 A1 | 1/2011 | Tanaka et al. | |
| 2011/0294070 A1 * | 12/2011 | Hatakeyama et al. ..... | 430/285.1 |
| 2014/0072905 A1 * | 3/2014 | Tsuchimura et al. ............. | 430/5 |

FOREIGN PATENT DOCUMENTS

| | | |
|---|---|---|
| JP | 2004-158287 A | 6/2004 |
| JP | 2005-157401 A | 6/2005 |
| JP | 2007-132998 A | 5/2007 |

(Continued)

OTHER PUBLICATIONS

English translation of International Preliminary Report on Patentability dated Jan. 3, 2014 in International Application No. PCT/JP2012/065797.

(Continued)

*Primary Examiner* — John S Chu

(74) *Attorney, Agent, or Firm* — Sughrue Mion, PLLC

(57) ABSTRACT

According to one embodiment, an actinic-ray- or radiation-sensitive resin composition includes a compound (P) containing at least one phenolic hydroxyl group and at least one group with a phenolic hydroxyl group whose hydrogen atom is replaced by any of groups of general formula (1) below.

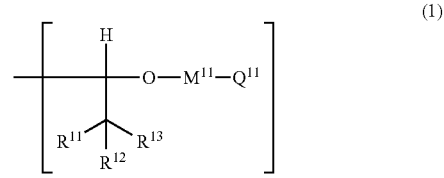

(1)

19 Claims, 6 Drawing Sheets

(56) References Cited

FOREIGN PATENT DOCUMENTS

| JP | 2008-95009 A | 4/2008 |
|---|---|---|
| JP | 2008-162101 A | 7/2008 |
| JP | 2009-69630 A | 4/2009 |
| JP | 2011-13419 A | 1/2011 |
| JP | 2011-39315 A | 2/2011 |
| JP | 2012-27453 A | 2/2012 |
| WO | 2011/013842 A1 | 2/2011 |
| WO | 2012/153869 A1 | 11/2012 |

OTHER PUBLICATIONS

Yoshihiko Hirai, editor, "Fundamentals of nanoimprint and its technology development/application deployment—technology of nanoimprint substrate and its latest technology deployment", Jun. 2006, Frontier Publishing, p. 95.

International Search Report for PCT/JP2012/065797 dated Jul. 17, 2012 English Translation.

Extended European Search Report dated Dec. 19, 2014, issued by the European Patent Office in corresponding European Application No. 12801083.2.

\* cited by examiner

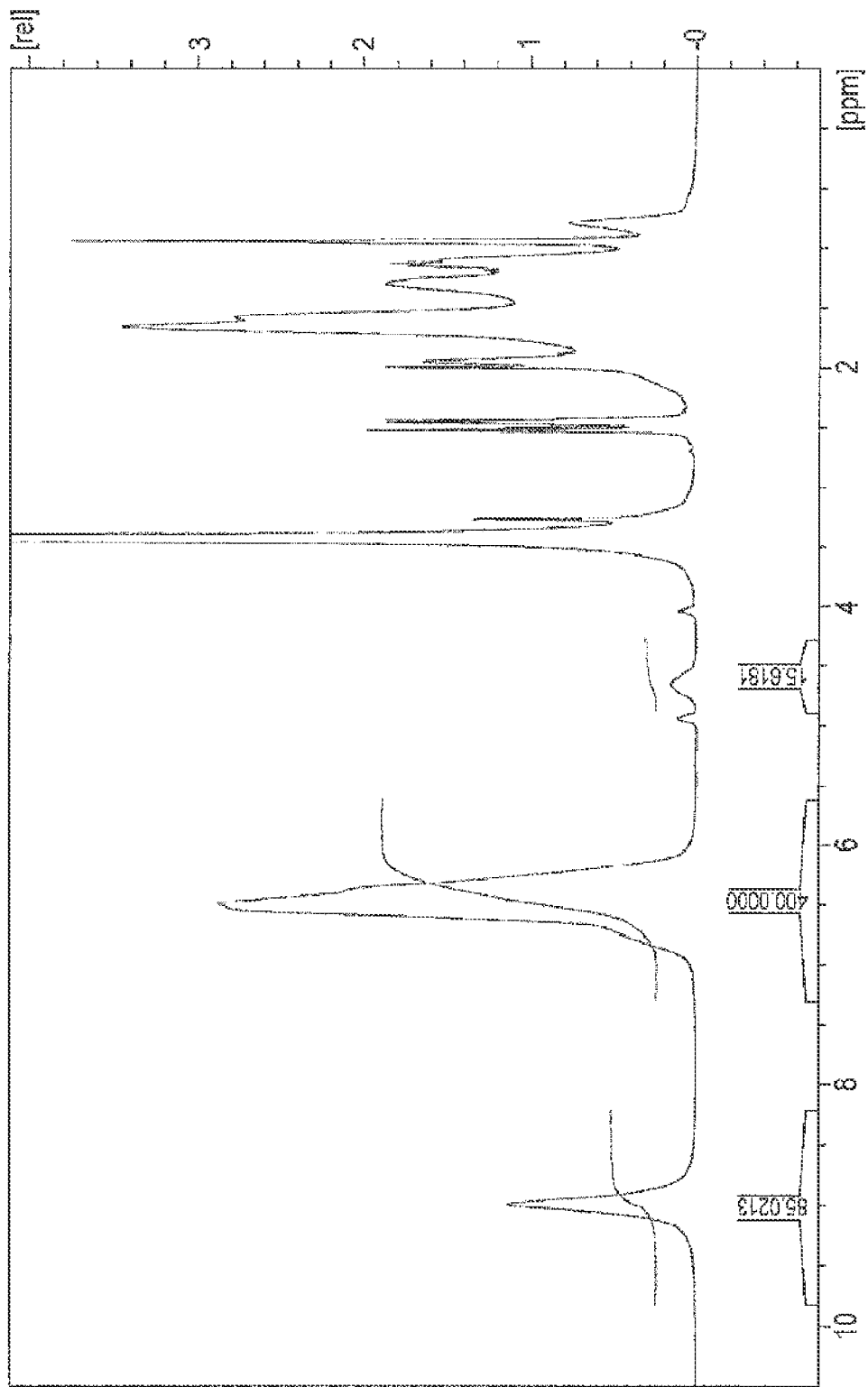
F I G. 1

ACTINIC-RAY- OR RADIATION SENSITIVE RESIN COMPOSITION, ACTINIC-RAY- OR RADIATION-SENSITIVE FILM THEREFROM AND METHOD OF FORMING PATTERN

CROSS-REFERENCE TO RELATED APPLICATIONS

This application is a Continuation application of PCT Application No. PCT/JP2012/065797, filed Jun. 14, 2012 and based upon and claims the benefit of priority from the prior Japanese Patent Applications No. 2011-132620, filed Jun. 14, 2011; and No. 2012-077484, filed Mar. 29, 2012, the entire contents of all of which are incorporated herein by reference.

BACKGROUND OF THE INVENTION

1. Field of the Invention

The present invention relates to an actinic-ray- or radiation-sensitive resin composition, an actinic-ray- or radiation-sensitive film therefrom and a method of forming a pattern. More particularly, the present invention relates to an actinic-ray- or radiation-sensitive resin composition that is suitable for use in an ultramicrolithography process applicable to a process for manufacturing a super-LSI or a high-capacity microchip, a process for manufacturing a nanoimprint mold, a process for producing a high-density information recording medium, etc., and other photofabrication processes, and relates to an actinic-ray- or radiation-sensitive film from the composition and a method of forming a pattern. Further more particularly, the present invention relates to an actinic-ray- or radiation-sensitive resin composition, actinic-ray- or radiation-sensitive film therefrom and method of forming a pattern that can find appropriate application in the microfabrication of semiconductor devices by electron beams, X-rays or EUV light.

2. Description of the Related Art

In the microfabrication using a resist composition, the formation of an ultrafine pattern is increasingly required in accordance with the realization of high integration for integrated circuits. In accordance with this requirement, the trend of exposure wavelength toward a short wavelength is seen. For example, the development of lithography technology using electron beams, X-rays or EUV light in place of an excimer laser light is progressing (see, for example, patent reference 1).

In the lithography using electron beams (EB), it is known that the influence of electron scattering, namely, forward scattering in a resist film is lessened by increasing the acceleration voltage of EB. Therefore, in recent years, the acceleration voltage of EB tends to be increased. However, increasing the acceleration voltage of EB, although lessening the influence of forward scattering, increases the influence of the scattering of electrons reflected by a resist substrate, namely, backward scattering. When it is intended to form an isolated line pattern of large exposure area, this influence of backward scattering is especially grave. Accordingly, for example, an increase of the acceleration voltage of EB might lead to the possibility of a deterioration of the resolution of the isolated line pattern.

In particular in the patterning of a photomask blank for use in semiconductor exposure, as a light shielding film containing a heavy atom, such as chromium, molybdenum or tantalum, is present in a layer under a resist film, the influence of backward scattering attributed to a reflection from the resist underlayer is more conspicuous than in the application of a resist onto a silicon wafer. Therefore, when an isolated line pattern is formed on a photomask blank, the influence of backward scattering is so grave that the possibility of resolution deterioration is high.

A chemically amplified positive resist is generally a photosensitive composition comprising a compound (photoacid generator) that when exposed to light, generates a strong acid and a compound in which a hydrophobic acid-unstable group is decomposed by the catalytic action of generated acid to thereby convert the compound to an alkali-soluble substance. The photosensitive composition may further comprise a basic compound in order to inhibit any dark reaction in unexposed areas. The presence of a basic compound makes it possible to deactivate through a neutralizing reaction any acid generated due to the influence of scattered electrons to thereby suppress any film thinning in unexposed areas. However, when an acetal group exhibiting a low activation energy in acidolysis reaction is used as an acid-unstable group, the decomposition reaction of the acid-unstable group competes with the neutralizing reaction between generated acid and basic compound, so that the film thinning in unexposed areas cannot be completely suppressed. In particular, the resolution of an isolated line pattern is deteriorated.

As a method for enhancing the resolution of an isolated line pattern, the use of a resin containing a group capable of regulating the solubility of the resin is being studied (see, for example, patent reference 2). However, this does not pose a radical solution to the problem, and fails to realize a fully satisfactory resolution of isolated line pattern.

Moreover, the microfabrication using a resist composition is not only directly used in the manufacturing of integrated circuits but also, in recent years, finds application in the fabrication of so-called imprint mold structures, etc. (see, for example, patent references 3, 4 and non-patent reference 1). In the fabrication of imprint mold structures as well, the influence of backward scattering becomes conspicuous in accordance with an increase of drawn area, thereby tending to invite a deterioration of resolution. Therefore, in the formation of an isolated pattern using, in particular, X-rays, soft X-rays or electron beams as an exposure light source as well, it is an important task to simultaneously satisfy high sensitivity, high resolution and favorable dry etching resistance, and is now needed to resolve this task.

CITATION LIST

Patent Literature

Patent reference 1: Jpn. Pat. Appln. KOKAI Publication No. (hereinafter referred to as JP-A-) 2008-95009,
Patent reference 2: JP-A-2005-157401,
Patent reference 3: JP-A-2004-158287, and
Patent reference 4: JP-A-2008-162101.

Non-Patent Literature

Non-patent reference 1: "Fundamentals of nanoimprint and its technology development/application deployment— technology of nanoimprint substrate and its latest technology deployment" edited by Yoshihiko Hirai, published by Frontier Publishing (issued in June, 2006).

BRIEF SUMMARY OF THE INVENTION

It is an object of the present invention to provide an actinic-ray- or radiation-sensitive resin composition that forms an isolated line pattern of favorable shape exhibiting high resolution and excels in other resist performances including dry etching resistance. It is other objects of the present invention to provide an actinic-ray- or radiation-sensitive film from the composition and a method of forming a pattern.

Some aspects according to the present invention are as follows.

[1] An actinic-ray- or radiation-sensitive resin composition comprising a compound (P) containing at least one phenolic hydroxyl group and at least one group with a phenolic hydroxyl group whose hydrogen atom is replaced by any of groups of general formula (1) below,

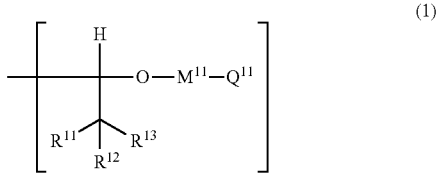
(1)

in which each of $R^{11}$, $R^{12}$ and $R^{13}$ independently represents an organic group with a carbon atom as an atom bonded to C of —$(CR^{11}R^{12}R^{13})$, provided that the organic groups represented by $R^{11}$, $R^{12}$ and $R^{13}$ contain carbon atoms totaling 4 or greater and that at least two of $R^{11}$, $R^{12}$ and $R^{13}$ may be bonded to each other to thereby form a ring, $M^{11}$ represents a single bond or a bivalent connecting group, and $Q^{11}$ represents an alkyl group, a cycloalkyl group or an aryl group.

[2] The composition according to item [1], wherein the compound (P) is a polymeric compound comprising any of repeating units of general formula (2) below or general formula (7) below,

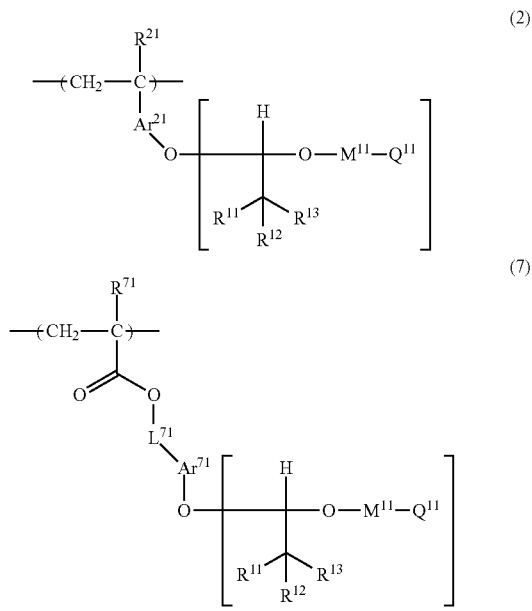

in general formula (2)
$R^{21}$ represents a hydrogen atom or a methyl group,
$Ar^{21}$ represents an arylene group,
each of $R^{11}$, $R^{12}$ and $R^{13}$ independently represents an organic group with a carbon atom as an atom bonded to C of —$(CR^{11}R^{12}R^{13})$, provided that the organic groups represented by $R^{11}$, $R^{12}$ and $R^{13}$ contain carbon atoms totaling 4 or greater and that at least two of $R^{11}$, $R^{12}$ and $R^{13}$ may be bonded to each other to thereby form a ring, $M^{11}$ represents a single bond or a bivalent connecting group, and $Q^{11}$ represents an alkyl group, a cycloalkyl group or an aryl group, and in general formula (7)
$R^{71}$ represents a hydrogen atom or a methyl group,
$L^{71}$ represents a single bond or an alkylene group,
$Ar^{71}$ represents an arylene group,
each of $R^{11}$, $R^{12}$ and $R^{13}$ independently represents an organic group with a carbon atom as an atom bonded to C of —$(CR^{11}R^{12}R^{13})$, provided that the organic groups represented by $R^{11}$, $R^{12}$ and $R^{13}$ contain carbon atoms totaling 4 or greater and that at least two of $R^{11}$, $R^{12}$ and $R^{13}$ may be bonded to each other to thereby form a ring, $M^{11}$ represents a single bond or a bivalent connecting group, and $Q^{11}$ represents an alkyl group, a cycloalkyl group or an aryl ring group.

[3] The composition according to item [2], wherein $Ar^{21}$ and $Ar^{71}$ are phenylene groups.

[4] The composition according to any of items [1] to [3], wherein at least one of $R^{11}$, $R^{12}$ and $R^{13}$ has at least one cyclic structure.

[5] The composition according to any of items [1] to [4], wherein at least two of $R^{11}$, $R^{12}$ and $R^{13}$ are bonded to each other to thereby form a polycycle.

[6] The composition according to any of items [1] to [5], wherein -$M^{11}$-$Q^{11}$ represents a group selected from among an alkyl group, a cycloalkyl-substituted alkyl group, a cycloalkyl group, an aralkyl group or an aryloxyalkyl group.

[7] The composition according to any of items [2] to [6], wherein the compound (P) comprises any of repeating units of general formula (5) below,

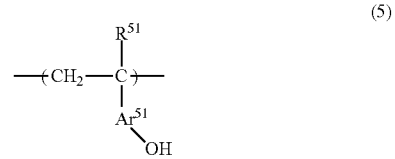
(5)

in which
$R^{51}$ represents a hydrogen atom or a methyl group, and
$Ar^{51}$ represents an arylene group.

[8] The composition according to any of items [2] to [7], wherein the compound (P) further comprises any of non-decomposable repeating units of general formula (3) below,

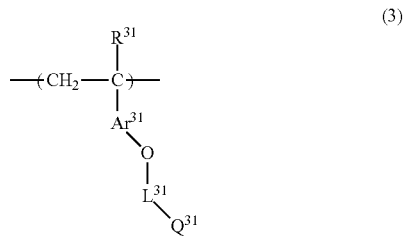
(3)

in which
$R^{31}$ represents a hydrogen atom or a methyl group,
$Ar^{31}$ represents an arylene group, $L^{31}$ represents a single bond or a bivalent connecting group, and $Q^{31}$ represents a cycloalkyl group or an aryl group.

[9] The composition according to any of items [2] to [8], wherein the compound (P) further comprises any of repeating units of general formula (4) below, $$-(CH_2-\underset{\underset{\underset{S}{\overset{|}{L^{41}}}}{\overset{|}{Ar^{41}}}}{\overset{R^{41}}{C}})- \quad (4)$$

in which $R^{41}$ represents a hydrogen atom or a methyl group, $Ar^{41}$ represents an arylene group, $L^{41}$ represents a single bond or a bivalent connecting group, and S represents a structural moiety that when exposed to actinic rays or radiation, is decomposed to thereby generate an acid in a side chain.

[10] The composition according to any of items [1] to [9], to be exposed to electron beams, X-rays or EUV light.

[11] An actinic-ray- or radiation-sensitive film formed from the composition according to any of items [1] to [10].

[12] A mask blank provided with the actinic-ray- or radiation-sensitive film according to item [11].

[13] A mask for semiconductor manufacturing produced by exposing the mask blank according to item [12] to light and developing the exposed mask blank.

[14] A method of forming a pattern, comprising:
exposing the film according to item [11] to light, and
developing the exposed film.

[15] A method of forming a pattern, comprising:
exposing the mask blank according to item [12] to light, and
developing the exposed mask blank.

[16] The method according to item [14] or [15], wherein the exposure is performed by means of electron beams, X-rays or EUV light.

[17] A polymeric compound comprising any of repeating units of general formula (2) below, $$-(CH_2-\underset{\underset{O}{\overset{|}{Ar^{21}}}}{\overset{R^{21}}{C}})-\left[\underset{\underset{R^{12}}{\overset{|}{R^{11}}}\overset{|}{}R^{13}}{\overset{H}{\overset{|}{C}}}-O-M^{11}-Q^{11}\right] \quad (2)$$

in which $R^{21}$ represents a hydrogen atom or a methyl group, $Ar^{21}$ represents an arylene group, each of $R^{11}$, $R^{12}$ and $R^{13}$ independently represents an organic group with a carbon atom as an atom bonded to C of $-(CR^{11}R^{12}R^{13})$, provided that the organic groups represented by $R^{11}$, $R^{12}$ and $R^{13}$ contain carbon atoms totaling 4 or greater and that at least two of $R^{11}$, $R^{12}$ and $R^{13}$ may be bonded to each other to thereby form a ring, $M^{11}$ represents a single bond or a bivalent connecting group, and $Q^{11}$ represents an alkyl group, a cycloalkyl group or an aryl group.

[18] A process for producing a polymeric compound according to item [17], comprising a reaction between a polymeric compound comprising any of repeating units of general formula (5) below and any of compounds of general formula (A) below, $$-(CH_2-\underset{\underset{OH}{\overset{|}{Ar^{51}}}}{\overset{R^{51}}{C}})- \quad (5)$$

$$X_A-\underset{\underset{R^{12}}{\overset{|}{R^{11}}}\overset{|}{}R^{13}}{\overset{H}{\overset{|}{C}}}-O-M^{11}-Q^{11} \quad (A)$$

in general formula (5)

$R^{51}$ represents a hydrogen atom or a methyl group, and $Ar^{51}$ represents an arylene group, and in general formula (A)

$X_A$ represents a chlorine atom, a bromine atom or an iodine atom, each of $R^{11}$, $R^{12}$ and $R^{13}$ independently represents an organic group with a carbon atom as an atom bonded to C of $-(CR^{11}R^{12}R^{13})$, provided that the organic groups represented by $R^{11}$, $R^{12}$ and $R^{13}$ contain carbon atoms totaling 4 or greater and that at least two of $R^{11}$, $R^{12}$ and $R^{13}$ may be bonded to each other to thereby form a ring, $M^{11}$ represents a single bond or a bivalent connecting group, and $Q^{11}$ represents an alkyl group, a cycloalkyl group or an aryl group.

[19] A process for producing a polymeric compound according to item [17], comprising polymerizing any of compounds of general formula (B) below, $$CH_2=\underset{\underset{O}{\overset{|}{Ar^{21}}}}{\overset{R^{21}}{C}}\left[\underset{\underset{R^{12}}{\overset{|}{R^{11}}}\overset{|}{}R^{13}}{\overset{H}{\overset{|}{C}}}-O-M^{11}-Q^{11}\right] \quad (B)$$

in which $R^{21}$ represents a hydrogen atom or a methyl group, $Ar^{21}$ represents an arylene group, each of $R^{11}$, $R^{12}$ and $R^{13}$ independently represents an organic group with a carbon atom as an atom bonded to C of $-(CR^{11}R^{12}R^{13})$, provided that the organic groups represented by $R^{11}$, $R^{12}$ and $R^{13}$ contain carbon atoms totaling 4 or greater and that at least two of $R^{11}$, $R^{12}$ and $R^{13}$ may be bonded to each other to thereby form a ring, $M^{11}$ represents a single bond or a bivalent connecting group, and $Q^{11}$ represents an alkyl group, a cycloalkyl group or an aryl group.

The present invention has made it feasible to provide an actinic-ray- or radiation-sensitive resin composition capable of forming an isolated line pattern of high resolution and favorable shape, which composition excels in resist performances, such as resolution of line-and-shape pattern, dry etching resistance and roughness characteristic, and to provide an actinic-ray- or radiation-sensitive film from the composition and a method of forming a pattern.

BRIEF DESCRIPTION OF THE SEVERAL VIEWS OF THE DRAWING

FIG. 1 is a $^1$H-NMR chart of compound (P-1) synthesized in Example.

DETAILED DESCRIPTION OF THE INVENTION

Figure 2:
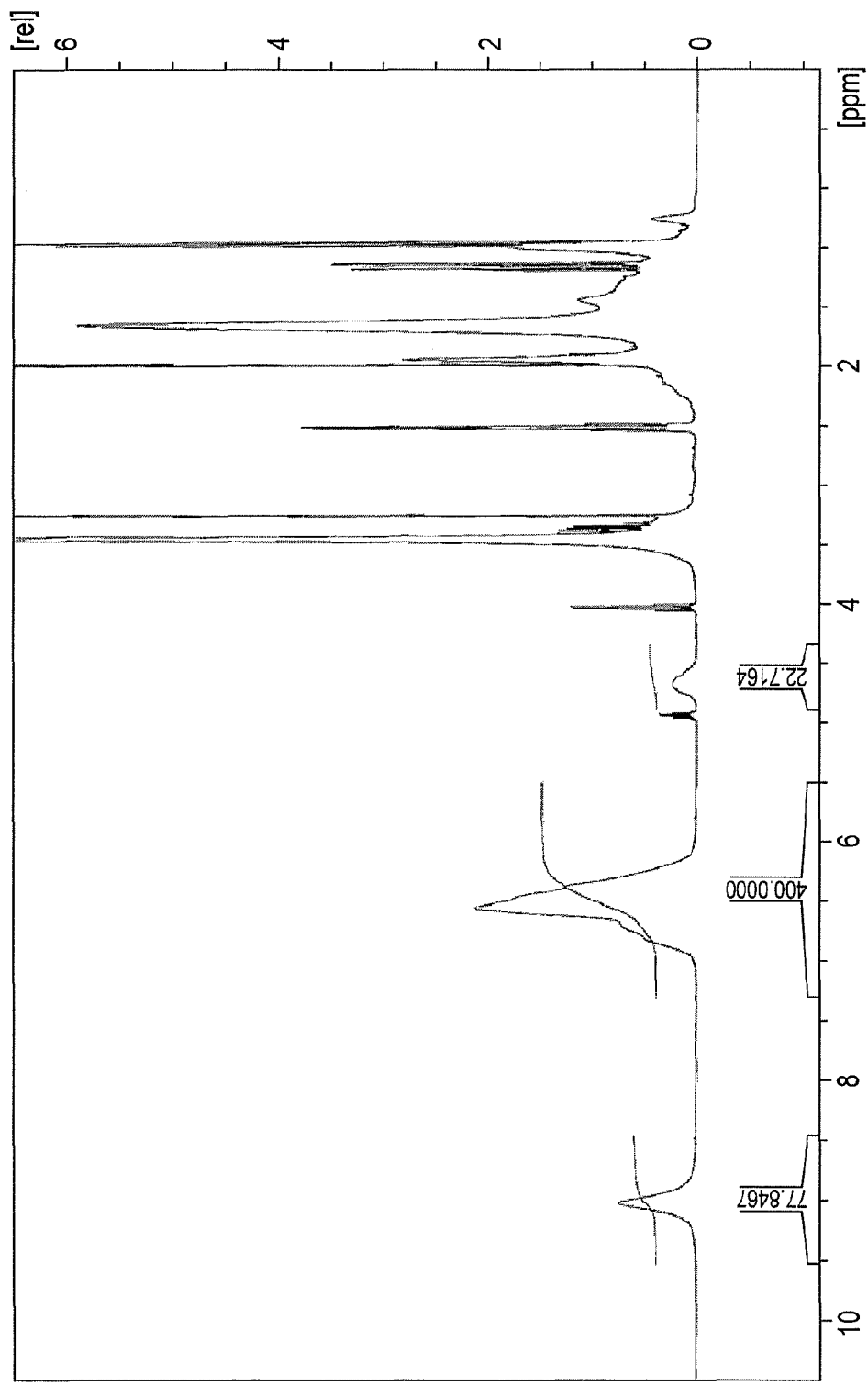
FIG. 2 is a $^1$H-NMR chart of compound (P-4) synthesized in Example.

Now, the embodiments of the present invention will be described in detail.

With respect to the expression of group (atomic group) used in this specification, the expression even when there is no mention of "substituted and unsubstituted" encompasses groups not only having no substituent but also having substituents. For example, the expression "alkyl groups" encompasses not only alkyls having no substituent (unsubstituted alkyls) but also alkyls having substituents (substituted alkyls).

In the present invention, the term "actinic rays" or "radiation" means, for example, brightline spectra from a mercury lamp, far ultraviolet represented by an excimer laser, extreme ultraviolet (EUV light), x-rays, electron beams (EB) and the like. Further, in the present invention, the term "light" means actinic rays or radiation. The term "exposure to light" used in this specification, unless otherwise specified, means not only irradiation with light, such as light from a mercury lamp, far ultraviolet represented by an excimer laser, X-rays or EUV light, but also lithography using particle beams, such as electron beams and ion beams.

The actinic-ray- or radiation-sensitive resin composition of the present invention is, for example, a positive composition, typically a positive resist composition. The constituents of this composition will be described below.

[1] Compound (P)

The composition of the present invention comprises a compound (P) containing at least one phenolic hydroxyl group and at least one group with a phenolic hydroxyl group whose hydrogen atom is replaced by any of groups of general formula (1) below (hereinafter also referred to as "group unstable in an acid (or acid-unstable group)"). Herein, the term "group unstable in an acid (or acid-unstable group)" means a group that when acted on by an acid, is split through the cleavage of a chemical bond. The term "phenolic hydroxyl group" means a hydroxyl group directly bonded to an aromatic ring.

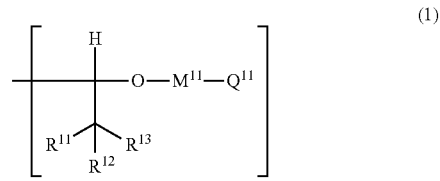

In general formula (1), each of $R^{11}$, $R^{12}$ and $R^{13}$ independently represents an organic group with a carbon atom as an atom bonded to C of —(CR$^{11}$R$^{12}$R$^{13}$), provided that the organic groups represented by $R^{11}$, $R^{12}$ and $R^{13}$ contain carbon atoms totaling 4 or greater and that at least two of $R^{11}$, $R^{12}$ and $R^{13}$ may be bonded to each other to thereby form a ring.

$M^{11}$ represents a single bond or a bivalent connecting group.

$Q^{11}$ represents an alkyl group, a cycloalkyl group or an aryl group.

General formula (1) will be described in greater detail below.

As mentioned above, each of $R^{11}$, $R^{12}$ and $R^{13}$ independently represents an organic group.

Herein, the term "organic group" means a group containing at least one carbon atom. One of the contained carbon atoms is bonded to C of the group —(CR$^{11}$R$^{12}$R$^{13}$).

The sum of carbon atoms contained in the organic groups represented by $R^{11}$, $R^{12}$ and $R^{13}$ is 4 or greater, preferably in the range of 6 to 20 and most preferably 6 to 10.

Each of the organic groups represented by $R^{11}$, $R^{12}$ and $R^{13}$ is preferably an organic group containing a carbon-hydrogen bond moiety. When two or more carbon atoms are contained, it may be a saturated organic group wherein any carbon-carbon bond is comprised of a single bond only, or may be an unsaturated organic group wherein the carbon-carbon bonds contain a moiety comprised of a double bond or triple bond. Further, each of the organic groups may contain a heteroatom, such as an oxygen atom, a nitrogen atom or a sulfur atom.

Each of $R^{11}$, $R^{12}$ and $R^{13}$ can be, for example, an alkyl group, a cycloalkyl group, an aryl group, an aralkyl group or a heterocyclic group to be linked by means of its carbon atom. The heterocyclic group to be linked by means of its carbon atom may be aromatic or nonaromatic.

The alkyl group in its one form preferably contains 20 or less carbon atoms, more preferably 8 or less carbon atoms. The alkyl group can be, for example, any of a methyl group, an ethyl group, a propyl group, an isopropyl group, an n-butyl group, a sec-butyl group, a t-butyl group, a hexyl group, a 2-ethylhexyl group, an octyl group and a dodecyl group. Of these, a methyl group, an ethyl group, a propyl group, an isopropyl group and a t-butyl group are especially preferred.

The cycloalkyl group may be monocyclic or polycyclic. The cycloalkyl group preferably contains 3 to 10 carbon atoms. The cycloalkyl group can be, for example, any of a cyclopropyl group, a cyclobutyl group, a cyclopentyl group, a cyclohexyl group, a cycloheptyl group, a cyclooctyl group, a 1-adamantyl group, a 2-adamantyl group, a 1-norbornyl group and a 2-norbornyl group. Of these, a cyclopentyl group and a cyclohexyl group are preferred.

The aryl groups include a structure (for example, a biphenyl group or a terphenyl group) in which a plurality of aromatic rings are linked to each other through a single bond.

Each of the aryl group preferably has 4 to 20 carbon atoms, more preferably 6 to 14 carbon atoms. The aryl groups can be, for example, a phenyl group, a naphthyl group, an anthranyl group, a biphenyl group, a terphenyl group and the like. Of these, a phenyl group, a naphthyl group and a biphenyl group are especially preferred.

The aralkyl group preferably has 6 to 20 carbon atoms, more preferably 7 to 12 carbon atoms. The aralkyl group can be, for example, any of a benzyl group, a phenethyl group, a naphthylmethyl group and a naphthylethyl group.

A substituent may further be introduced in each of the alkyl group, cycloalkyl group, aryl group and aralkyl group.

As the substituent that may further be introduced in the alkyl group, there can be mentioned, for example, a cycloalkyl group, an aryl group, an amino group, an amido group, a ureido group, a urethane group, a hydroxyl group, a carboxyl group, a halogen atom, an alkoxy group, an aralkyloxy group, a thioether group, an acyl group, an acyloxy group, an alkoxycarbonyl group, a cyano group or a nitro group.

As the substituent that may further be introduced in the cycloalkyl group, there can be mentioned an alkyl group or any of the groups mentioned above as examples of the substituents that may further be introduced in the alkyl group.

The substituent that may further be introduced in the alkyl group or cycloalkyl group preferably has 8 or less carbon atoms.

As the substituent that may further be introduced in the aryl group or aralkyl group, there can be mentioned, for example, a nitro group, a halogen atom such as a fluorine atom, a carboxyl group, a hydroxyl group, an amino group, a cyano group, an alkyl group (preferably having 1 to 15 carbon atoms), an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms) or an alkoxycarbonyloxy group (preferably having 2 to 7 carbon atoms).

With respect to the heterocyclic group to be linked by means of its carbon atom, the expression "linked by means of its carbon atom" means that the atom bonded to C of —(CR$^{11}$R$^{12}$R$^{13}$) is a carbon atom. The heterocycle may be an aromatic ring or a nonaromatic ring, and preferably contains 2 to 20 carbon atoms, more preferably 4 to 14 carbon atoms. As the heterocyclic group to be linked by means of its carbon atom, there can be mentioned a pyrrolyl group, a pyridyl group, a pyrimidyl group, a furanyl group, a thienyl group, a tetrahydrofuranyl group, a tetrahydropyranyl group, a tetrahydrothienyl group, a pyrrolidinyl group, a morpholinyl or the like.

At least two of R$^{11}$, R$^{12}$ and R$^{13}$ may be bonded to each other to thereby form a ring. When two of R$^{11}$, R$^{12}$ and R$^{13}$ are bonded to each other to thereby form a ring, the formed ring can be, for example, any of a cyclopentane ring, a cyclohexane ring, an adamantane ring, a norbornene ring and a norbornane ring. A substituent may be introduced in these. As the introducible substituent, there can be mentioned an alkyl group or any of the groups mentioned above as examples of the substituents that may further be introduced in the alkyl group. When all of R$^{11}$, R$^{12}$ and R$^{13}$ are bonded to each other to thereby form a ring, the formed ring can be, for example, any of an adamantane ring, a norbornane ring, a norbornene ring, a bicyclo[2,2,2]octane ring and a bicyclo[3,1,1]heptane ring. Of these, an adamantane ring is most preferred. A substituent may be introduced in these. As the introducible substituent, there can be mentioned an alkyl group or any of the groups mentioned above as examples of the substituents that may further be introduced in the alkyl group.

From the viewpoint of dry etching resistance and increase of the glass transition temperature of compound (P), it is preferred for at least one of R$^{11}$, R$^{12}$ and R$^{13}$ to have a cyclic structure. More preferably, at least two of R$^{11}$, R$^{12}$ and R$^{13}$ are bonded to each other to thereby form a ring. Most preferably, all of R$^{11}$, R$^{12}$ and R$^{13}$ are bonded to each other to thereby form a ring.

Particular examples of the groups of the formula —(CR$^{11}$R$^{12}$R$^{13}$) are shown below, which in no way limit the scope of the present invention.

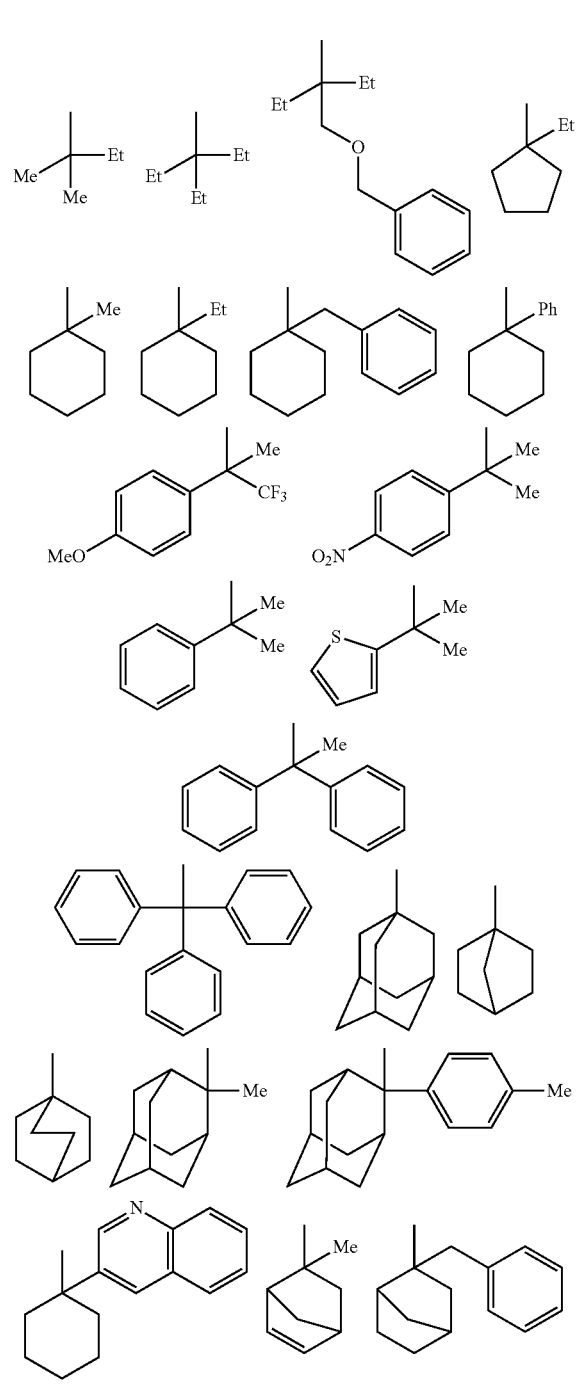

-continued

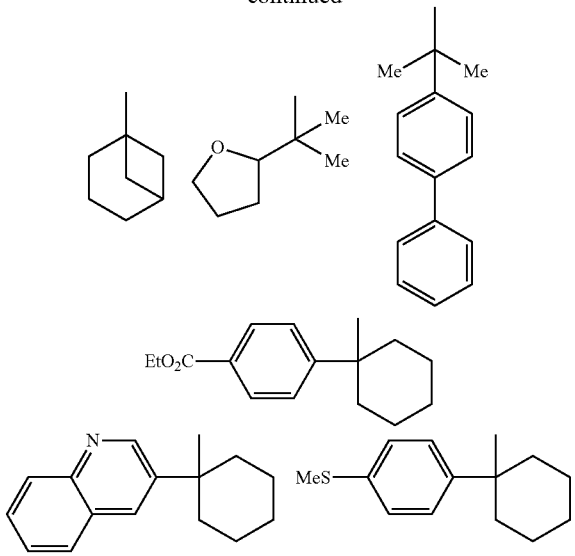

The bivalent connecting group represented by $M^{11}$ is, for example, an alkylene group (preferably an alkylene group having 1 to 8 carbon atoms, e.g., a methylene group, an ethylene group, a propylene group, a butylene group, a hexylene group or an octylene group), a cycloalkylene group (preferably a cycloalkylene group having 3 to 15 carbon atoms, e.g., a cyclopentylene group or a cyclohexylene group), —S—, —O—, —CO—, —CS—, —$SO_2$—, —N($R_0$)— or a combination of two or more of these in which the total number of carbon atoms is preferably 20 or less. $R_0$ represents a hydrogen atom or an alkyl group (for example, an alkyl group having 1 to 8 carbon atoms; in particular, a methyl group, an ethyl group, a propyl group, an n-butyl group, a sec-butyl group, a hexyl group, an octyl group or the like).

It is preferred for $M^{11}$ to be a single bond, an alkylene group, or a bivalent connecting group comprised of a combination of an alkylene group and at least one of —O—, —CO—, —CS— and —N($R_0$)—. A single bond, an alkylene group and a bivalent connecting group comprised of a combination of an alkylene group and —O— are more preferred. Herein, $R_0$ is as defined above.

A substituent may further be introduced in $M^{11}$. The substituent that may further be introduced in $M^{11}$ is the same as any of those that may be introduced in the alkyl group represented by $R^{11}$.

The alkyl group represented by $Q^{11}$ is, for example, the same as that represented by $R^{11}$.

The cycloalkyl group represented by $Q^{11}$ may be monocyclic or polycyclic. The cycloalkyl group preferably contains 3 to 10 carbon atoms. The cycloalkyl group can be, for example, any of a cyclopropyl group, a cyclobutyl group, a cyclopentyl group, a cyclohexyl group, a cycloheptyl group, a cyclooctyl group, a 1-adamantyl group, a 2-adamantyl group, a 1-norbornyl group, a 2-norbornyl group, a bornyl group, an isobornyl group, a 4-tetracyclo[6.2.1.1$^{3,6}$.0$^{2,7}$]dodecyl group, a 8-tricyclo[5.2.1.0$^{2,6}$]decyl group and a 2-bicyclo[2.2.1]heptyl group. Of these, a cyclopentyl group, a cyclohexyl group, a 2-adamantyl group, an 8-tricyclo[5.2.1.0$^{2,6}$]decyl group and a 2-bicyclo[2.2.1]heptyl group are preferred.

The aryl group represented by $Q^{11}$ is, for example, the same as that represented by $R^{11}$. The aryl group preferably contains 3 to 18 carbon atoms.

Substituents may be introduced in the cycloalkyl group and aryl group represented by $Q^{11}$. Such substituents can be, for example, an alkyl group, a cycloalkyl group, a cyano group, a halogen atom, a hydroxyl group, an alkoxy group, a carboxyl group and an alkoxycarbonyl group.

It is most preferred for -($M^{11}$-$Q^{11}$) to be an alkyl group, an alkyl group substituted with a cycloalkyl group, a cycloalkyl group, an aralkyl group, an aryloxyalkyl group or the like. In particular $Q^{11}$) is, for example, a methyl group, an ethyl group, an isopropyl group, a cyclopentyl group, a cyclohexyl group, a cyclohexylethyl group, a 2-adamantyl group, an 8-tricyclo[5.2.1.0$^{2,6}$]decyl group, a 2-bicyclo[2.2.1]heptyl group, a benzyl group, a 2-phenethyl group, a 2-phenoxyethyl group or the like.

Particular examples of the groups of the formula -($M^{11}$-$Q^{11}$) are shown below, which however in no way limit the scope of the present invention.

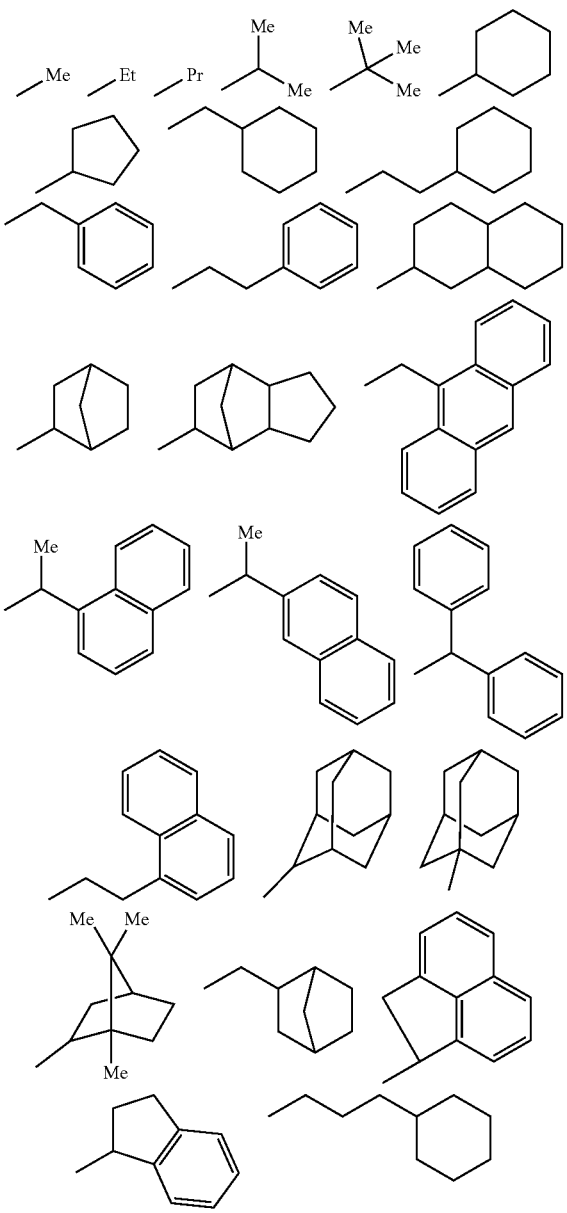

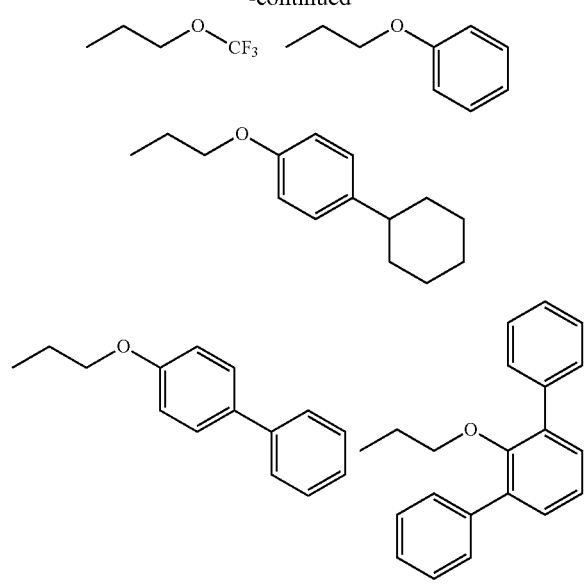
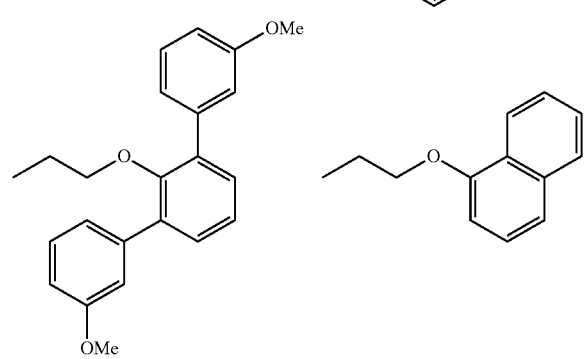

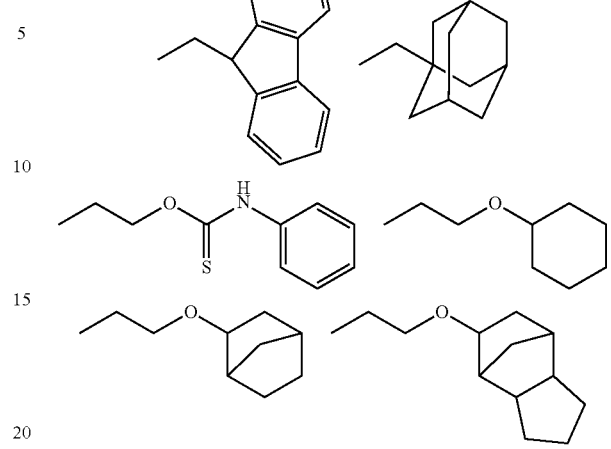

Nonlimiting particular examples of the groups unstable in an acid of general formula (1) include those each comprised of a combination of any of the above-mentioned particular examples of the groups of the formula —$(CR^{11}R^{12}R^{13})$ and any of the above-mentioned particular examples of the groups of the formula -$(M^{11}$-$Q^{11})$.

Preferred examples of the groups unstable in an acid of general formula (1) are shown below.

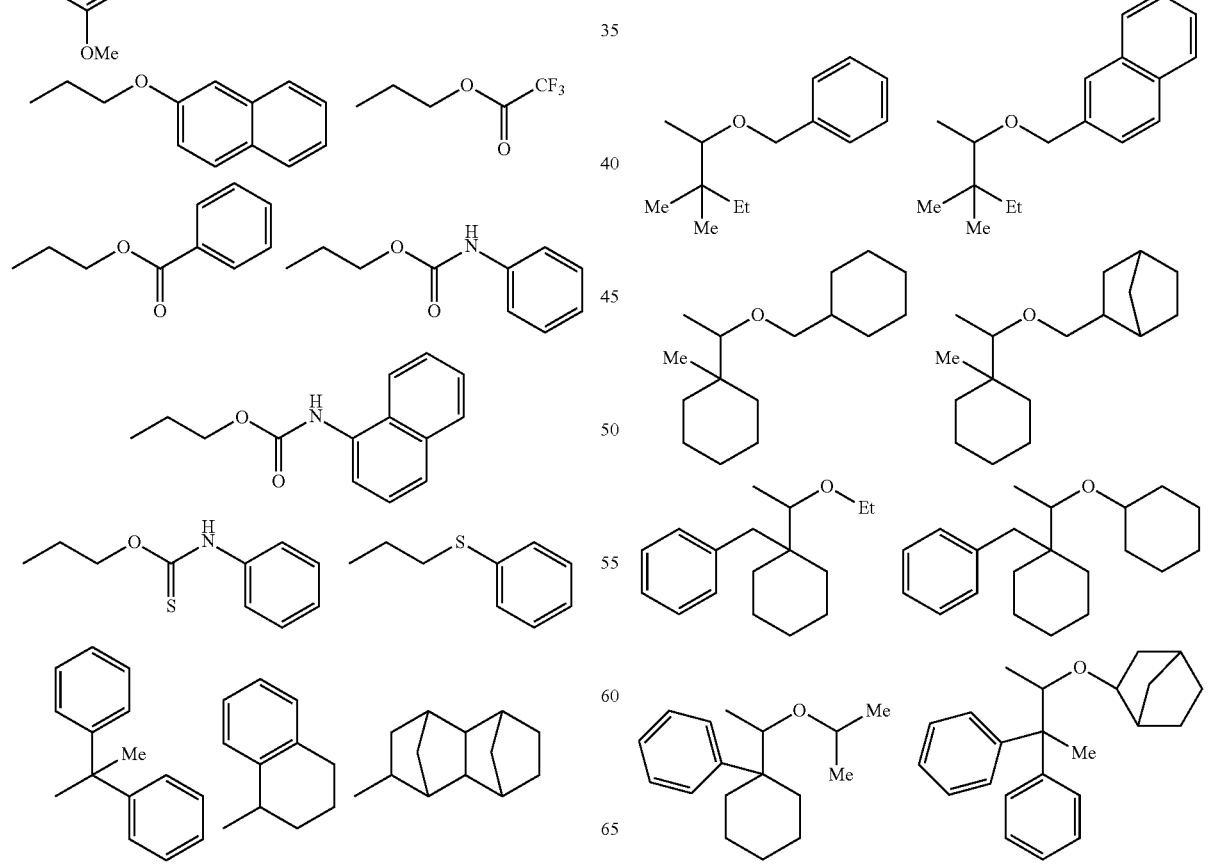

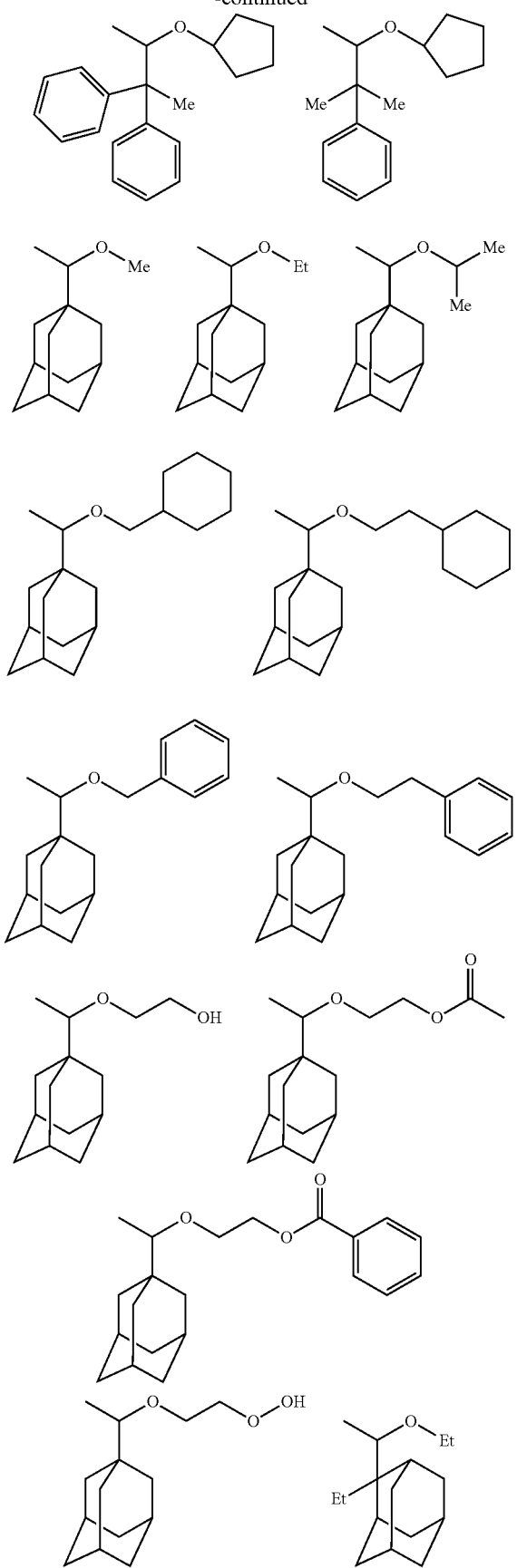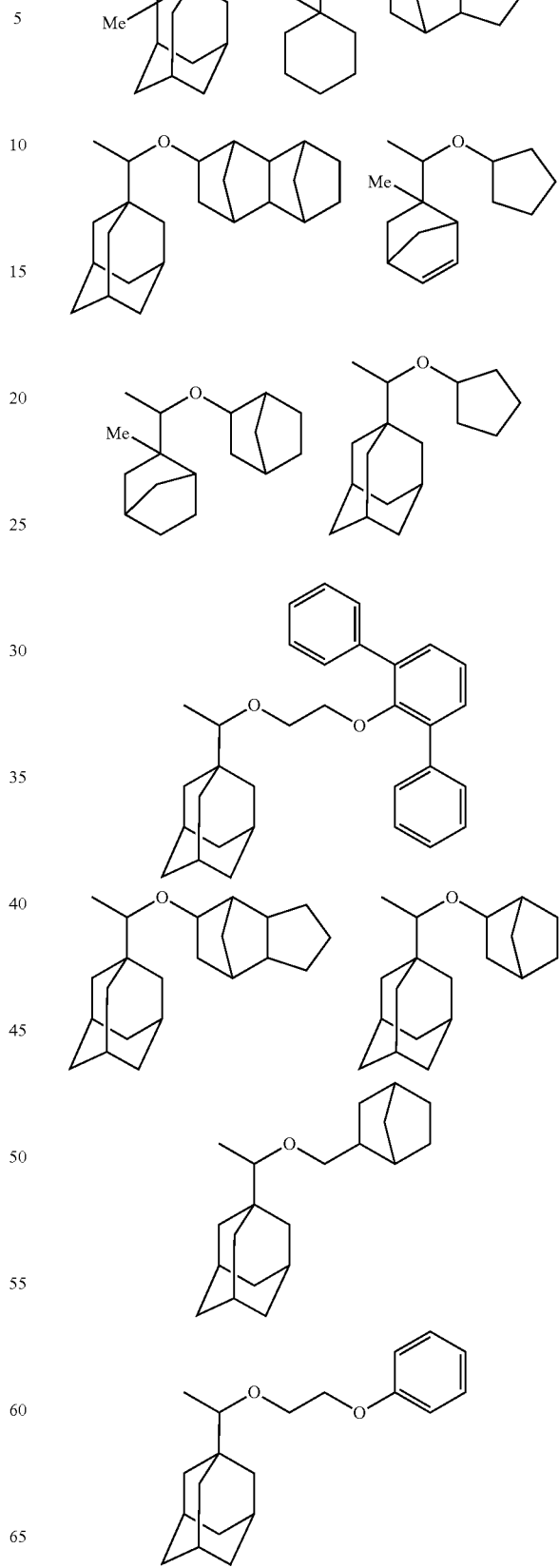

-continued

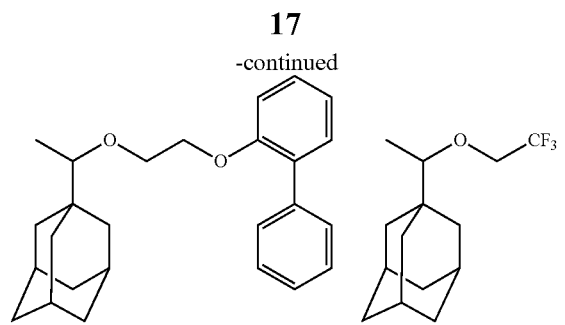
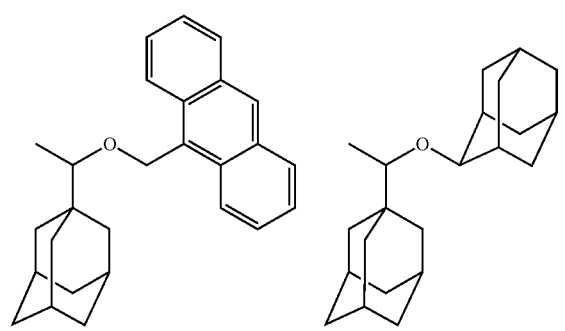
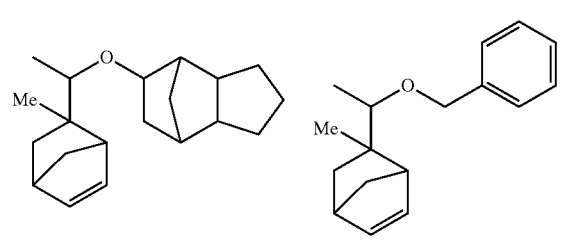
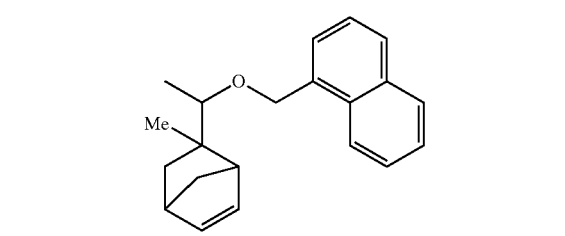
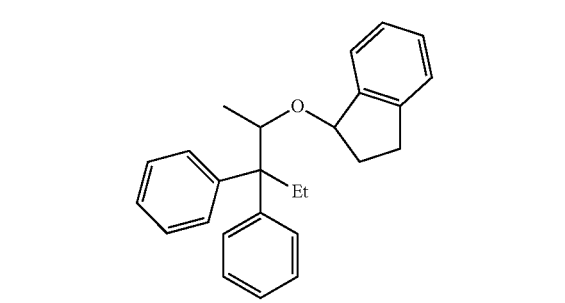
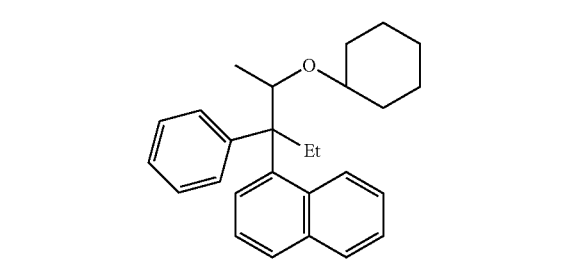

-continued

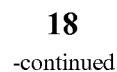
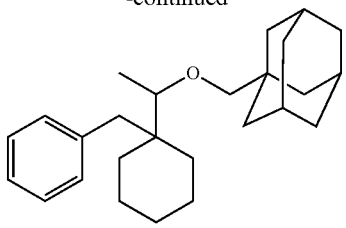
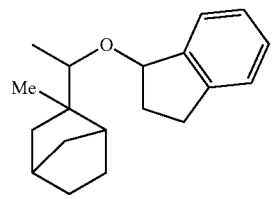
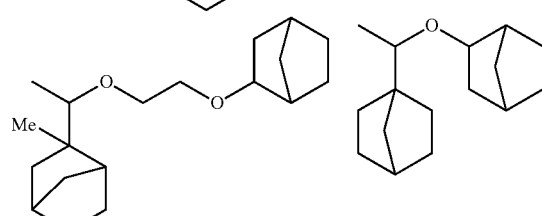

It is presumed that the groups unstable in an acid of general formula (1) exhibit an activation energy of acid decomposition reaction higher than that of, for example, the group unstable in an acid resulting from substitution of all of $R^{11}$, $R^{12}$ and $R^{13}$ with hydrogen atoms, as the carbocation intermediate produced in the course of decomposition by the action of an acid is not stabilized by the hyperconjugation effect by means of C—H σ bond.

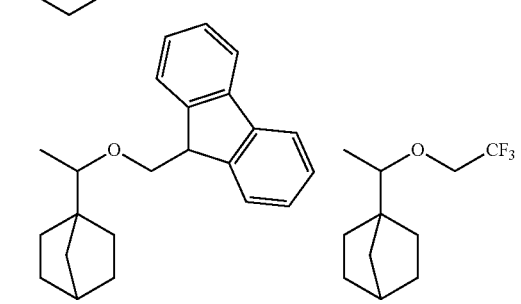
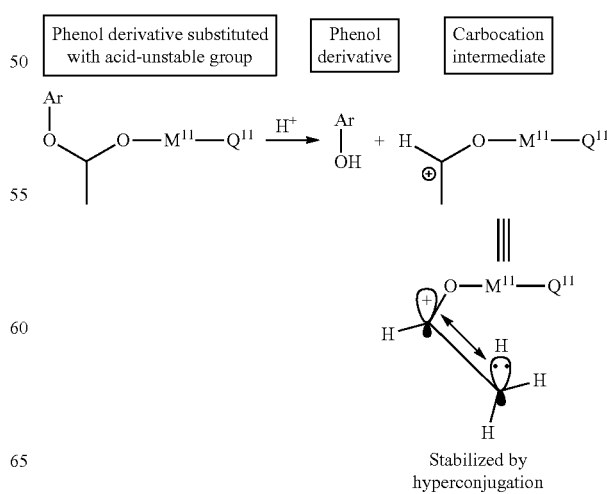

Stabilized by hyperconjugation

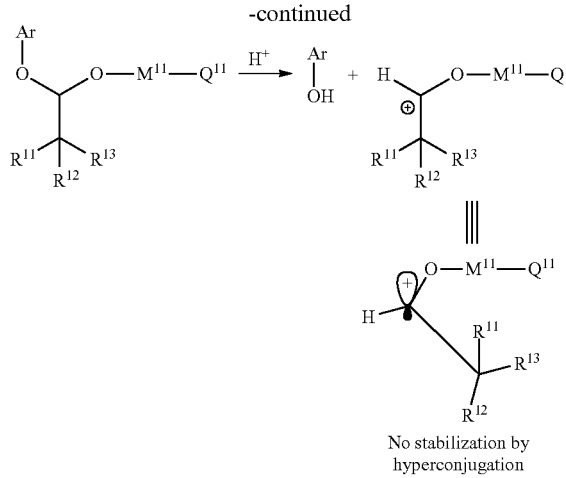

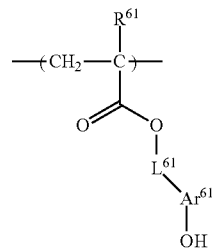

No stabilization by hyperconjugation

The increase of the activation energy inhibits any decomposition reaction of a group unstable in an acid at about room temperature and eliminates any competition between the reaction of neutralizing a generated acid and the decomposition reaction of the group unstable in an acid in the resist film. Thus, the resolution and roughness characteristics are enhanced.

The degree of substitution of the compound (P) according to the present invention with the group unstable in an acid expressed by general formula (1) is preferably in the range of 1 to 60 mol %, more preferably 2 to 40 mol % and most preferably 2 to 30 mol %, based on all the phenolic hydroxyl groups.

The compound (P) in its one form may be a polymeric compound comprising a repeating unit containing a phenolic hydroxyl group and a repeating unit containing a group with a phenolic hydroxyl group whose hydrogen atom is substituted with the group unstable in an acid expressed by general formula (1). Also, the compound (P) in its other form may be a low-molecular compound comprised of a scaffold compound with a plurality of phenolic hydroxyl groups, the hydrogen atom of part of which is substituted with the group unstable in an acid expressed by general formula (1).

First, the instance in which the compound (P) is a polymeric compound will be described.

As mentioned above, the compound (P) in its one form may be a polymeric compound comprising a repeating unit containing a phenolic hydroxyl group and a repeating unit containing a group with a phenolic hydroxyl group whose hydrogen atom is substituted with the group unstable in an acid expressed by general formula (1).

The repeating unit containing a phenolic hydroxyl group is, for example, any of the repeating units of general formulae (5) and (6) below, preferably any of the repeating units of general formula (5).

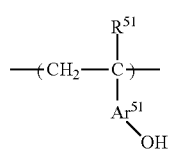

(5)

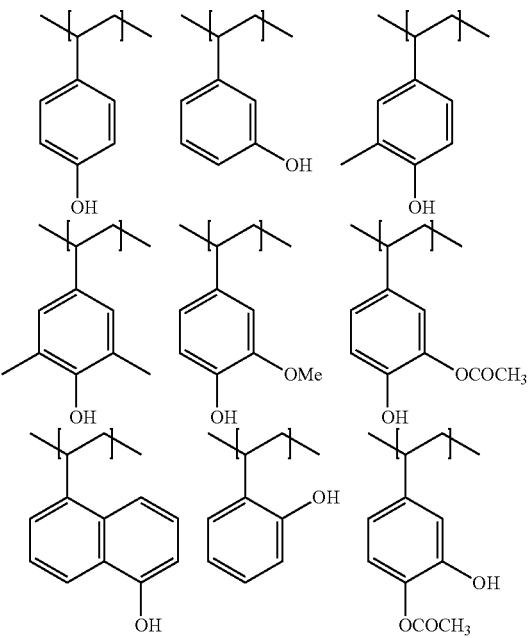

In general formulae (5) and (6), each of $R^{51}$ and $R^{61}$ independently represents a hydrogen atom or a methyl group. Each of $Ar^{51}$ and $Ar^{61}$ independently represents an arylene group. $L^{61}$ represents a single bond or an alkylene group.

$R^{51}$ is preferably a hydrogen atom, and $R^{61}$ is preferably a methyl group.

A substituent may be introduced in each of the arylene groups represented by $Ar^{51}$ and $Ar^{61}$. Each of the arylene groups is preferably an optionally substituted arylene group having 6 to 18 carbon atoms, more preferably an optionally substituted phenylene group or naphthylene group and most preferably an optionally substituted phenylene group. As the substituents that may be introduced in these, there can be mentioned, for example, an alkyl group, a halogen atom, a hydroxyl group, an alkoxy group, a carboxyl group and an alkoxycarbonyl group.

As mentioned above, $L^{61}$ represents a single bond or an alkylene group. The alkylene group is preferably an alkylene group having 1 to 8 carbon atoms, more preferably 1 to 4 carbon atoms. The alkylene group is, for example, a methylene group, an ethylene group, a propylene group, a butylene group, a hexylene group or an octylene group. A methylene group and an ethylene group are most preferred.

Particular examples of the repeating units of general formula (5) are shown below, which however in no way limit the scope of the present invention.

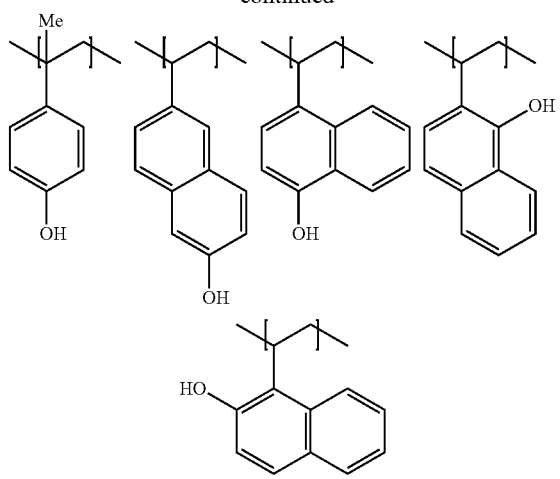

Particular examples of the repeating units of general formula (6) are shown below, which however in no way limit the scope of the present invention.

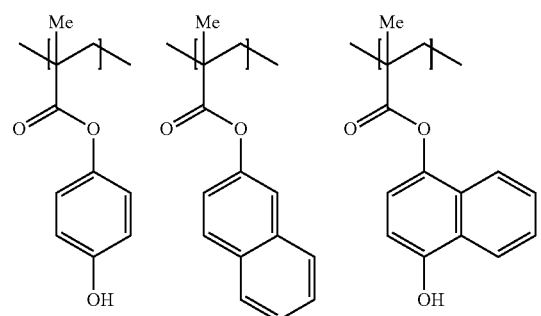

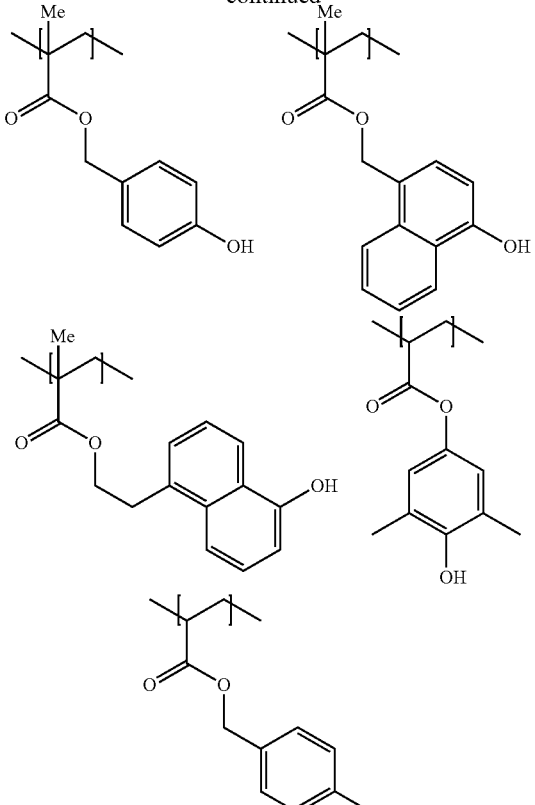

The repeating unit containing a group with a phenolic hydroxyl group whose hydrogen atom is substituted with the group unstable in an acid expressed by general formula (1) is, for example, any of the repeating units of general formulae (2) and (7) below, preferably any of the repeating units of general formula (2).

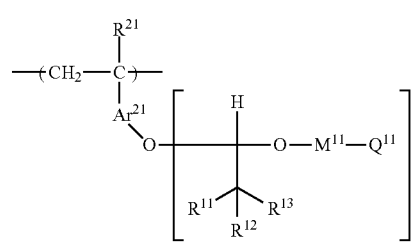

(2)

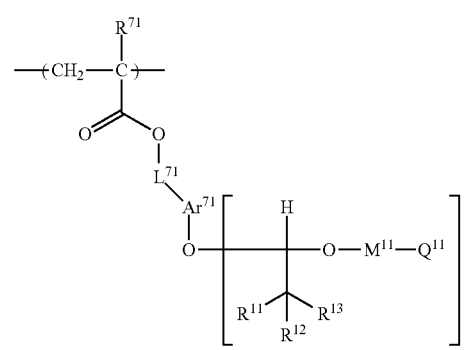

(7)

In general formulae (2) and (7), each of $R^{21}$ and $R^{71}$ independently represents a hydrogen atom or a methyl group.

Each of $Ar^{21}$ and $Ar^{71}$ independently represents an arylene group.

$L^{71}$ represents a single bond or an alkylene group.

Each of $R^{11}$, $R^{12}$ and $R^{13}$ independently represents an organic group with a carbon atom as an atom bonded to C of —$(CR^{11}R^{12}R^{13})$, provided that the organic groups represented by $R^{11}$, $R^{12}$ and $R^{13}$ contain carbon atoms totaling 4 or greater and that at least two of $R^{11}$, and $R^{13}$ may be bonded to each other to thereby form a ring.

$M^{11}$ represents a single bond or a bivalent connecting group.

$Q^{11}$ represents an alkyl group, a cycloalkyl group or an aryl ring group.

$R^{21}$ is preferably a hydrogen atom, and $R^{71}$ is preferably a methyl group.

Substituents may be introduced in the arylene groups represented by $Ar^{21}$ and $Ar^{71}$. Particular examples thereof are the same as those mentioned above with respect to $Ar^{51}$ and $Ar^{61}$ of general formulae (5) and (6).

Particular examples of the alkylene groups represented by $L^{71}$ are the same as those mentioned above with respect to $L^{51}$ and $L^{61}$ of general formula (6).

The groups represented by $R^{11}$, $R^{12}$, $R^{13}$, $M^{11}$ and $Q^{11}$ are the same as described above with respect to general formula (1).

As particular examples of the repeating units of general formulae (2) and (7), there can be mentioned, for example, the above-mentioned particular examples of the repeating units of general formulae (5) and (6) wherein the hydrogen atom of the phenolic hydroxyl group is substituted with any of the above-mentioned particular examples of the groups unstable in an acid expressed by general formula (1).

The compound (P) according to the present invention may further comprise any of nondecomposable repeating units of general formula (3) below.

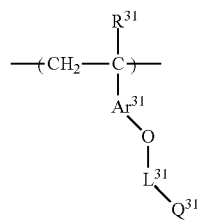

(3)

$R^{31}$ represents a hydrogen atom or a methyl group.

$Ar^{31}$ represents an arylene group.

$L^{31}$ represents a single bond or a bivalent connecting group.

$Q^{31}$ represents a cycloalkyl group or an aryl group.

Herein, the term "nondecomposable" means that any chemical bond is not cleaved by the action of an acid generated upon exposure to light, an alkali developer or the like.

$R^{31}$ is a hydrogen atom or a methyl group as mentioned above, preferably a hydrogen atom. $Ar^{31}$ represents an arylene group as mentioned above. Particular examples and preferred ranges of arylene groups are the same as those described above with respect to $Ar^{21}$ of general formula (2).

As the bivalent connecting group represented by $L^{31}$, there can be mentioned, for example, an alkylene group, an alkenylene group, —O—, —CO—, —$NR^{32}$—, —S—, —CS— or a combination of these. Herein, $R^{32}$ represents a hydrogen atom, an alkyl group, a cycloalkyl group, an aryl group or an aralkyl group. The total number of carbon atoms of each of the bivalent connecting groups represented by $L^{31}$ is preferably in the range of 1 to 15, more preferably 1 to 10.

The alkylene group is preferably an alkylene group having 1 to 8 carbon atoms, more preferably 1 to 4 carbon atoms. The alkylene group is, for example, a methylene group, an ethylene group, a propylene group, a butylene group, a hexylene group or an octylene group.

The alkenylene group is preferably an alkenylene group having 2 to 8 carbon atoms, more preferably 2 to 4 carbon atoms.

Particular examples and preferred ranges of the alkyl groups, cycloalkyl groups, aryl groups and aralkyl groups represented by $R^{32}$ are the same as those described above with respect to $R^{11}$ of general formula (1).

$L^{31}$ is preferably any of a carbonyl group, a methylene group, *—CO—$NR^{32}$—, *—CO—$(CH_2)_n$—O—, *—CO—$(CH_2)_n$—O—CO—, *—$(CH_2)_n$—COO—, *—$(CH_2)_n$—$CONR^{32}$— and *—CO—$(CH_2)_n$—$NR^{32}$—. Of these, a carbonyl group, a methylene group, *—CO—$NR^{32}$—, *—$CH_2$—COO—, *—CO—$CH_2$—O—, *—CO—$CH_2$—O—CO—, *—$CH_2$—$CONR^{32}$— and *—CO—$CH_2$—$NR^{32}$— are more preferred. A carbonyl group, a methylene group, *—CO—$NR^{32}$— and *—$CH_2$—COO— are most preferred. Herein, n is an integer of 1 to 10, and * represents a site of connection to the side of the principal chain, namely, a site of connection to the O atom of the general formula.

$Q^{31}$ represents a cycloalkyl group or an aryl group, as mentioned above. Particular examples and preferred ranges thereof are the same as those described above with respect to $Q^{11}$ of general formula (1).

Particular examples of the repeating units of general formula (3) are shown below, which however in no way limit the scope of the present invention.

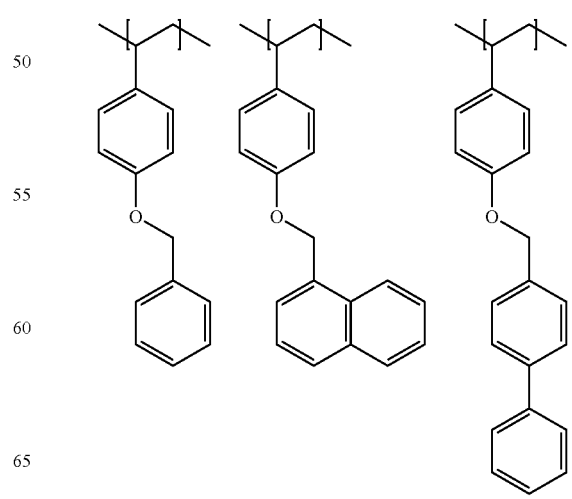

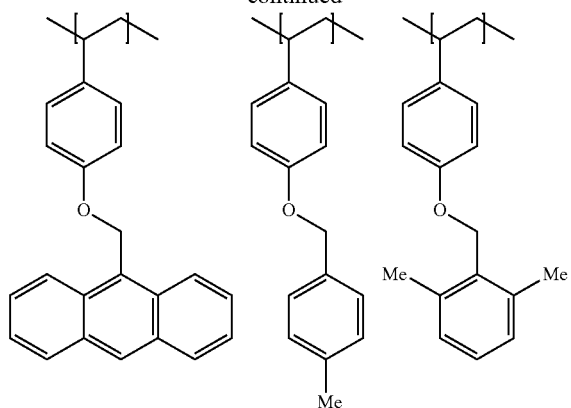
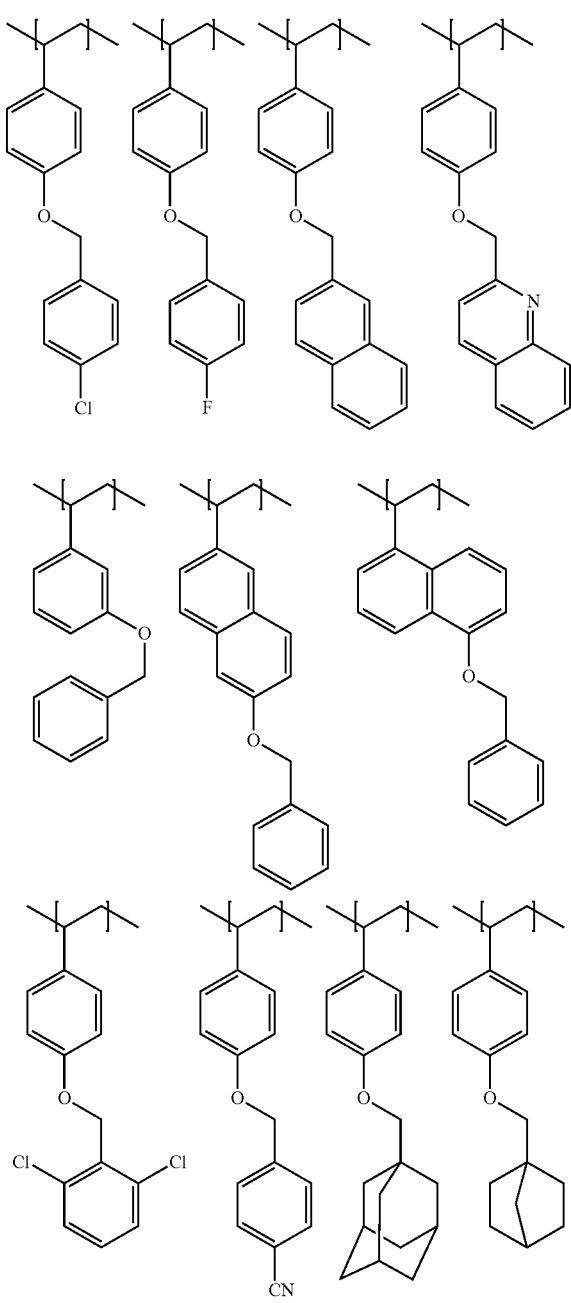
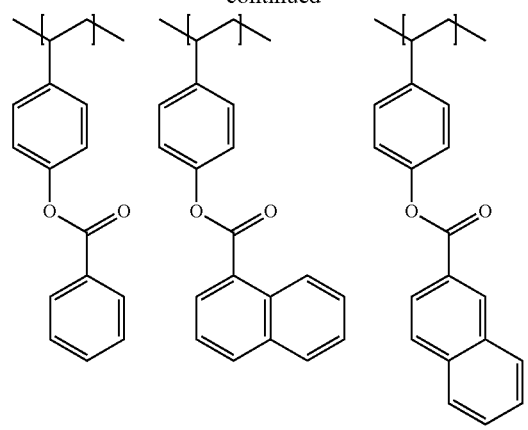
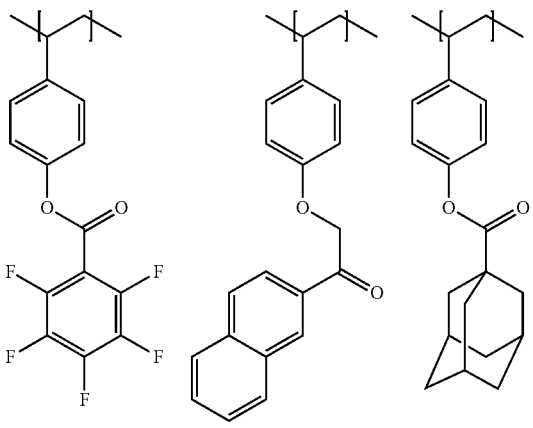

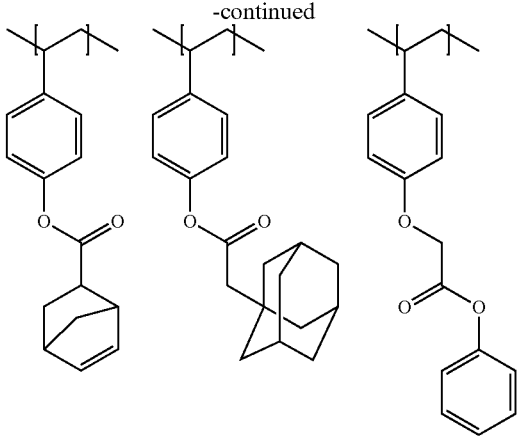

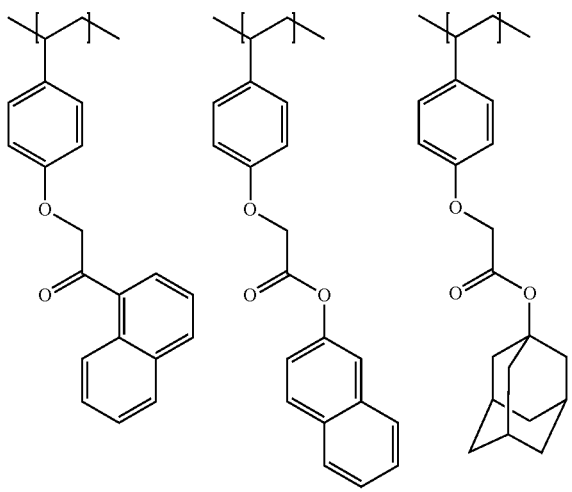

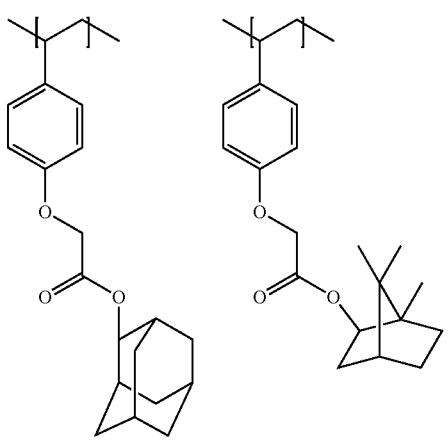

When the scaffold is a polymeric compound, the content of repeating unit expressed by general formula (3) in the compound (P) according to the present invention, based on all the repeating units of the compound (P), is preferably in the range of 1 to 30 mol %, more preferably 2 to 20 mol % and most preferably 2 to 10 mol %.

The compound (P) according to the present invention may further comprise any of repeating units of general formula (4) below.

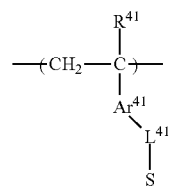

(4)

$R^{41}$ represents a hydrogen atom or a methyl group. $Ar^{41}$ represents an arylene group. $L^{41}$ represents a single bond or a bivalent connecting group. S represents a structural moiety that when exposed to actinic rays or radiation, is decomposed to thereby generate an acid in a side chain.

$R^{41}$ is a hydrogen atom or a methyl group as mentioned above, preferably a hydrogen atom. $Ar^{41}$ represents an arylene group as mentioned above. Particular examples and preferred ranges of arylene groups are the same as those described above with respect to $Ar^{21}$ of general formula (2).

$L^{41}$ represents a single bond or a bivalent connecting group. When $L^{41}$ is a bivalent connecting group, as the bivalent connecting group, there can be mentioned, for example, an alkylene group, a cycloalkylene group, an arylene group, —O—, —SO$_2$—, —CO—, —N(R)—, —S—, —CS— or a combination of two or more of these. The total number of carbon atoms thereof is preferably 20 or less. Herein, R represents an aryl group, an alkyl group or a cycloalkyl group.

When the compound (P) further comprises any of repeating units of general formula (4), for example, at least one of the resolution, roughness characteristic and EL (exposure latitude) is enhanced.

The alkylene group represented by $L^{41}$ is preferably an alkylene group having 1 to 12 carbon atoms, such as a methylene group, an ethylene group, a propylene group, a butylene group, a hexylene group, an octylene group or a dodecanylene group.

The cycloalkylene group represented by $L^{41}$ is preferably a cycloalkylene group having 5 to 8 carbon atoms, such as a cyclopentylene group or a cyclohexylene group.

The arylene group represented by $L^{41}$ is preferably an arylene group having 6 to 14 carbon atoms, such as a phenylene group or a naphthyl group.

A substituent may further be introduced in each of these alkylene, cycloalkylene and arylene groups.

As the substituent, there can be mentioned, for example, an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group or a nitro group.

S represents a structural moiety that when exposed to actinic rays or radiation, is decomposed to thereby generate an acid in a side chain. S is preferably a structural moiety that when exposed to actinic rays or radiation, is decomposed to thereby generate an acid anion in a side chain of the resin, more preferably any of the structural moieties introduced in a photoinitiator for photocationic polymerization, a photoinitiator for photoradical polymerization, a photo-achromatic agent and photo-discoloring agent for dyes and any of generally known compounds that when exposed to light, generate an acid, employed in microresists, etc. Further more preferably, the structural moiety is an ionic structural moiety.

It is especially preferred for S to be an ionic structural moiety containing a sulfonium salt or an iodonium salt. More particularly, S is preferably any of the groups of general formulae (PZI) and (PZII) below.

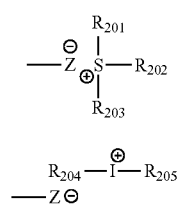

(PZI)

(PZII)

In general formula (PZI) above, each of $R_{201}$ to $R_{203}$ independently represents an organic group.

The number of carbon atoms of each of the organic groups represented by $R_{201}$ to $R_{203}$ is generally in the range of 1 to 30, preferably 1 to 20.

Two of $R_{201}$ to $R_{203}$ may be bonded to each other to thereby form a ring structure, and the ring within the same may contain an oxygen atom, a sulfur atom, an ester bond, an amido bond or a carbonyl group. As the group formed by bonding of two of $R_{201}$ to $R_{203}$, there can be mentioned an alkylene group (for example, a butylene group or a pentylene group). When use is made of a compound in which two of $R_{201}$ to $R_{203}$ are bonded to each other to thereby form a ring structure, favorably, prevention of any staining of an exposure apparatus by decomposition products occurring at exposure to light can be expected.

$Z^-$ represents an acid anion occurring as a result of decomposition upon exposure to actinic rays or radiation. $Z^-$ is preferably a normucleophilic anion. As the normucleophilic anion, there can be mentioned, for example, a sulfonate anion, a carboxylate anion, a sulfonylimide anion, a bis(alkylsulfonyl)imide anion, a tris(alkylsulfonyl)methyl anion or the like.

The normucleophilic anion is an anion whose capability of inducing a nucleophilic reaction is extremely low and is an anion capable of inhibiting any temporal decomposition by intramolecular nucleophilic reaction. This enhances the temporal stability of the resist and thus the temporal stability of the composition.

The organic groups represented by $R_{201}$ to $R_{203}$ include an aryl group, an alkyl group, a cycloalkyl group, a cycloalkenyl group, an indolyl group and the like. With respect to the cycloalkyl group and cycloalkenyl group, at least one of the carbon atoms constituting the ring may be a carbonyl carbon.

Preferably, at least one of $R_{201}$ to $R_{203}$ is an aryl group. More preferably, all three of $R_{201}$ to $R_{203}$ are aryl groups.

Each of the aryl groups represented by $R_{201}$, $R_{202}$ and $R_{203}$ is preferably a phenyl group or a naphthyl group, more preferably a phenyl group.

Among the alkyl groups, cycloalkyl groups and cycloalkenyl groups represented by $R_{201}$, $R_{202}$ and $R_{203}$, a linear or branched alkyl group having 1 to 10 carbon atoms (for example, a methyl group, an ethyl group, a propyl group, a butyl group or a pentyl group), a cycloalkyl group having 3 to 10 carbon atoms (for example, a cyclopentyl group, a cyclohexyl group or a norbonyl group) and a cycloalkenyl group having 3 to 10 carbon atoms (for example, a pentadienyl group or a cyclohexenyl group) ate preferred.

Substituents may further be introduced in these organic groups, such as aryl, alkyl, cycloalkyl, cycloalkenyl and indolyl groups, represented by $R_{201}$, $R_{202}$ and $R_{203}$. As the substituents, there can be mentioned a nitro group, a halogen atom such as a fluorine atom, a carboxyl group, a hydroxyl group, an amino group, a cyano group, an alkyl group (preferably having 1 to 15 carbon atoms), an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an arylthio group (preferably having 6 to 14 carbon atoms), a hydroxyalkyl group (preferably having 1 to 15 carbon atoms), an alkylcarbonyl group (preferably having 2 to 15 carbon atoms), a cycloalkylcarbonyl group (preferably having 4 to 15 carbon atoms), an arylcarbonyl group (preferably having 7 to 14 carbon atoms), a cycloalkenyloxy group (preferably having 3 to 15 carbon atoms), a cycloalkenylalkyl group (preferably having 4 to 20 carbon atoms) and the like. The appropriate substituents are not limited to these.

With respect to the cycloalkyl and cycloalkenyl groups as the substituents that may further be introduced in the groups represented by $R_{201}$, $R_{202}$ and $R_{203}$, at least one of the carbon atoms constituting the ring may be a carbonyl carbon.

Still further substituents may be introduced in the substituents that may be introduced in the groups represented by $R_{201}$, $R_{202}$ and $R_{203}$. Examples of such still further substituents are the same as those mentioned above in connection with the substituents that may be introduced in the groups represented by $R_{201}$, $R_{202}$ and $R_{203}$. Such still further substituents are preferably an alkyl group and a cycloalkyl group.

When at least one of $R_{201}$ to $R_{203}$ is not an aryl group, as preferred structures, there can be mentioned cationic structures, such as the compounds set forth in sections 0046 and 0047 of JP-A-2004-233661 and sections 0040 to 0046 of JP-A-2003-35948, the compounds of formulae (I-1) to (I-70) shown as examples in US Patent Application Publication No. 2003/0224288 and the compounds of formulae (IA-1) to (IA-54) and (IB-1) to (IB-24) shown as examples in US Patent Application Publication No. 2003/0077540.

In general formula (PZII) above, each of $R_{204}$ and $R_{205}$ independently represents an aryl group, an alkyl group or a cycloalkyl group. These aryl, alkyl and cycloalkyl groups are the same as set forth above in connection with $R_{201}$ to $R_{203}$ of the compounds (PZI).

Each of the aryl groups represented by $R_{204}$ and $R_{205}$ may be an aryl group with a heterocyclic structure containing an oxygen atom, a nitrogen atom, a sulfur atom or the like. As the aryl group with a heterocyclic structure, there can be mentioned, for example, a pyrrole residue (group formed by the loss of one hydrogen atom from pyrrole), a furan residue (group formed by the loss of one hydrogen atom from furan), a thiophene residue (group formed by the loss of one hydrogen atom from thiophene), an indole residue (group formed by the loss of one hydrogen atom from indole), a benzofuran residue (group formed by the loss of one hydrogen atom from benzofuran), a benzothiophene residue (group formed by the loss of one hydrogen atom from benzothiophene) or the like.

Substituents may further be introduced in the aryl, alkyl and cycloalkyl groups represented by $R_{204}$ and $R_{205}$. The substituents are also the same as those optionally introduced in the aryl, alkyl and cycloalkyl groups represented by $R_{201}$ to $R_{203}$ of the compounds (PZI).

$Z^-$ represents an acid anion generated by the decomposition upon exposure to actinic rays or radiation, preferably a normucleophilic anion. As such, there can be mentioned any of those set forth above in connection with $Z^-$ of general formula (PZI).

Nonlimiting preferred particular examples of the moieties represented by S are shown below. In the formulae, the mark represents a bonding hand to $L^{41}$.
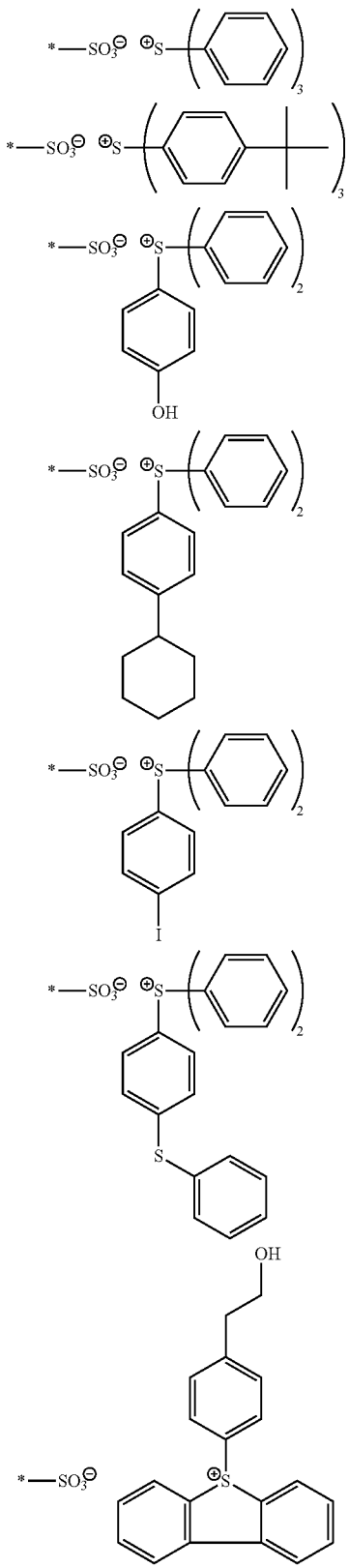
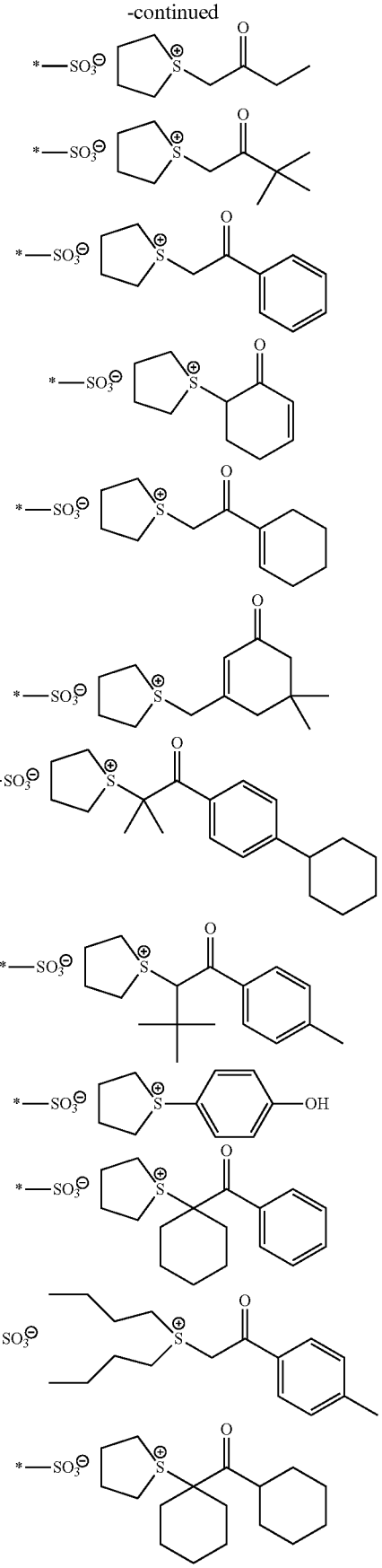

33
-continued
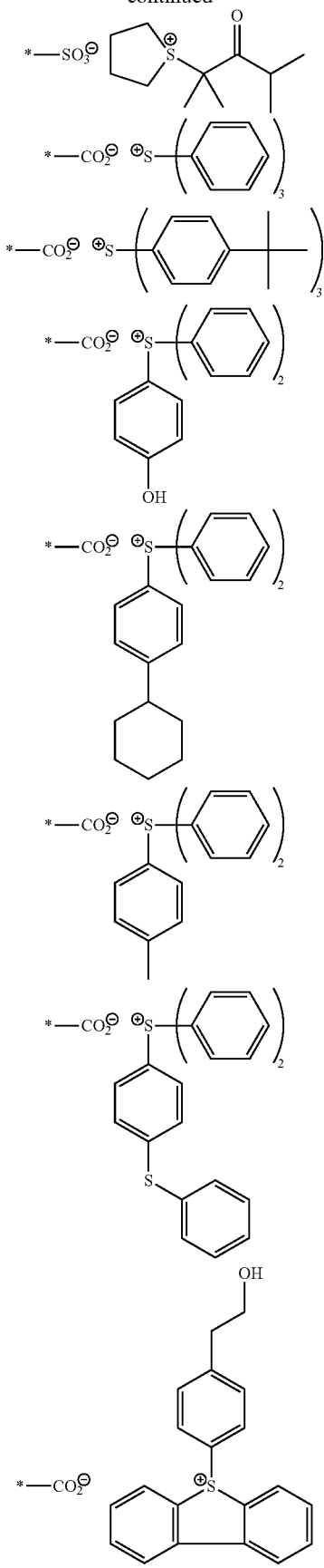
34
-continued
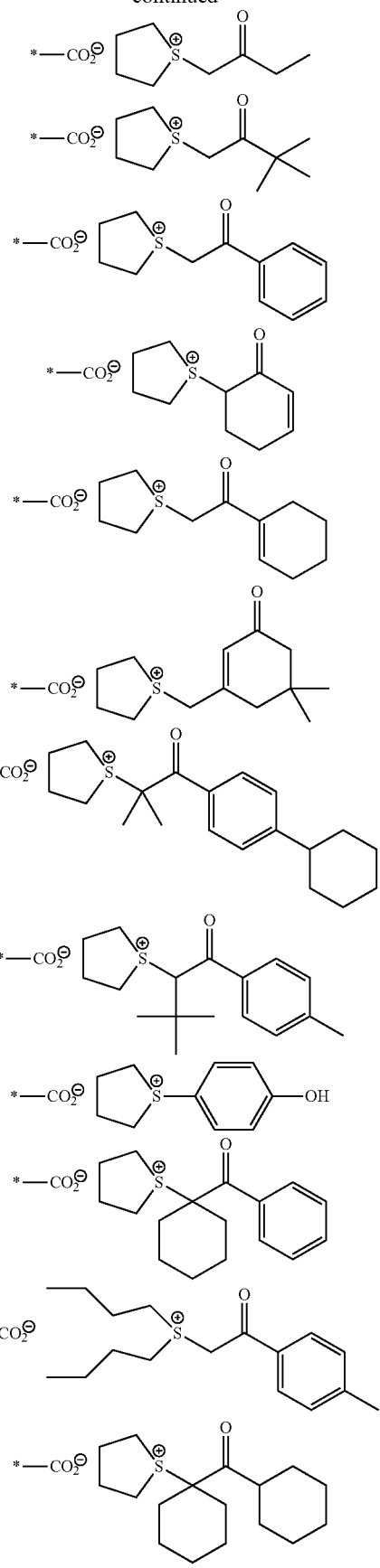

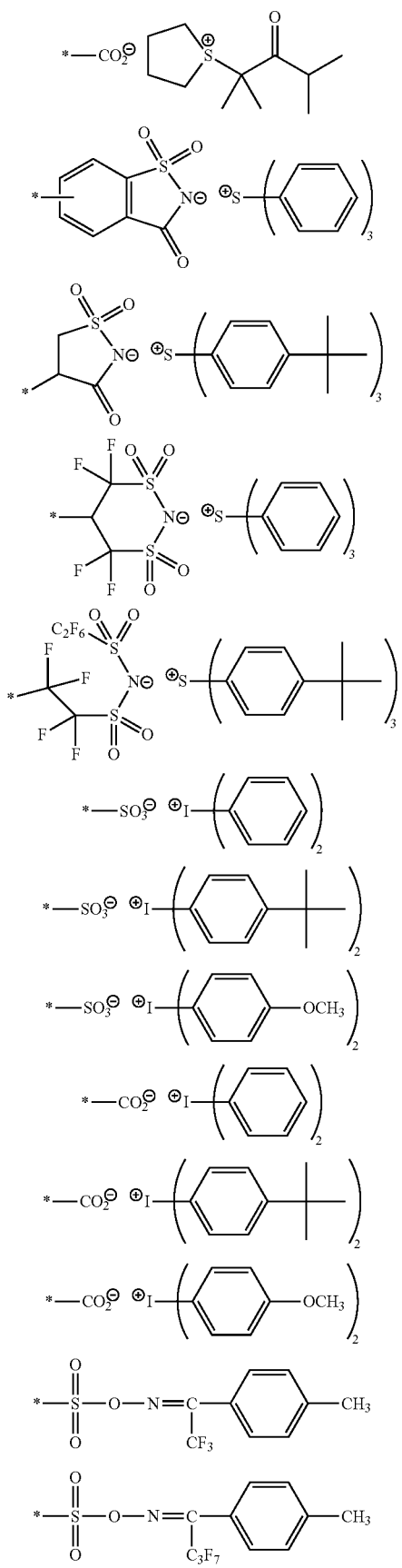
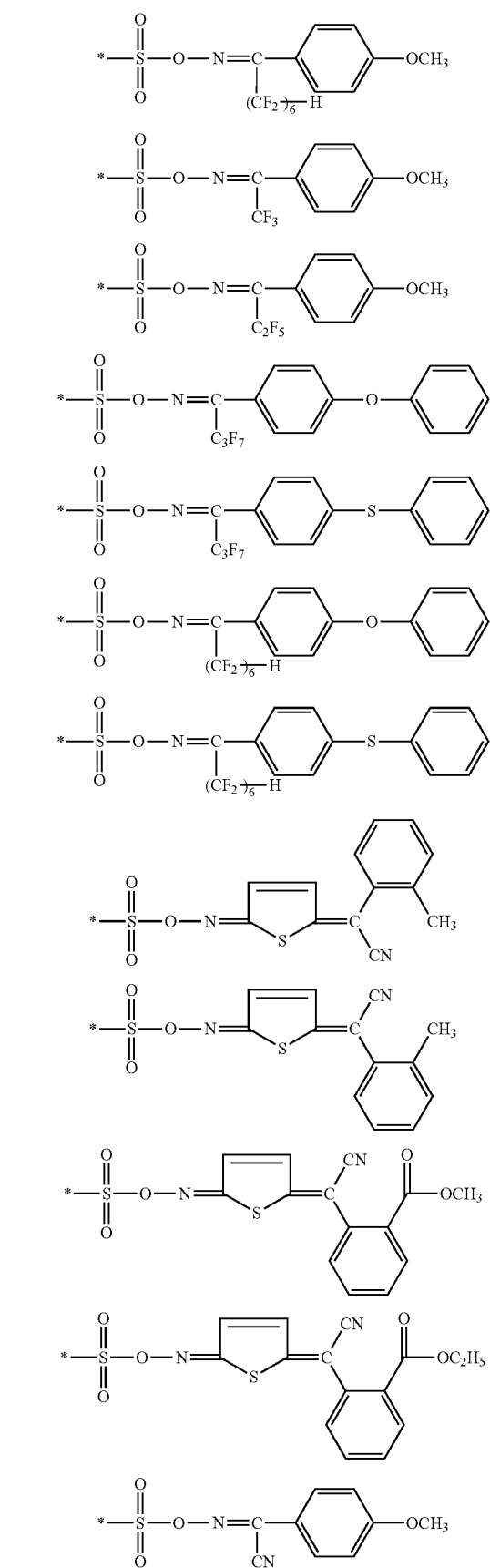

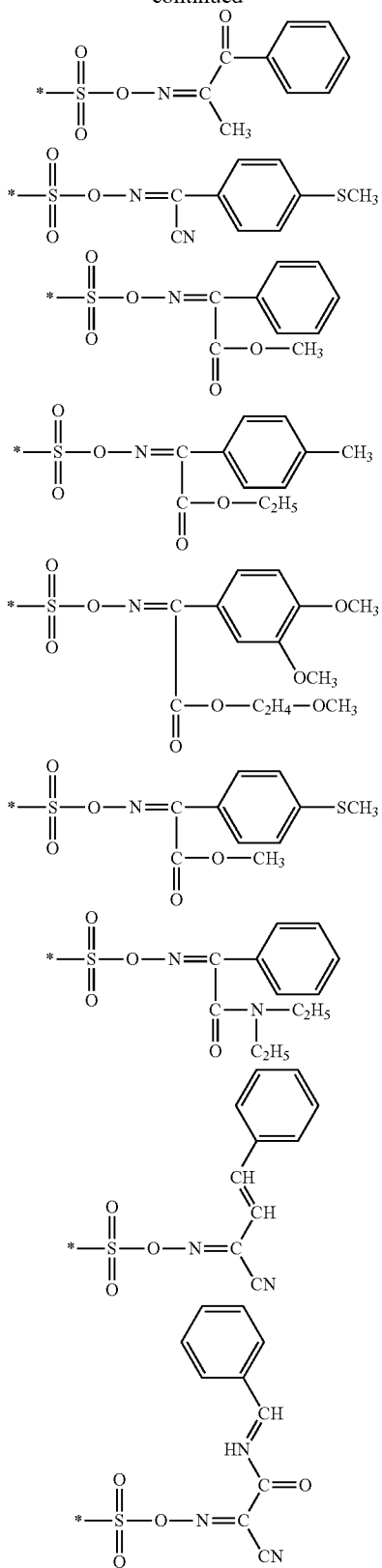

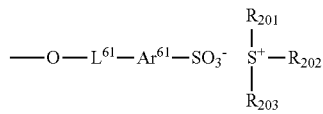

In the formula, $L^{61}$ represents a bivalent organic group, and $Ar^{61}$ represents an arylene group.

As the bivalent organic group represented by $L^{61}$, there can be mentioned, for example, an alkylene group, a cycloalkylene group, —O—, —SO$_2$—, —CO—, —N(R)—, —S—, —CS— or a combination of these. Herein, R is as defined above in connection with $L^{41}$ of formula (4). The total number of carbon atoms of the bivalent organic group represented by $L^{61}$ is preferably in the range of 1 to 15, more preferably 1 to 10.

The alkylene group and cycloalkylene group represented by $L^{61}$ are the same as described above in connection with $L^{41}$ of formula (4). Preferred examples thereof are also the same.

$L^{61}$ is preferably any of a carbonyl group, a methylene group, *—CO—(CH$_2$)$_n$—O—, *—CO—(CH$_2$)$_n$—O—CO—, *—(CH$_2$)$_n$—COO—, *—(CH$_2$)$_n$—CONR— and *—CO—(CH$_2$)$_n$—NR—. Of these, a carbonyl group, *—CH$_2$—COO—, *—CO—CH$_2$—O—, *—CO—CH$_2$—O—CO—, *—CH$_2$—CONR— and *—CO—CH$_2$—NR— are more preferred. Herein, n is an integer of 1 to 10, preferably 1 to 6, more preferably 1 to 3 and most preferably 1. In the formulae, * represents a site of connection to the side of the principal chain, namely, a site of connection to the O atom of the general formula.

$Ar^{61}$ represents an arylene group. A substituent may be introduced therein. As the substituent that may be introduced in $Ar^{61}$, there can be mentioned an alkyl group (preferably 1 to 8 carbon atoms, more preferably 1 to 4 carbon atoms), an alkoxy group (preferably 1 to 8 carbon atoms, more preferably 1 to 4 carbon atoms) or a halogen atom (preferably a fluorine atom, a chlorine atom, a bromine atom or an iodine atom, more preferably a fluorine atom). The aromatic ring contained in $Ar^{61}$ may be an aromatic hydrocarbon ring (for example, a benzene ring or a naphthalene ring), or an aromatic heterocycle (for example, a quinoline ring). The aromatic ring preferably contains 6 to 18 carbon atoms, more preferably 6 to 12 carbon atoms.

$Ar^{61}$ is preferably an arylene group unsubstituted or substituted with an alkyl group or a fluorine atom, more preferably a phenylene group or a naphthylene group.

The method of synthesizing the monomer corresponding to any of the repeating units of general formula (4) is not particularly limited. For example, in the instance of an onium structure, there can be mentioned a synthetic method in which an acid anion containing a polymerizable unsaturated bond corresponding to the repeating unit is exchanged with a halide of a known onium salt.

More specifically, a metal ion salt (for example, a salt of sodium ion, potassium ion or the like) or ammonium salt (an ammonium or triethylammonium salt or the like) of an acid containing a polymerizable unsaturated bond corresponding to the repeating unit and an onium salt containing a halide ion (chloride ion, bromide ion, iodide ion or the like) are agitated together in the presence of water or methanol to thereby accomplish an anion exchange reaction. The reaction liquid is subjected to liquid separation/washing operations using water and an organic solvent, such as dichloromethane, chloroform, ethyl acetate, methyl isobutyl ketone or tetrahydroxy- The moiety corresponding to (-$L^{41}$-S) of the repeating units of general formula (4) is preferably expressed by general formula (6) below.

furan. Thus, the desired monomer corresponding to any of the repeating units of general formula (4) can be obtained.

Alternatively, the synthesis can be accomplished by agitating the mixture in the presence of water and an organic solvent capable of separation from water, such as dichloromethane, chloroform, ethyl acetate, methyl isobutyl ketone or tetrahydroxyfuran, to thereby accomplish an anion exchange reaction and subjecting the reaction liquid to liquid separation with water/washing operations.

The repeating units of general formula (4) can also be synthesized by introducing an acid anion moiety in a side chain through a polymer reaction and thereafter introducing an onium salt through a salt exchange.

Particular examples of the repeating units of general formula (4) are shown below, which however in no way limit the scope of the present invention.

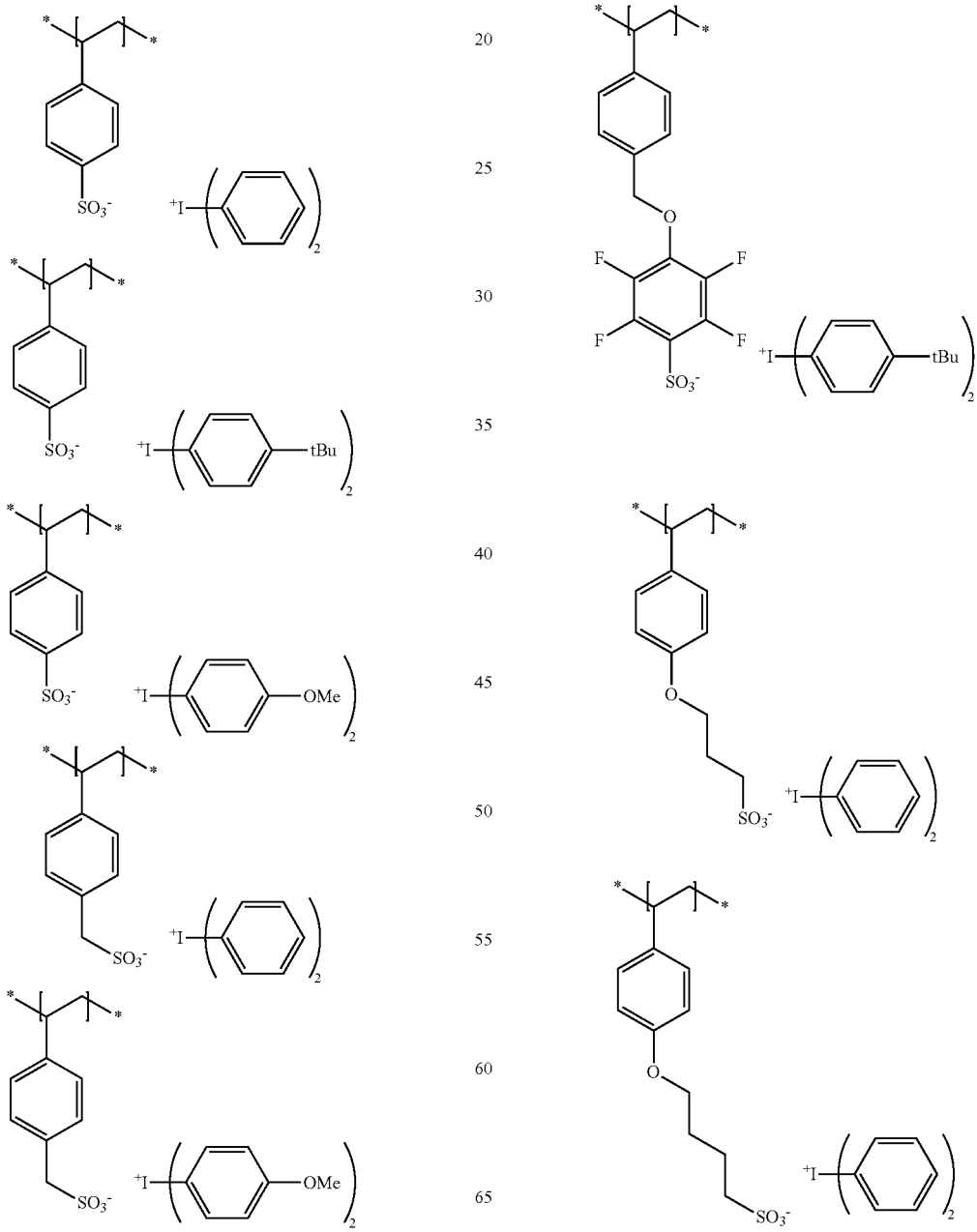

41
-continued
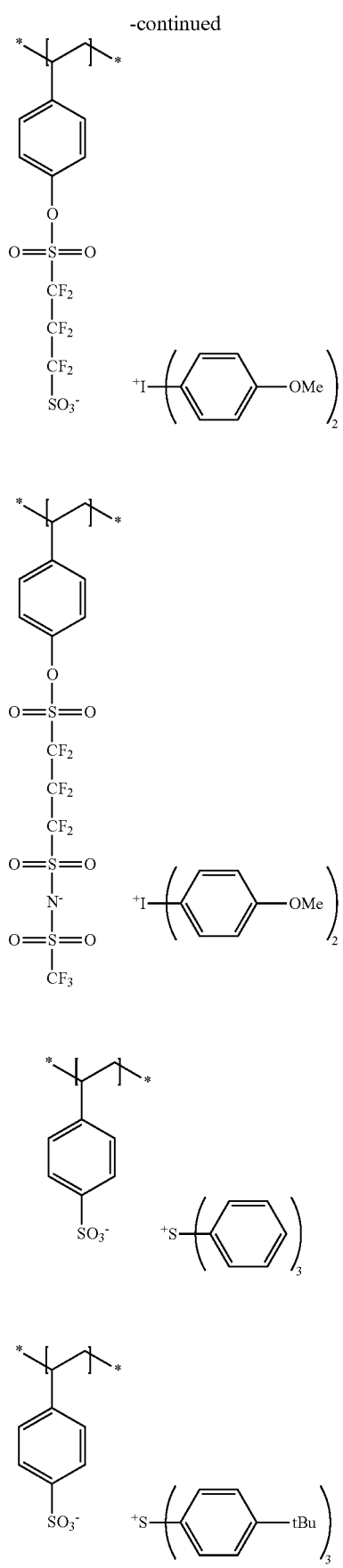
42
-continued
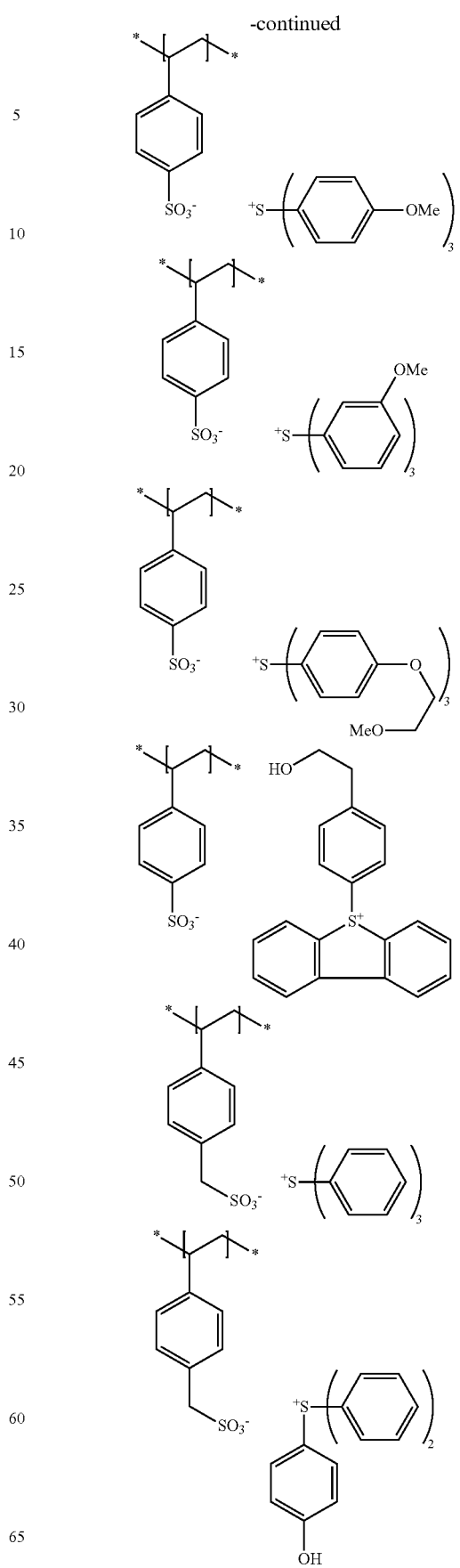

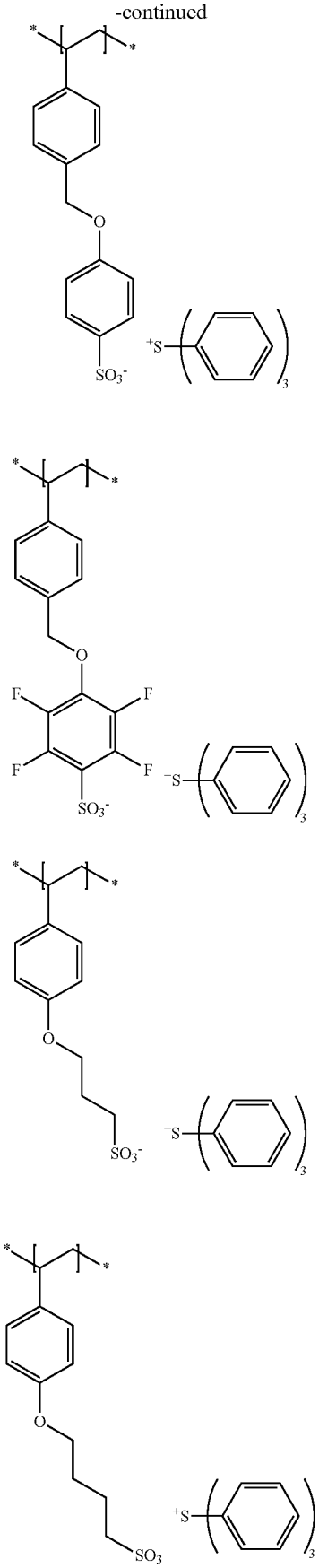
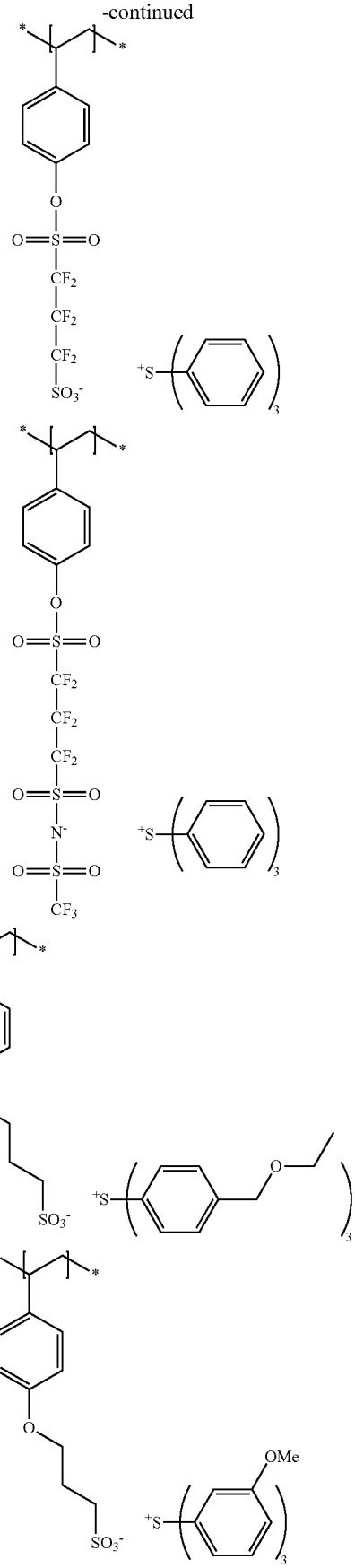

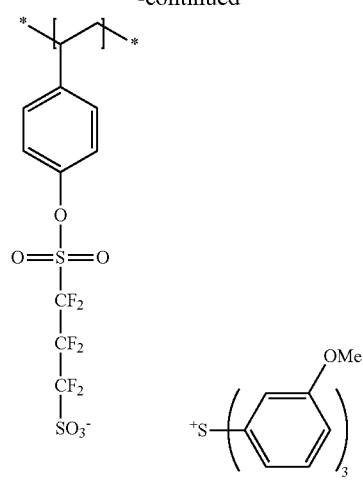
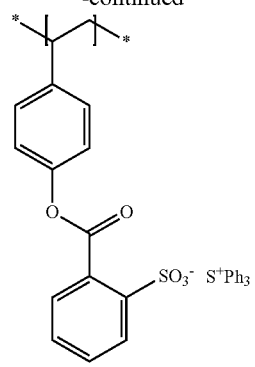

47
-continued
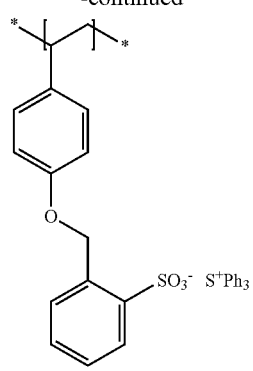
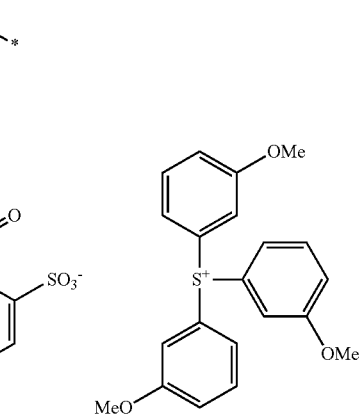
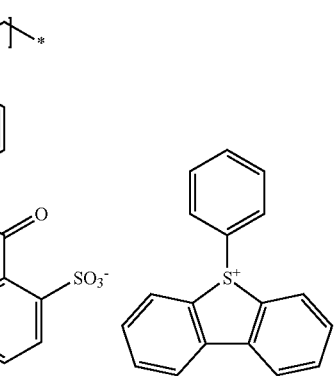
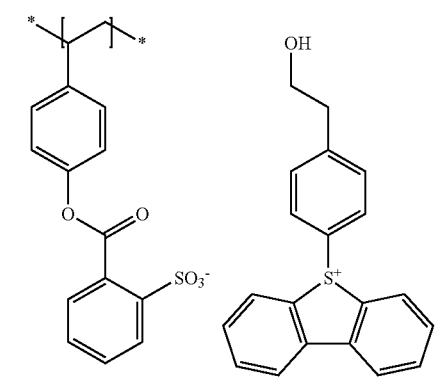
48
-continued
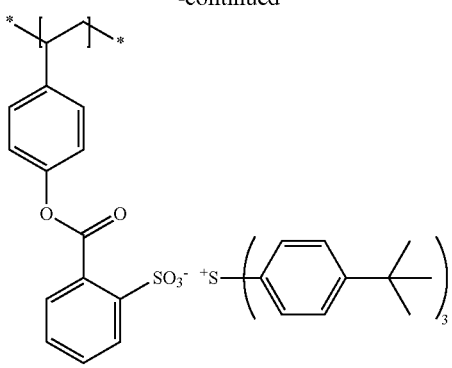
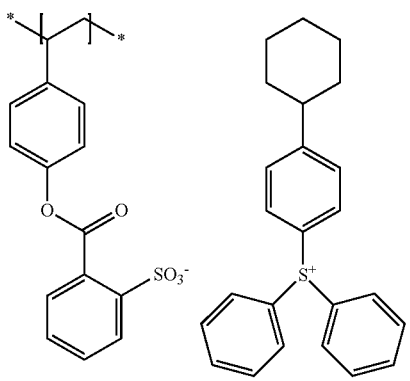
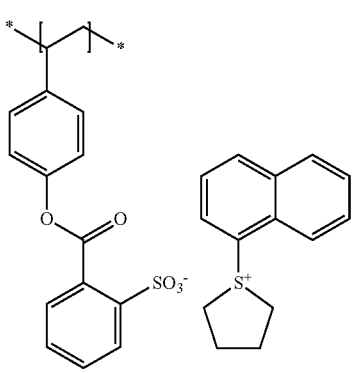
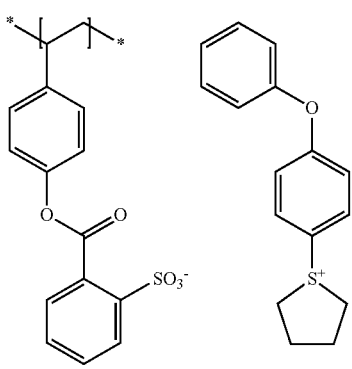

49
-continued
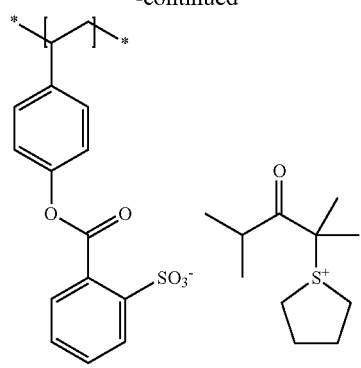
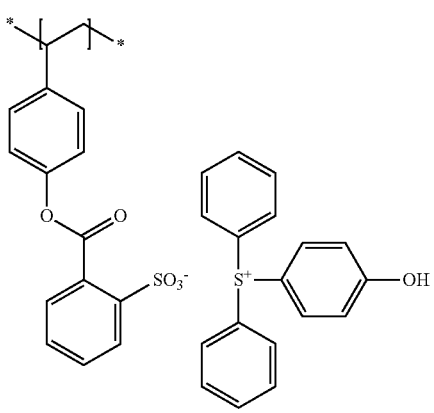
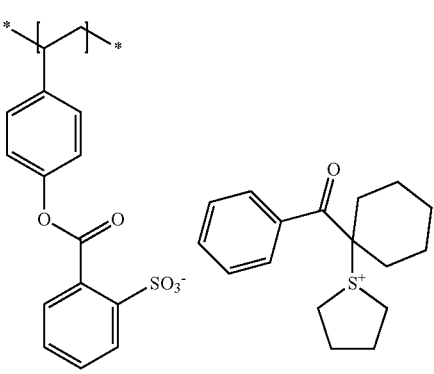
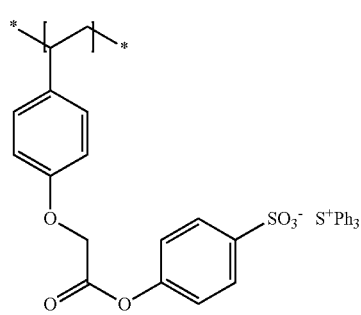
50
-continued
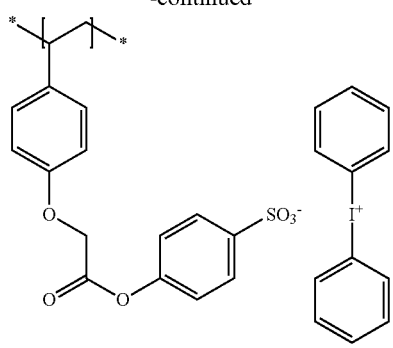
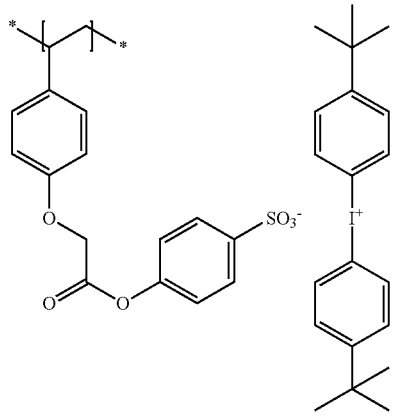
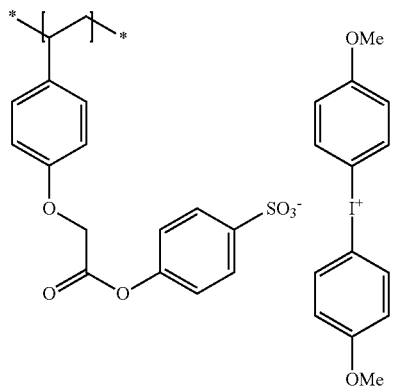
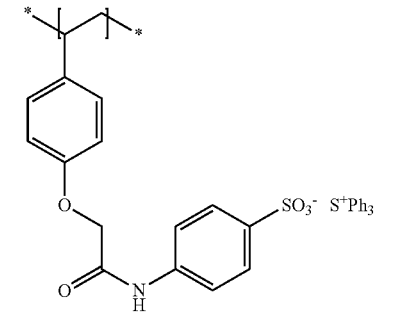

51
-continued
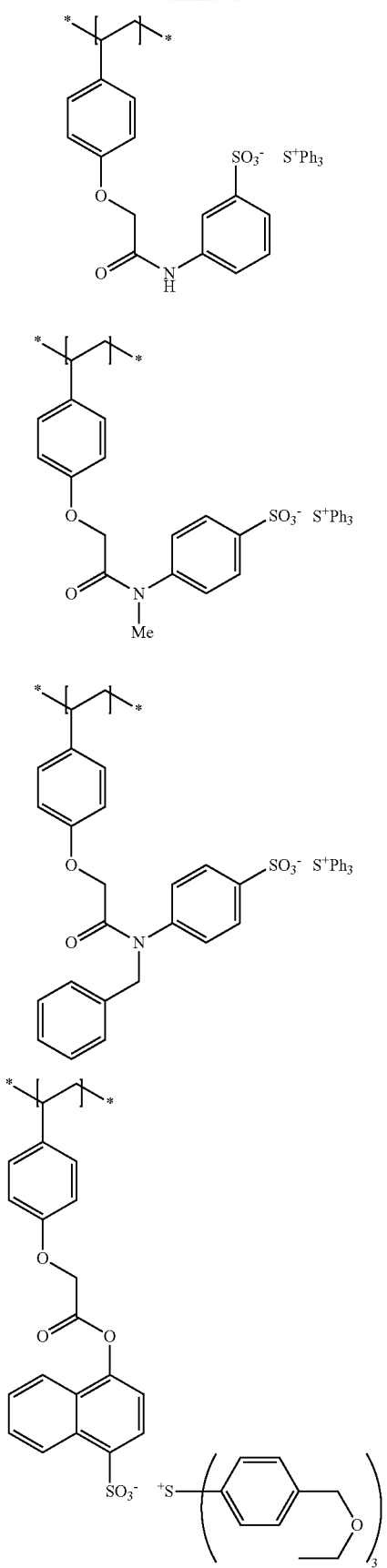
52
-continued
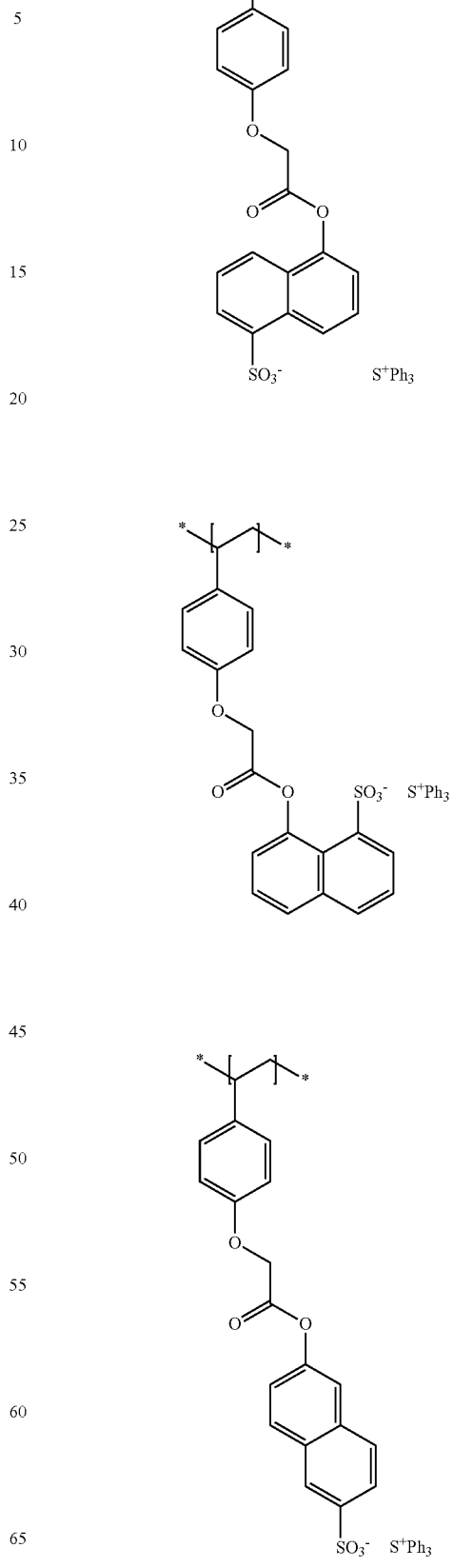

53
-continued
54
-continued
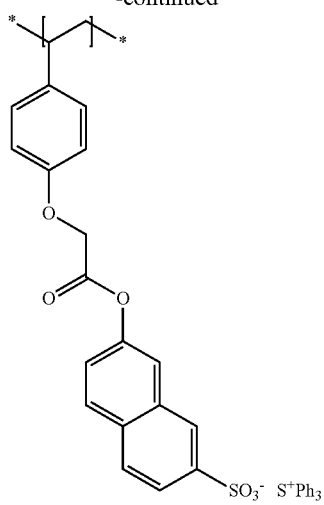
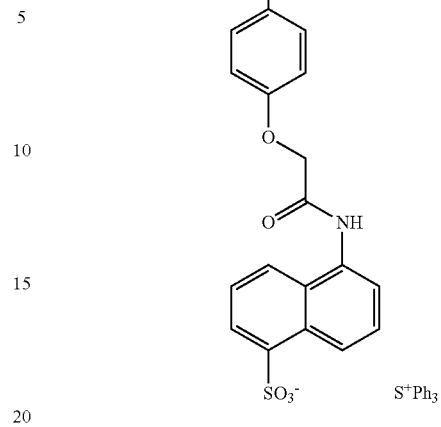
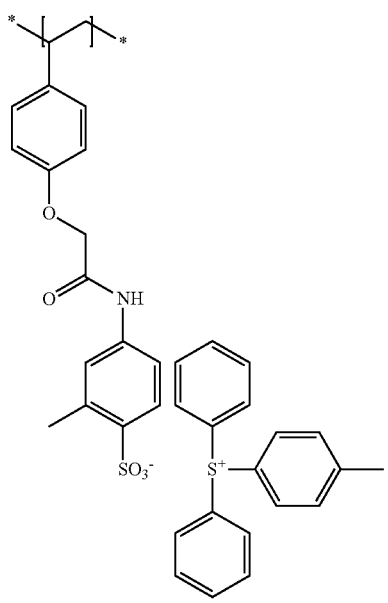
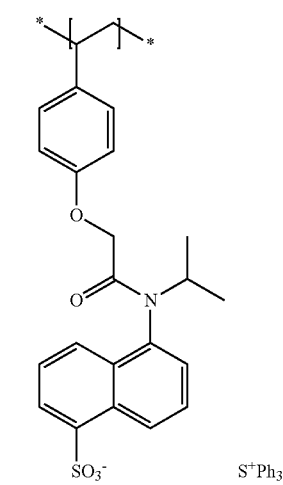
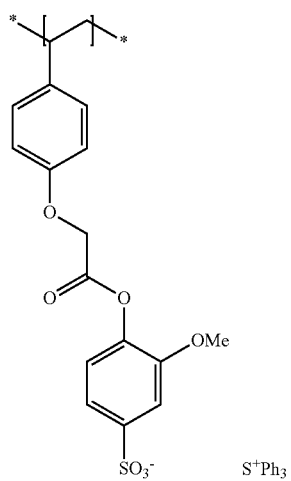
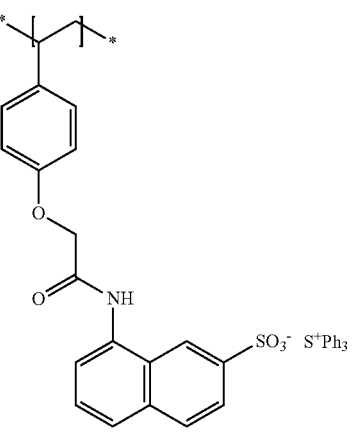

55
-continued
56
-continued
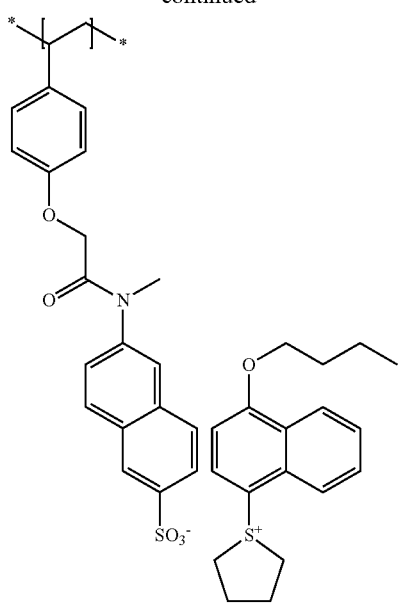
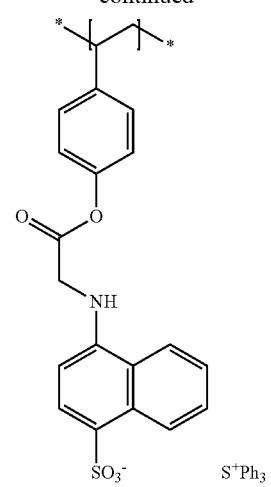
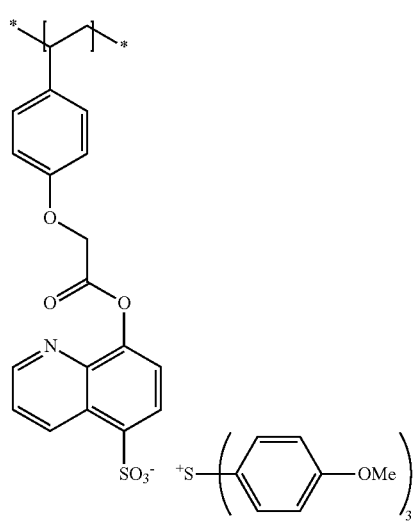
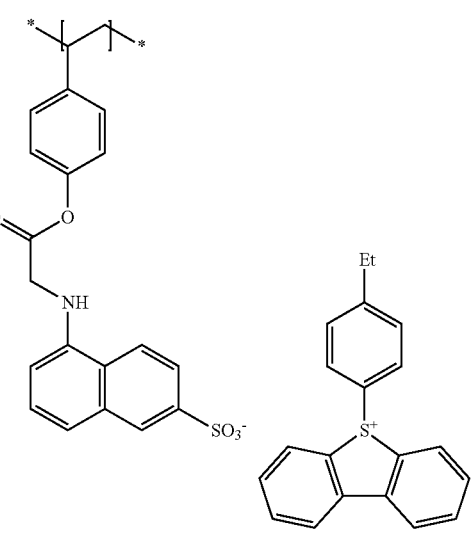
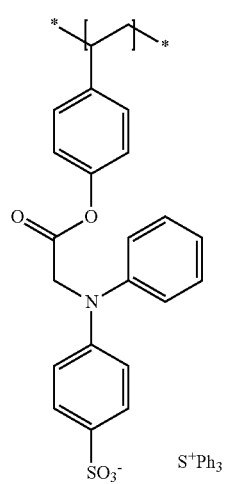
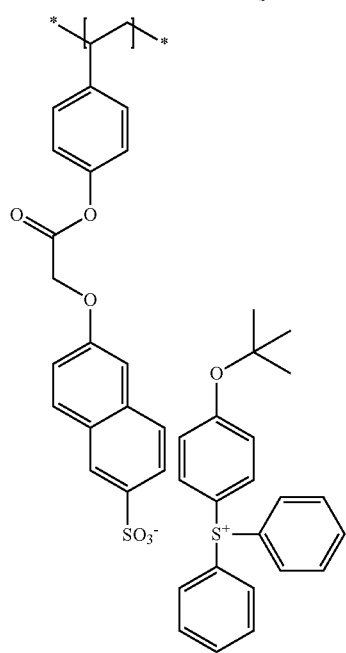

57
-continued
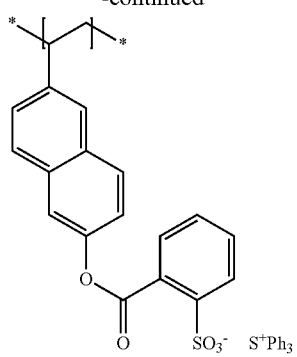
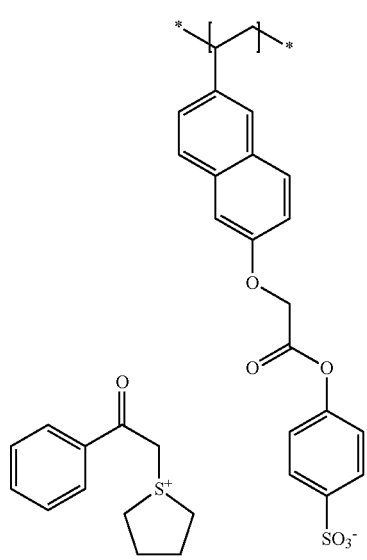
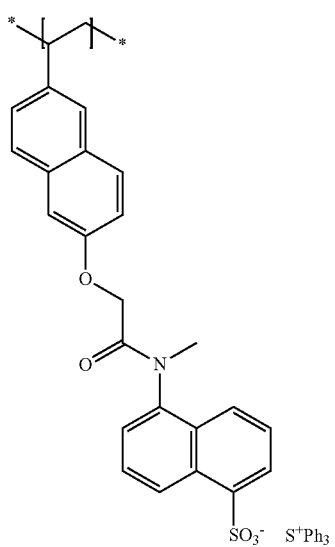
58
-continued
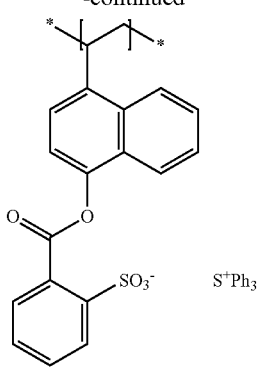
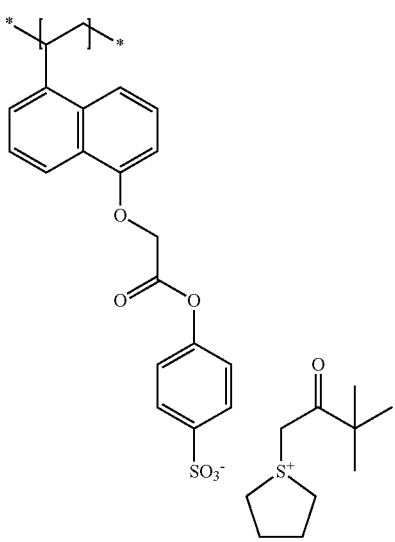
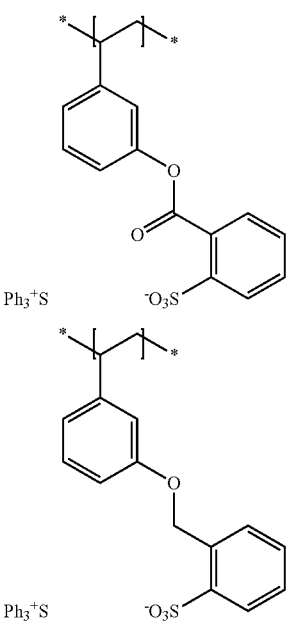

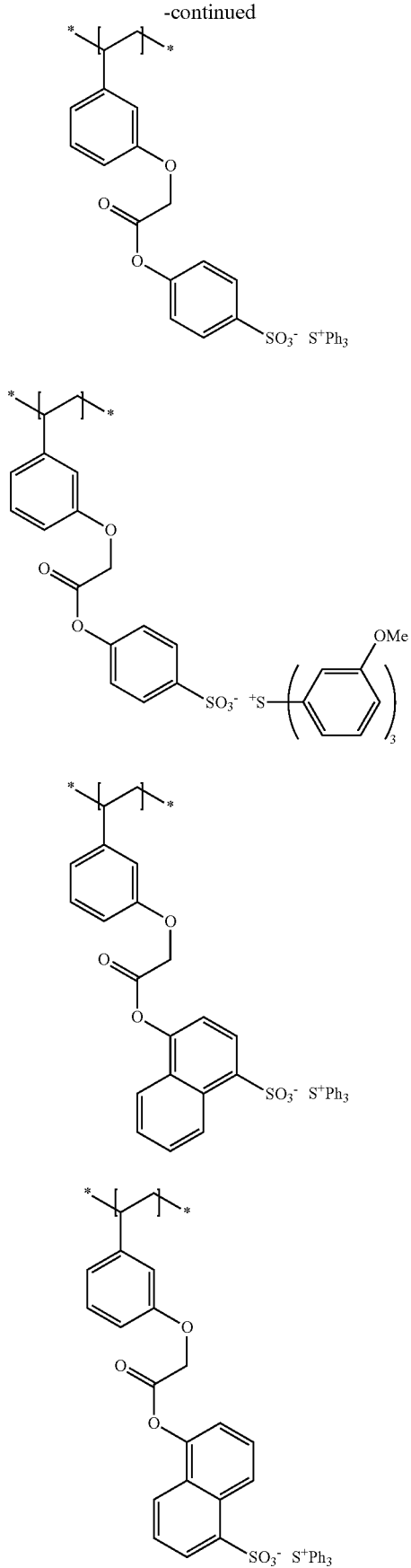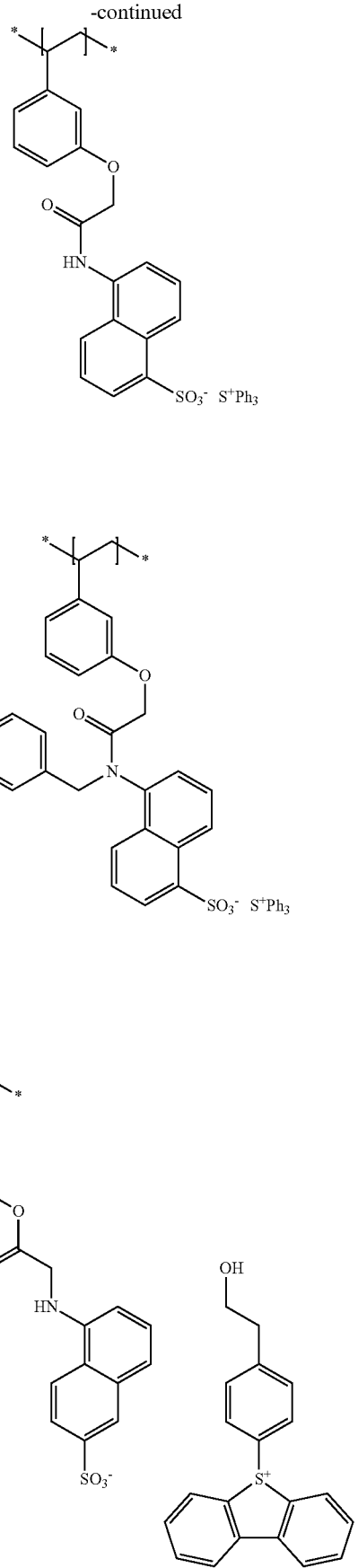

61
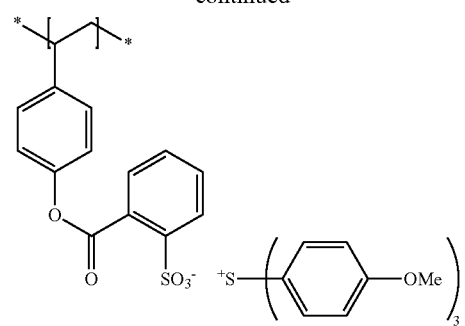
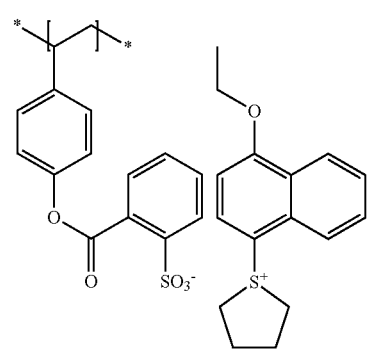
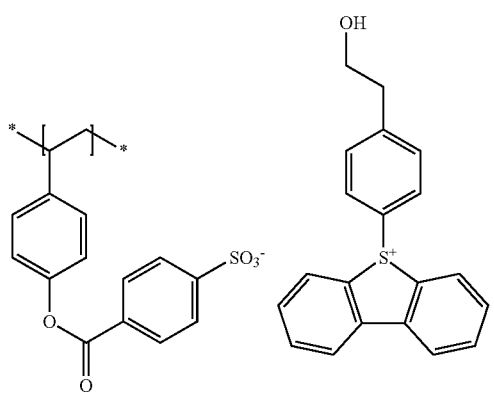
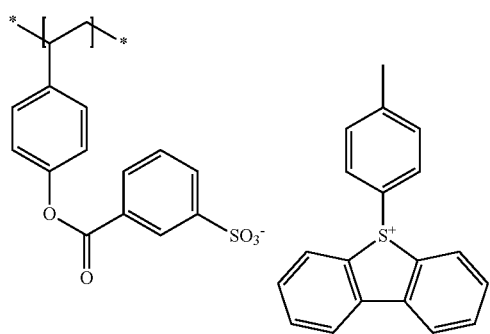
62
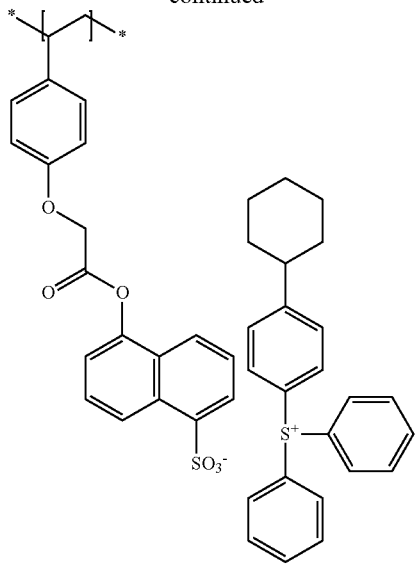
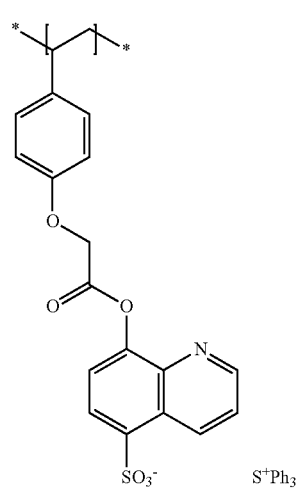
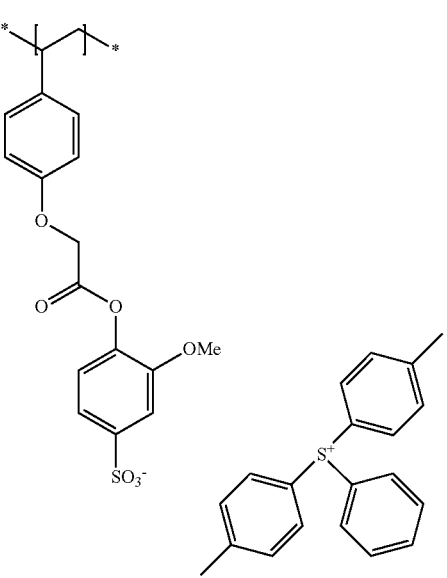

63
-continued
64
-continued
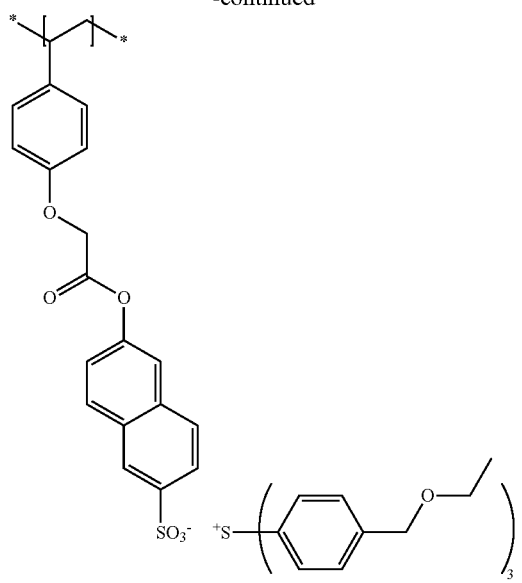
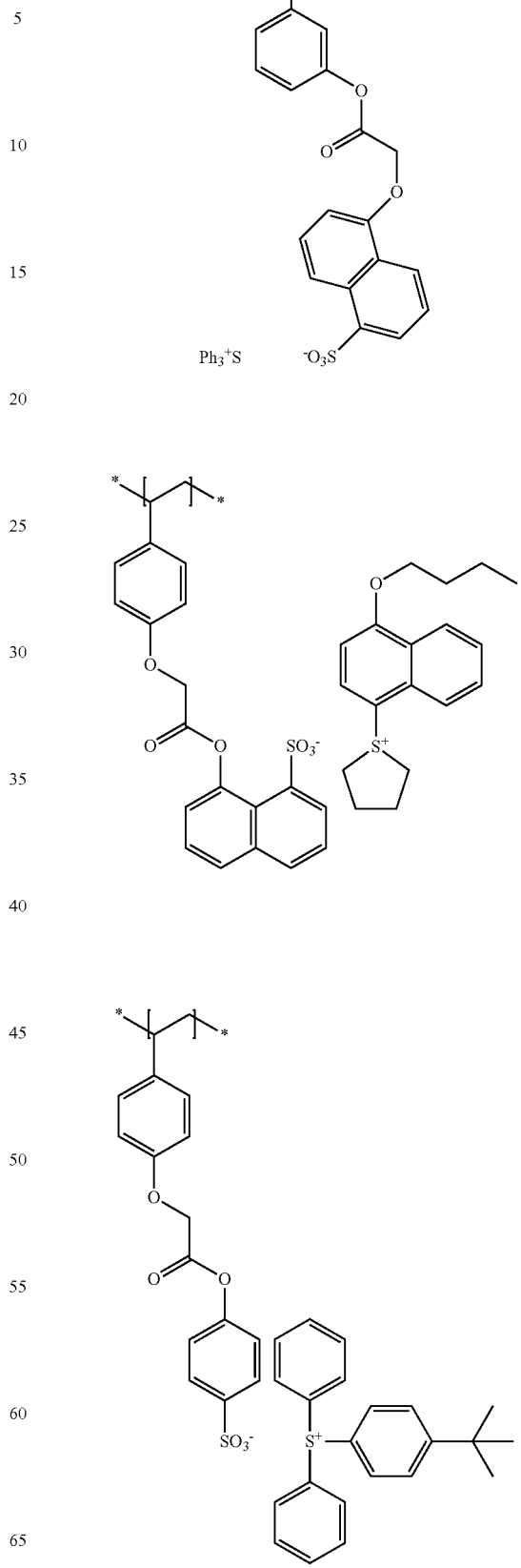

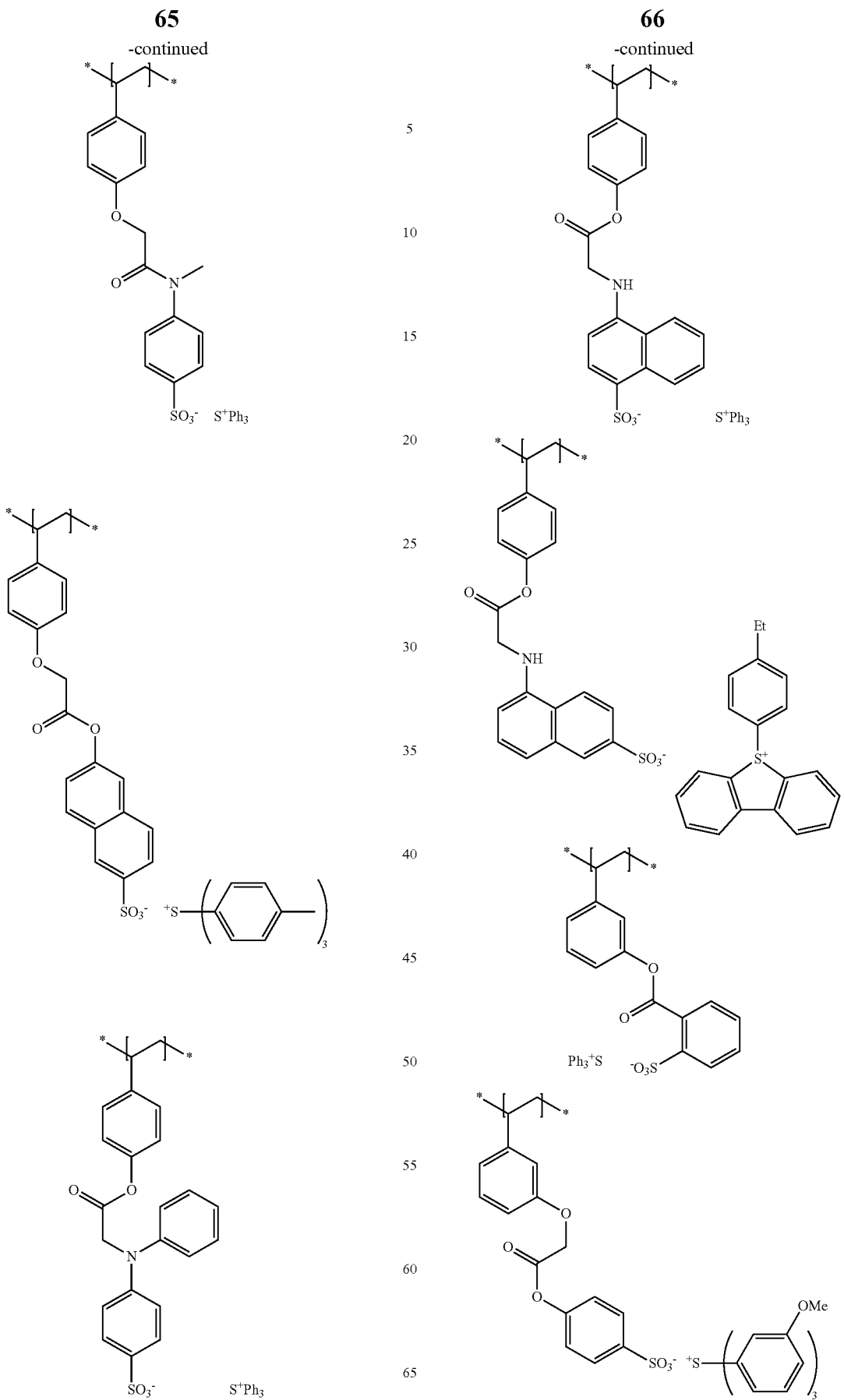

67
-continued
68
-continued
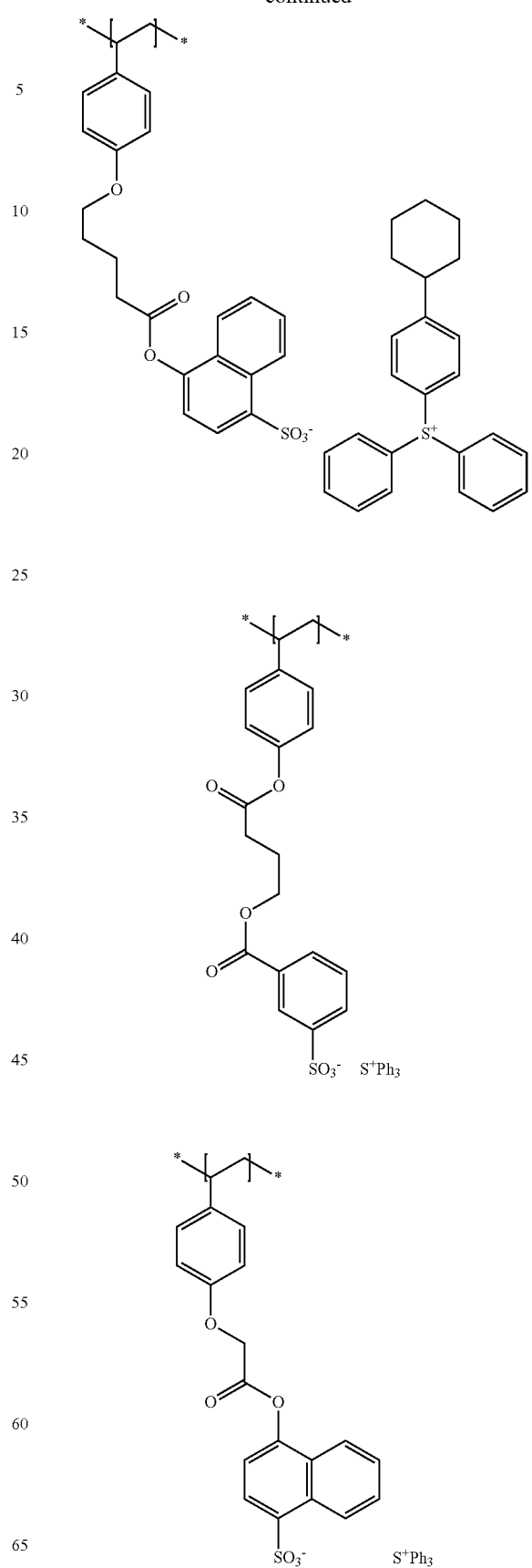

-continued

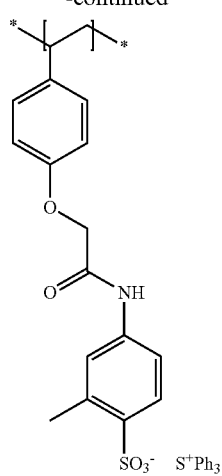
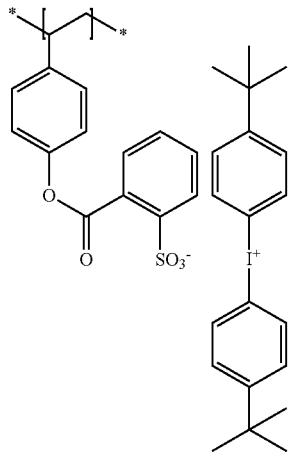
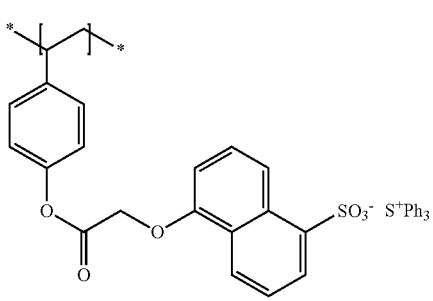

-continued

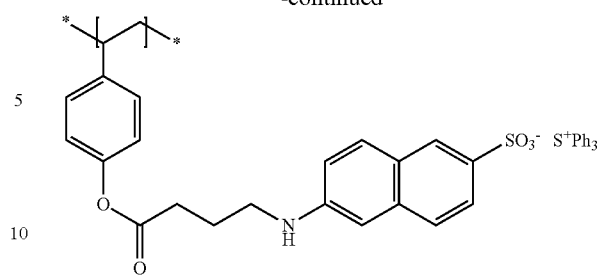
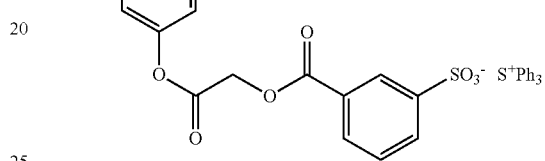
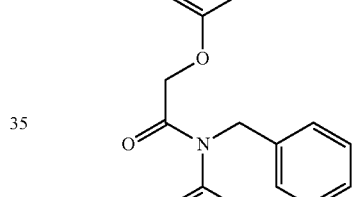
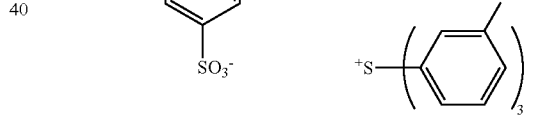

When the scaffold is a polymeric compound, the content of repeating unit expressed by general formula (4) in the compound (P) according to the present invention, based on all the repeating units of the compound (P), is preferably in the range of 1 to 30 mol %, more preferably 2 to 15 mol % and most preferably 2 to 10 mol %.

When the scaffold is a polymeric compound, the compound (P) for use in the present invention preferably further contains the following repeating units as other repeating units.

For example, there can be mentioned a repeating unit containing a group that is decomposed by the action of an alkali developer to thereby increase its rate of dissolution in the alkali developer. As such a group, there can be mentioned a group with a lactone structure, a group with a phenyl ester structure, or the like. The repeating unit containing a group that is decomposed by the action of an alkali developer to thereby increase its rate of dissolution in the alkali developer is preferably any of repeating units of general formula (AII) below.

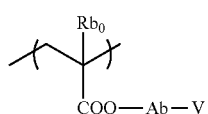

(AII)

In general formula (AII), V represents a group that is decomposed by the action of an alkali developer to thereby increase its rate of dissolution into the alkali developer. $Rb_0$ represents a hydrogen atom or a methyl group. Ab represents a single bond or a bivalent organic group.

V representing a group that is decomposed by the action of an alkali developer is a group with an ester bond. In particular, a group with a lactone structure is preferred. The group with a lactone structure is not limited as long as a lactone structure is introduced therein. A 5 to 7-membered ring lactone structure is preferred, and one resulting from the condensation of a 5 to 7-membered ring lactone structure with another cyclic structure effected in a fashion to form a bicyclo structure or spiro structure is especially preferred.

Preferred Ab is a single bond or any of bivalent connecting groups of the formula $-AZ-CO_2-$ (AZ represents an alkylene group or an aliphatic ring group). AZ is preferably a methylene group, an ethylene group, a cyclohexylene group, an adamantylene group or a norbornylene group.

Particular examples of the repeating units are shown below. In the formulae, Rx represents H or $CH_3$.

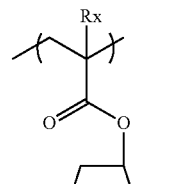

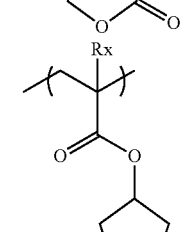

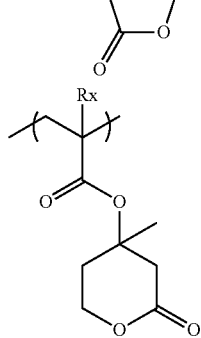

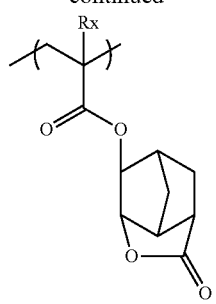

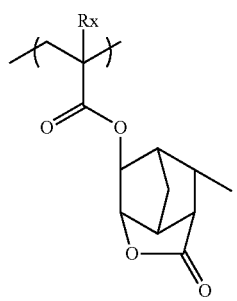

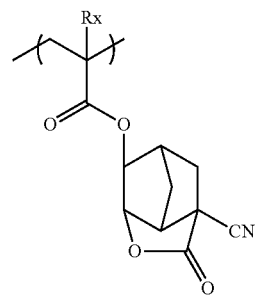

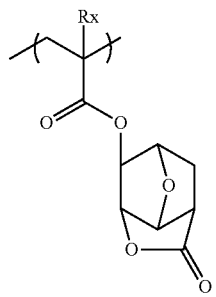

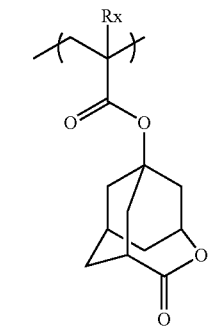

-continued
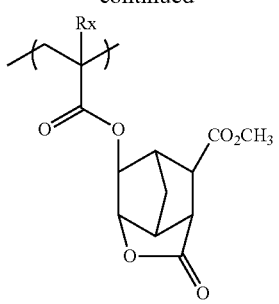
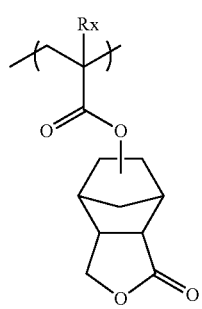
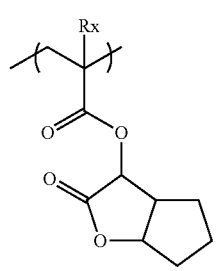
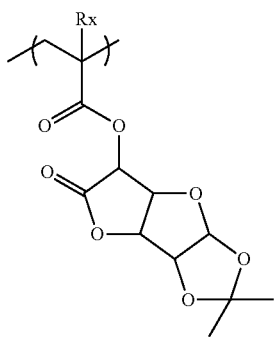
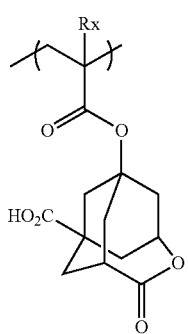
-continued
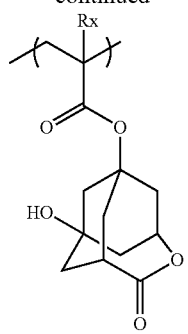
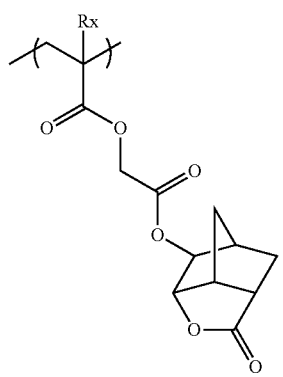
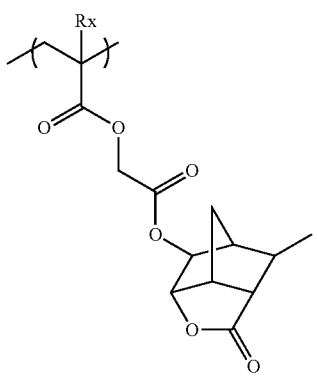
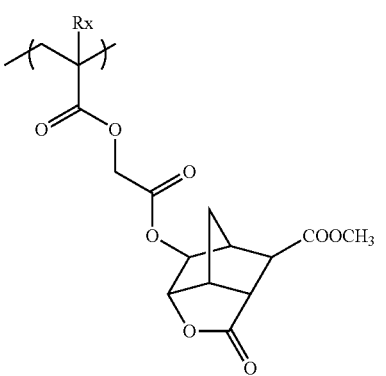

75
-continued
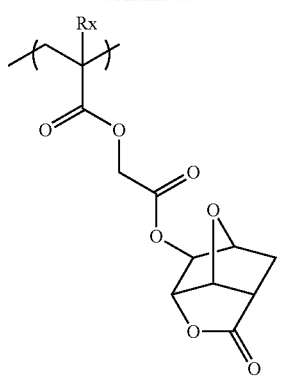
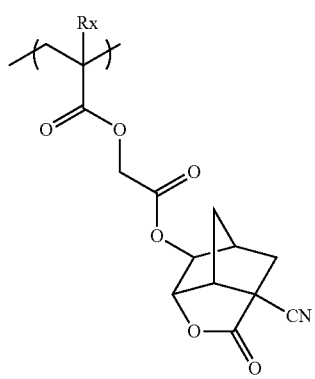
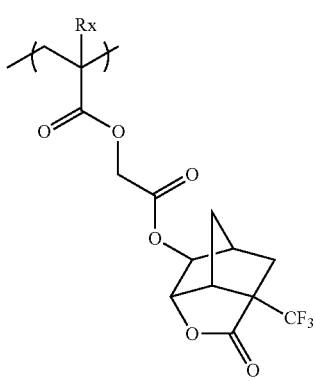
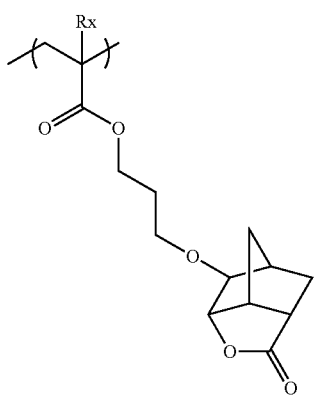
76
-continued
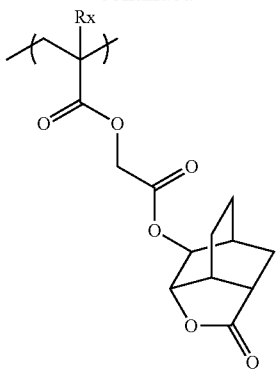
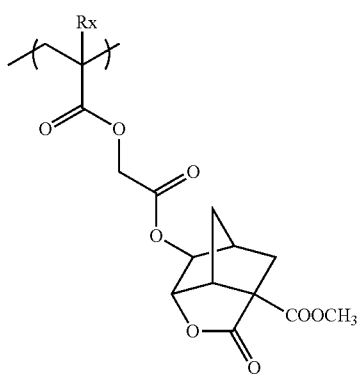
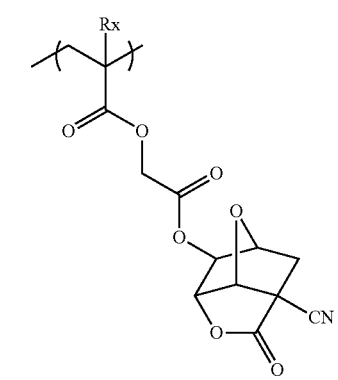
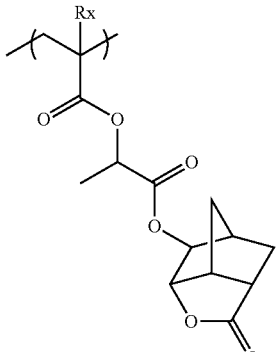

-continued

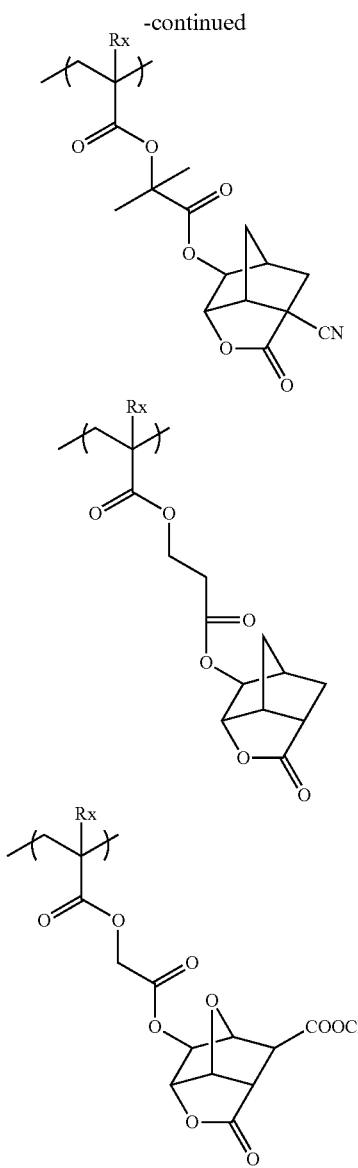

It is optional for the compound (P) to contain repeating unit containing a group that is decomposed by the action of an alkali developer to thereby increase its rate of dissolution in the alkali developer. When the repeating unit is contained, the content of repeating unit containing the group in the compound (P), based on all the repeating units of the compound (P), is preferably in the range of 10 to 60 mol %, more preferably 15 to 50 mol % and further more preferably 15 to 40 mol %.

As examples of polymerizable monomers for the formation of repeating units other than those mentioned above in the compound (P) according to the present invention, there can be mentioned styrene, an alkyl-substituted styrene, an alkoxy-substituted styrene, an O-alkylated styrene, an O-acylated styrene, a hydrogenated hydroxystyrene, maleic anhydride, an acrylic acid derivative (acrylic acid, an acrylic ester or the like), a methacrylic acid derivative (methacrylic acid, a methacrylic ester or the like), an N-substituted maleimide, acrylonitrile, methacrylonitrile, vinylnaphthalene, vinylanthracene, acenaphthylene, an optionally substituted indene and the like. The substituted styrene is preferably 4-(1-naphthylmethoxy)styrene, 4-benzyloxystyrene, 4-(4-chlorobenzyloxy)styrene, 3-(1-naphthylmethoxy)styrene, 3-benzyloxystyrene, 3-(4-chlorobenzyloxy)styrene or the like.

It is optional for the compound (P) to contain repeating units therefrom. When repeating units therefrom are contained, the content thereof in the compound (P), based on all the repeating units of the compound (P), is generally in the range of 1 to 20 mol %, preferably 2 to 10 mol %.

When the scaffold is a polymeric compound, the compound (P) according to the present invention can be synthesized through, for example, a process (i) comprising polymerizing an unsaturated monomer corresponding to the precursor of an individual repeating unit and modifying the synthesized polymer with a low-molecular compound so as to attain a conversion to a desired repeating unit. Alternatively, the compound (P) can be synthesized through a process (ii) comprising polymerizing an unsaturated monomer corresponding to an individual repeating unit by a radical, anionic or cationic polymerization technique. The details of the processes (i) and (ii) will be described below.

[Process (i)]

The polymeric compound (P) comprising any of repeating units of general formula (2) above or any of repeating units of general formula (7) above can be synthesized through the operation of reacting a polymeric compound containing, as a unit corresponding to a precursor thereof, any of repeating units of general formula (5) above or any of repeating units of general formula (6) above with the above compound (A) being a modifier, as indicated in the following reaction scheme (W).

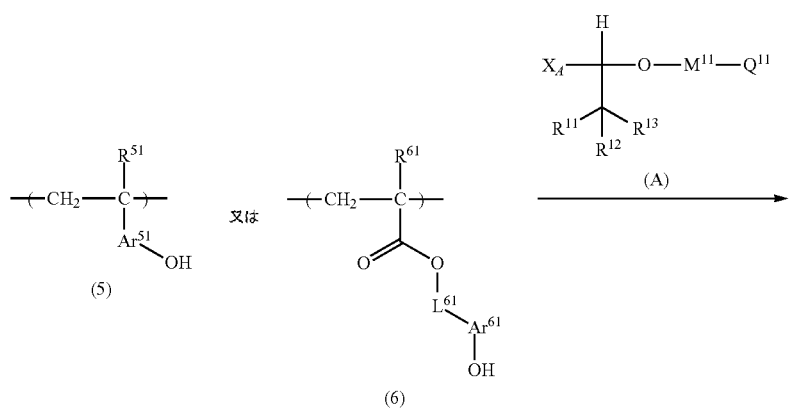

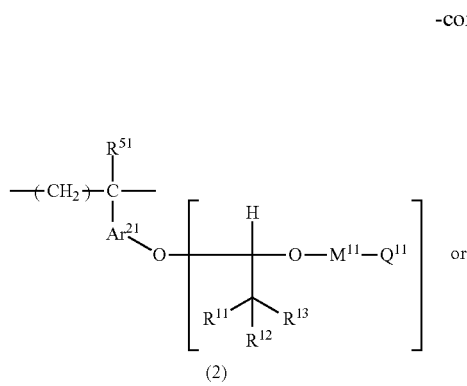 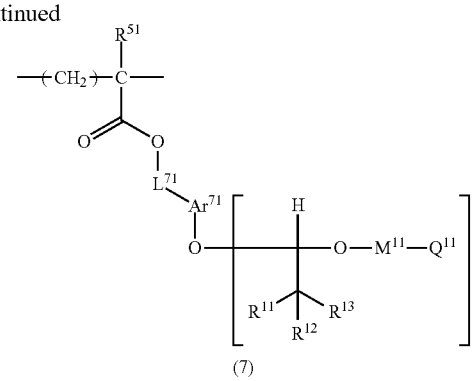

In general formula (A) above, $X_A$ is a chlorine atom, a bromine atom or an iodine atom, preferably a chlorine atom or a bromine atom and most preferably a chlorine atom.

The above reaction (W) is preferably performed in the presence of a basic compound and a reaction solvent.

As a preferred basic compound, there can be mentioned any of the compounds of general formulae (W1) and (W2) below.

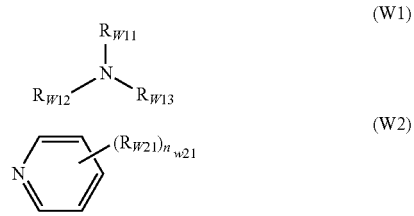

In general formula (W1), each of $Rw_{11}$, $Rw_{12}$ and $Rw_{13}$ independently represents an alkyl group, an aryl group or an aralkyl group.

Each of the alkyl groups represented by $Rw_{11}$, $Rw_{12}$ and $Rw_{13}$ may be substituted with a heteroatom, and may be any of a linear alkyl group, a branched alkyl group and a cycloalkyl group. Each of the alkyl groups preferably contains 1 to 20 carbon atoms, more preferably 1 to 6 carbon atoms. As particular examples of the alkyl groups represented by $Rw_{11}$, $Rw_{12}$ and $Rw_{13}$, there can be mentioned, for example, a methyl group, an ethyl group, an n-propyl group, an isopropyl group, an n-butyl group, a sec-butyl group, a tert-butyl group, an n-pentyl group, a neopentyl group, an n-hexyl group, a cyclohexyl group, an n-heptyl group, an n-octyl group, an n-dodecyl group and the like. Of these, a methyl group, an ethyl group, an n-propyl group and an isopropyl group are preferred.

Each of the aryl groups represented by $Rw_{11}$, $Rw_{12}$ and $Rw_{13}$ may contain a heteroatom, and a substituent may further be introduced on the ring thereof.

Each of the aryl groups represented by $Rw_{11}$, $Rw_{12}$ and $Rw_{13}$ is preferably one having 4 to 20 carbon atoms, more preferably 6 to 10 carbon atoms. As particular examples of the aryl groups, there can be mentioned, for example, a phenyl group, a naphthyl group, an anthranyl group, a pyrenyl group, a pyridyl group, a pyrrolyl group and an indolyl group. Of these, a phenyl group is preferred.

Each of the aralkyl groups represented by $Rw_{11}$, $Rw_{12}$ and $Rw_{13}$ may contain a heteroatom, and a substituent may further be introduced on the ring thereof.

Each of the aralkyl groups represented by $Rw_{11}$, $Rw_{12}$ and $Rw_{13}$ is preferably one having 7 to 21 carbon atoms, more preferably 7 to 15 carbon atoms. As the aralkyl groups, there can be mentioned, for example, a benzyl group, a phenethyl group, a propylphenyl group, a naphthylmethyl group and an anthranylmethyl group. Of these, a benzyl group is preferred.

Two of $Rw_{11}$, $Rw_{12}$ and $Rw_{13}$ may be bonded to each other to thereby form a ring. As the formed ring, there can be mentioned a 5-, 6- or 7-membered ring. Especially, 5- and 6-membered rings are preferred.

As the compounds of general formula (W1), there can be mentioned, for example, N,N-diethylmethylamine, triethylamine, N,N-dimethylisopropylamine, N,N-dimethylethylamine, N,N-diisopropylethylamine, 1-methylpyrrolidine, 1-ethylpyrrolidine, tripropylamine, triisobutylamine, triamylamine, trihexylamine, N,N-dicyclohexylmethylamine, trioctylamine, didecylmethylamine, tris(2-ethylhexyl)amine, N,N-dimethylhexadecylamine, tri-n-decylamine, N,N-diethylcyclohexylamine, N,N-dimethyl-n-octadecylamine, 1-methylpiperidine, 1-ethylpiperidine, N-methylmorpho line, N-ethylmorpholine, N-phenylmorpholine, N-(4-pyridyl) morpholine, N,N-dimethylaniline, N,N-dimethyl-p-toluidine, N,N-dimethyl-o-toluidine, N,N-dimethyl-m-toluidine, N,N-dimethyl-1-naphthylamine, N,N-dimethyl-2-naphthylamine, N,N-diethylaniline, N,N-dipropylaniline, 4-dimethylaminopyridine, triphenylamine, tri-p-tolylamine, N-methyldiphenylamine, 1,8-diazabicyclo[5.4.0]-7-undecene and 1,5-diazabicyclo[4.3.0]-5-nonene. These however in no way limit the scope of the present invention.

In general formula (W2), $n_{W21}$ is an integer of 0 to 4, preferably 0 to 3, more preferably 0 to 2 and further more preferably 0 or 1.

$Rw_{21}$ is a monovalent substituent. As the monovalent substituent, there can be mentioned, for example, an alkyl group, a halogen atom, an alkoxy group or a dialkylamino group.

The alkyl group represented by $Rw_{21}$ preferably contains 1 to 5 carbon atoms, more preferably 1 to 3 carbon atoms. As the alkyl group, there can be mentioned, for example, a methyl group, an ethyl group, a propyl group, an isopropyl group, an n-butyl group, a sec-butyl group, a tert-butyl group or an n-pentyl group. Of these, a methyl group and an ethyl group are preferred.

As the halogen atom represented by $Rw_{21}$, there can be mentioned a fluorine atom, a chlorine atom, a bromine atom or an iodine atom. Of these, a fluorine atom and a bromine atom are preferred.

The alkoxy group represented by $Rw_{21}$ preferably contains 1 to 5 carbon atoms, more preferably 1 to 3 carbon atoms. As the alkoxy group, there can be mentioned, for example, a methoxy group, an ethoxy group, a propoxy group, an isopropoxy group, an n-butyloxy group, a sec-butyloxy, a tert-butyloxy or an n-pentyloxy group. Of these, a methoxy group and an ethoxy group are preferred.

The alkyl group contained in the dialkylamino group represented by $Rw_{21}$ preferably contains 1 to 3 carbon atoms. As the dialkylamino group, there can be mentioned, for example, a dimethylamino group, a diethylamino group or a dipropylamino group.

As the compounds of general formula (W2), there can be mentioned, for example, pyridine, 2-picoline, 3-picoline, 4-picoline, 2,3-lutidine, 2,4-lutidine, 2,5-lutidine, 2,6-lutidine, 3,4-lutidine, 3,5-lutidine, 2-ethylpyridine, 2,4,6-trimethylpyridine, 2-methoxypyridine, 3-methoxypyridine, 4-methoxypyridine, 2,6-dimethoxypyridine, 2-chloro-6-methoxypyridine, 2-butoxypyridine, 2-chloropyridine, 3-chloropyridine, 4-chloropyridine, 2,6-dichloropyridine, 2-chloro-4-methylpyridine, 2-bromopyridine, 2-dimethylaminopyridine and 4-dimethylaminopyridine. These however in no way limit the scope of the present invention.

These basic compounds are preferably used in an amount of 1.0 to 20.0 equivalent weight, more preferably 2.0 to 15.0 equivalent weight and most preferably 2.0 to 10.0 equivalent weight based on the compound (A).

As solvents that can be appropriately used in the above reaction (W), there can be mentioned an ether solvent, such as tetrahydrofuran, 1,2-dimethoxyethane or 1,4-dioxane; a hydrocarbon solvent, such as hexane, heptane, benzene or toluene; a halogenated solvent, such as dichloromethane, dichloroethane or chloroform; an ester solvent, such as ethyl acetate or butyl acetate; a ketone solvent, such as acetone or methyl ethyl ketone; an amide solvent, such as N,N-dimethylformamide, N,N-dimethylacetamide, N-methylpyrrolidone or N-ethylpyrrolidone; acetonitrile; propylene glycol monomethyl ether acetate; and the like. One of these may be used alone, or two or more thereof may be used in a mixture. When the employed solvent is soluble in water, any salt precipitation during reaction can be suppressed to thereby allow the reaction to homogeneously advance. Therefore, the solvent preferably contains a water-soluble liquid in an amount of 50 mass % or more, more preferably 65 mass % or more. Herein, the water-soluble liquid refers to a liquid whose mixture prepared by gently mixing the same with an equal amount of pure water at 20° C. under 1 atm. maintains a homogeneous appearance after the abatement of the flow by mixing.

The reaction solvent is preferably added in an amount such that the content of a polymeric compound containing any of repeating units of general formula (5) above or any of repeating units of general formula (6) above is in the range of 2 to 60 mass %, more preferably 10 to 40 mass % and most preferably 15 to 30 mass %.

The temperature at which the reaction (W) is performed is preferably in the range of −20 to 100° C., more preferably −10 to 50° C. and most preferably 0 to 30° C.

[Process (ii)]

The polymeric compound (P) containing any of repeating units of general formula (2) above or any of repeating units of general formula (7) above can be synthesized through the operation of polymerizing any of compounds of general formula (B) below or any of compounds of general formula (C) below.

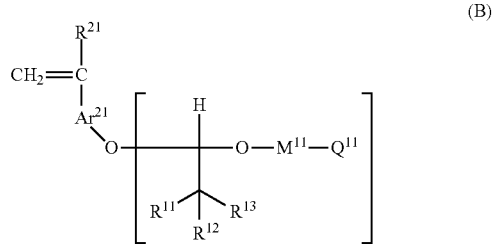

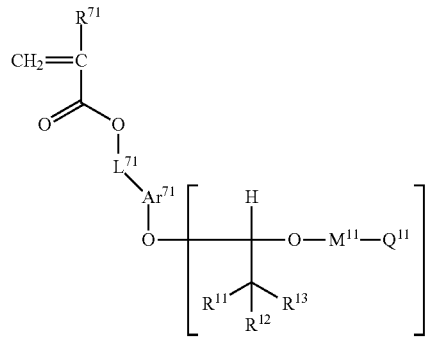

In general formula (B), $R^{21}$, $Ar^{21}$, $R^{11}$, $R^{12}$, $R^{13}$, $M^{11}$ and $Q^{11}$ are as defined above in connection with general formula (2).

In general formula (C), $R^{71}$, $L^{71}$, $Ar^{71}$, $R^{11}$, $R^{12}$, $R^{13}$, $M^{11}$ and $Q^{11}$ are as defined above in connection with general formula (7).

For example, when a radical polymerization is intended, there can be employed a batch polymerization method in which a monomer species and an initiator are dissolved in a solvent and heated to thereby carry out polymerization, a dropping polymerization method in which a solution of monomer species and initiator is dropped into a heated solvent over a period of 1 to 10 hours, or the like. The dropping polymerization method is preferred. As a reaction solvent, there can be mentioned, for example, an ether, such as tetrahydrofuran, 1,4-dioxane or diisopropyl ether; a ketone, such as methyl ethyl ketone or methyl isobutyl ketone; an ester solvent, such as ethyl acetate; an amide solvent, such as dimethylformamide or dimethylacetamide; or a solvent, such as propylene glycol monomethyl ether acetate, propylene glycol monomethyl ether or cyclohexanone.

The polymerization reaction is preferably carried out in an atmosphere comprised of an inert gas, such as nitrogen or argon. The polymerization is initiated by use of a commercially available radical initiator (azo initiator, peroxide, etc.) as a polymerization initiator. Among the radical initiators, an azo initiator is preferred, and azo initiators having an ester group, a cyano group and a carboxyl group are especially preferred. As specific preferred initiators, there can be mentioned azobisisobutyronitrile, azobisdimethylvaleronitrile, dimethyl 2,2'-azobis(2-methylpropionate) and the like. If desirable, the initiator may be supplemented, or may be added in fractional amounts. After the completion of the reaction, the reaction liquid is poured into a solvent, and the intended polymer is recovered by a method of powder or solid recovery or the like. The reaction concentration is in the range of 5 to 50 mass %, preferably 10 to 30 mass %. The reaction temperature is generally in the range of 10 to 150° C., preferably 30 to 120° C. and more preferably 60 to 100° C.

The intended synthesis can be performed by a cationic polymerization or an anionic polymerization as well as the radical polymerization.

The weight average molecular weight of the compound (P) for use in the present invention is preferably in the range of 1000 to 200,000, more preferably 2000 to 50,000 and further more preferably 2000 to 15,000. The polydispersity index (molecular weight distribution, Mw/Mn) of the compound (P) is preferably in the range of 1.0 to 1.7, more preferably 1.0 to 1.3. The weight average molecular weight and polydispersity index of the compound (P) are defined as polystyrene-equivalent values measured by GPC.

Particular examples of the compounds (P) as polymeric compounds are shown below, which however in no way limit the scope of the present invention.

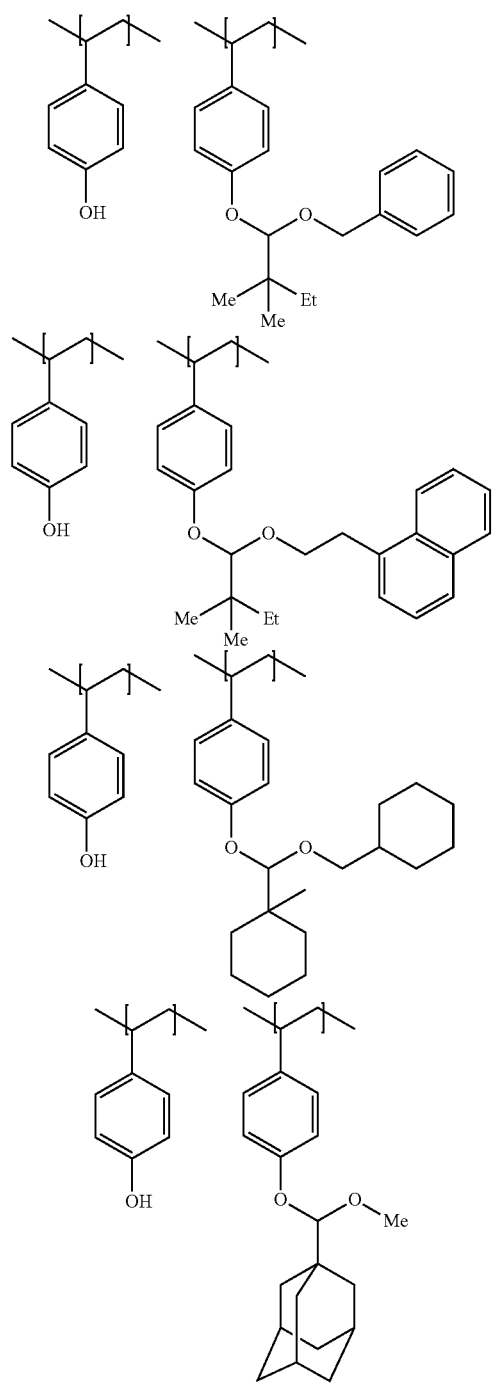
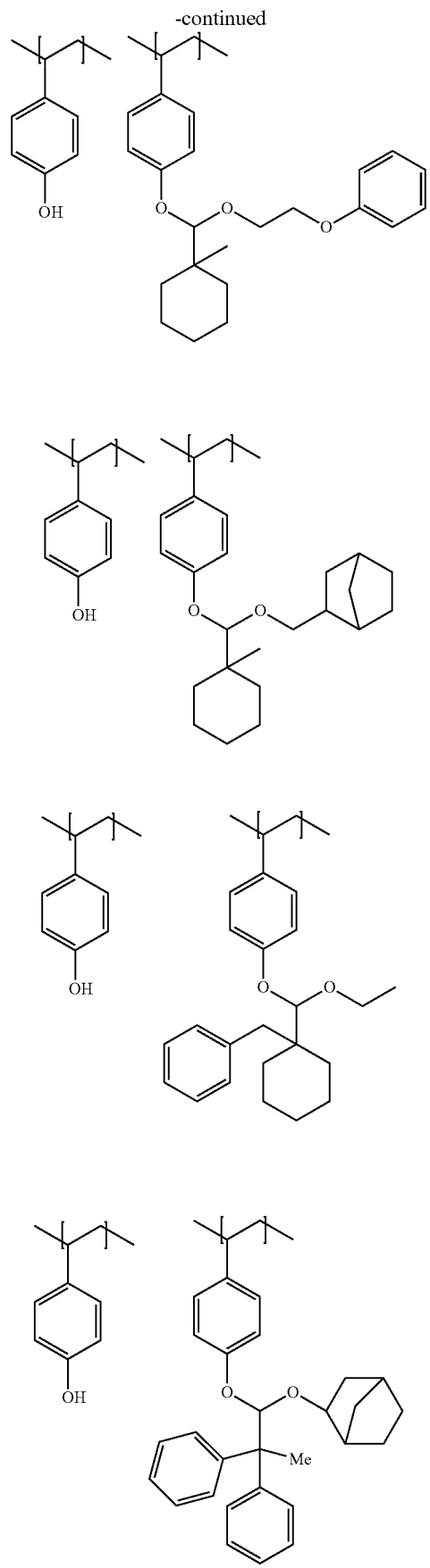

85
-continued
86
-continued
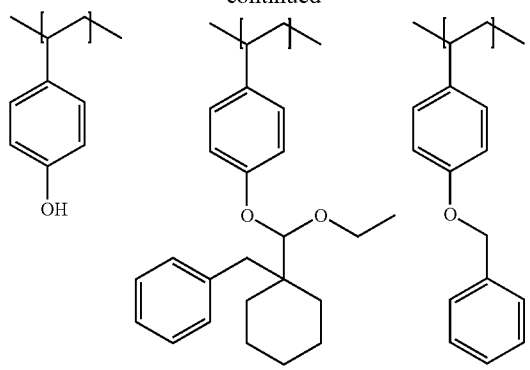
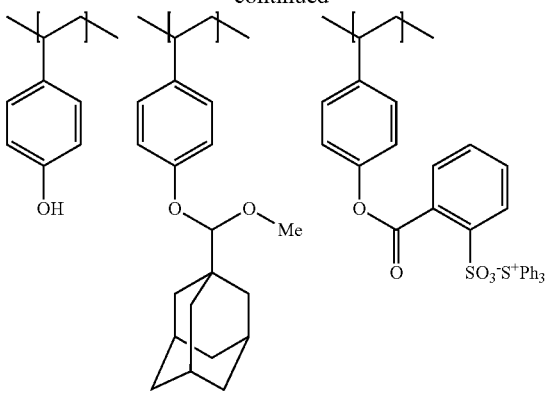
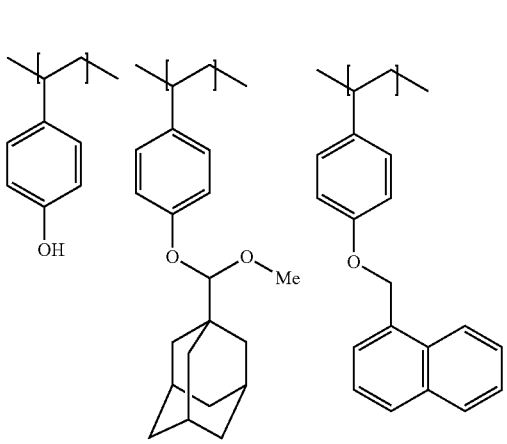
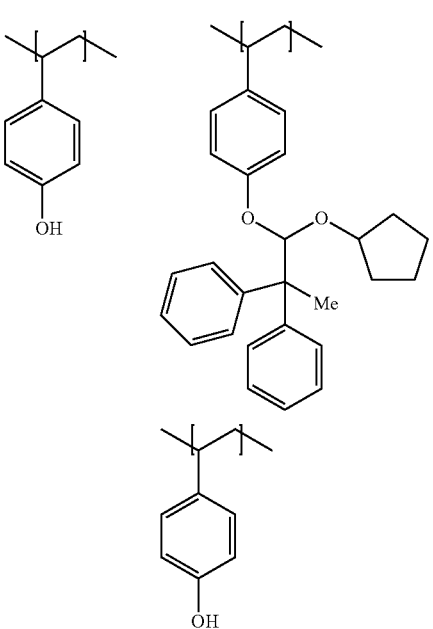

87
-continued
88
-continued
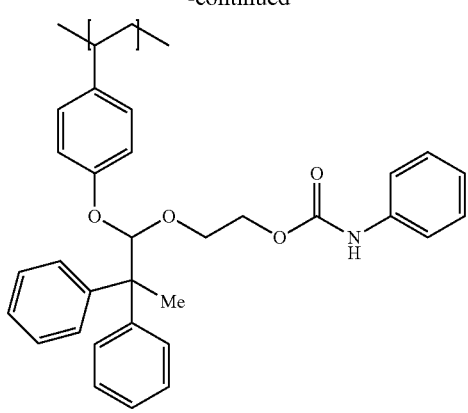
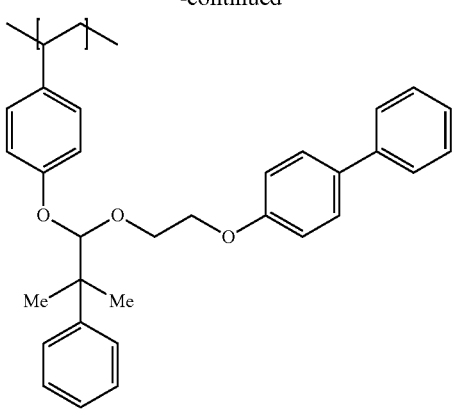
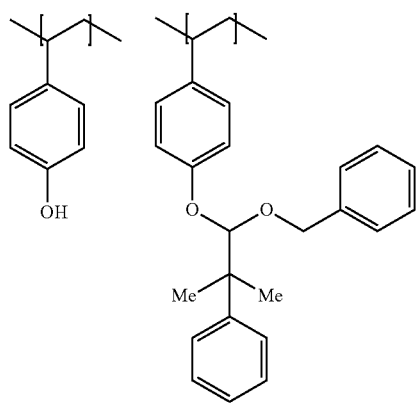
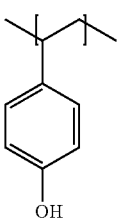
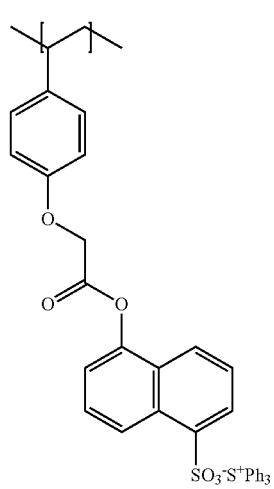
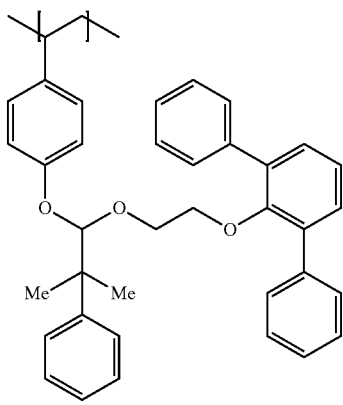
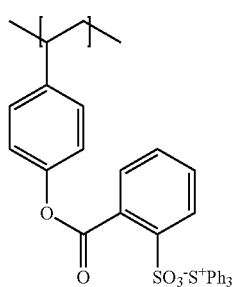

89
-continued
90
-continued
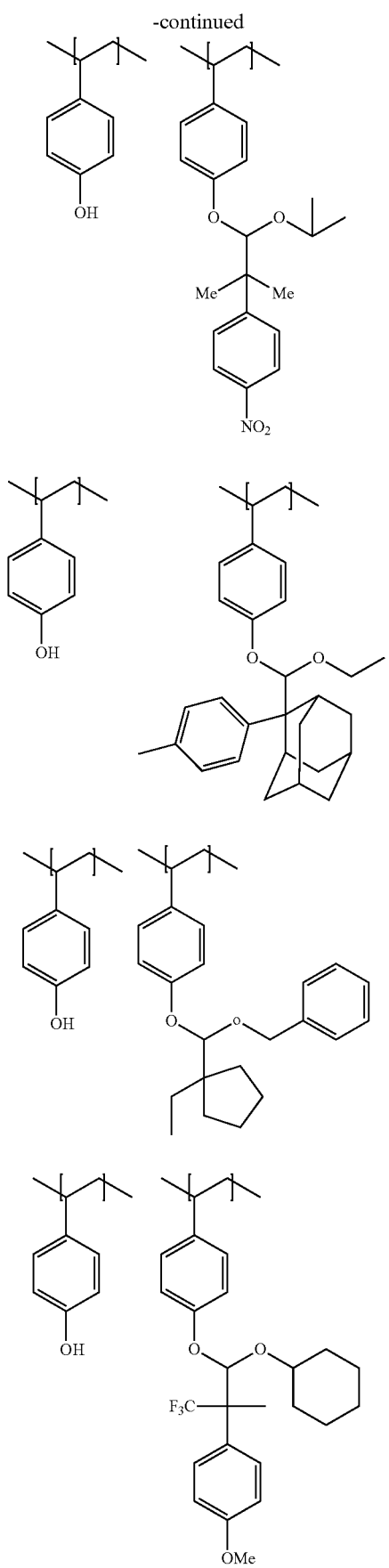
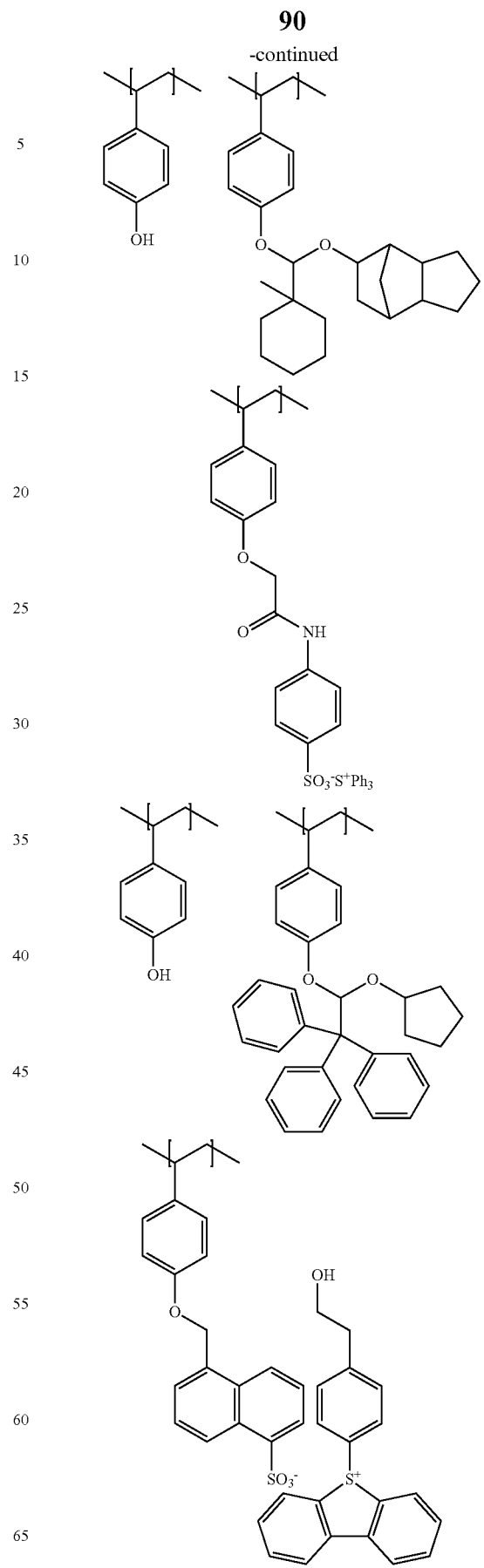

91
-continued
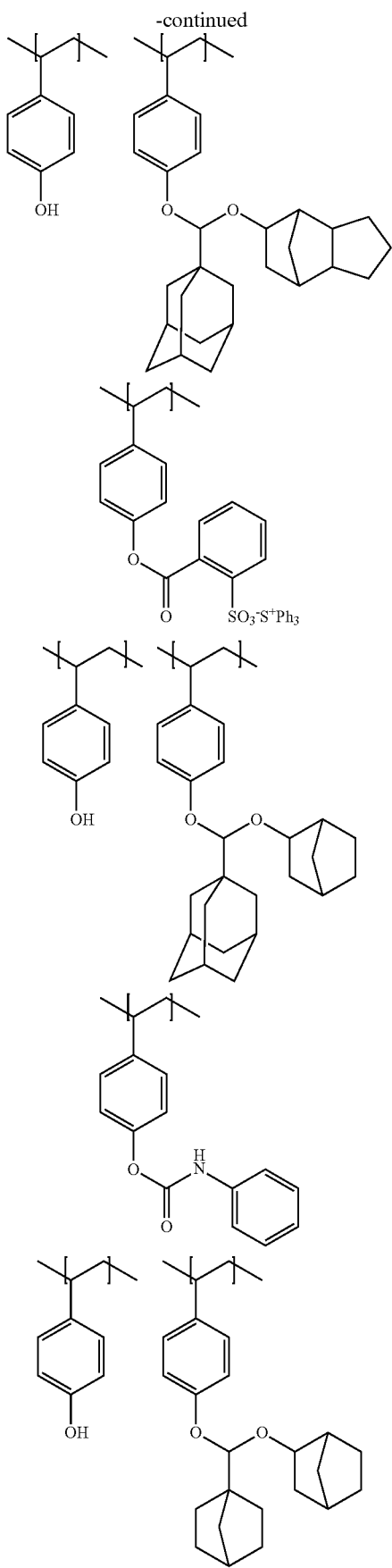
92
-continued
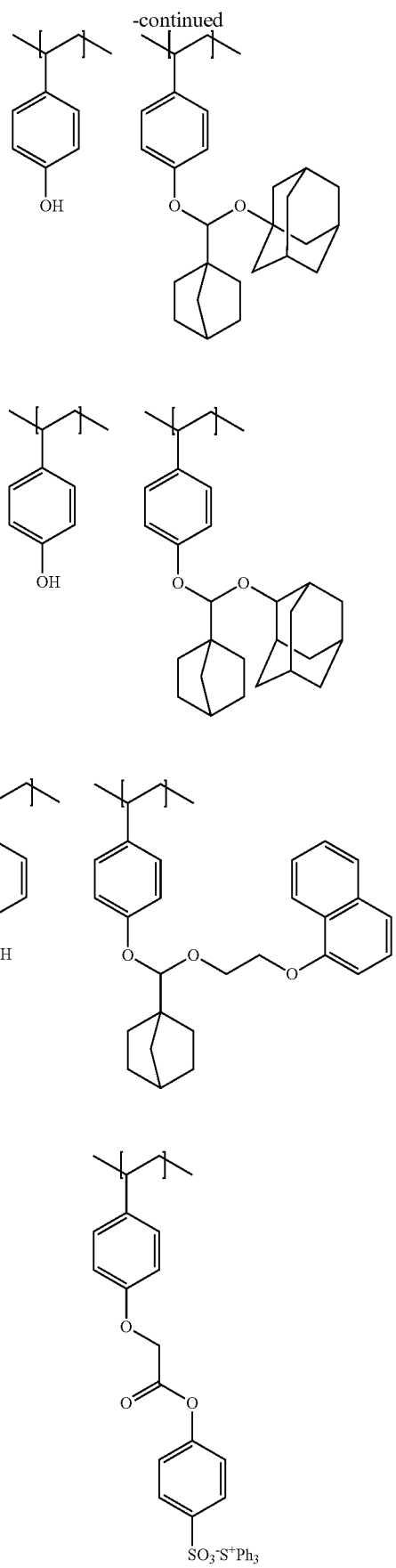

93
-continued
94
-continued
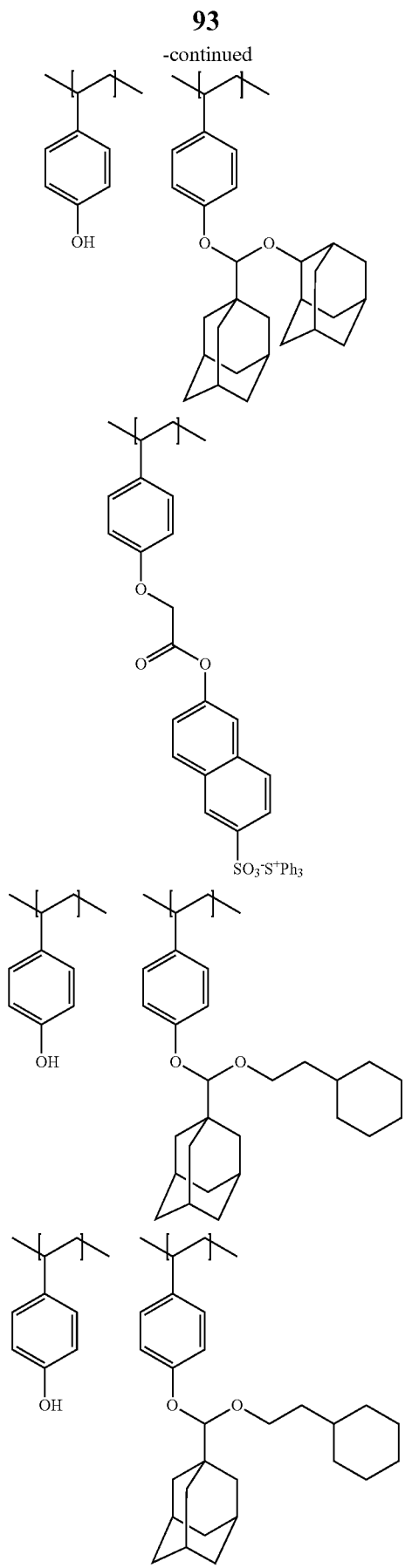
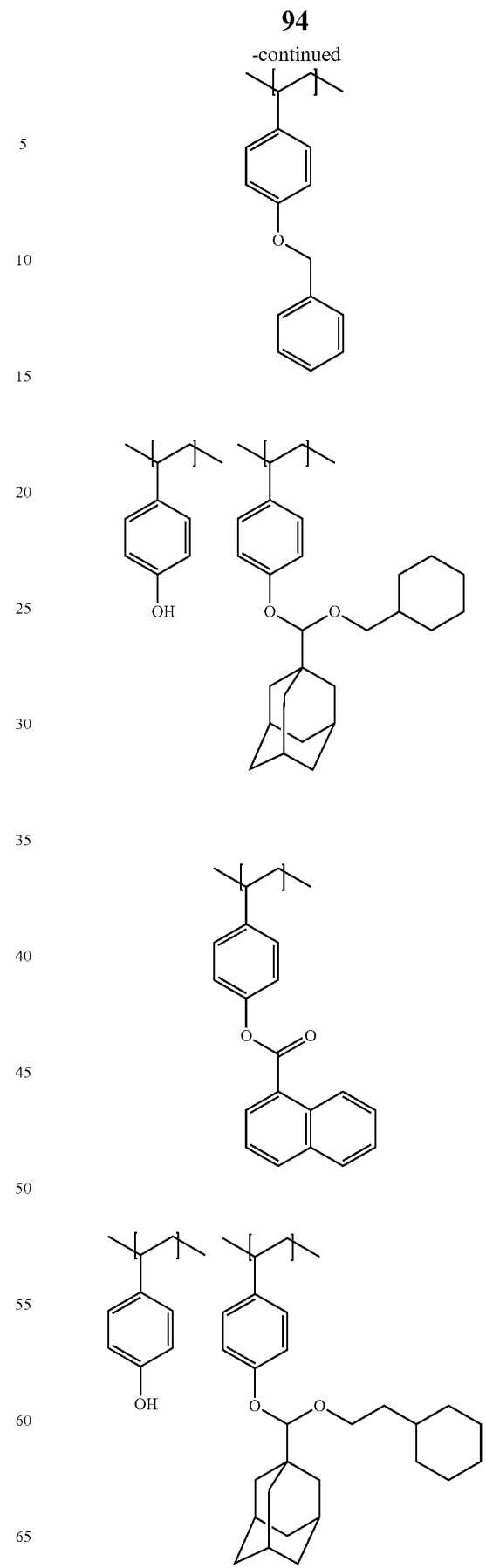

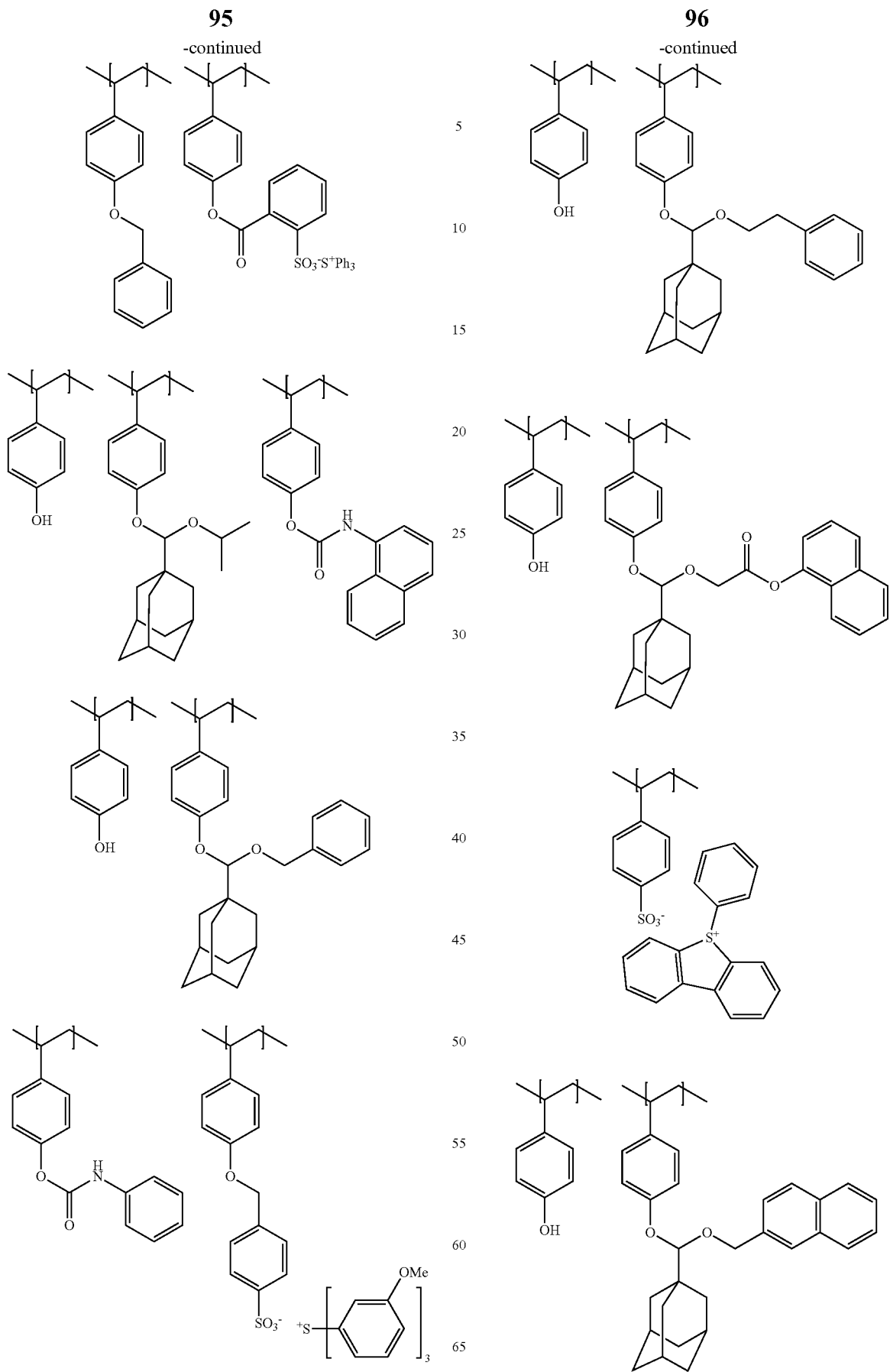

-continued
97
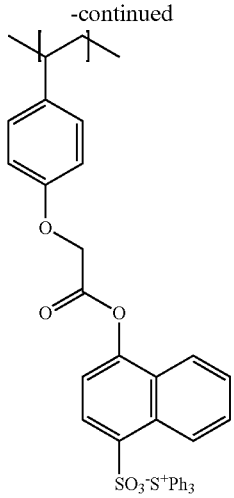
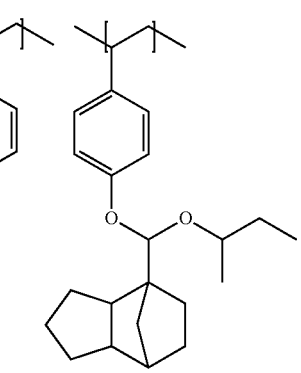
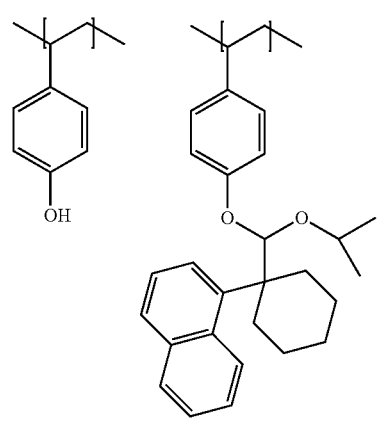
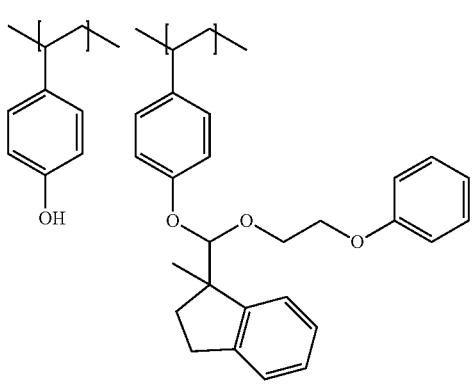
98
-continued
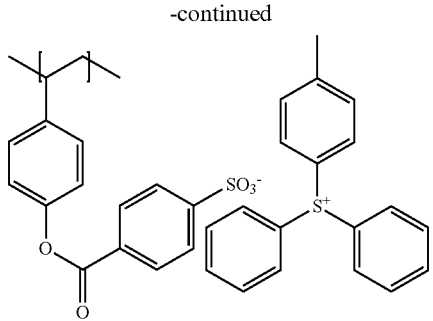
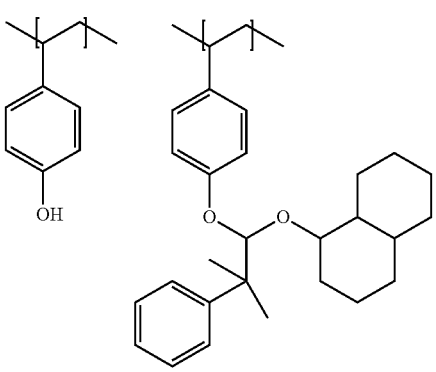
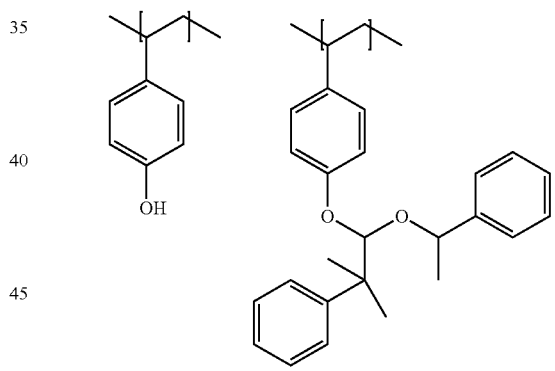
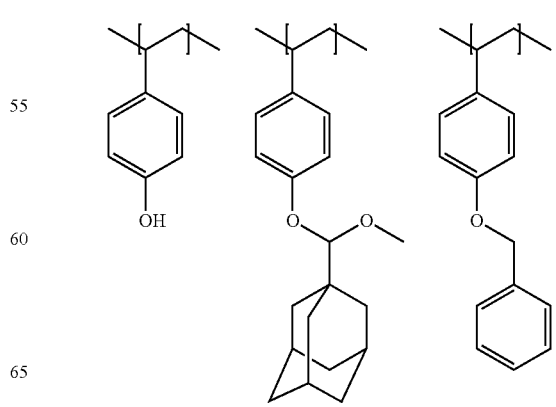

99
-continued
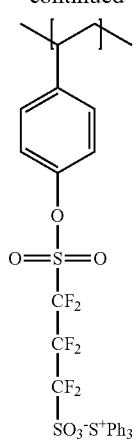
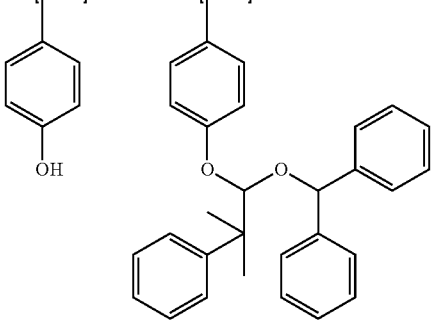
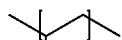
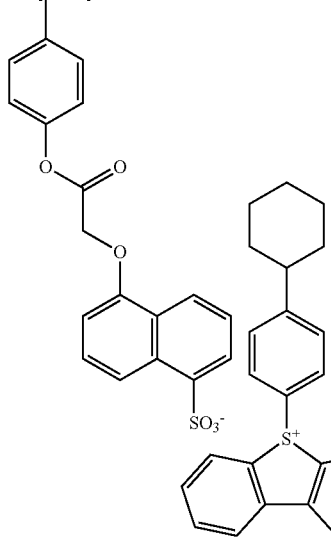
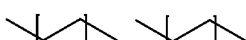
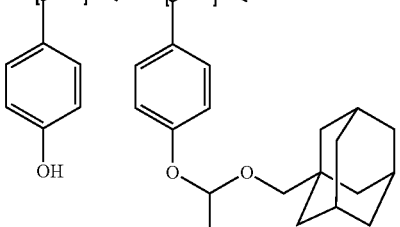
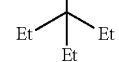
100
-continued
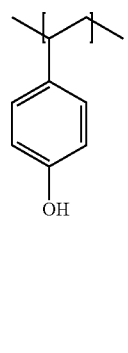
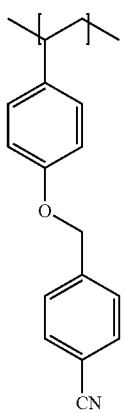
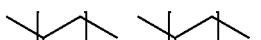
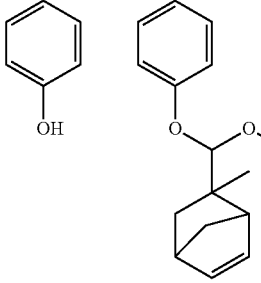
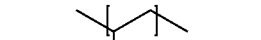
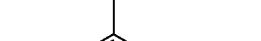
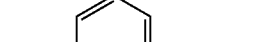
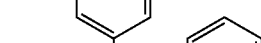
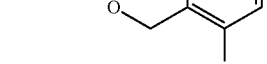

101
-continued
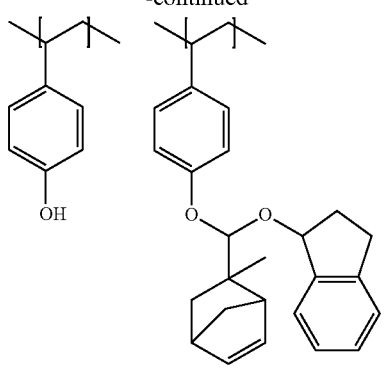
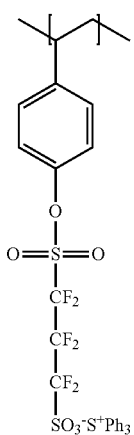
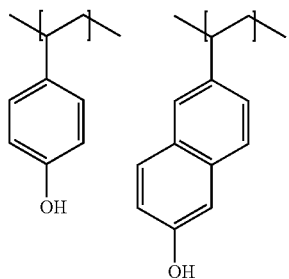
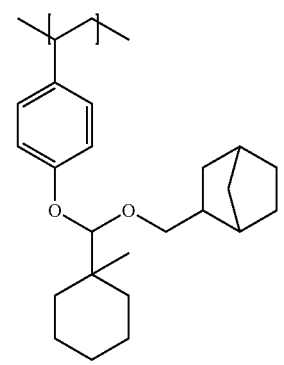
102
-continued
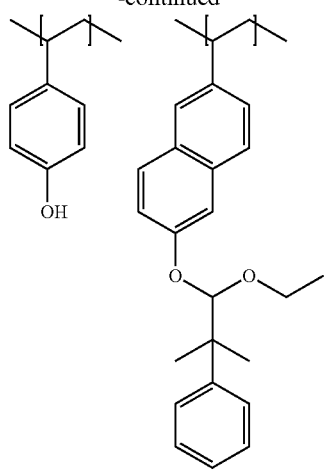
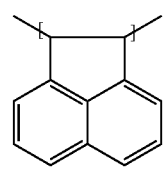
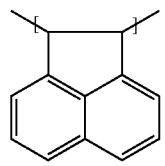

103
-continued
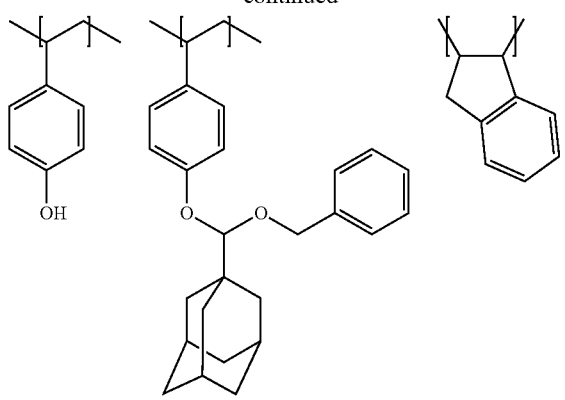
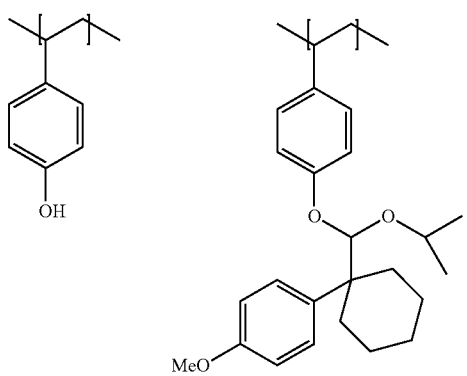
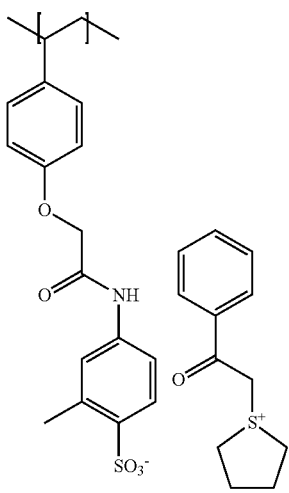
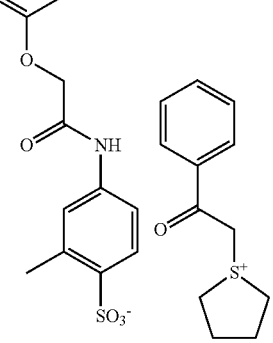
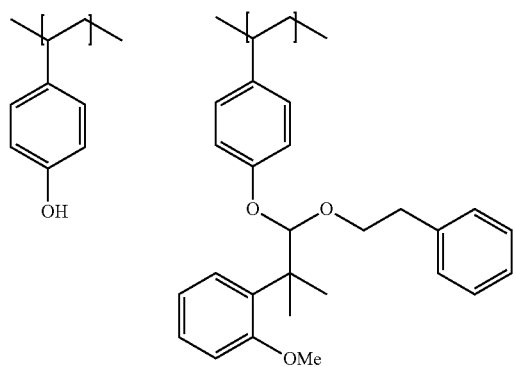
104
-continued
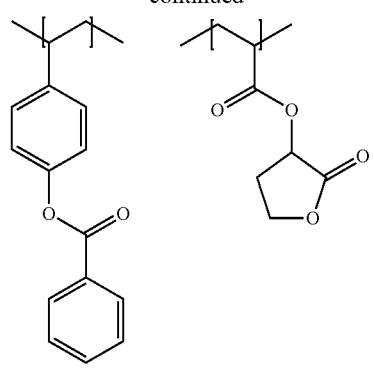
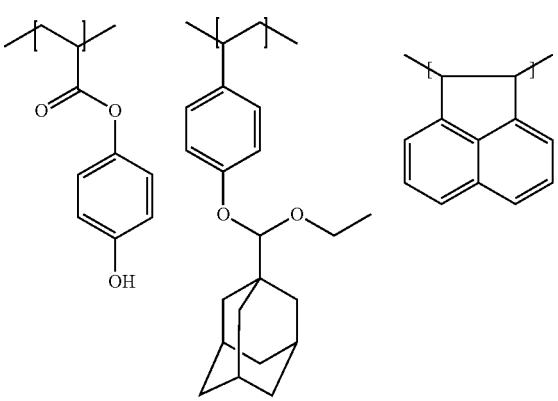
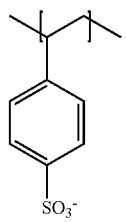
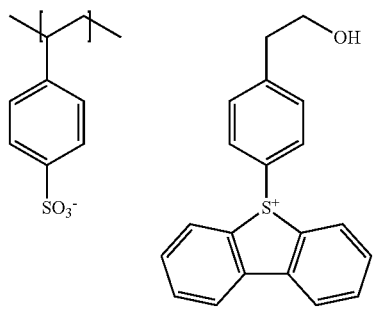
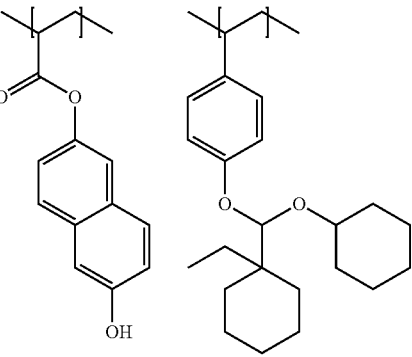

105
-continued
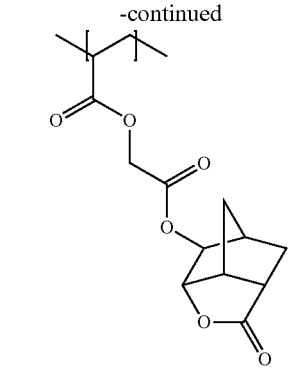
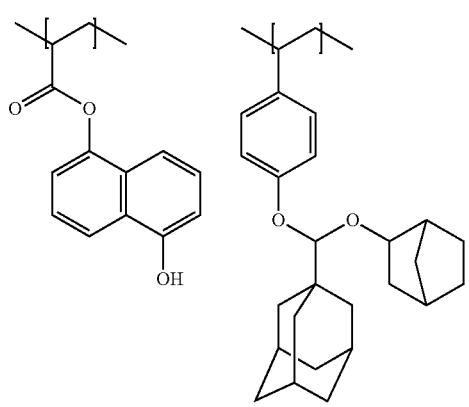
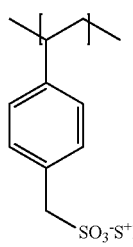
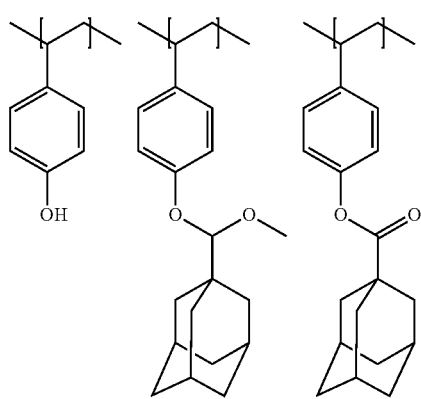
106
-continued
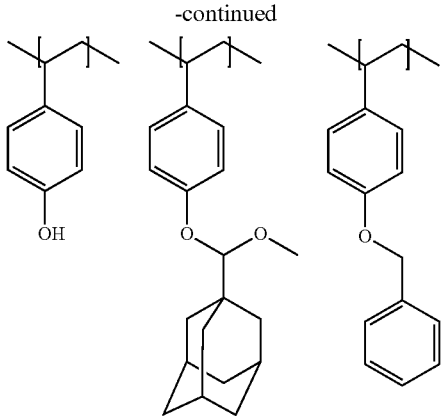
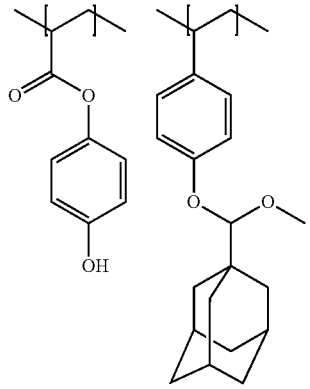

107
-continued
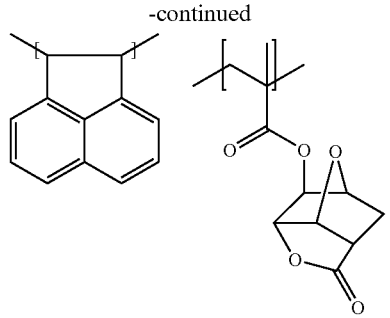
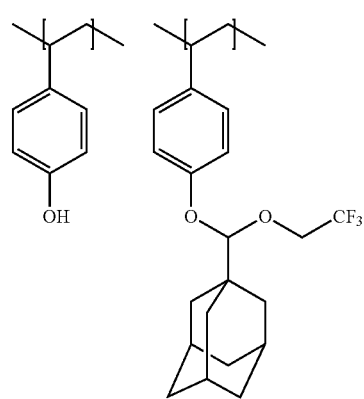
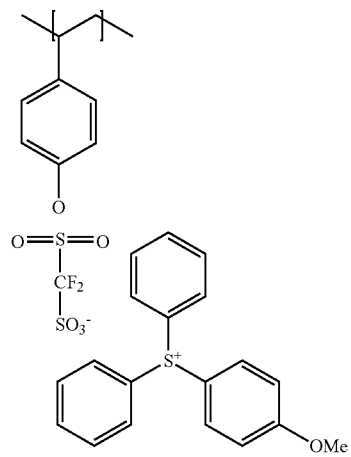
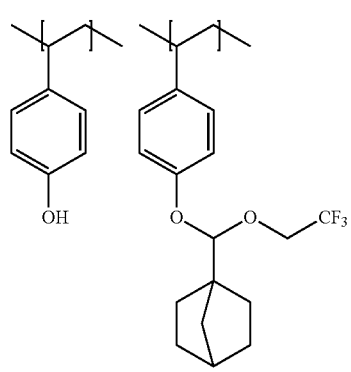
108
-continued
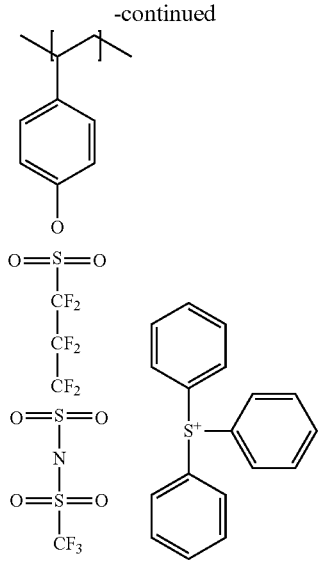
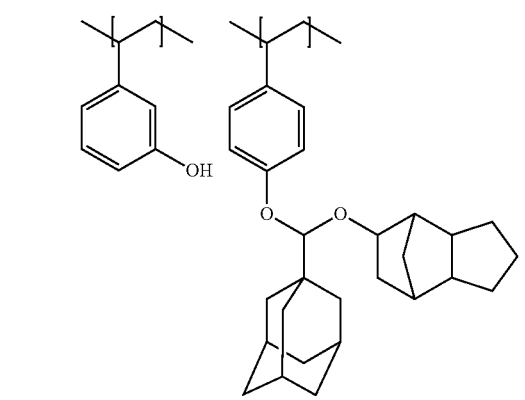
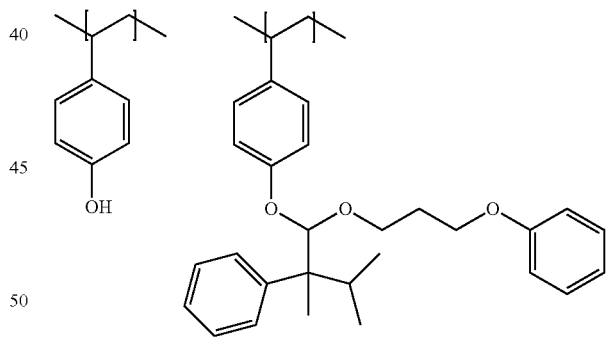
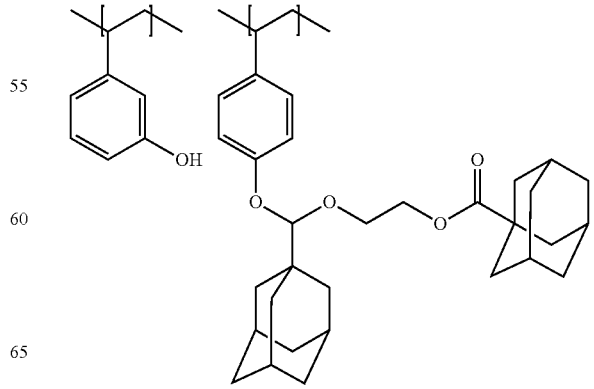

109
-continued
110
-continued
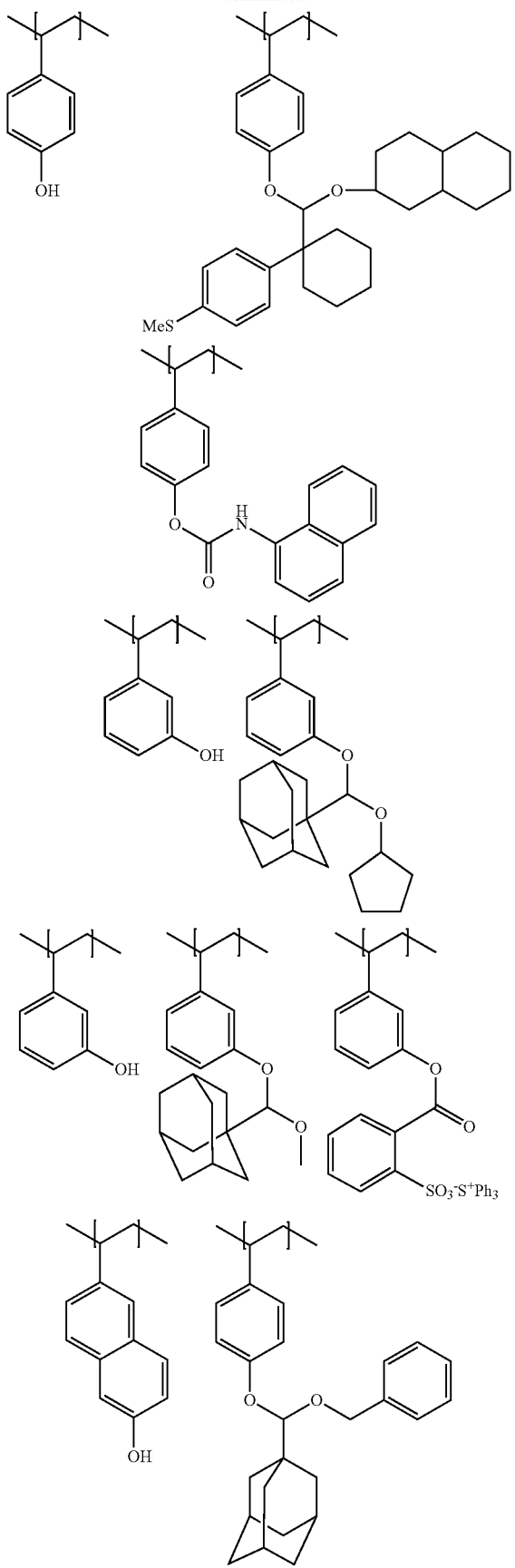
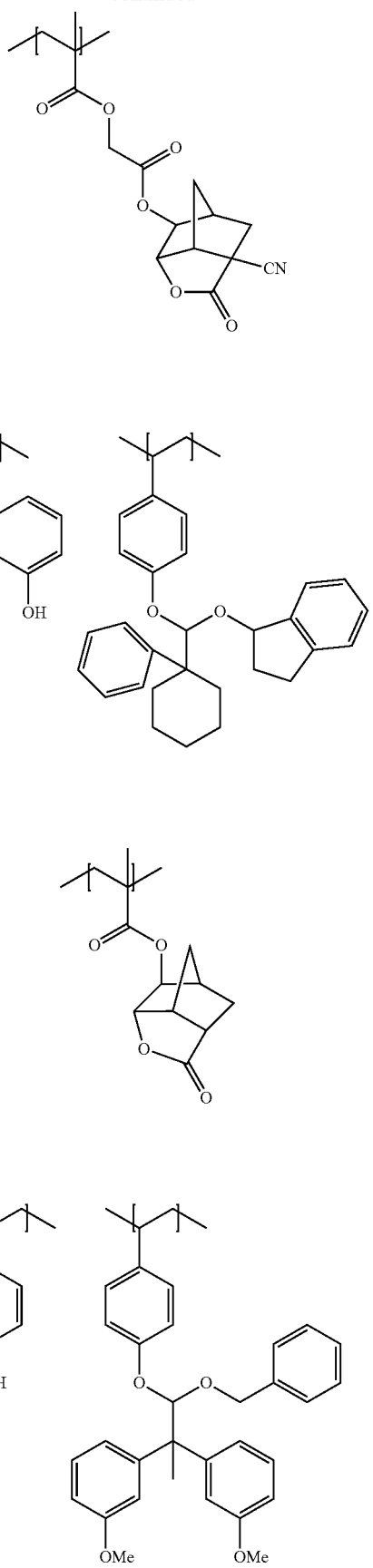

111
-continued
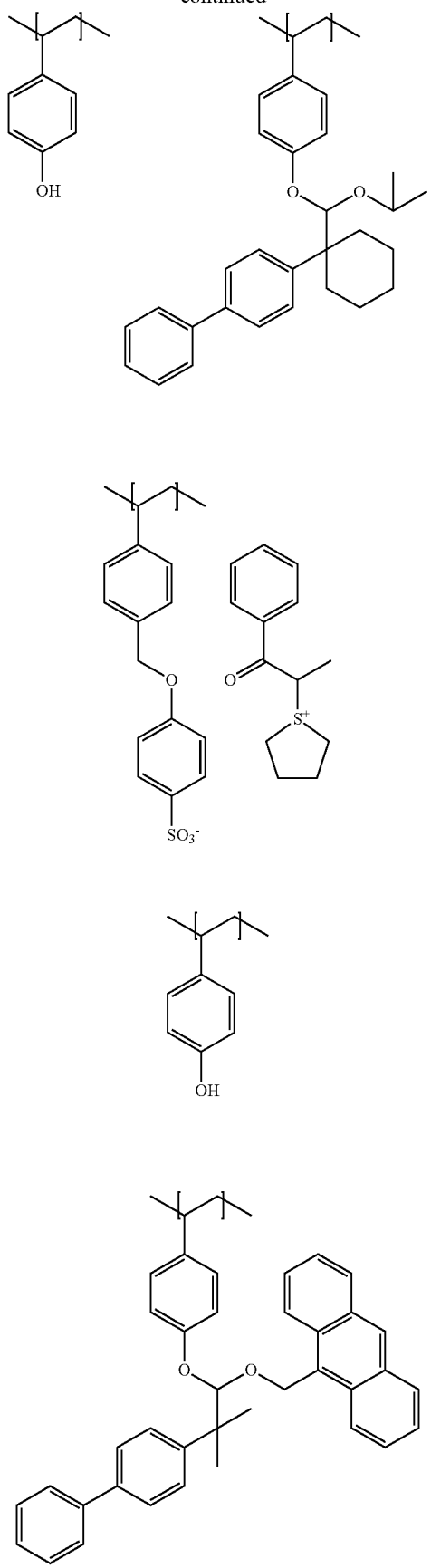
112
-continued
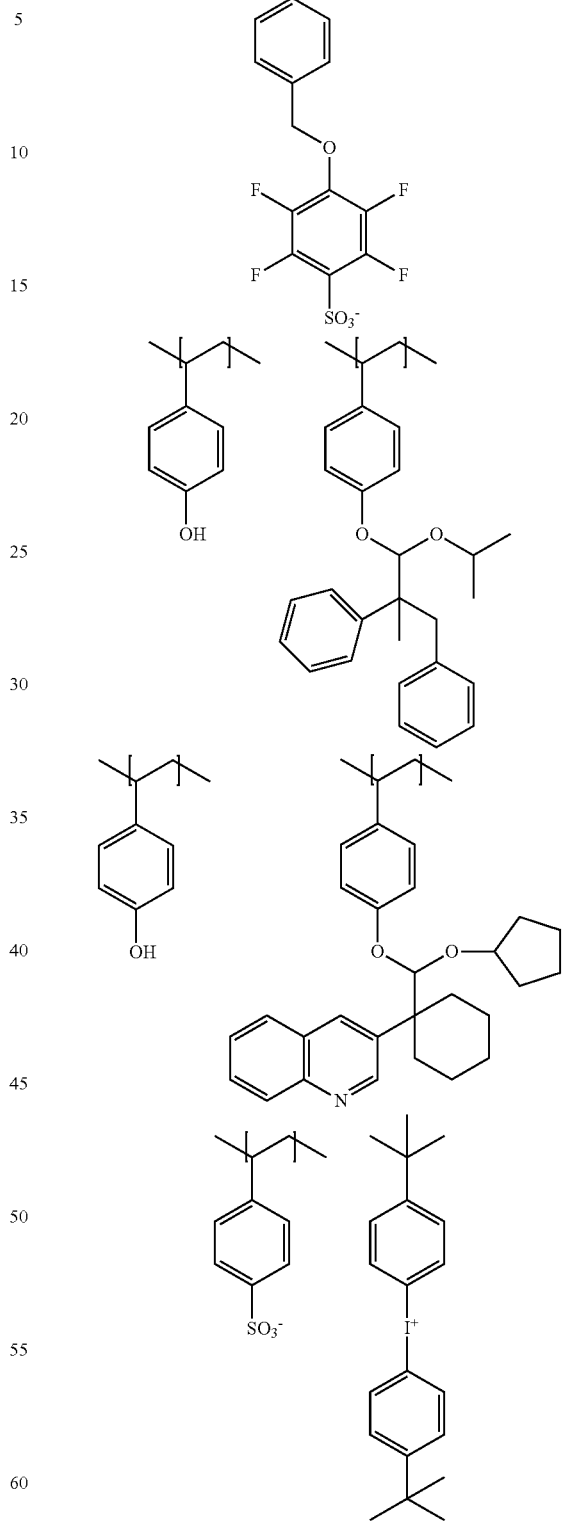
Now, the compound (P) as a low-molecular compound will be described.
As aforementioned, the compound (P) may be a low-molecular compound comprised of a scaffold compound of single molecular skeleton with a plurality of phenolic hydroxyl groups, the hydrogen atom of part of which is substituted with the group unstable in an acid expressed by general formula (1). Herein, the term "low-molecular compound" means, for example, a compound comprised of less than 10 repeating units derived from a polymerizable monomer. The molecular weight thereof is, for example, 3000 or less, preferably in the range of 300 to 2000 and more preferably 500 to 1500.

The low-molecular compound (P) in its one form has any of structures of general formulae (T-I) and (T-II) below.

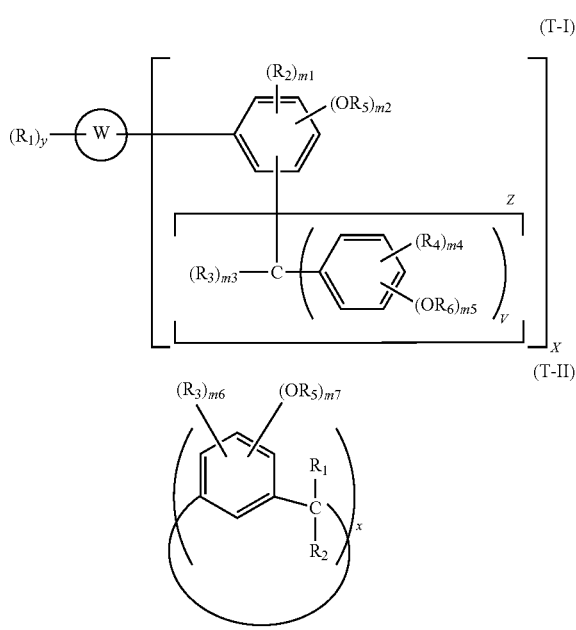

In general formulae (T-I) and (T-II), each of $R_1$, $R_2$, $R_3$ and $R_4$ independently represents a hydrogen atom, an alkyl group or a cycloalkyl group. Two or more $R_1$s may be bonded to each other to thereby form a ring. Two or more $R_2$s may be bonded to each other to thereby form a ring. Two or more $R_3$s may be bonded to each other to thereby form a ring. Two or more $R_4$s may be bonded to each other to thereby form a ring. Two or more $R_1$s, $R_2$s, $R_3$s, and $R_4$s may be identical to or different from each other.

Each of $R_5$ and $R_6$ independently represents a hydrogen atom or an organic group. Two or more $R_5$s, and $R_6$s may be identical to or different from each other. At least one of two or more $R_5$s and $R_6$s is any of groups of general formula (1).

W represents a single bond, an alkylene group, an arylene group or a group comprised of an arbitrary combination of these.

In the formulae, x is a positive integer;
y is an integer of 0 or greater, being 0 when W is a single bond;
z is an integer of 0 or greater; and
v is an integer of 0 or greater.
Further, each of m1, m3, m4 and m6 is a positive integer; and
each of m2, m5 and m7 is an integer of 0 or greater, provided that the relationships m1+m2+z=5, m3+v=3, m4+m5=5 and m2+m5≥2 are satisfied, and that m6+m7=4.

It is preferred for the compounds (P) of general formula (T-I) to be the compounds of any of general formulae (T-III) to (T-V) above.

These compounds (P) can be synthesized by reacting a phenolic hydroxyl group of a compound functioning as a scaffold (scaffold compound), such as a polyhydric phenol compound, with a protective reactant to thereby protect the phenolic hydroxyl group of the scaffold compound by any of groups of general formula (1). Herein, the protective reactant refers to a compound used in the reaction for the introduction of a protective group. The ratio of phenolic hydroxyl groups protected by an acid-unstable group to the sum of phenolic hydroxyl groups contained in the scaffold compound is referred to as the protection rate.

Particular examples of the scaffold compounds for the compounds (P) of general formula (T-I) are shown below, which however in no way limit the scope of the present invention.

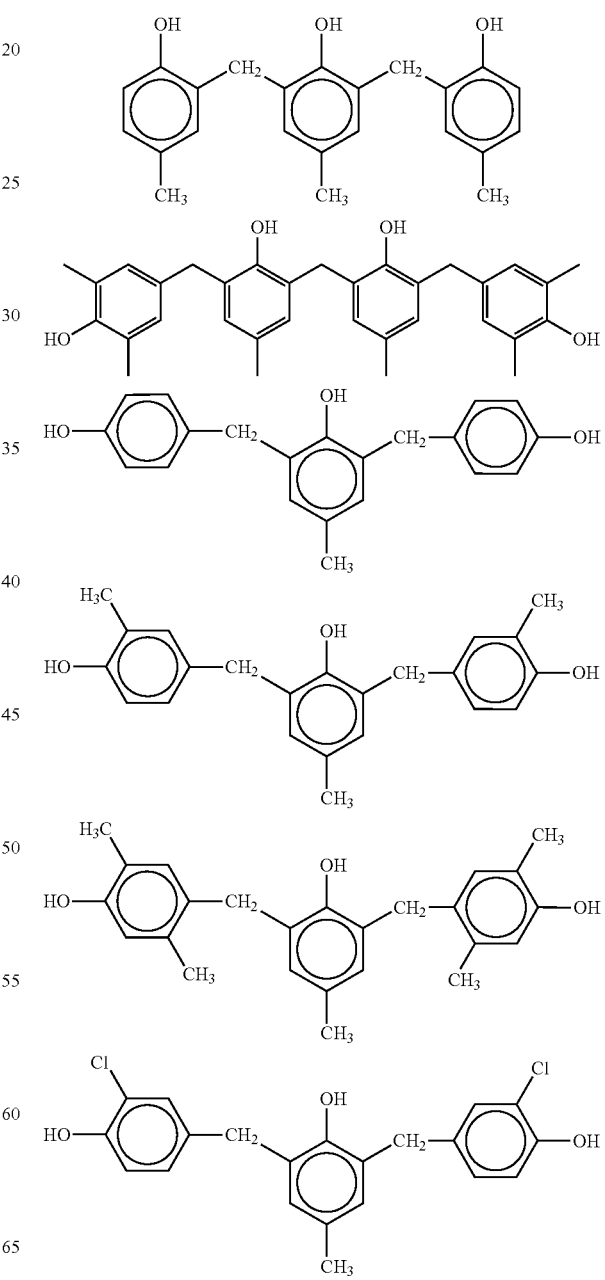

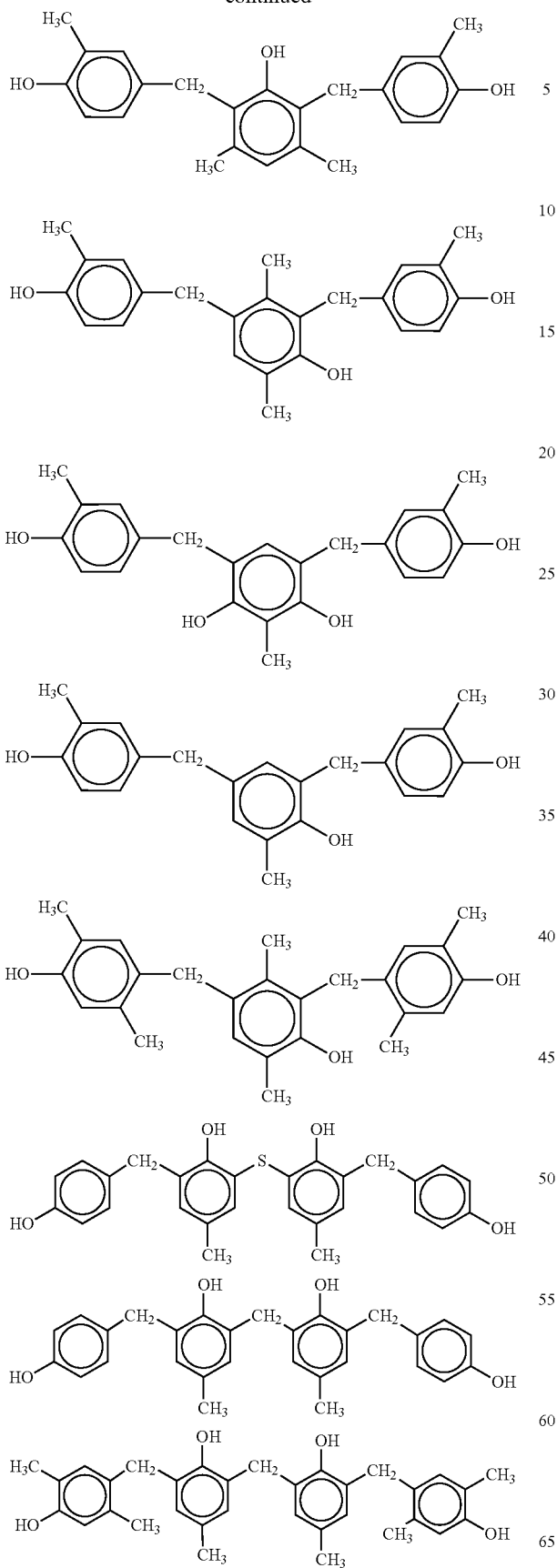
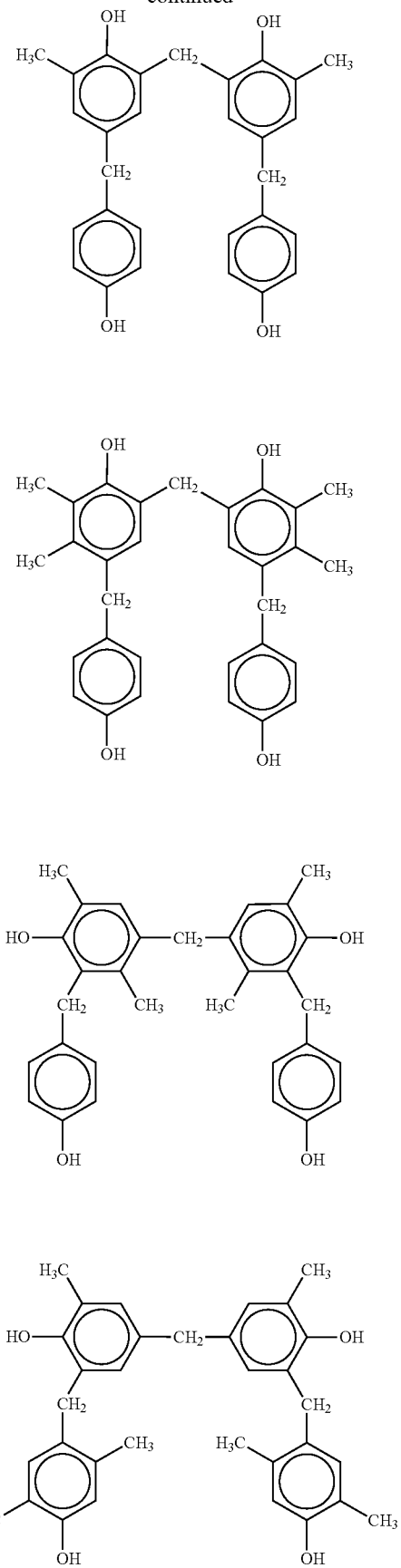

117
-continued
118
-continued
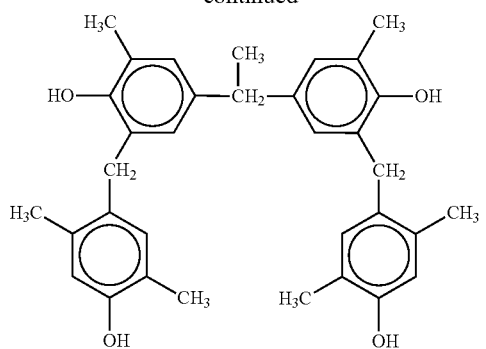
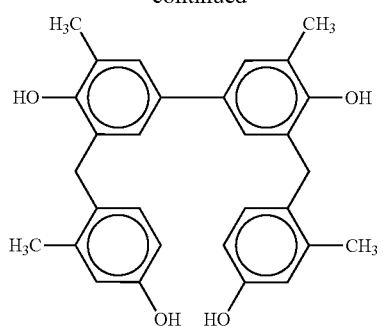
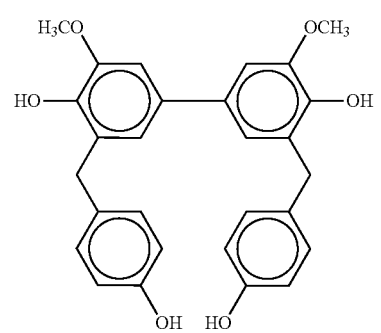
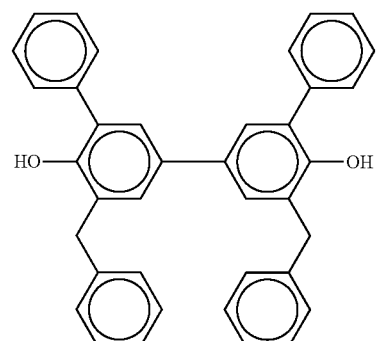
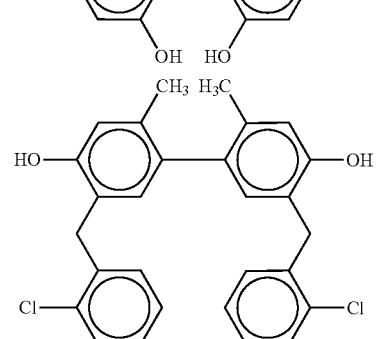
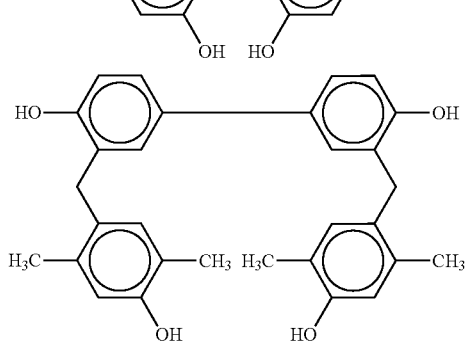

119
-continued
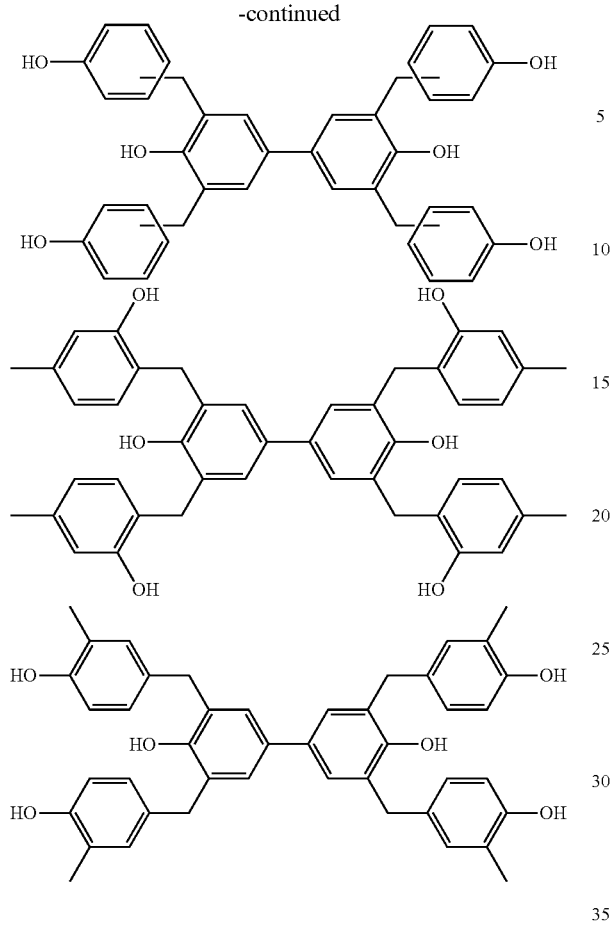
Mixt. of ortho-substitution/para-substitution
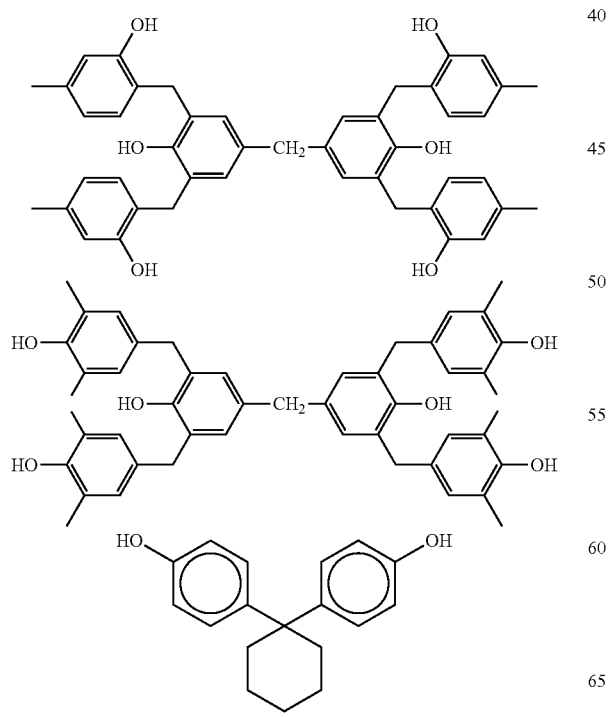
120
-continued
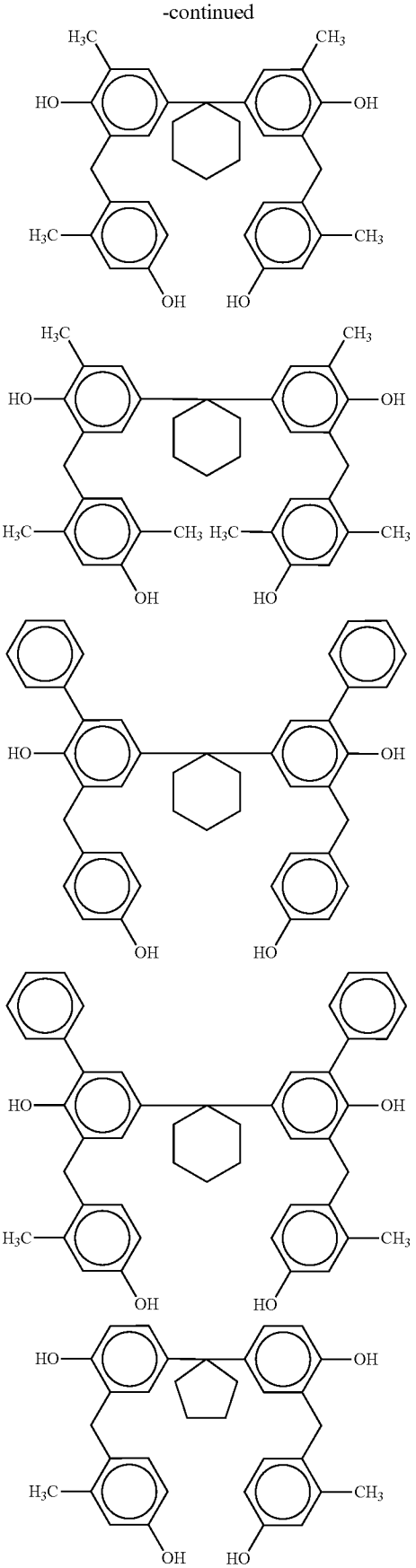

121
-continued
122
-continued
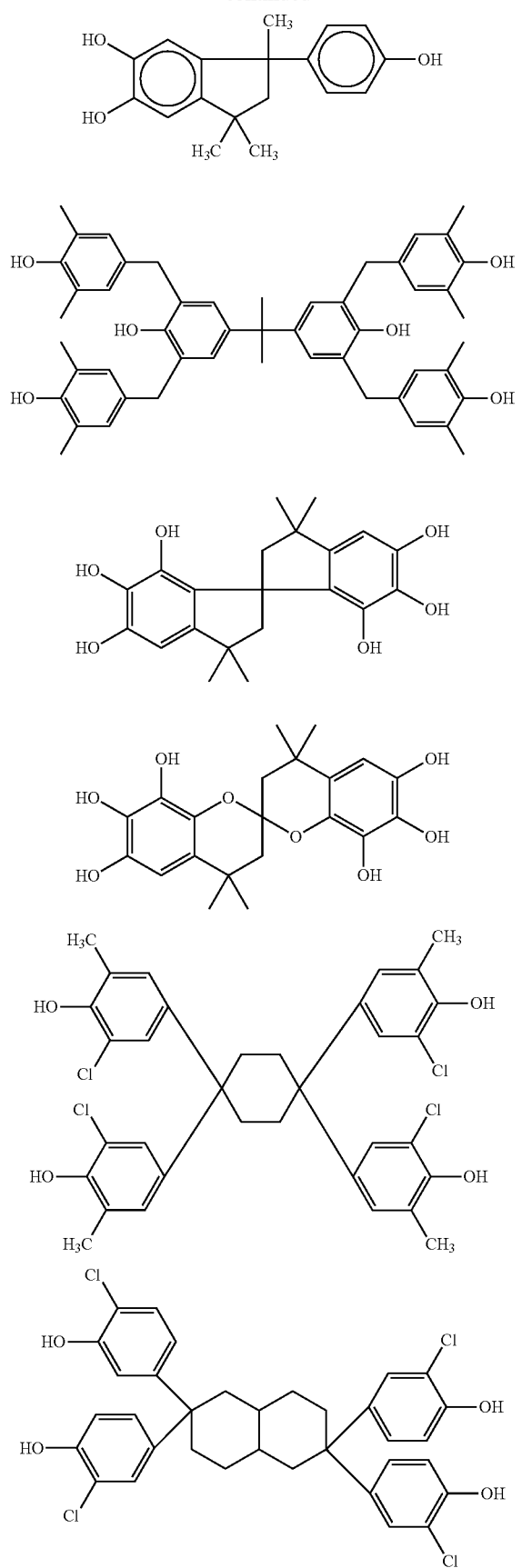
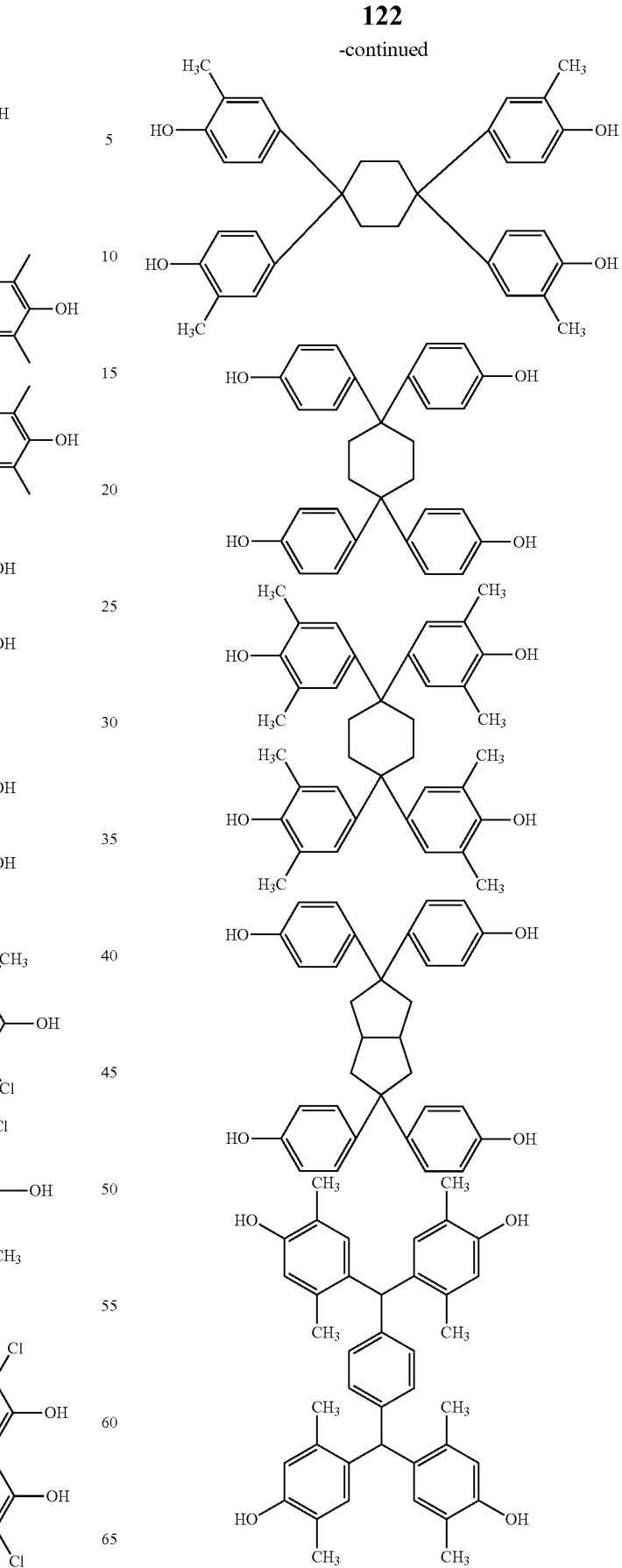

123
-continued
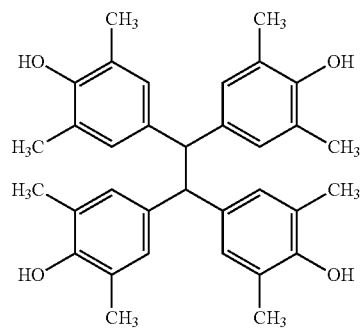
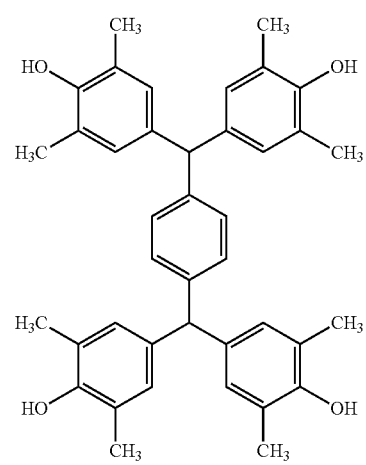
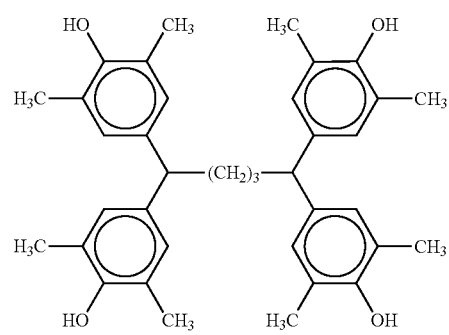
124
-continued
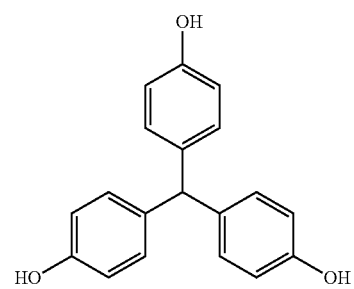
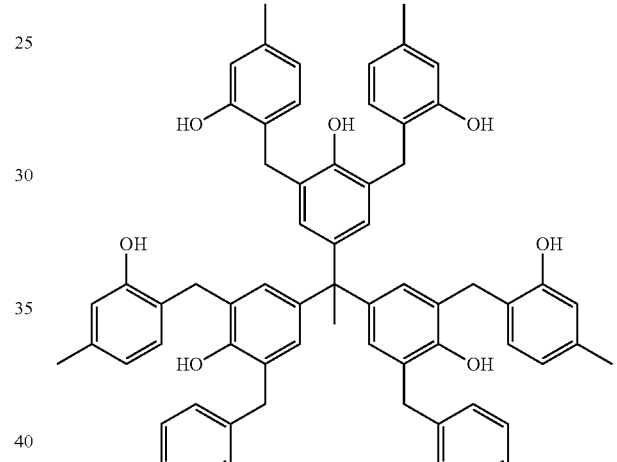
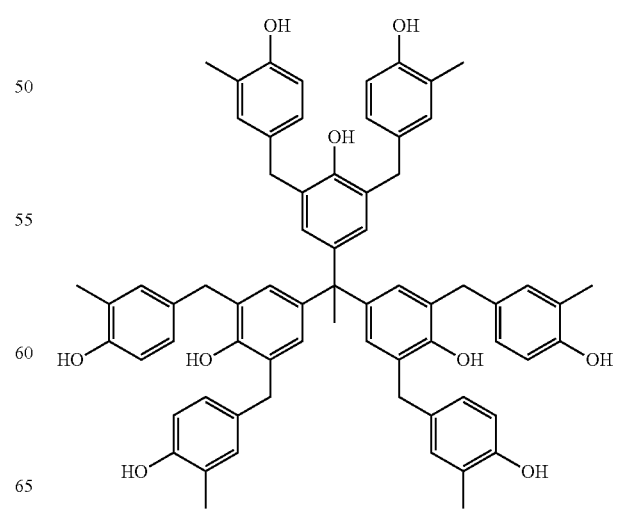

-continued
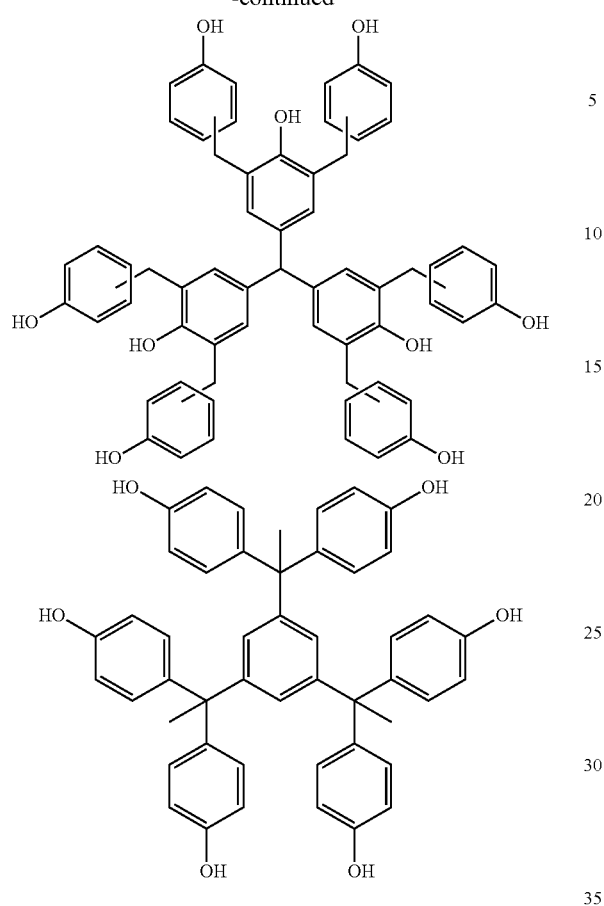
Mixt. of
ortho-substitution/para-substitution
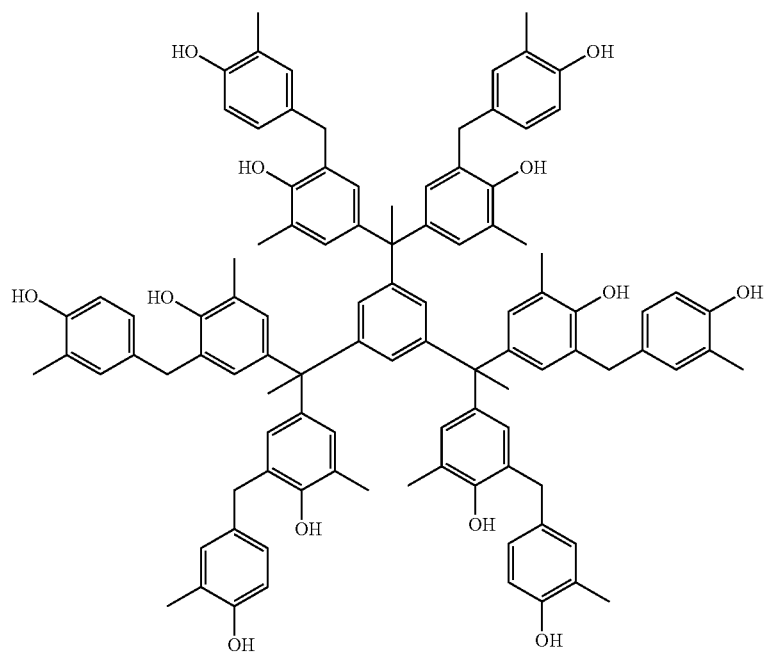

-continued
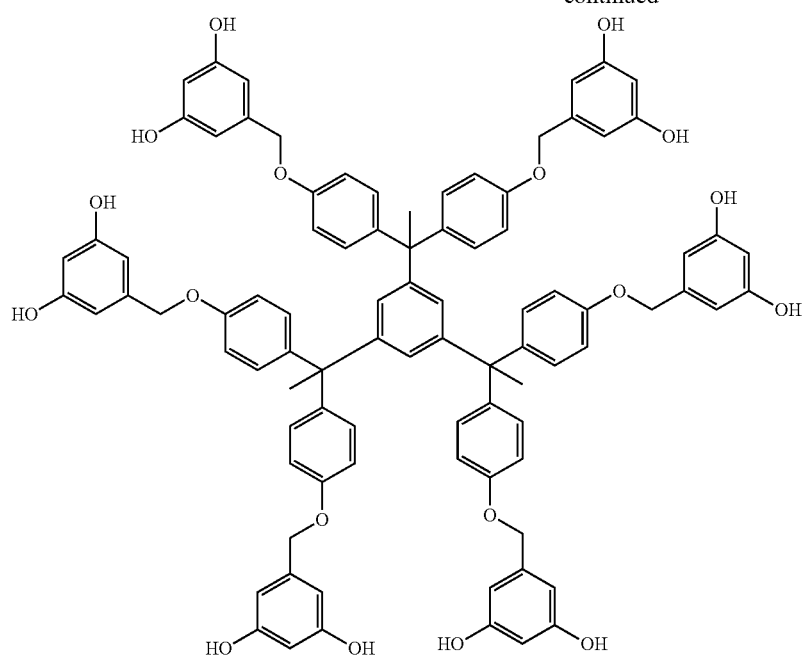
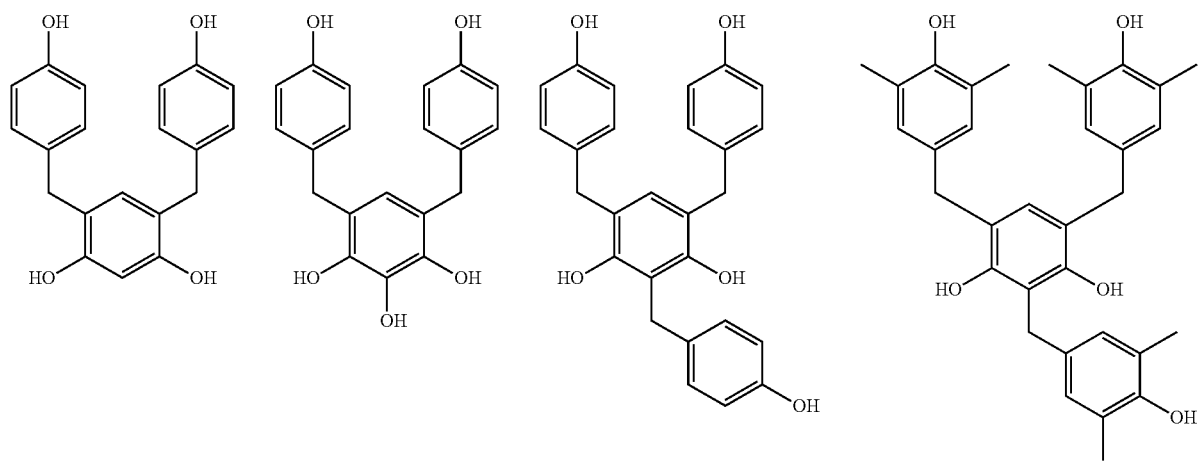
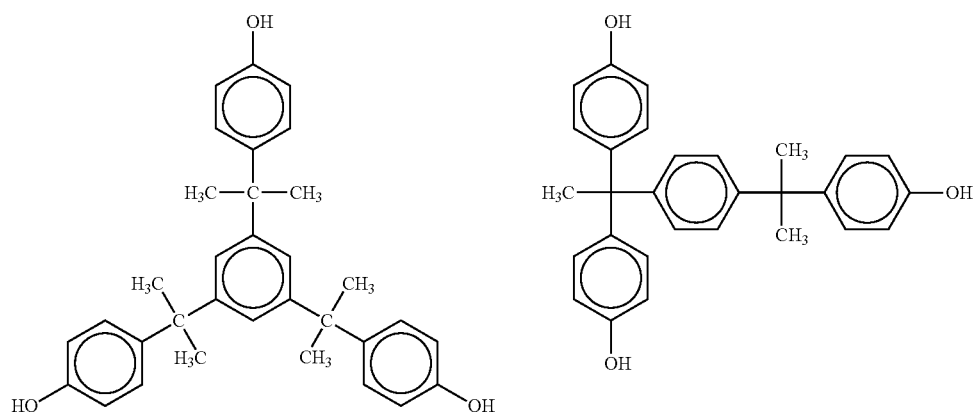

-continued
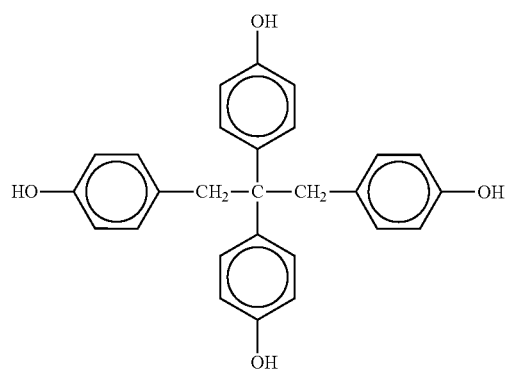
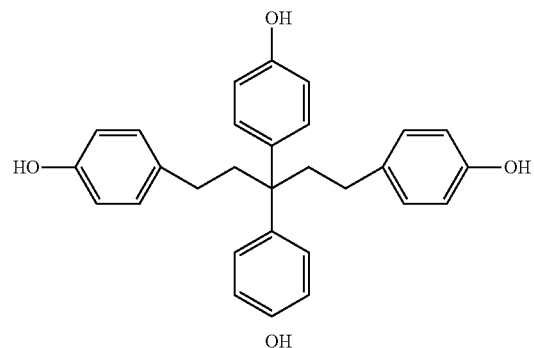
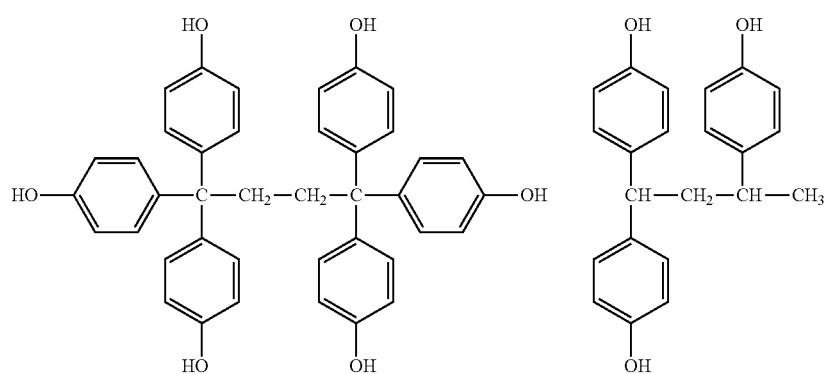
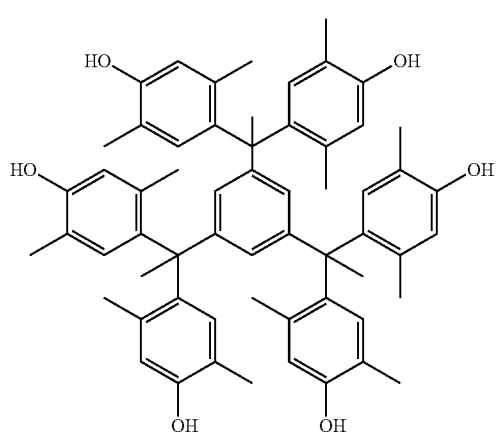
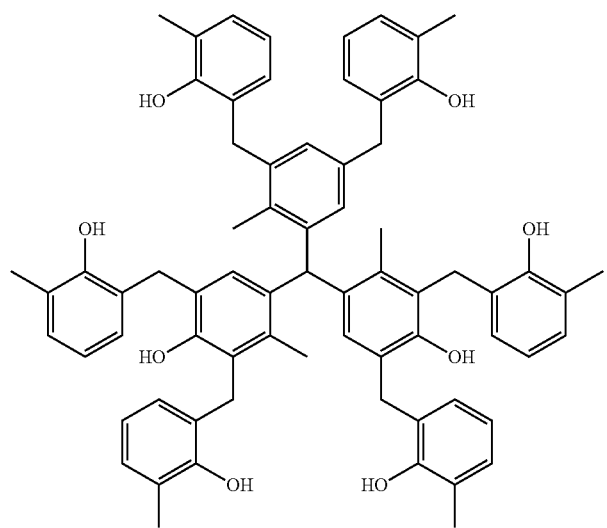

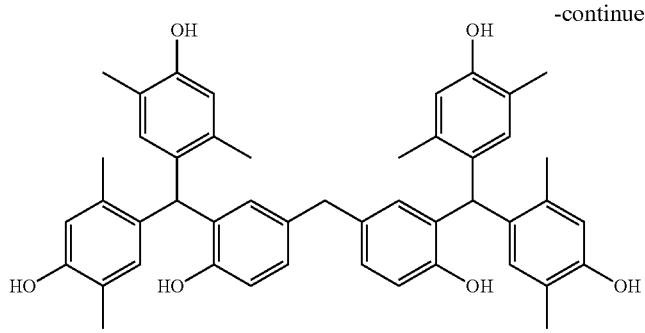
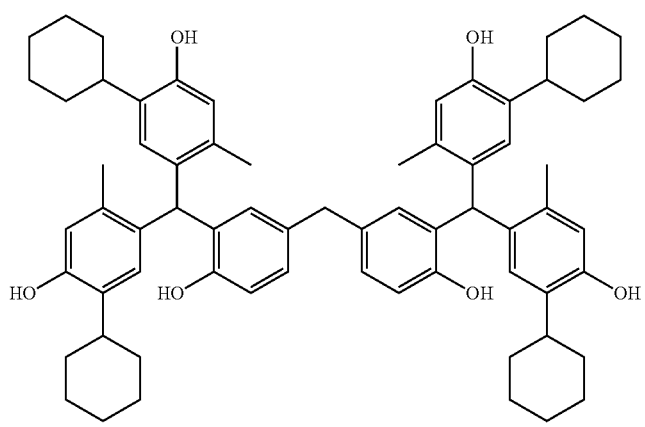
Particular examples of the scaffold compounds for the compounds (P) of general formula (T-II) are shown below, which however in no way limit the scope of the present invention.
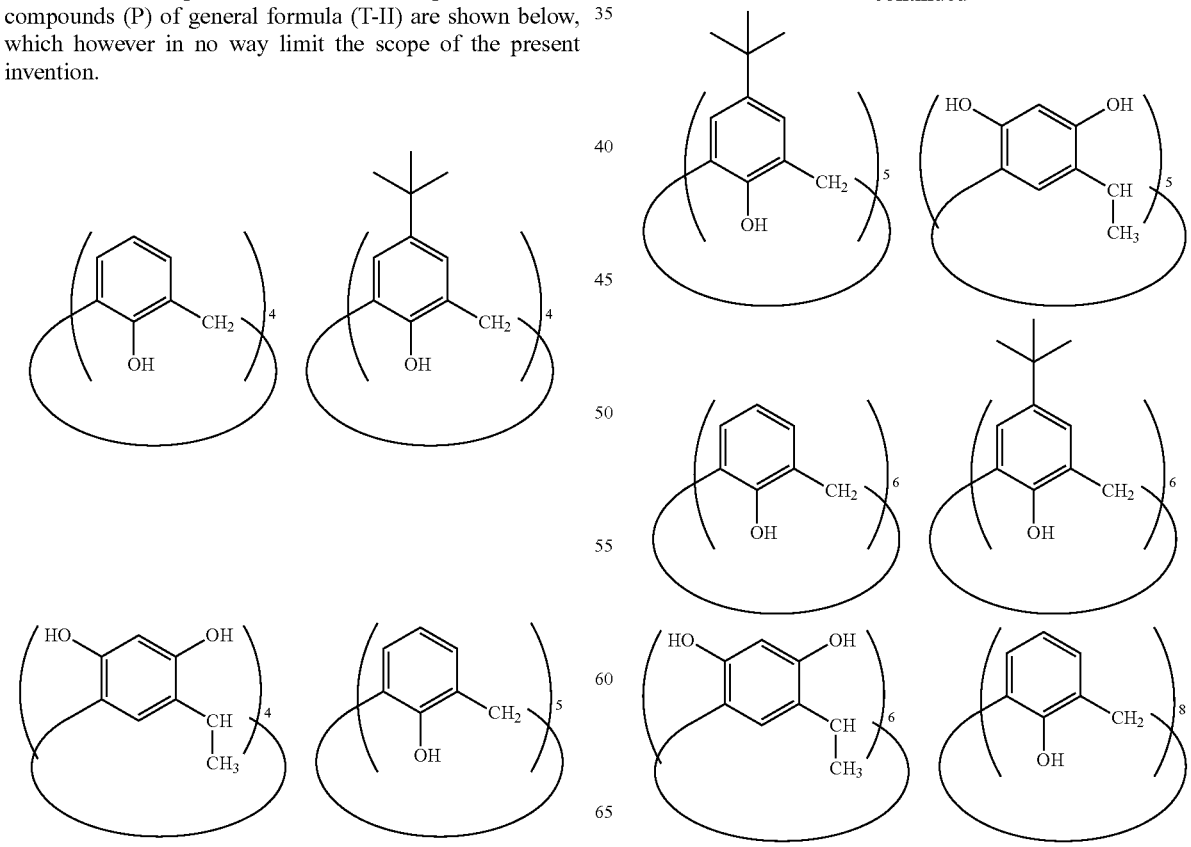

-continued

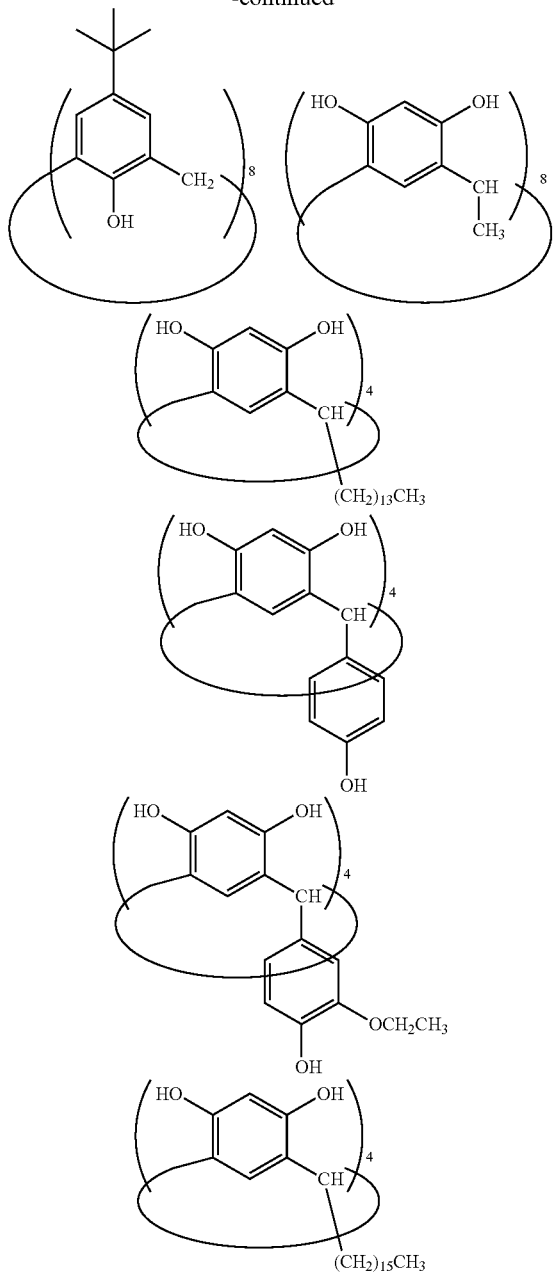

<Other Component>

The composition of the present invention may further contain a basic compound, an acid-decomposable resin, a photoacid generator, an organic solvent, a surfactant, an acid-decomposable dissolution inhibiting compound, a dye, a plasticizer, a photosensitizes, a compound capable of increasing the solubility in a developer, a compound containing a functional group as a proton acceptor, etc.

[2] Basic Compound

The composition of the present invention may further contain a basic compound. Any change over time of performance during the period from exposure to baking can be reduced by further containing a basic compound. Moreover, if so, the in-film diffusion of an acid generated upon exposure can be controlled.

The basic compound is preferably a nitrogen-containing organic compound. Useful compounds are not particularly limited. However, for example, the compounds of categories (1) to (4) below can be used.

(1) Compounds of General Formula (BS-1) Below

In general formula (BS-1), each of R's independently represents a hydrogen atom or an organic group, provided that at least one of three R's is an organic group. The organic group is a linear or branched alkyl group, a mono- or polycycloalkyl group, an aryl group or an aralkyl group.

The number of carbon atoms of the alkyl group represented by R is not particularly limited. However, it is generally in the range of 1 to 20, preferably 1 to 12.

The number of carbon atoms of the cycloalkyl group represented by R is not particularly limited. However, it is generally in the range of 3 to 20, preferably 5 to 15.

The number of carbon atoms of the aryl group represented by R is not particularly limited. However, it is generally in the range of 6 to 20, preferably 6 to 10. In particular, a phenyl group, a naphthyl group and the like can be mentioned.

The number of carbon atoms of the aralkyl group represented by R is not particularly limited. However, it is generally in the range of 7 to 20, preferably 7 to 11. In particular, a benzyl group and the like can be mentioned.

In the alkyl group, cycloalkyl group, aryl group and aralkyl group represented by R, a hydrogen atom thereof may be replaced by a substituent. As the substituent, there can be mentioned, for example, an alkyl group, a cycloalkyl group, an aryl group, an aralkyl group, a hydroxyl group, a carboxyl group, an alkoxy group, an aryloxy group, an alkylcarbonyloxy group, an alkyloxycarbonyl group or the like.

In the compounds of general formula (BS-1), preferably, at least two of R's are organic groups.

Specific examples of the compounds of general formula (BS-1) include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline and 2,4,6-tri(t-butyl)aniline.

As preferred basic compounds of general formula (BS-1), there can be mentioned those in which at least one of R's is a hydroxylated alkyl group. In particular, there can be mentioned, for example, triethanolamine and N,N-dihydroxyethylaniline.

With respect to the alkyl group represented by R, an oxygen atom may be present in the alkyl chain. Namely, an oxyalkylene chain may be formed. The oxyalkylene chain is preferably —CH$_2$CH$_2$O—. In particular, there can be mentioned, for example, tris(methoxyethoxyethyl)amine and compounds shown by way of example in column 3 line 60 et seq. of U.S. Pat. No. 6,040,112.

(2) Compound with Nitrogen-Containing Heterocyclic structure

The nitrogen-containing heterocycle may be aromatic or nonaromatic. It may contain a plurality of nitrogen atoms, and also may contain a heteroatom other than nitrogen. For example, there can be mentioned compounds with an imidazole structure (2-phenylbenzimidazole, 2,4,5-triphenylimidazole and the like), compounds with a piperidine structure (N-hydroxyethylpiperidine, bis(1,2,2,6,6-pentamethyl-4-piperidyl) sebacate and the like), compounds with a pyridine structure (4-dimethylaminopyridine and the like) and compounds with an antipyrine structure (antipyrine, hydroxyantipyrine and the like).

Further, compounds with two or more ring structures can be appropriately used. In particular, there can be mentioned, for example, 1,5-diazabicyclo[4.3.0]non-5-ene and 1,8-diazabicyclo[5.4.0]-undec-7-ene.

(3) Amine Compound with Phenoxy Group

The amine compounds with a phenoxy group are those having a phenoxy group at the end of the alkyl group of each of the amine compounds opposite to the nitrogen atom. A substituent may be introduced in the phenoxy group. The substituent is, for example, an alkyl group, an alkoxy group, a halogen atom, a cyano group, a nitro group, a carboxyl group, a carboxylic ester group, a sulfonic ester group, an aryl group, an aralkyl group, an acyloxy group or an aryloxy group.

Each of these compounds preferably contains at least one oxyalkylene chain between the phenoxy group and the nitrogen atom. The number of oxyalkylene chains in each molecule is preferably in the range of 3 to 9, more preferably 4 to 6. Among the oxyalkylene chains, —$CH_2CH_2O$— is most preferred.

Particular examples thereof include 2-[2-{2-(2,2-dimethoxy-phenoxyethoxy)ethyl}-bis-(2-methoxyethyl)]-amine and compounds (C1-1) to (C3-3) shown by way of example in section [0066] of US Patent Application Publication No. 2007/0224539 A1.

(4) Ammonium Salt

Ammonium salts can also be appropriately used. Ammonium hydroxides and carboxylates are preferred. Particular preferred examples thereof are tetraalkylammonium hydroxides, such as tetrabutylammonium hydroxide.

As other basic compounds usable in the composition of the present invention, there can be mentioned compounds synthesized in Examples of JP-A-2002-363146, compounds described in section [0108] of JPA-2007-298569 and the like Further, photosensitive basic compounds may be used as the basic compound. As photosensitive basic compounds, use can be made of, for example, the compounds described in Jpn. PCT National Publication No. 2003-524799, J. Photopolym. Sci&Tech. Vol. 8, pp. 543-553 (1995), etc.

The molecular weight of each of these basic compounds is preferably in the range of 250 to 2000, more preferably 400 to 1000.

One of these basic compounds may be used alone, or two or more thereof may be used in combination.

When the composition of the present invention contains any of these basic compounds, the content thereof based on the total solids of the composition is generally in the range of 0.001 to 10 mass %, preferably 0.01 to 5 mass %.

The molar ratio of photoacid generator to be described hereinafter to basic compound is preferably in the range of 1.5 to 300. Namely, a molar ratio of 1.5 or higher is preferred from the viewpoint of the enhancement of sensitivity and resolution. A molar ratio of 300 or below is preferred from the viewpoint of the inhibition of any resolution deterioration due to pattern thickening over time until baking treatment after exposure. The molar ratio is more preferably in the range of 2.0 to 200, further more preferably 2.5 to 150.

When the compound (P) contains any of repeating units of general formula (4) described above, the photoacid generator mentioned in the above molar ratio refers to the total amount of the repeating unit and the photoacid generator to be described hereinafter.

[3] Acid-Decomposable Resin

The composition of the present invention may further contain, other than the compounds (P), a resin that when acted on by an acid, is decomposed to thereby increase its rate of dissolution in an alkali aqueous solution, namely an acid-decomposable resin.

The acid-decomposable resin typically contains a group that is decomposed by the action of an acid to thereby produce an alkali soluble group (hereinafter also referred to as an acid-decomposable group). This resin may contain the acid-decomposable group in either its principal chain or side chain, or both thereof. It is preferred for the resin to contain the acid-decomposable group in its side chain.

The acid-decomposable resin can be obtained by, for example, either reacting the precursor of a group cleavable under the action of an acid with an alkali-soluble resin, or copolymerizing an alkali-soluble resin monomer to which a group cleavable under the action of an acid is bonded with any of various monomers, as described in, for example, European Patent No. 254853 and JP-A's H2-25850, H3-223860 and H4-251259.

It is preferred for the acid-decomposable group to be a group as obtained by substituting the hydrogen atom of an alkali-soluble group, such as —COOH or —OH, with a group cleavable under the action of an acid.

Particular examples and preferred examples of the acid-decomposable groups are the same as set forth above in connection with "$OY^1$" of general formula (3) and "$COOY^2$" of general formula (4) with respect to resin (P).

The above alkali-soluble resin is not particularly limited. As the same, for example, there can be mentioned a resin containing a phenolic hydroxyl group, or a resin comprising a repeating unit containing a carboxyl group, such as (meth) acrylic acid or norbornenecarboxylic acid.

As preferred resins containing a phenolic hydroxyl group, there can be mentioned poly(o-hydroxystyrene), poly(m-hydroxystyrene), poly(p-hydroxystyrene), copolymers of these, a hydrogenated poly(hydroxystyrene), poly(hydroxystyrene) polymers containing substituents of the structures shown below, a styrene-hydroxystyrene copolymer, an α-methylstyrene-hydroxystyrene copolymer and an alkali-soluble resin with a hydroxystyrene structural unit, such as a hydrogenated novolak resin.

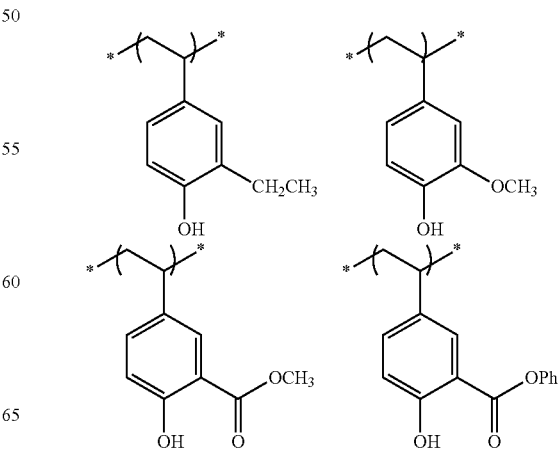

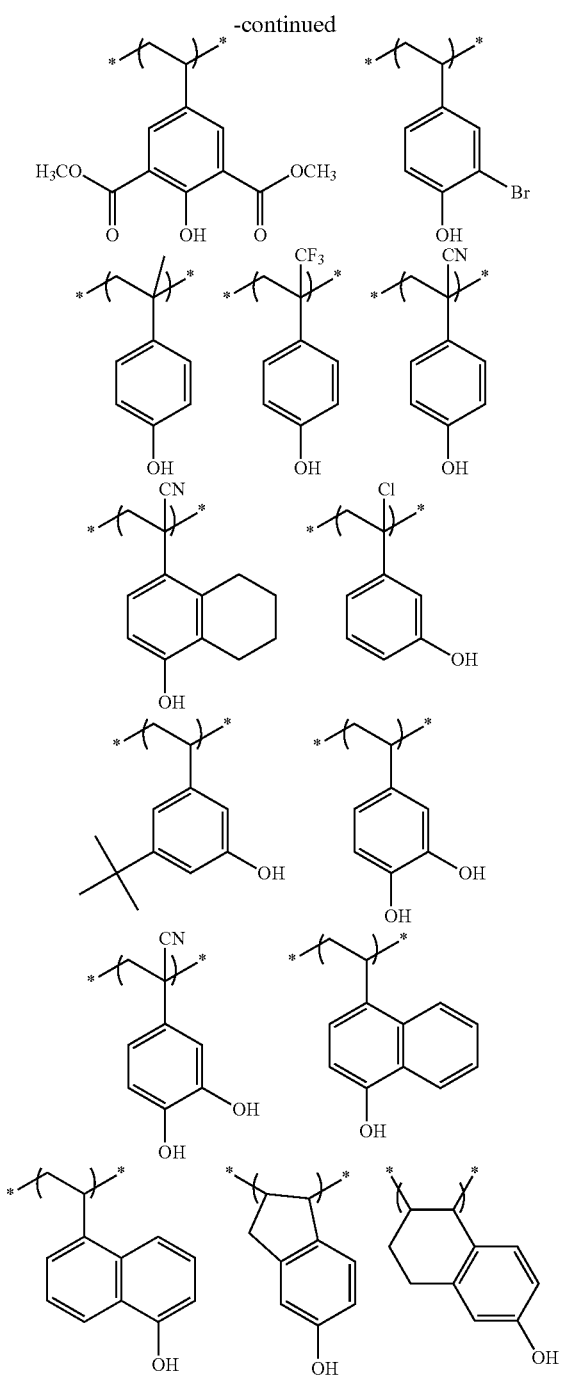

The alkali dissolution rate of these alkali-soluble resins as measured in a 2.38 mass % tetramethylammonium hydroxide (TMAH) solution at 23° C. is preferably 170 Å/sec or greater, more preferably 330 Å/sec or greater. In particular, the alkali dissolution rate can be determined by dissolving only an alkali-soluble resin in a solvent, such as propylene glycol monomethyl ether acetate (PGMEA), to thereby obtain a composition of 4 mass % solid content, subsequently applying the composition on a silicon wafer to thereby form a film (thickness: 100 nm) and thereafter measuring the time (second) required for complete dissolution of the film in the aqueous TMAH solution.

As monomers that can be employed as a starting material for these resins, there can be mentioned, for example, an alkylcarbonyloxystyrene (e.g., t-butoxycarbonyloxystyrene), an alkoxystyrene (e.g., a 1-alkoxyethoxystyrene or t-butoxystyrene), and a (meth)acrylic acid tertiary alkyl ester (e.g., t-butyl (meth)acrylate, a 2-alkyl-2-adamantyl(meth)acrylate or a dialkyl(1-adamantyl)methyl (meth)acrylate).

When the composition of the present invention is exposed to a KrF excimer laser light, electron beams, X-rays or high-energy light rays of wavelength 50 nm or shorter (for example, EUV), it is preferred for the acid-decomposable resin to comprise a repeating unit containing an aromatic group. It is especially preferred to comprise hydroxystyrene as a repeating unit. As such a resin, there can be mentioned, for example, a copolymer of hydroxystyrene/hydroxystyrene protected by a group cleavable under the action of an acid, or a copolymer of hydroxystyrene/(meth)acrylic acid tertiary alkyl ester.

The acid-decomposable resin is most preferably a resin comprising any of repeating units of general formula (3) above.

The acid-decomposable resin may comprise any of repeating units derived from other polymerizable monomers. As such other polymerizable monomers, there can be mentioned, for example, those set forth above as other polymerizable monomers that can be contained in the compound (P). The content of repeating units derived from such other polymerizable monomers based on all the repeating units is generally 50 mol % or less, preferably 30 mol % or less.

Furthermore, the acid-decomposable resin may contain a repeating unit containing an alkali-soluble group, such as a hydroxyl group, a carboxyl group or a sulfonic acid group. In that instance, the content of repeating unit containing an alkali-soluble group based on all the repeating units constituting the acid-decomposable resin is preferably in the range of 1 to 99 mol %, more preferably 3 to 95 mol % and most preferably 5 to 90 mol %.

The content of repeating unit containing an acid-decomposable group based on all the repeating units constituting the acid-decomposable resin is preferably in the range of 3 to 95 mol %, more preferably 5 to 90 mol % and most preferably 10 to 85 mol %.

The weight average molecular weight of the acid-decomposable resin in terms of polystyrene-equivalent value measured by GPC (solvent: THF) is preferably 50,000 or less, more preferably 1000 to 20,000 and most preferably 1000 to 10,000.

The polydispersity index (Mw/Mn) of the acid-decomposable resin is preferably in the range of 1.0 to 3.0, more preferably 1.05 to 2.0 and further more preferably 1.1 to 1.7.

Two or more types of acid-decomposable resins may be used in combination.

Nonlimiting particular preferred examples of acid-decomposable resins are shown below.

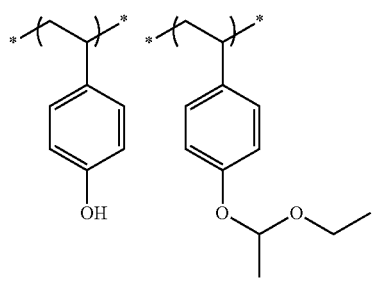

139
-continued
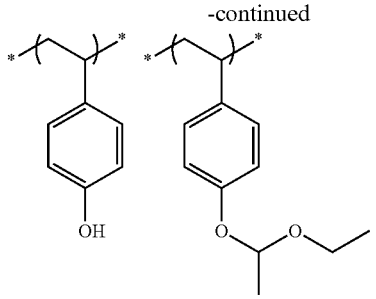 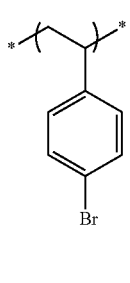 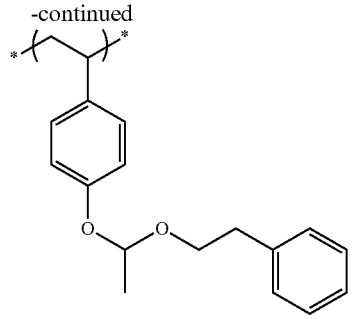
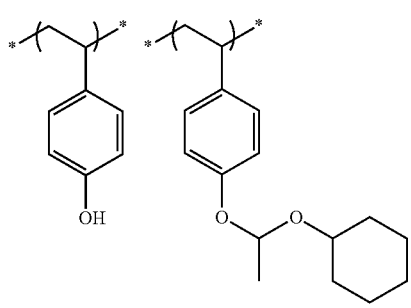
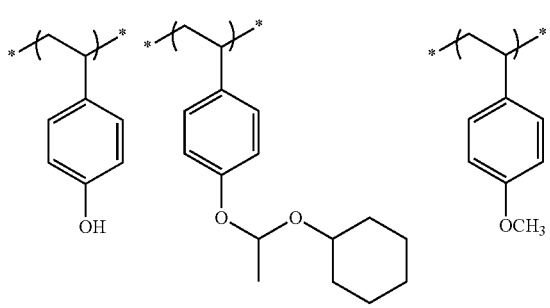
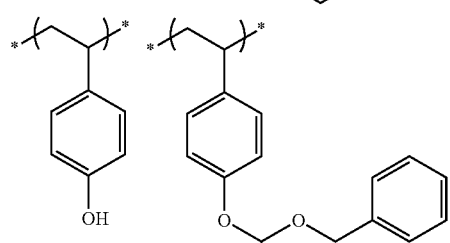
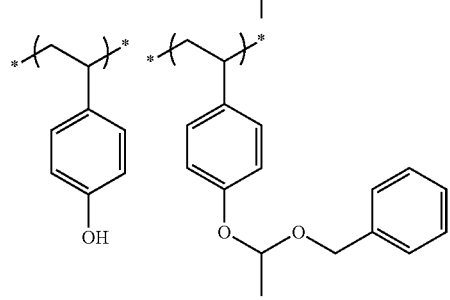
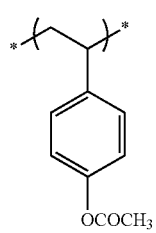
140
-continued
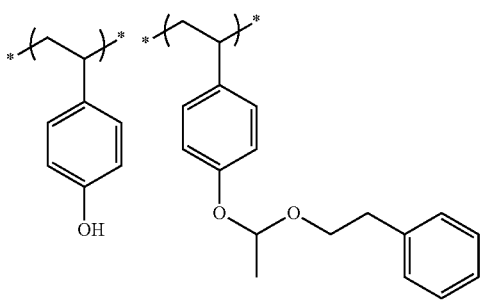
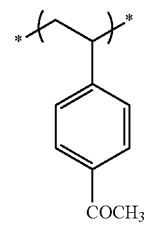
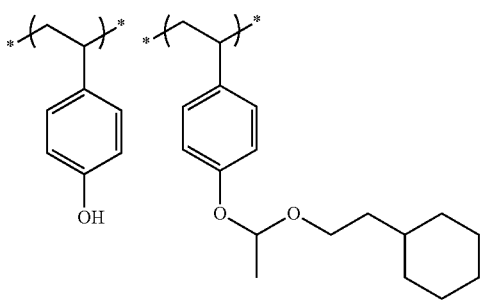
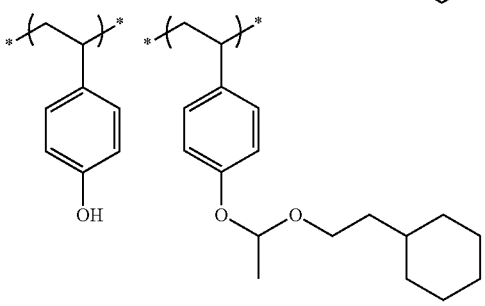
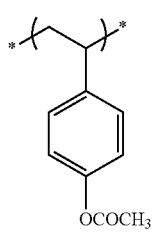

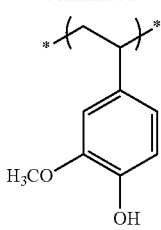
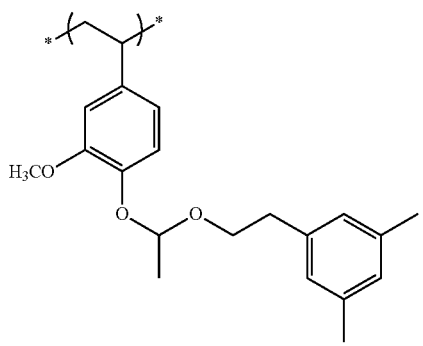
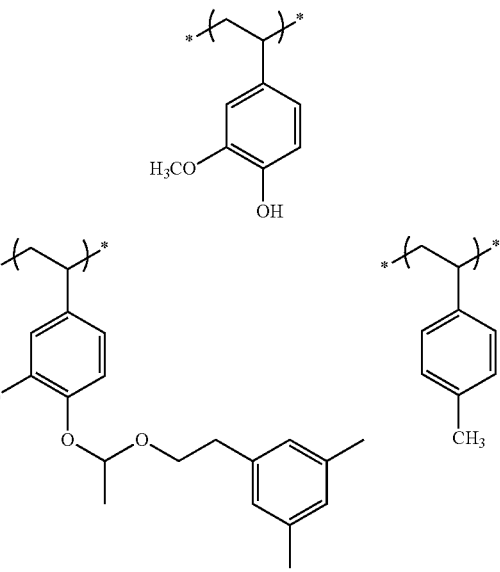
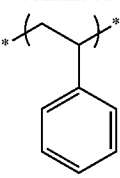
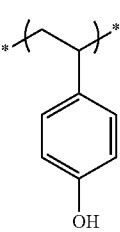
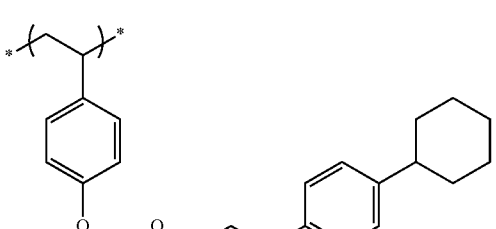
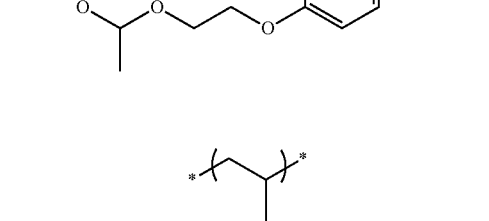
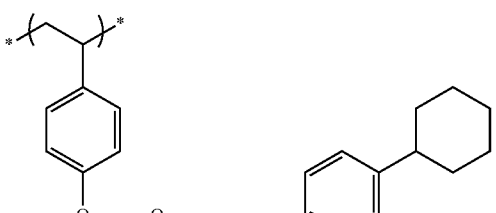
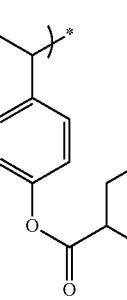

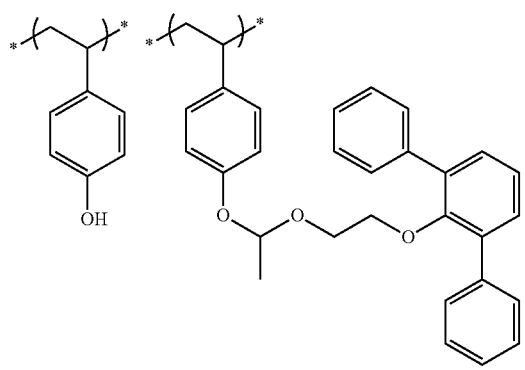
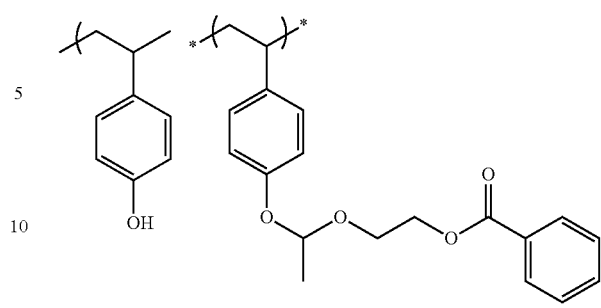
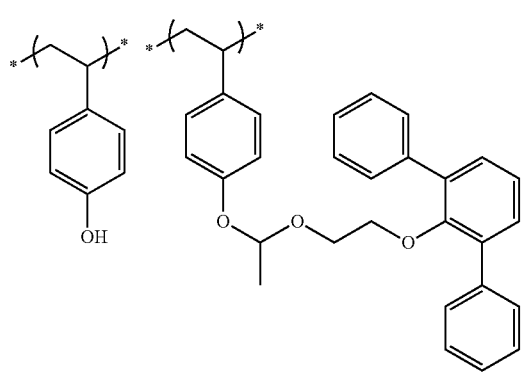
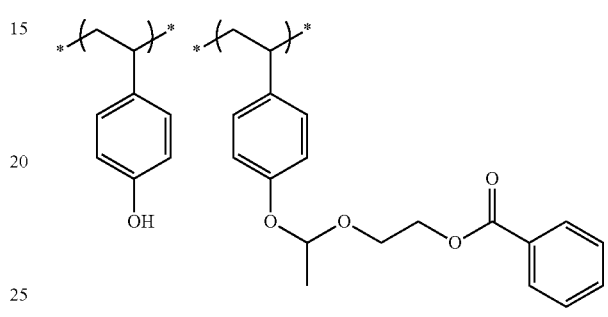
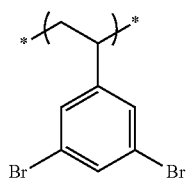
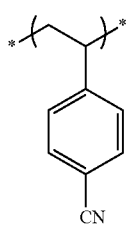
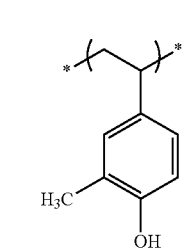
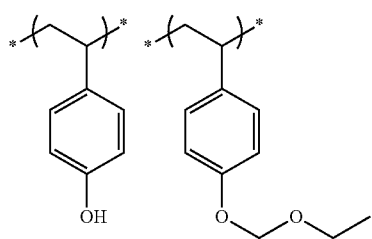
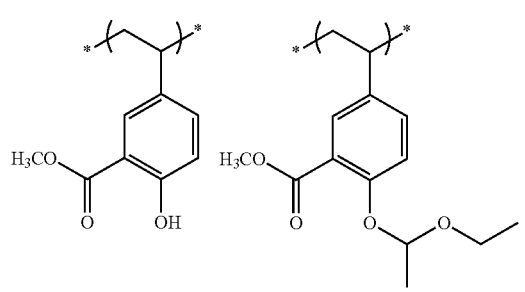
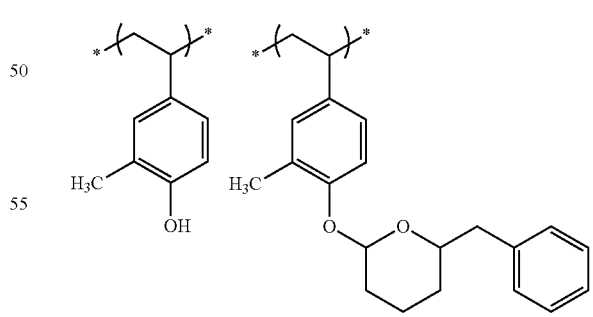
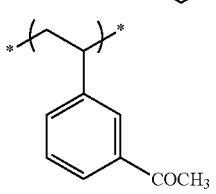

145
-continued
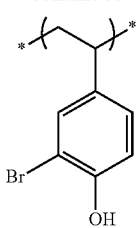
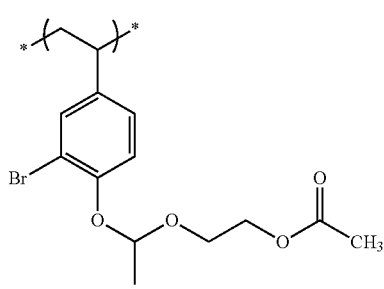
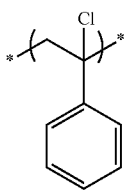
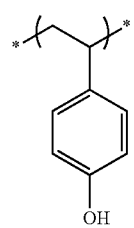
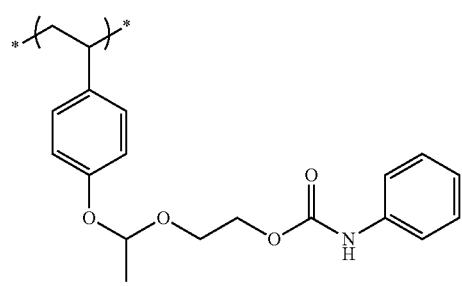
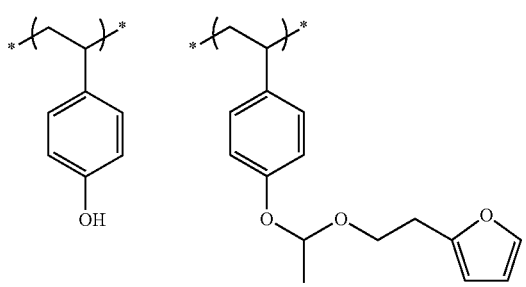
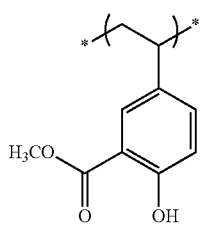
146
-continued
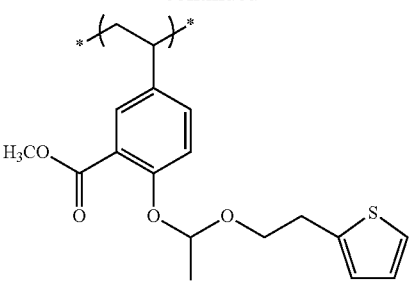
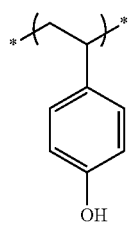
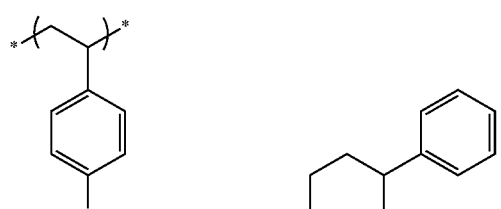
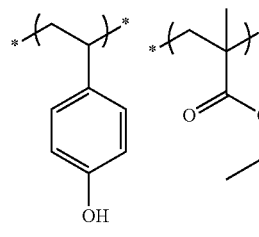
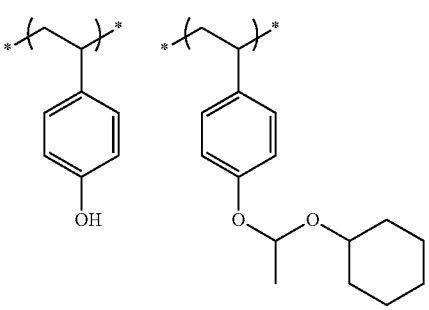
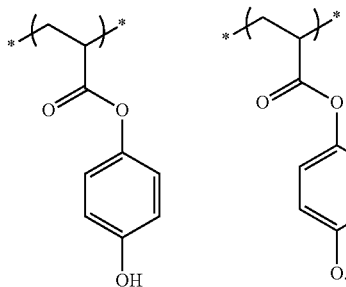

-continued

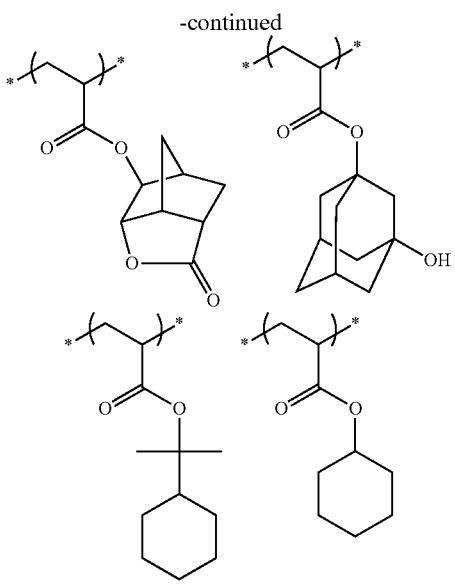

When the composition of the present invention contains a resin other than the compounds (P), the content thereof based on the total solids of the composition is preferably in the range of 0.5 to 80 mass %, more preferably 5 to 50 mass % and further more preferably 10 to 30 mass %.

[4] Photoacid Generator

The photoacid generator is a compound that when irradiated with actinic rays or radiation, generates an acid. As the photoacid generator, use can be made of a member appropriately selected from among a photoinitiator for photocationic polymerization, a photoinitiator for photoradical polymerization, a photo-achromatic agent of dyes, a photo-discoloring agent, any of publicly known compounds that when irradiated with actinic rays or radiation, generate an acid, employed in a microresist, etc., and mixtures thereof. As examples of the photoacid generators, there can be mentioned a sulfonium salt, an iodonium salt and a bis(alkylsulfonyldiazomethane).

As preferred compounds among the acid generators, those represented by general formulae (ZI), (ZII) and (ZIII) below can be exemplified.

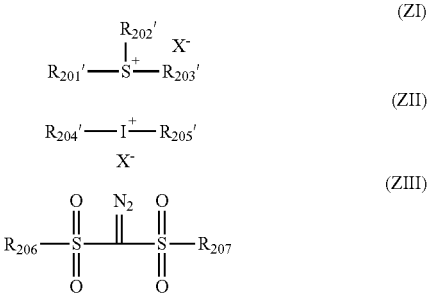

In general formula (ZI), each of $R_{201'}$, $R_{202'}$ and $R_{203'}$ independently represents an organic group. The number of carbon atoms of each of the organic groups represented by $R_{201'}$, $R_{202'}$ and $R_{203'}$ is generally in the range of 1 to 30, preferably 1 to 20.

Two selected from among $R_{201'}$, $R_{202'}$ and $R_{203'}$, may be bonded via a single bond or a connecting group to each other to thereby form a ring. The connecting group may be any of an ether bond, a thioether bond, an ester bond, an amido bond, a carbonyl group, a methylene group or an ethylene group. As the group formed by bonding of two of $R_{201'}$ to $R_{203'}$, there can be mentioned an alkylene group (for example, a butylene group or a pentylene group).

As the specific examples of $R_{201'}$, $R_{202'}$ and $R_{203'}$, there can be mentioned, for example, corresponding groups of compounds (ZI-1), (ZI-2) and (ZI-3) to be described hereinafter.

X⁻ represents a nonnucleophilic anion. As a preferred such nonnucleophilic anion, there can be mentioned sulfonate anion, bis(alkylsulfonyl)amido anion or tris(alkylsulfonyl)methide anion, $BF_4^-$, $PF_6^-$, $SbF_6^-$, etc. Especially preferably, such nonnucleophilic anion is an organic anion having a carbon atom.

As preferred organic anions, there can be mentioned those of formulae AN1 to AN3 below.

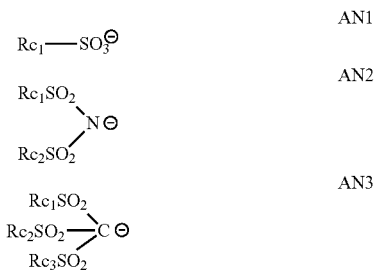

In the formulae AN1 to AN3, each of $R_{C1}$ to $R_{C3}$ independently represents an organic group. As the organic groups represented by $R_{C1}$ to $R_{C3}$, there can be mentioned those having 1 to 30 carbon atoms. As preferred examples, there can be mentioned an alkyl group, an aryl group, or groups derived from linkage of two or more thereof by means of a single bond or a connecting group such as —O—, —$CO_2$—, —S—, —$SO_3$— or —$SO_2N(Rd_1)$-. $Rd_1$ represents a hydrogen atom or an alkyl group, and may form a ring structure in cooperation with a bonded alkyl group or aryl group.

The organic groups represented by $R_{C1}$ to $R_{C3}$ may be alkyl groups substituted at the 1-position thereof with a fluorine atom or a fluoroalkyl group or phenyl groups substituted with a fluorine atom or a fluoroalkyl group. The acidity of the acid generated upon exposure to light can be enhanced by introducing a fluorine atom or a fluoroalkyl group. Accordingly, the sensitivity of the actinic-ray- or radiation-sensitive resin composition can be enhanced. In this connection, $Rc_1$ to $Rc_3$ may be bonded to another alkyl group or aryl group or the like to thereby form a ring structure.

X⁻ is preferably any of sulfonate anions of general formulae (SA1) and (SA2) below:

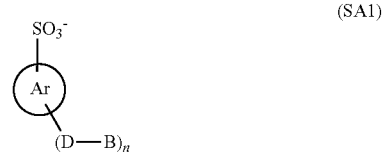

In formula (SA1),

Ar represents an aryl group, in which a substituent other than sulfonate anions and -(D-B) groups may further be introduced.

In the formula, n is an integer of 1 or greater, preferably in the range of 1 to 4, more preferably 2 or 3 and most preferably 3.

D represents a single bond or a bivalent connecting group. As the bivalent connecting group, there can be mentioned an ether group, a thioether group, a carbonyl group, a sulfoxide group, a sulfon group, a sulfonic ester group, an ester group, a combination of two or more of these, or the like.

B represents a hydrocarbon group.

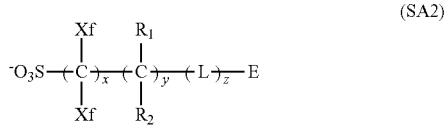
(SA2)

In formula (SA2), each of Xf's independently represents a fluorine atom or an alkyl group substituted with at least one fluorine atom.

Each of $R_1$ and $R_2$ independently represents a hydrogen atom, a fluorine atom or an alkyl group. Two or more $R_1$s, and $R_2$s may be identical to or different from each other.

L represents a bivalent connecting group. Two or more L's may be identical to or different from each other.

E represents a cyclic organic group, and x is an integer of 1 to 20, y an integer of 0 to 10, and z an integer of 0 to 10.

First, the sulfonate anions of formula (SA1) will be described in detail below.

In formula (SA1), Ar is preferably an aromatic ring having 6 to 30 carbon atoms. In particular, Ar is, for example, a benzene ring, a naphthalene ring, a pentalene ring, an indene ring, an azulene ring, a heptalene ring, an indecene ring, a perylene ring, a pentacene ring, an acenaphthalene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring or a phenazine ring. Of these, a benzene ring, a naphthalene ring and an anthracene ring are preferred from the viewpoint of the simultaneous attainment of roughness and sensitivity enhancements. A benzene ring is more preferred.

When a substituent other than sulfonate anions and -(D-B) groups is further introduced in Ar, the substituent is, for example, a halogen atom, such as a fluorine atom, a chlorine atom, a bromine atom or an iodine atom; a hydroxyl group; a carboxyl group; or a sulfonic acid group.

In formula (SA1), D is preferably a single bond or an ether or ester group. More preferably, D is a single bond.

In formula (SA1), B is, for example, an alkyl group, an alkenyl group, an alkynyl group, an aryl group or a cycloalkyl group. B is preferably an alkyl group or a cycloalkyl group, more preferably a cycloalkyl group. A substituent may be introduced in each of the alkyl group, alkenyl group, alkynyl group, aryl group and cycloalkyl group represented by B.

The alkyl group represented by B is preferably a branched alkyl group. As the branched alkyl group, there can be mentioned, for example, an isopropyl group, a tert-butyl group, a tert-pentyl group, a neopentyl group, a sec-butyl group, an isobutyl group, an isohexyl group, a 3,3-dimethylpentyl group or a 2-ethylhexyl group.

As the alkenyl group represented by B, there can be mentioned, for example, a vinyl group, a propenyl group or a hexenyl group.

As the alkynyl group represented by B, there can be mentioned, for example, a propynyl group or a hexynyl group.

As the aryl group represented by B, there can be mentioned, for example, a phenyl group or a p-tolyl group.

The cycloalkyl group represented by B may be a monocycloalkyl group or a polycycloalkyl group. As the monocycloalkyl group, there can be mentioned, for example, a cyclopropyl group, a cyclobutyl group, a cyclopentyl group, a cyclohexyl group, a cycloheptyl group or a cyclooctyl group. As the polycycloalkyl group, there can be mentioned, for example, an adamantyl group, a norbornyl group, a bornyl group, a camphenyl group, a decahydronaphthyl group, a tricyclodecanyl group, a tetracyclodecanyl group, a camphoroyl group, a dicyclohexyl group or a pinenyl group.

When a substituent is introduced in each of the alkyl group, alkenyl group, alkynyl group, aryl group and cycloalkyl group represented by B, the substituent is, for example, as follows. Namely, as the substituent, there can be mentioned a halogen atom, such as a fluorine atom, a chlorine atom, a bromine atom or an iodine atom; an alkoxy group, such as a methoxy group, an ethoxy group or a tert-butoxy group; an aryloxy group, such as a phenoxy group or a p-tolyloxy group; an alkylthioxy group, such as a methylthioxy group, an ethylthioxy group or a tert-butylthioxy group; an arylthioxy group, such as a phenylthioxy group or a p-tolylthioxy group; an alkoxy- or aryloxycarbonyl group, such as a methoxycarbonyl group, a butoxycarbonyl group or a phenoxycarbonyl group; an acetoxy group; a linear or branched alkyl group, such as a methyl group, an ethyl group, a propyl group, a butyl group, a heptyl group, a hexyl group, a dodecyl group or a 2-ethylhexyl group; a cycloalkyl group, such as a cyclohexyl group; an alkenyl group, such as a vinyl group, a propenyl group or a hexenyl group; an alkynyl group, such as an acetylene group, a propynyl group or a hexynyl group; an aryl group, such as a phenyl group or a tolyl group; a hydroxyl group; a carboxyl group; a sulfonic acid group; a carbonyl group; or the like. Of these, a linear or branched alkyl group is preferred from the viewpoint of the simultaneous attainment of roughness and sensitivity enhancements.

Now, the sulfonate anions of formula (SA2) will be described in detail below.

In formula (SA2), Xf represents a fluorine atom or an alkyl group substituted with at least one fluorine atom. This alkyl group preferably contains 1 to 10 carbon atoms, more preferably 1 to 4 carbon atoms. The alkyl group substituted with a fluorine atom is preferably a perfluoroalkyl group.

Xf is preferably a fluorine atom or a perfluoroalkyl group having 1 to 4 carbon atoms. In particular, Xf is preferably a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ or $CH_2CH_2C_4F_9$. Of these, a fluorine atom and $CF_3$ are preferred. A fluorine atom is most preferred.

In formula (SA2), each of $R_1$ and $R_2$ independently represents a hydrogen atom, a fluorine atom or an alkyl group. A substituent (preferably, a fluorine atom) may be introduced in the alkyl group. The alkyl group preferably has 1 to 4 carbon atoms. The optionally substituted alkyl group represented by $R_1$ or $R_2$ is most preferably a perfluoroalkyl group having 1 to 4 carbon atoms. In particular, as the substituted alkyl group represented by $R_1$ or $R_2$, there can be mentioned $CF_3$, $C_2F_5$, $C_3F_7$, $C_4F_9$, $C_5F_{11}$, $C_6F_{13}$, $C_7F_{15}$, $C_8F_{17}$, $CH_2CF_3$, CH$_2$CH$_2$CF$_3$, CH$_2$C$_2$F$_5$, CH$_2$CH$_2$C$_2$F$_5$, CH$_2$C$_3$F$_7$, CH$_2$CH$_2$C$_3$F$_7$, CH$_2$C$_4$F$_9$ or CH$_2$CH$_2$C$_4$F$_9$. Of these, CF$_3$ is preferred.

In formula (SA2), x is preferably 1 to 8, more preferably 1 to 4; y is preferably 0 to 4, more preferably 0; and z is preferably 0 to 8, more preferably 0 to 4.

In formula (SA2), L represents a single bond or a bivalent connecting group. As the bivalent connecting group, there can be mentioned, for example, —COO—, —OCO—, —CO—, —O—, —S—, —SO—, —SO$_2$—, an alkylene group, a cycloalkylene group, an alkenylene group or a combination of two or more of these. The sum of carbon atoms thereof is preferably 20 or less. Of these, —COO—, —COO—, —CO—, —O—, —S—, —SO— and —SO$_2$— are preferred. —COO—, —COO— and —SO$_2$— are more preferred.

In formula (SA2), E represents a cyclic organic group. E is, for example, a cycloaliphatic group, an aryl group or a heterocyclic group.

The cycloaliphatic group represented by E may have a monocyclic structure or a polycyclic structure. The cycloaliphatic group with a monocyclic structure is preferably a monocycloalkyl group, such as a cyclopentyl group, a cyclohexyl group or a cyclooctyl group. The cycloaliphatic group with a polycyclic structure is preferably a polycycloalkyl group, such as a norbornyl group, a tricyclodecanyl group, a tetracyclodecanyl group, a tetracyclododecanyl group or an adamantyl group. In particular, when a cycloaliphatic group with a bulky structure of 6 or more-membered ring is employed as E, any in-film diffusion in the PEB (post-exposure bake) operation can be suppressed, and the resolving power and EL (exposure latitude) can be enhanced.

The aryl group represented by E is, for example, a benzene ring, a naphthalene ring, a phenanthrene ring or an anthracene ring.

It is optional for the heterocyclic group represented by E to have any aromaticity. The heteroatom contained in this group is preferably a nitrogen atom or an oxygen atom. As particular examples of the heterocyclic structures, there can be mentioned a furan ring, a thiophene ring, a benzofuran ring, a benzothiophene ring, a dibenzofuran ring, a dibenzothiophene ring, a pyridine ring, a piperidine ring, a morpholine ring and the like. Of these, a furan ring, a thiophene ring, a pyridine ring, a piperidine ring and a morpholine ring are preferred.

A substituent may be introduced in E. As the substituent, there can be mentioned, for example, an alkyl group (may be any of linear, branched and cyclic forms, preferably having 1 to 12 carbon atoms), an aryl group (preferably having 6 to 14 carbon atoms), a hydroxyl group, an alkoxy group, an ester group, an amido group, a urethane group, a ureido group, a thioether group, a sulfonamido group or a sulfonic ester group.

As a photoacid generator, use may be made of a compound with a plurality of structures of general formula (ZI). For example, use may be made of compounds with a structure wherein at least one of R$_{201}$' to R$_{203}$' of any of compounds of general formula (ZI) is bonded to at least one of R$_{201}$' to R$_{203}$' of another of compounds of general formula (ZI).

As further preferred (ZI) components, there can be mentioned the following compounds (ZI-1) to (ZI-4).

Compounds (ZI-1) are compounds of general formula (ZI) above wherein at least one of R$_{201}$' to R$_{203}$' is an aryl group. Namely, compounds (ZI-1) are arylsulfonium compounds, i.e., compounds each containing an arylsulfonium as a cation.

With respect to the compounds (ZI-1), all of R$_{201}$' to R$_{203}$' may be aryl groups. It is also appropriate that R$_{201}$' to R$_{203}$' are partially an aryl group and the remainder is an alkyl group. When any of the compounds (ZI-1) contains a plurality of aryl groups, the aryl groups may be identical to or different from each other.

As the compounds (ZI-1), there can be mentioned, for example, a triarylsulfonium compound, a diarylalkylsulfonium compound and an aryldialkylsulfonium compound.

The aryl group contained in the compounds (ZI-1) is preferably a phenyl group, a naphthyl group, or a heteroaryl group, such as an indole residue or a pyrrole residue. A phenyl group, a naphthyl group and an indole residue are especially preferred.

The alkyl group contained in the compounds (ZI-1) according to necessity is preferably a linear, branched or cyclic alkyl group having 1 to 15 carbon atoms. As such, there can be mentioned, for example, a methyl group, an ethyl group, a propyl group, an n-butyl group, a sec-butyl group, a t-butyl group, a cyclopropyl group, a cyclobutyl group or a cyclohexyl group.

Substituents may be introduced in these aryl and alkyl groups. As the substituents, there can be mentioned, for example, an alkyl group (preferably 1 to 15 carbon atoms), an aryl group (preferably 6 to 14 carbon atoms), an alkoxy group (preferably 1 to 15 carbon atoms), a halogen atom, a hydroxyl group and a phenylthio group.

Preferred substituents are a linear, branched or cyclic alkyl group having 1 to 12 carbon atoms and a linear, branched or cyclic alkoxy group having 1 to 12 carbon atoms. Most preferred substituents are an alkyl group having 1 to 6 carbon atoms and an alkoxy group having 1 to 6 carbon atoms. The substituents may be introduced in any one of three R$_{201}$' to R$_{203}$', or alternatively may be introduced in all three of R$_{201}$' to R$_{203}$'. When R$_{201}$' to R$_{203}$' are phenyl groups, the substituent preferably lies at the p-position of the aryl group.

Further, forms in which one or two of R$_{201}$', R$_{202}$' and R$_{203}$' are optionally substituted aryl groups and the remainder is a linear, branched or cyclic alkyl group are preferred. As particular examples of such structures, there can be mentioned those described in sections 0141 to 0153 of JP-A-2004-210670.

The above aryl groups are, for example, the same as mentioned above in connection with R$_{201}$', R$_{202}$' and R$_{203}$', preferably a phenyl group and a naphthyl group. The aryl groups preferably contain any of a hydroxyl group, an alkoxy group and an alkyl group as a substituent. The substituent is preferably an alkoxy group having 1 to 12 carbon atoms, more preferably an alkoxy group having 1 to 6 carbon atoms.

The above linear, branched or cyclic alkyl group as the remainder is preferably an alkyl group having 1 to 6 carbon atoms. A substituent may further be introduced in the group. When there are two remainder groups, these two may be bonded to each other to thereby form a ring structure.

The compounds (ZI-1) are, for example, those of general formula (ZI-1A) below.

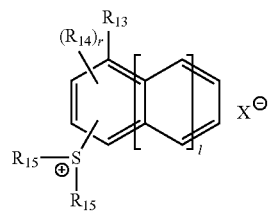

(ZI-1A)

In general formula (ZI-1A), $R_{13}$ represents a hydrogen atom, a fluorine atom, a hydroxyl group, an alkyl group, a cycloalkyl group, an alkoxy group or an alkoxycarbonyl group.

$R_{14}$, each independently in the instance of $R_{14}$s, represents any of an alkyl group, a cycloalkyl group, an alkoxy group, an alkylsulfonyl group or a cycloalkylsulfonyl group.

Each of $R_{15}$s independently represents an alkyl group or a cycloalkyl group, provided that the two $R_{15}$s may be bonded to each other to thereby form a ring structure.

In the formula, 1 is an integer of 0 to 2, and r is an integer of 0 to 8.

$X^-$ represents a normucleophilic anion. As such, there can be mentioned, for example, any of the same normucleophilic anions as mentioned with respect to the $X^-$ of general formula (ZI).

The alkyl groups represented by $R_{13}$, $R_{14}$ and $R_{15}$ may be linear or branched and preferably each have 1 to 10 carbon atoms. As such, there can be mentioned a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, an n-heptyl group, an n-octyl group, a 2-ethylhexyl group, an n-nonyl group, an n-decyl group and the like. Of these alkyl groups, a methyl group, an ethyl group, an n-butyl group, a t-butyl group and the like are especially preferred.

As the cycloalkyl groups represented by $R_{13}$, $R_{14}$ and $R_{15}$, there can be mentioned a mono- or polycycloalkyl group (preferably having 3 to 20 carbon atoms). As such, there can be mentioned, for example, a cyclopropyl group, a cyclobutyl group, a cyclopentyl group, a cyclohexyl group, a cycloheptyl group, a cyclooctyl group, a cyclododecanyl group, a cyclopentenyl group, a cyclohexenyl group, a cyclooctadienyl group and the like. Of these cycloalkyl groups, a cyclopropyl group, a cyclopentyl group, a cyclohexyl group, a cycloheptyl group and cyclooctyl group are especially preferred.

As the alkyl moieties in the alkoxy groups represented by $R_{13}$ and $R_{14}$, those explained for the alkyl groups represented by $R_{13}$, $R_{14}$ and $R_{15}$ can be exemplified. As the alkoxy group, a methoxy group, an ethoxy group, an n-propoxy group, and an n-butoxy group are especially preferred.

As the cycloalkyl moieties in the cycloalkoxy groups represented by $R_{13}$ and $R_{14}$, those explained for the cycloalkyl groups represented by $R_{13}$, $R_{14}$ and $R_{15}$ can be exemplified. As the cycloalkoxy group, a cyclopentyloxy group and a cyclohexyloxy group are especially preferred.

As the alkoxy moieties in the alkoxycarbonyl groups represented by $R_{13}$ those explained for the alkoxy groups represented by $R_{13}$, $R_{14}$ and $R_{15}$ can be exemplified. As the alkoxycarbonyl group, a methoxycarbonyl group, an ethoxycarbonyl group, and an n-butoxycarbonyl group are especially preferred.

As the alkyl moieties in the alkylsulfonyl groups represented by $R_{14}$ those explained for the alkyl groups represented by $R_{13}$, $R_{14}$ and $R_{15}$ can be exemplified. As the alkyl moieties in the cycloalkylsulfonyl groups represented by $R_{14}$ those explained for the cycloalkyl groups represented by $R_{13}$, $R_{14}$ and $R_{15}$ can be exemplified. As the alkylsulfonyl group and the cycloalkylsulfonyl group, a methylsulfonyl group, an ethylsulfonyl group, an n-propylsulfonyl group, an n-butylsulfonyl group, a cyclopentylsulfonyl group, and a cyclohexyl sulfonyl group are especially preferred.

1 preferably is 0 or 1, and more preferably is 1. r preferably is an integer of 0 to 2.

Each of the groups may have one or more substituents. As such substituent, there can be mentioned, for example, a halogen atom (e.g., a fluorine atom), a hydroxyl group, a carboxyl group, a cyano group, a nitro group, an alkoxy group, a cycloalkyloxy group, an alkoxyalkyl group, a cycloalkoxyalkyl group, an alkoxycarbonyl group, a cycloalkoxycarbonyl group, an alkoxycarbonyloxy group, a cycloalkoxycarbonyloxy group, or the like.

As the alkoxy group, there can be mentioned, for example, a linear or branched alkoxy group having 1 to 20 carbon atoms, such as a methoxy group, an ethoxy group, an n-propoxy group, an i-propoxy group, an n-butoxy group, a 2-methylpropoxy group, a 1-methylpropoxy group, and a t-butoxy group.

As the cycloalkoxy group, there can be mentioned, for example, those having 3 to 20 carbon atoms, such as a cyclopentyloxy group and a cyclohexyloxy group.

As the alkoxyalkyl group, there can be mentioned, for example, a linear or branched alkoxyalkyl group having 2 to 21 carbon atoms, such as a methoxymethyl group, an ethoxymethyl group, a 1-methoxyethyl group, a 2-methoxyethyl group, a 1-ethoxyethyl group, and a 2-ethoxyethyl group.

As the cycloalkoxyalkyl group, there can be mentioned, for example, those having 4 to 21 carbon atoms, such as a cyclopentyloxyethyl group, a cyclopentyloxypethyl group, a cyclohexyloxyethyl group, and a cyclohexyloxypethyl group.

As the alkoxycarbonyl group, there can be mentioned, for example, a linear or branched alkoxycarbonyl group having 2 to 21 carbon atoms, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, and a t-butoxycarbonyl group.

As the cycloalkoxycarbonyl group, there can be mentioned, for example, those having 4 to 21 carbon atoms, such as a cyclopentyloxycarbonyl group and a cyclohexyloxycarbonyl group.

As the alkoxycarbonyloxy group, there can be mentioned, for example, a linear or branched alkoxycarbonyloxy group having 2 to 21 carbon atoms, such as a methoxycarbonyloxy group, an ethoxycarbonyloxy group, an n-propoxycarbonyloxy group, an i-propoxycarbonyloxy group, an n-butoxycarbonyloxy group, and a t-butoxycarbonyloxy group.

As the cycloalkoxycarbonyloxy group, there can be mentioned, for example, those having 4 to 21 carbon atoms, such as a cyclopentyloxycarbonyloxy group and a cyclohexyloxycarbonyloxy group.

The cyclic structure that may be formed by the bonding of the two $R_{15}$s to each other is preferably a 5- or 6-membered ring, especially a 5-membered ring (namely, a tetrahydrothiophene ring) formed by two bivalent $R_{15}$s in cooperation with the sulfur atom of general formula (ZI-1A).

The cyclic structure may have substituents. As such substituents, there can be mentioned, for example, a hydroxyl group, a carboxyl group, a cyano group, a nitro group, an alkyl group, a cycloalkyl group, an alkoxy group, an alkoxyalkyl group, an alkoxycarbonyl group, an alkoxycarbonyloxy group and the like. A plurality of such a substituents may be introduced in this ring structure. The plurality of such substituents may be bonded to each other to thereby form a ring (for example, any of aromatic or nonaromatic hydrocarbon rings, aromatic or nonaromatic heterocycles, and polycyclic condensed rings each comprised of a combination of two or more of these).

It is especially preferred for the $R_{15}$ to be a methyl group, an ethyl group, or the bivalent group allowing two $R_{15}$s to be bonded to each other so as to form a tetrahydrothiophene ring structure in cooperation with the sulfur atom of the general formula (ZI-1A).

Substituents may further be introduced in the alkyl group, cycloalkyl group, alkoxy group and alkoxycarbonyl group represented by $R_{13}$, and the alkyl group, cycloalkyl group, alkoxy group, alkylsulfonyl group and cycloalkylsulfonyl group represented by $R_{14}$. As such a substituent, there can be mentioned, for example, a hydroxyl group, an alkoxy group, an alkoxycarbonyl group, a halogen atom (especially, a fluorine atom) or the like.

Specific examples of the cation moieties in the compounds represented by general formula (ZI-1A) will be given below.

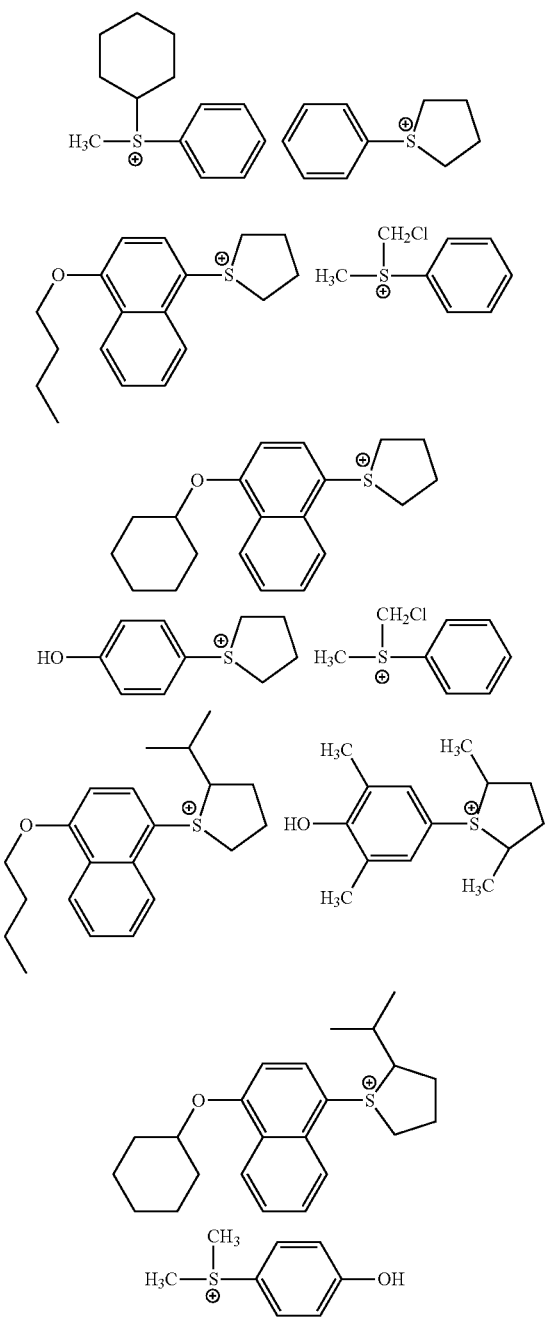

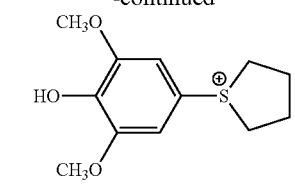

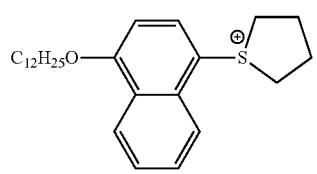

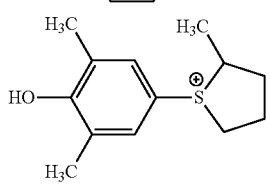

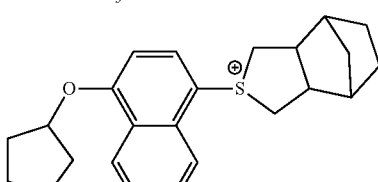

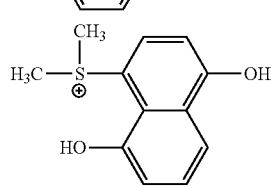

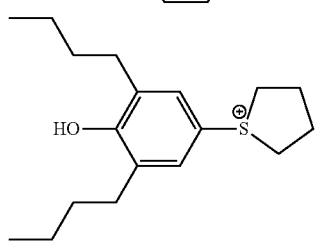

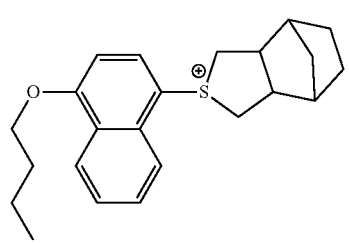

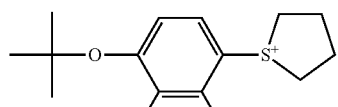

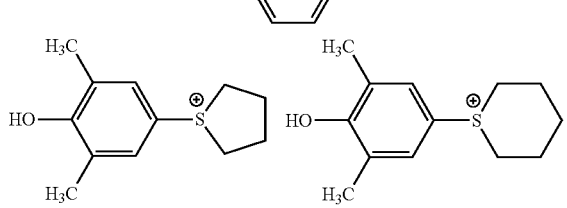

157
-continued
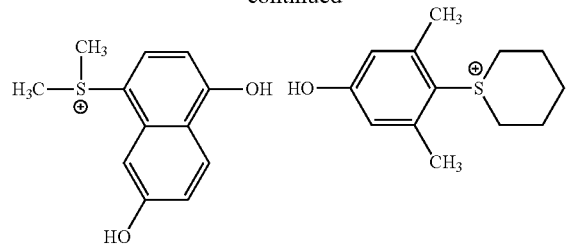
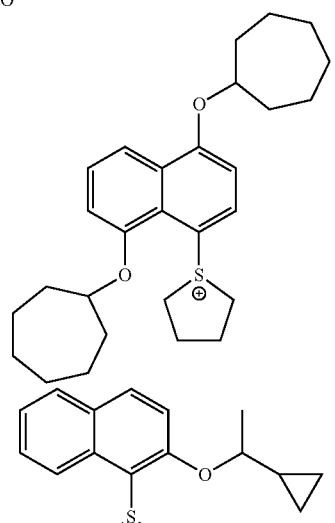
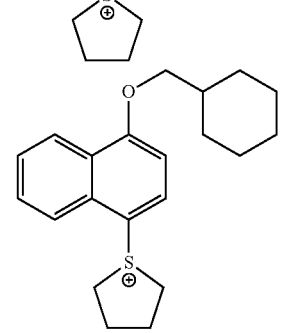
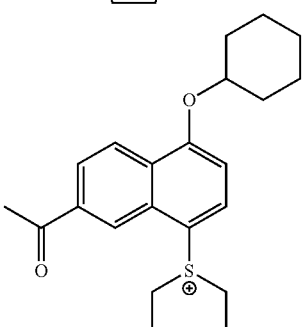
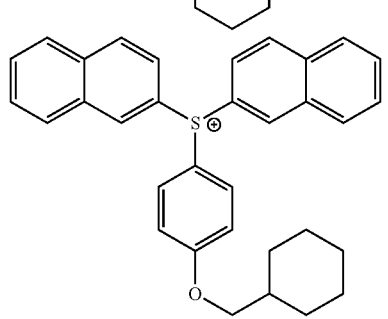
158
-continued
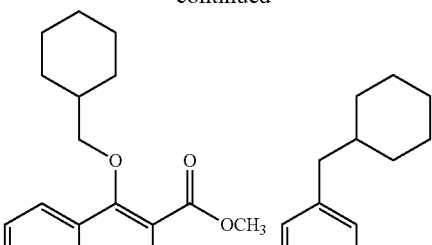
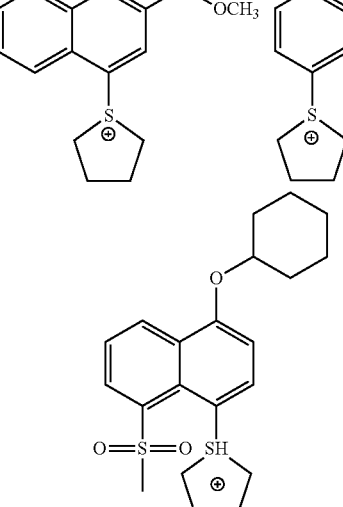
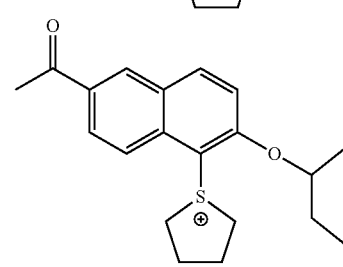
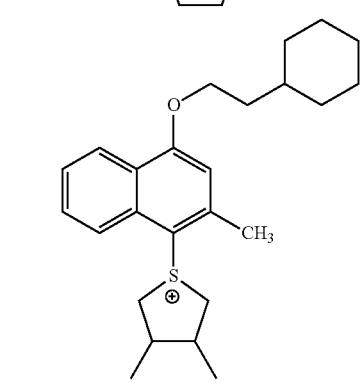
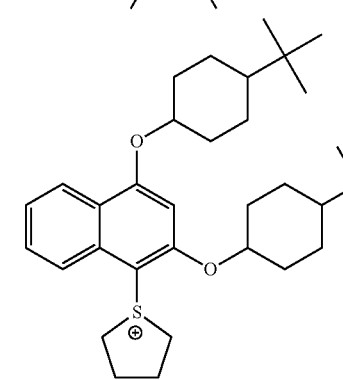

159
-continued

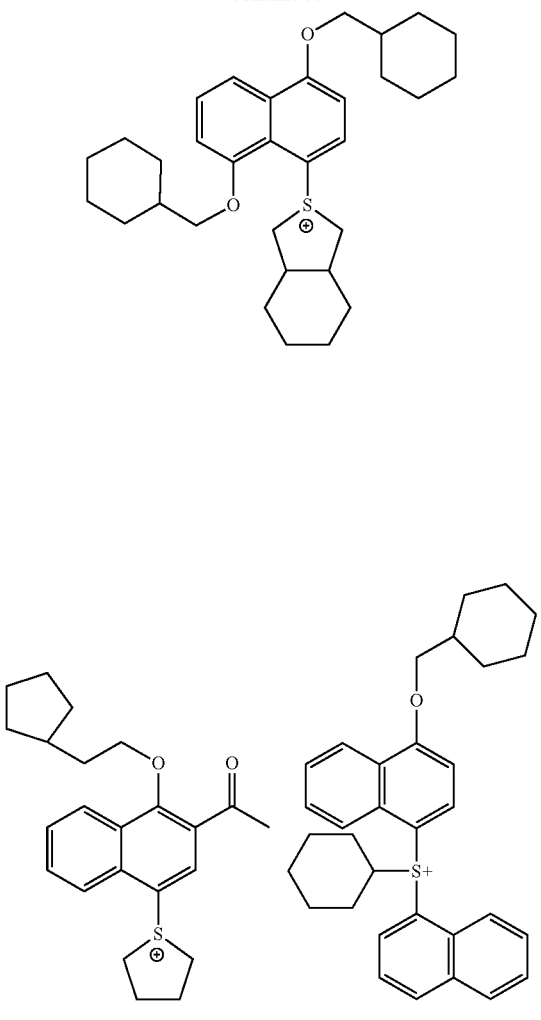

160
-continued

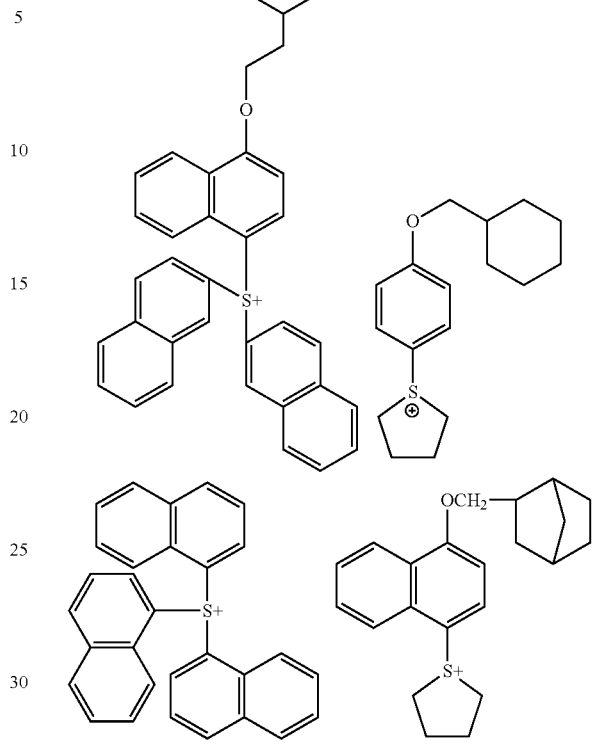

Now, compounds (ZI-2) will be described.

Compounds (ZI-2) are compounds of formula (ZI) wherein each of $R_{201}'$ to $R_{203}'$ independently represents an organic group containing no aromatic ring. The aromatic rings include an aromatic ring containing a heteroatom.

Each of the organic groups containing no aromatic ring represented by $R_{201}'$ to $R_{203}'$ has, for example, 1 to 30 carbon atoms, preferably 1 to 20 carbon atoms.

Preferably, each of $R_{201}'$ to $R_{203}'$ independently represents an alkyl group, a cycloalkyl group, a 2-oxoalkyl group, an alkoxycarbonylmethyl group, an allyl group or a vinyl group. A linear, branched or cyclic 2-oxoalkyl group and an alkoxycarbonylmethyl group are more preferred. A linear or branched 2-oxoalkyl group is most preferred.

As preferred alkyl groups and cycloalkyl groups represented by $R_{201}'$ to $R_{203}'$, there can be mentioned a linear or branched alkyl group having 1 to 10 carbon atoms (for example, a methyl group, an ethyl group, a propyl group, a butyl group or a pentyl group) and a cycloalkyl group having 3 to 10 carbon atoms (a cyclopentyl group, a cyclohexyl group or a norbornyl group).

The 2-oxoalkyl groups represented by $R_{201}'$ to $R_{203}'$ may be linear, branched or cyclic. A group having >C=O at the 2-position of any of the above alkyl groups is preferred.

As preferred examples of the alkoxy groups contained in the alkoxycarbonylmethyl groups represented by $R_{201}'$ to $R_{203}'$, there can be mentioned alkoxy groups each having 1 to 5 carbon atoms (a methoxy group, an ethoxy group, a propoxy group, a butoxy group and a pentoxy group).

$R_{201}'$ to $R_{203}'$ may be further substituted with, for example, a halogen atom, an alkoxy group (for example, 1 to 5 carbon atoms), a hydroxyl group, a cyano group and/or a nitro group.

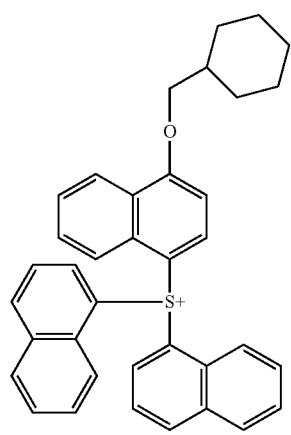

Two of $R_{201}'$ to $R_{203}'$ may be bonded to each other to thereby form a ring structure. With respect to the ring structure, an oxygen atom, a sulfur atom, an ester bond, an amido bond and/or a carbonyl group may be contained in the ring. As the group formed by the mutual bonding of two of $R_{201}'$ to $R_{203}'$, there can be mentioned, for example, an alkylene group (e.g., a butylene group or a pentylene group).

As the above ring structure, there can be mentioned an aromatic or nonaromatic hydrocarbon ring, an aromatic or nonaromatic heterocycle, or a polycyclic condensed ring comprised of a combination of two or more of these. As the ring structure, there can be mentioned a 3- to 10-membered ring. A 4- to 8-membered ring is preferred. A 5- or 6-membered ring is more preferred.

Below, compounds (ZI-3) will be described.

Compounds (ZI-3) are compounds of general formula (ZI-3) below, being compounds with a phenacylsulfonium salt structure.

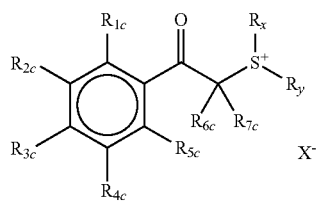

(ZI-3)

In the formula, each of $R_{1c}$ to $R_{5c}$ independently represents a hydrogen atom, an alkyl group, an alkoxy group or a halogen atom. Each of the alkyl group and alkoxy group preferably has 1 to 6 carbon atoms.

Each of $R_{6c}$ and $R_{7c}$ represents a hydrogen atom or an alkyl group. The alkyl group preferably has 1 to 6 carbon atoms.

Each of $R_x$ and $R_y$ independently represents an alkyl group, a 2-oxoalkyl group, an alkoxycarbonylmethyl group, an allyl group or a vinyl group. Each of these atomic groups preferably has 1 to 6 carbon atoms.

Any two or more of $R_{1c}$ to $R_{7c}$ may be bonded to each other to thereby form a ring structure. $R_x$ and $R_y$ may be bonded to each other to thereby form a ring structure. Each of these ring structures may contain an oxygen atom, a sulfur atom, an ester bond and/or an amido bond.

$X^-$ as a moiety of general formula (ZI-3) is as defined above in connection with general formula (ZI).

As particular examples of the compounds (ZI-3), there can be mentioned compounds shown as examples in sections 0046 and 0047 of JP-A-2004-233661 and sections 0040 to 0046 of JP-A-2003-35948.

Further, compounds (ZI-4) will be described below.

Compounds (ZI-4) are compounds containing any of cations of general formula (ZI-4) below. The compounds (ZI-4) are effective in the suppression of outgassing.

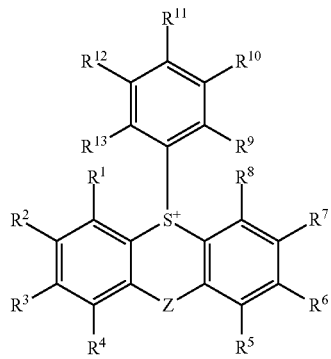

(ZI-4)

In general formula (ZI-4), each of $R^1$ to $R^{13}$ independently represents a hydrogen atom or a substituent. It is preferred for at least one of $R^1$ to $R^{13}$ to be a substituent containing an alcoholic hydroxyl group. Herein, the term "alcoholic hydroxyl group" means a hydroxyl group bonded to a carbon atom of an alkyl group.

Z represents a single bond or a bivalent connecting group.

When $R^1$ to $R^{13}$ are substituents containing an alcoholic hydroxyl group, it is preferred for $R^1$ to $R^{13}$ to represent the groups of the formula —(W—Y), wherein Y represents a hydroxyl-substituted alkyl group and W represents a single bond or a bivalent connecting group.

As preferred examples of the alkyl groups represented by Y, there can be mentioned an ethyl group, a propyl group and an isopropyl group. Most preferably, Y contains the structure of —$CH_2CH_2OH$.

The bivalent connecting group represented by W is not particularly limited. Preferably, W is a single bond or a bivalent group as obtained by replacing with a single bond any hydrogen atom of an alkoxy group, an acyloxy group, an acylamino group, an alkyl- or arylsulfonylamino group, an alkylthio group, an alkylsulfonyl group, an acyl group, an alkoxycarbonyl group or a carbamoyl group. More preferably, W is a single bond, or a bivalent group as obtained by replacing with a single bond any hydrogen atom of an acyloxy group, an alkylsulfonyl group, an acyl group or an alkoxycarbonyl group.

When $R^1$ to $R^{13}$ represent substituents containing an alcoholic hydroxyl group, the number of carbon atoms contained in each of the substituents is preferably in the range of 2 to 10, more preferably 2 to 6 and most preferably 2 to 4.

Each of the substituents containing an alcoholic hydroxyl group represented by $R^1$ to $R^{13}$ may contain two or more alcoholic hydroxyl groups. The number of alcoholic hydroxyl groups contained in each of the substituents containing an alcoholic hydroxyl group represented by $R^1$ to $R^{13}$ is in the range of 1 to 6, preferably 1 to 3 and more preferably 1.

The number of alcoholic hydroxyl groups contained in each of the compounds of general formula (ZI-4) as the sum of those of $R^1$ to $R^{13}$ is in the range of 1 to 10, preferably 1 to 6 and more preferably 1 to 3.

When $R^1$ to $R^{13}$ do not contain any alcoholic hydroxyl group, as the substituents represented by $R^1$ to $R^{13}$, there can be mentioned, for example, a halogen atom, an alkyl group, a cycloalkyl group, an alkenyl group, a cycloalkenyl group, an alkynyl group, an aryl group, a heterocyclic group, a cyano group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkyl- or arylsulfonylamino group, a mercapto group, an alkylthio group, an arylthio group, a heterocyclic thio group, a sulfamoyl group, a sulfo group, an alkyl- or arylsulfinyl group, an alkyl- or arylsulfonyl group, an acyl group, an aryloxycarbonyl group, an alkoxycarbonyl group, a carbamoyl group, an aryl- or heterocyclic azo group, an imido group, a phosphino group, a phosphinyl group, a phosphinyloxy group, a phosphinylamino group, a phosphono group, a silyl group, a hydrazino group, a ureido group, a boronic acid group (—B(OH)$_2$), a phosphato group (—OPO(OH)$_2$), a sulfato group (—OSO$_3$H) and any of other substituents known in the art.

When $R^1$ to $R^{13}$ do not contain any alcoholic hydroxyl group, each of $R^1$ to $R^{13}$ preferably represents a hydrogen atom, a halogen atom, an alkyl group, a cycloalkyl group, an alkenyl group, a cycloalkenyl group, an alkynyl group, an aryl group, a cyano group, a carboxyl group, an alkoxy group, an aryloxy group, an acyloxy group, a carbamoyloxy group, an acylamino group, an aminocarbonylamino group, an alkoxycarbonylamino group, an aryloxycarbonylamino group, a sulfamoylamino group, an alkyl- or arylsulfonylamino group, an alkylthio group, an arylthio group, a sulfamoyl group, an alkyl- or arylsulfonyl group, an aryloxycarbonyl group, an alkoxycarbonyl group, a carbamoyl group, an imido group, a silyl group or a ureido group.

When $R^1$ to $R^{13}$ do not contain any alcoholic hydroxyl group, each of $R^1$ to $R^{13}$ more preferably represents a hydrogen atom, a halogen atom, an alkyl group, a cycloalkyl group, a cyano group, an alkoxy group, an acyloxy group, an acylamino group, an aminocarbonylamino group, an alkoxycarbonylamino group, an alkyl- or arylsulfonylamino group, an alkylthio group, a sulfamoyl group, an alkyl- or arylsulfonyl group, an alkoxycarbonyl group or a carbamoyl group.

When $R^1$ to $R^{13}$ do not contain any alcoholic hydroxyl group, each of $R^1$ to $R^{13}$ most preferably represents a hydrogen atom, an alkyl group, a cycloalkyl group, a halogen atom or an alkoxy group.

Any two adjacent to each other of $R^1$ to $R^{13}$ may be bonded to each other to thereby form a ring. The thus formed rings include an aromatic or nonaromatic hydrocarbon ring and heterocycle. These rings may be further combined to thereby form condensed rings.

With respect to the compounds (ZI-4), preferably, at least one of $R^1$ to $R^{13}$ has a structure containing an alcoholic hydroxyl group. More preferably, at least one of $R^9$ to $R^{13}$ has a structure containing an alcoholic hydroxyl group.

As mentioned above, Z represents a single bond or a bivalent connecting group. The bivalent connecting group is, for example, an alkylene group, an arylene group, a carbonyl group, a sulfonyl group, a carbonyloxy group, a carbonylamino group, a sulfonylamido group, an ether group, a thioether group, an amino group, a disulfide group, an acyl group, an alkylsulfonyl group, —CH=CH—, an aminocarbonylamino group or an aminosulfonylamino group.

A substituent may be introduced in the bivalent connecting group. The substituent is, for example, the same as any of those set forth above in connection with $R^1$ to $R^{13}$.

Preferably, Z is a bond or group exhibiting no electron withdrawing properties, such as a single bond, an alkylene group, an arylene group, an ether group, a thioether group, an amino group, —CH=CH—, an aminocarbonylamino group or an aminosulfonylamino group. More preferably, Z is a single bond, an ether group or a thioether group. Most preferably, Z is a single bond.

General formulae (ZII) and (ZIII) will be described below.

In general formulae (ZII) and (ZIII), each of $R^{204'}$, $R^{205'}$, $R_{206}$ and $R_{207}$ independently represents an aryl group, an alkyl group or a cycloalkyl group. Substituents may be introduced in these aryl, alkyl and cycloalkyl groups.

As preferred examples of the aryl groups represented by $R_{204'}$, $R_{205'}$, $R_{206}$ and $R_{207}$, there can be mentioned the same groups as set forth above in connection with $R_{201'}$ to $R_{203'}$ of compounds (ZI-1).

As preferred examples of the alkyl and cycloalkyl groups represented by $R_{204'}$, $R_{205'}$, $R_{206}$ and $R_{207}$, there can be mentioned the same linear, branched or cyclic alkyl groups as set forth above in connection with $R_{201'}$ to $R_{203'}$ of compounds (ZI-2).

Substituents may be introduced in the aryl, alkyl and cycloalkyl groups represented by $R_{204'}$, $R_{205'}$, $R_{206}$ and $R_{207}$. As the substituents that may be introduced in the aryl, alkyl and cycloalkyl groups represented by $R_{204'}$, $R_{205'}$, $R_{206}$ and $R_{207}$, there can be mentioned, for example, an alkyl group (for example, 1 to 15 carbon atoms), a cycloalkyl group (for example, 3 to 15 carbon atoms), an aryl group (for example, 6 to 15 carbon atoms), an alkoxy group (for example, 1 to 15 carbon atoms), a halogen atom, a hydroxyl group, a phenylthio group and the like.

$X^-$ of general formula (ZII) is as defined above in connection with general formula (ZI).

As other preferred examples of photoacid generators, there can be mentioned the compounds of general formulae (ZIV), (ZV) and (ZVI).

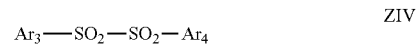

ZIV

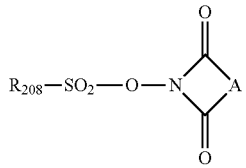

ZV

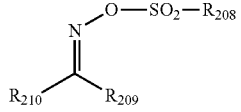

ZVI

In general formulae (ZIV) to (ZVI), each of $Ar_3$ and $Ar_4$ independently represents a substituted or unsubstituted aryl group.

Each of $R_{208}$'s of general formulae (ZV) and (ZVI) independently represents an alkyl group, a cycloalkyl group or an aryl group. These alkyl, cycloalkyl and aryl groups may be substituted or unsubstituted.

These groups are preferably substituted with a fluorine atom. If so, the strength of the acid generated by the photoacid generator can be enhanced.

Each of $R_{209}$ and $R_{210}$ independently represents an alkyl group, a cycloalkyl group, an aryl group or an electron withdrawing group. These alkyl, cycloalkyl, aryl and electron withdrawing groups may be substituted or unsubstituted. As a substituent that may be introduced in each of these alkyl, cycloalkyl, aryl and electron withdrawing groups, there can be mentioned, for example, a halogen atom, an alkoxy group (for example, 1 to 5 carbon atoms), a hydroxyl group, a cyano group or a nitro group.

$R_{209}$ is preferably a substituted or unsubstituted aryl group.

$R_{210}$ is preferably an electron withdrawing group. The electron withdrawing group is preferably a cyano group or a fluoroalkyl group.

A represents an alkylene group, an alkenylene group or an arylene group. Substituents may be introduced in these alkylene, alkenylene and arylene groups.

Particular examples of the aryl groups represented by $Ar_3$, $Ar_4$, $R_{208}$, $R_{209}$ and $R_{210}$ are the same as those set forth above in connection with $R_{201'}$, $R_{202'}$ and $R_{203'}$ of general formula (ZI-1).

Particular examples of the alkyl and cycloalkyl groups represented by $R_{208}$, $R_{209}$ and $R_{210}$ are the same as those set forth above in connection with $R_{201'}$, $R_{202'}$ and $R_{203'}$ of general formula (ZI-2).

As the alkylene group represented by A, there can be mentioned an alkylene group having 1 to 12 carbon atoms (for example, a methylene group, an ethylene group, a propylene group, an isopropylene group, a butylene group, an isobutylene group or the like). As the alkenylene group represented by A, there can be mentioned an alkenylene group having 2 to 12 carbon atoms (for example, an ethynylene group, a propenylene group, a butenylene group or the like). As the arylene group represented by A, there can be mentioned an arylene group having 6 to 10 carbon atoms (for example, a phenylene group, a tolylene group, a naphthylene group or the like).

A compound with a plurality of structures of general formula (ZVI) is also preferred as a photoacid generator. As such a compound, there can be mentioned, for example, a compound with a structure wherein $R_{209}$ or $R_{210}$ of any of compounds of general formula (ZVI) is bonded to $R_{209}$ or $R_{210}$ of another of compounds of general formula (ZVI).

As a photoacid generator, the compounds of general formulae (ZI) to (ZIII) are preferred. The compounds of general formulae (ZI) are more preferred. The compounds (ZI-1) to (ZI-3) are most preferred.

Particular examples of the photoacid generators are shown below, which in no way limit the scope of the present invention.

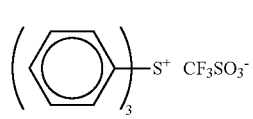
(z1)

(z2)

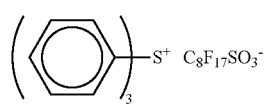
(z3)

(z4)

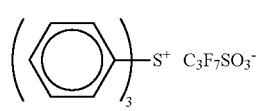
(z5)

(z6)

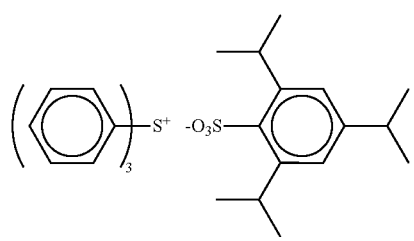
(z7)

(z8)

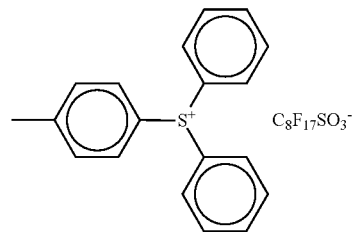
(z9)

(z10)

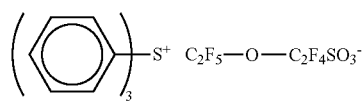
(z11)

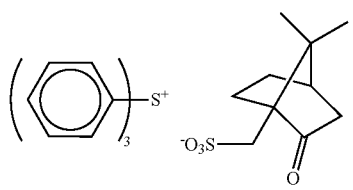
(z12)

-continued
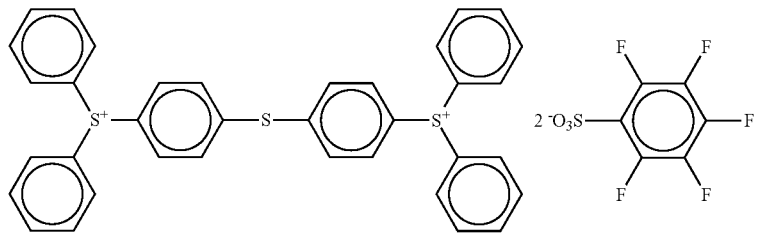 (z13)
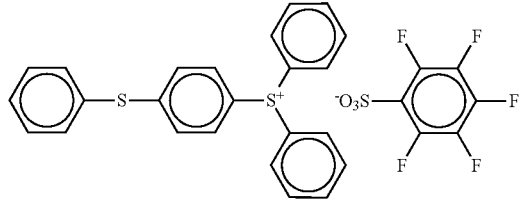 (z14)
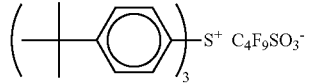 (z15)
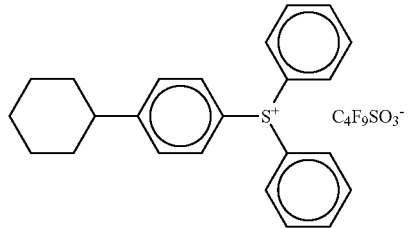 (z16)
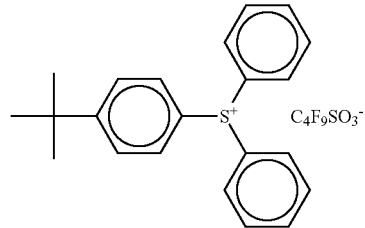 (z17)
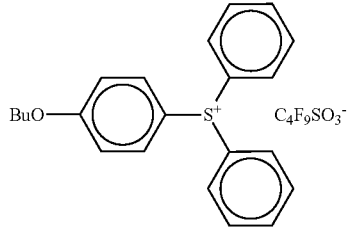 (z18)
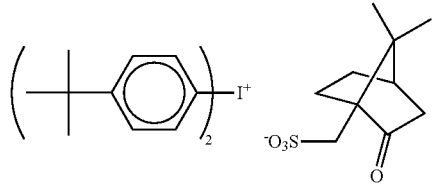 (z19)
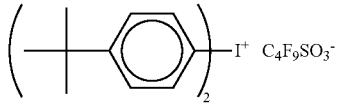 (z20)
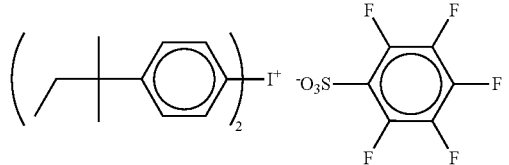 (z21)
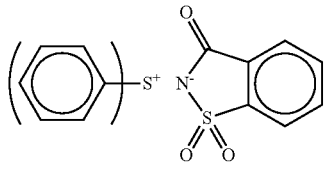 (z22)
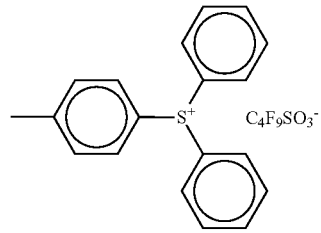 (z23)
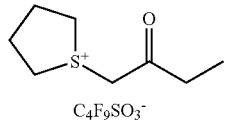 (z24)
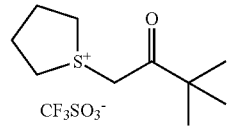 (z25)

-continued
(z26)
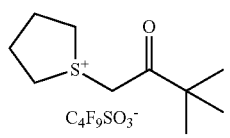
(z27)
(z28)
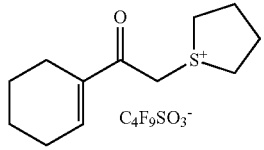
(z29)
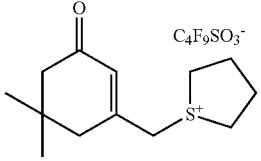
(z30)
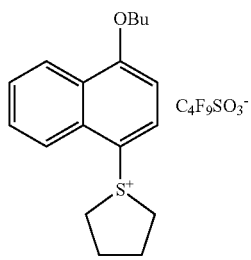
(z31)
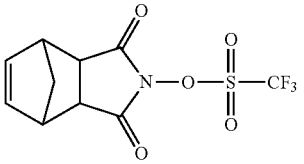
(z32)
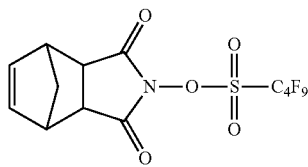
(z33)
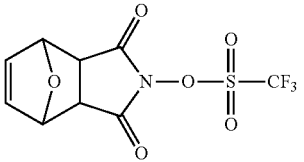
(z34)
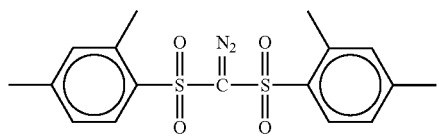
(z35)
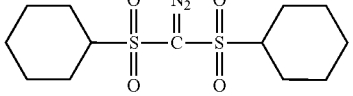
(z36)
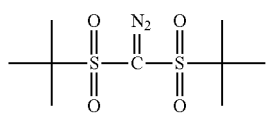
(z37)
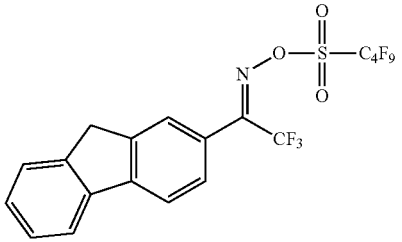
(z38)
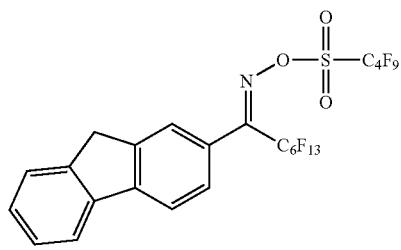
(z39)
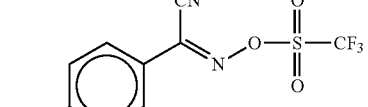
(z40)
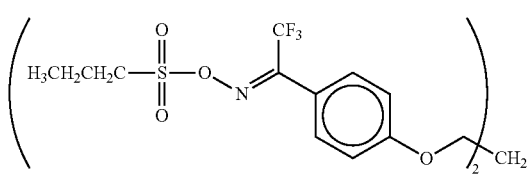
(z41)
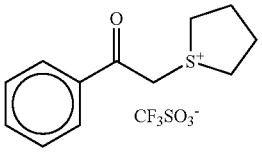

-continued
(z42)
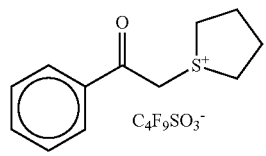
(z43)
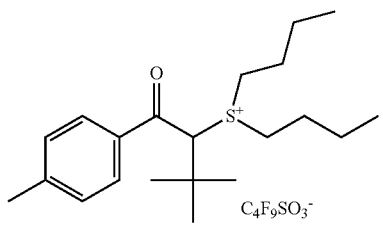
(z44)
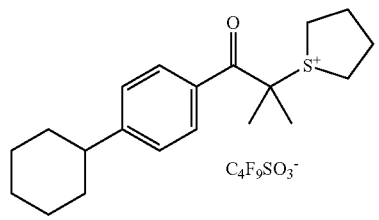
(z45)
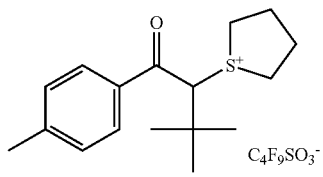
(z46)
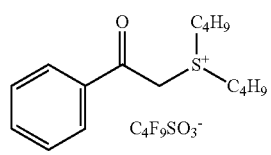
(z47)
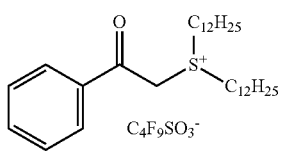
(z48)
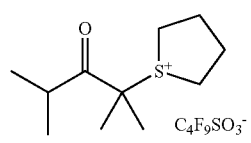
(z49)
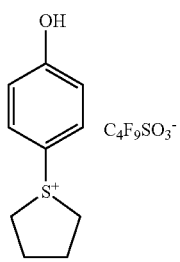
(z50)
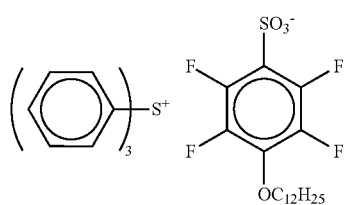
(z51)
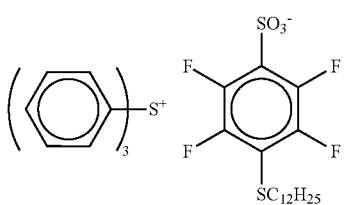
(z52)
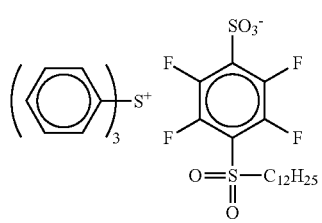
(z53)
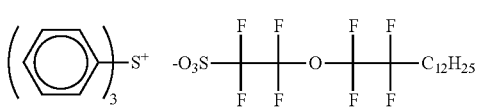
(z54)
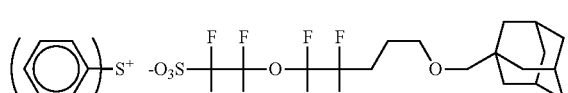
(z55)
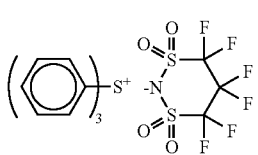

-continued
(z56)
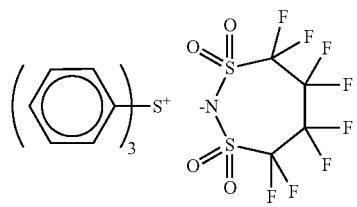
(z57)
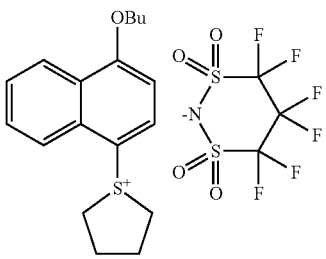
(z58)
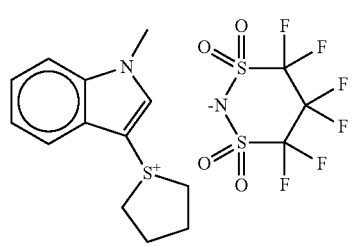
(z59)
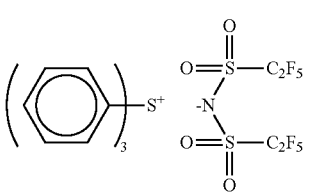
(z60)
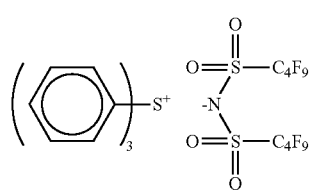
(z61)
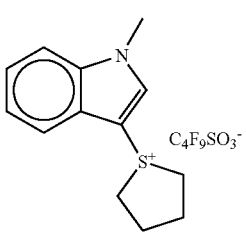
(z62)
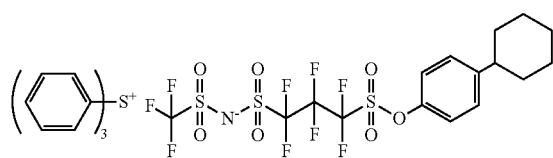
(z63)
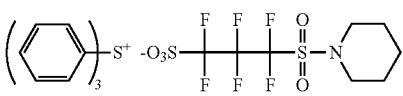
(z64)
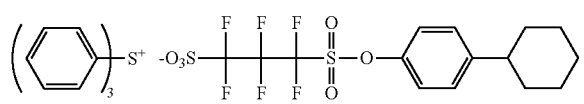
(z65)
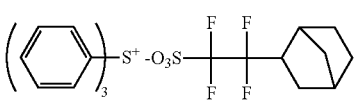
(z66)
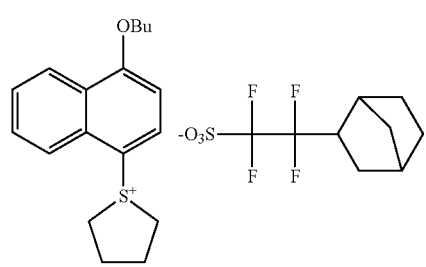
(z67)
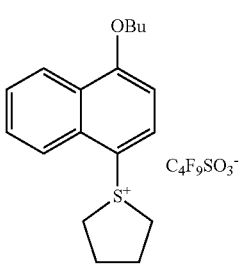
(z68)
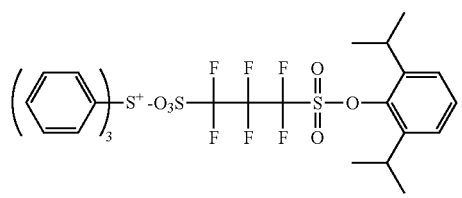
(z69)
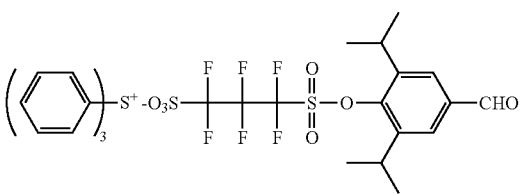

-continued
(z70) 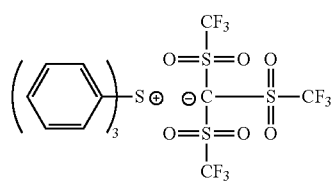
(z71) 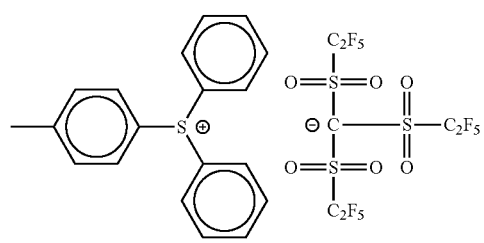
(z72) 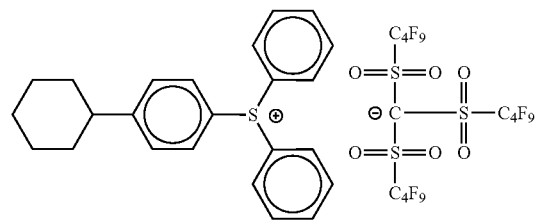
(z73) 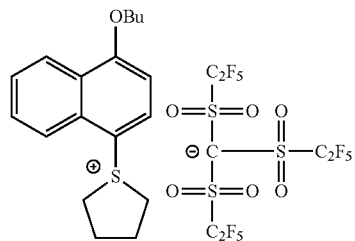
(z74) 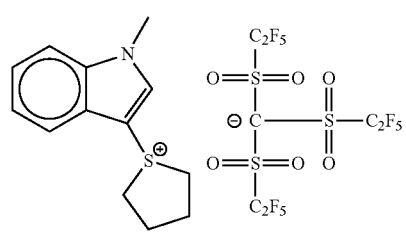
(z75) 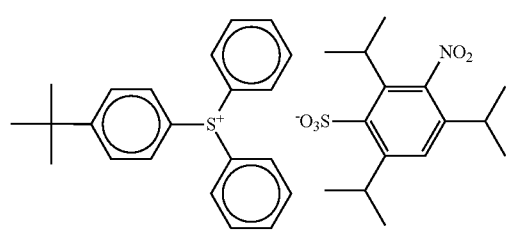
(z76) 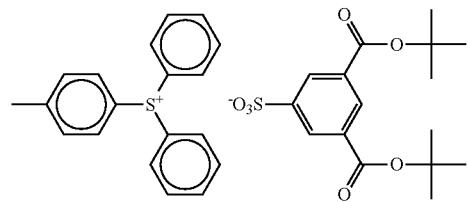
(z77) 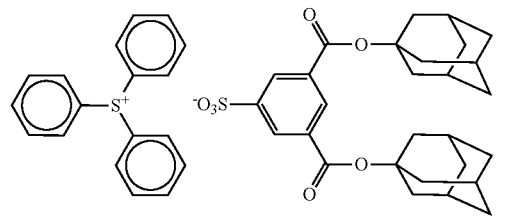
(z78) 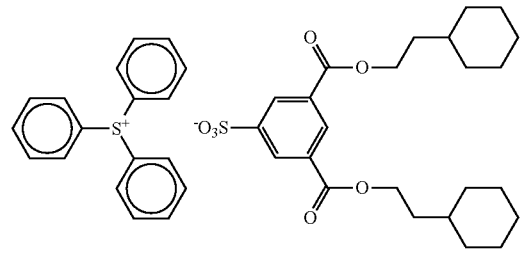
(z79) 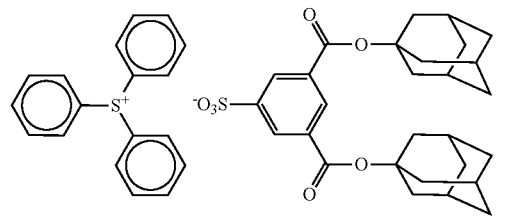
(z80) 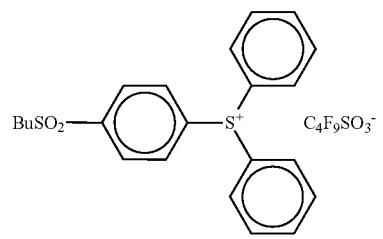
(z81) 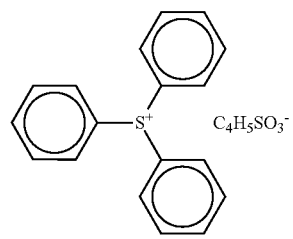

-continued
(z82) 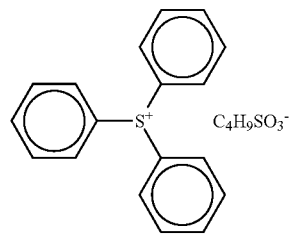
(z83) 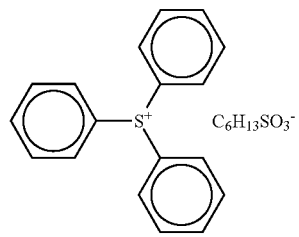
(z84) 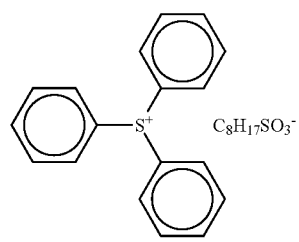
(z85) 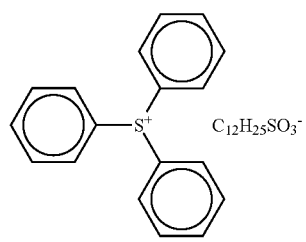
(z86) 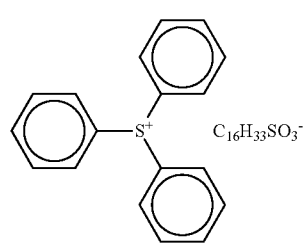
(z87) 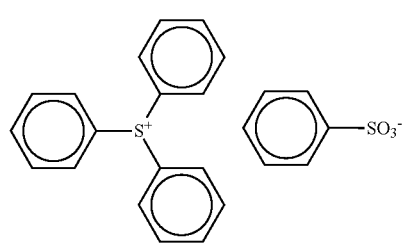
(z88) 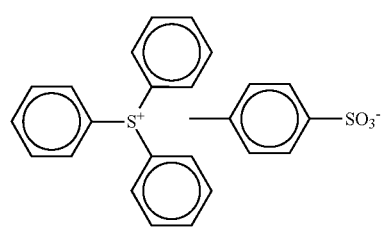
(z89) 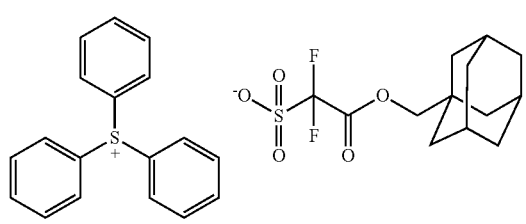
(z90) 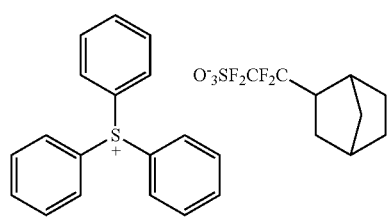
(z91) 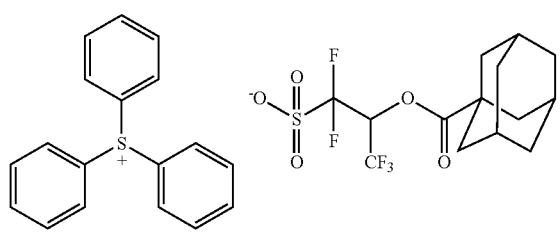
(z92) 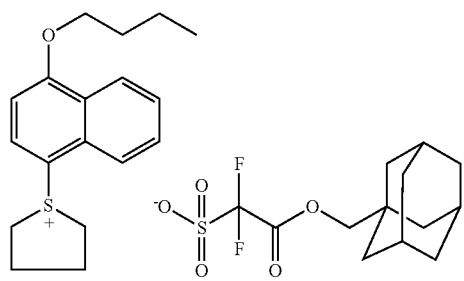
(z93) 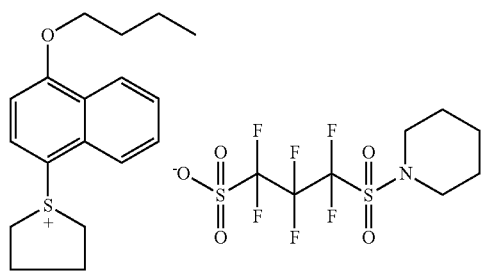

-continued
(z94)
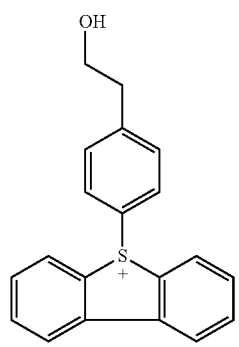 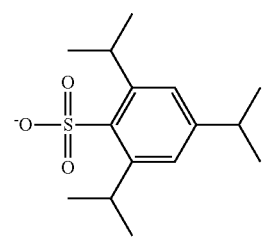
(z95)
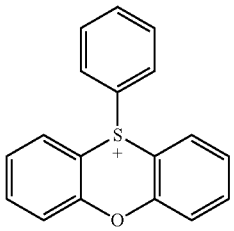 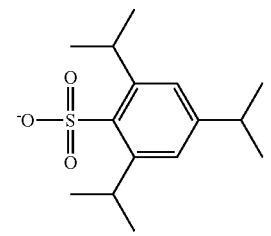
(z96)
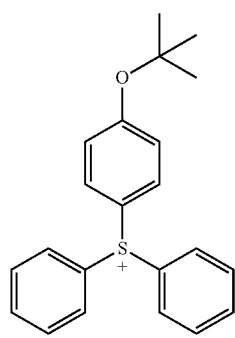 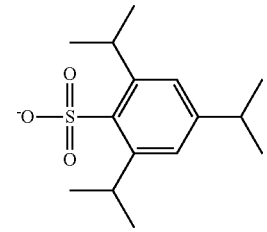
(z97)
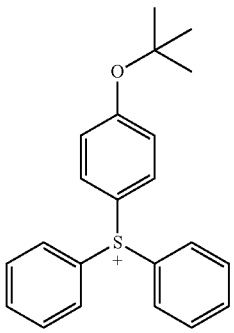 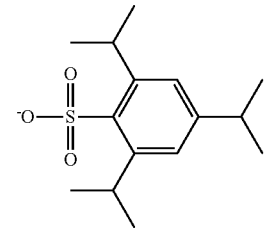
(z98)
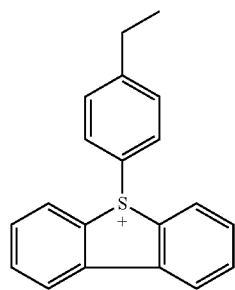 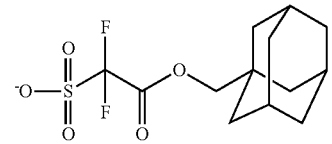
(z99)
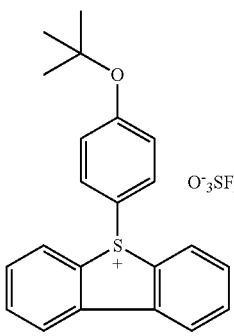 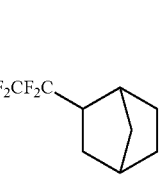
(z100)
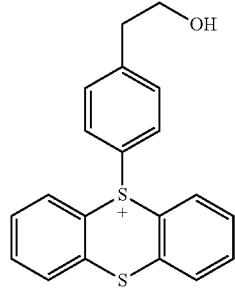 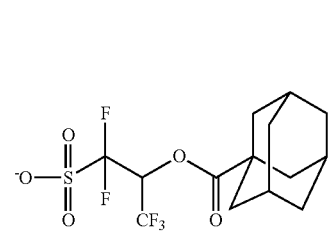
(z101)
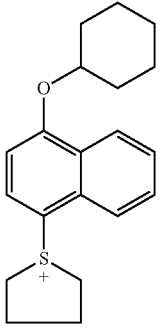 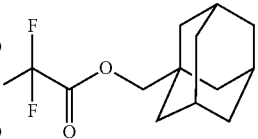

-continued (z102) 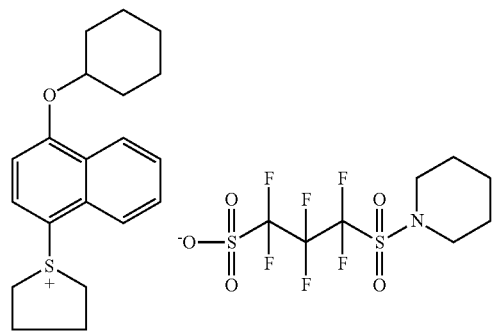

(z103) 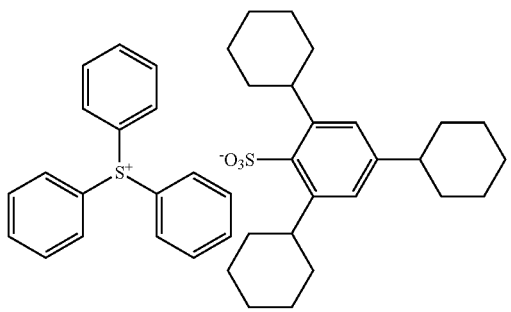

(z104) 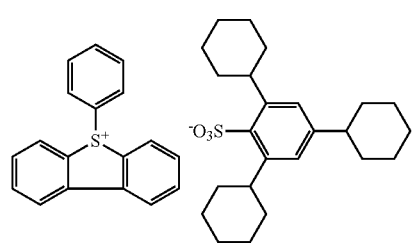

(z105) 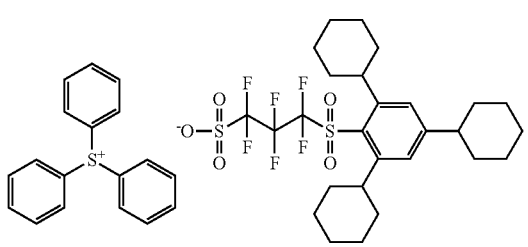

(Z106) 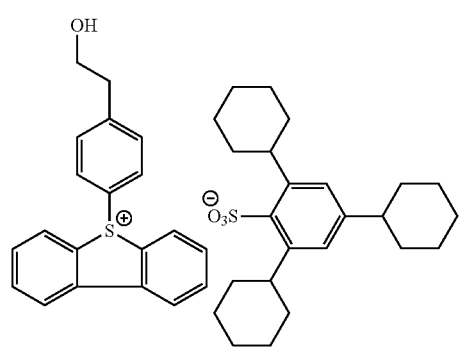

(Z107) 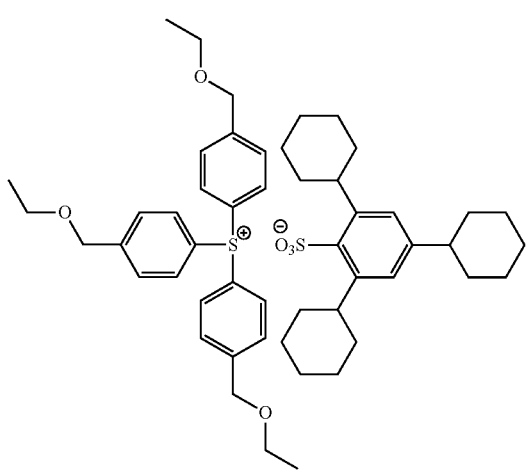

(Z108) 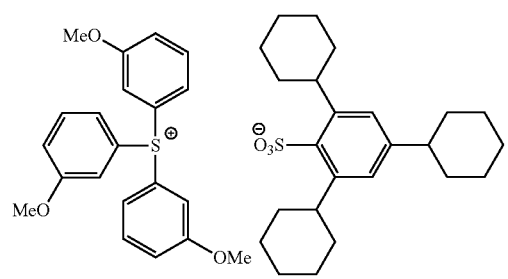

(Z109) 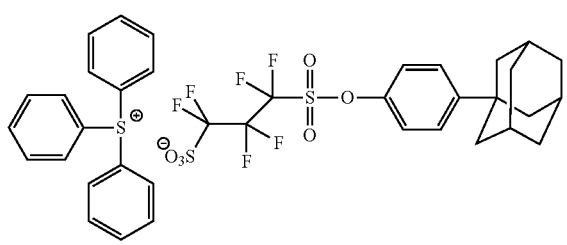

Any one of the photoacid generators can be used alone, or two or more thereof may be used in combination. When two or more of the photoacid generators are used in combination, it is preferred to combine compounds capable of generating two types of organic acids that are different from each other by two or more in the total number of atoms excluding hydrogen atoms.

It is preferred to combine the compound (P) according to the present invention with the compound (ZI-1) or compound (ZI-4) containing any of the sulfonate anions of general formula (SA1) from the viewpoint that the strength of generated acid can be appropriate.

When the composition of the present invention further contains a photoacid generator, the content thereof based on all the total solids of the composition is preferably in the range of 0.1 to 40 mass %, more preferably 0.5 to 30 mass % and further more preferably 1 to 20 mass %.

[5] Solvent

It is preferred for the composition of the present invention to comprise a solvent. The solvent that is usable in the preparation of the composition is not particularly limited as long as it can dissolve the components of the composition. For example, use can be made of an alkylene glycol monoalkyl ether carboxylate (propylene glycol monomethyl ether acetate (PGMEA, also known as 1-methoxy-2-acetoxypropane) or the like), an alkylene glycol monoalkyl ether (propylene glycol monomethyl ether (PGME, also known as 1-methoxy-2-propanol) or the like), an alkyl lactate (ethyl lactate, methyl lactate or the like), a cyclolactone (γ-butyrolactone or the like, preferably having 4 to 10 carbon atoms), a linear or cyclic ketone (2-heptanone, cyclohexanone or the like, preferably having 4 to 10 carbon atoms), an alkylene carbonate (ethylene carbonate, propylene carbonate or the like), an alkyl carboxylate (preferably an alkyl acetate such as butyl acetate), an alkyl alkoxyacetate (preferably ethyl ethoxypropionate) or the like. As other useful solvents, there can be mentioned, for example, those described in section [0244] et seq. of US 2008/0248425 A1 and the like.

Among the above solvents, an alkylene glycol monoalkyl ether carboxylate, an alkylene glycol monoalkyl ether, and ethyl lactate are especially preferred.

These solvents may be used alone or in combination. When two or more types of solvents are mixed together before use, it is preferred to mix a hydroxylated solvent with a non-hydroxylated solvent. The mass ratio of hydroxylated solvent to non-hydroxylated solvent is in the range of, for example, 1/99 to 99/1. The mass ratio is preferably 10/90 to 90/10, more preferably 20/80 to 60/40.

The hydroxylated solvent is preferably an alkylene glycol monoalkyl ether or an alkyl lactate. The non-hydroxylated solvent is preferably an alkylene glycol monoalkyl ether carboxylate. The solvent preferably contains a propylene glycol monomethyl ether in an amount of 50 mass % or more.

The amount of solvent used is not particularly limited. However, it is generally so selected that the total solid concentration of the composition falls in the range of preferably 0.1 to 10 mass %, more preferably 2.0 to 6.0 mass % and further more preferably 3.0 to 5.0 mass %.

[6] Surfactant

The composition according to the present invention may further contain a surfactant. The surfactant is most preferably a fluorinated and/or siliconized surfactant.

As such a surfactant, there can be mentioned, for example, Megafac F176 or Megafac R08 produced by Dainippon Ink & Chemicals, Inc., PF656 or PF6320 produced by OMNOVA SOLUTIONS, INC., Troy Sol S-366 produced by Troy Chemical Co., Ltd., Florad FC430 produced by Sumitomo 3M Ltd., or polysiloxane polymer KP-341 produced by Shin-Etsu Chemical Co., Ltd.

Surfactants other than these fluorinated and/or siliconized surfactants can also be used. In particular, the other surfactants include polyoxyethylene alkyl ethers, polyoxyethylene alkyl aryl ethers and the like.

Moreover, heretofore known surfactants can also be appropriately used. As useful surfactants, there can be mentioned, for example, those described in section [0273] et seq of US Patent Application Publication No. 2008/0248425 A1.

These surfactants may be used alone or in combination.

When the composition of the present invention contains a surfactant, the content of the surfactant is preferably in the range of 0.0001 to 2 mass %, more preferably 0.001 to 1 mass %, based on the total solids of the composition.

[7] Dissolution Inhibiting Compound

The composition according to the present invention may further contain a dissolution inhibiting compound. Here the "dissolution inhibiting compound" means compound having 3000 or less molecular weight that is decomposed by the action of an acid to increase the solubility in an alkali developer.

From the viewpoint of preventing lowering of the transmission at the wavelength of 220 nm or shorter, the dissolution inhibiting compound is preferably an alicyclic or aliphatic compound having an acid-decomposable group, such as any of cholic acid derivatives having an acid-decomposable group described in Proceeding of SPIE, 2724, 355 (1996). Particular examples of the acid-decomposable groups are the same as set forth above in connection with "OY$^1$" of general formula (3) and "COOY$^2$" of general formula (4) with respect to resin (P).

When the composition according to the present invention is exposed to a KrF excimer laser or irradiated with electron beams, preferred use is made of one having a structure resulting from substitution of the phenolic hydroxy group of a phenol compound with an acid-decomposable group. The phenol compound preferably contains 1 to 9 phenol skeletons, more preferably 2 to 6 phenol skeletons.

The molecular weight of the dissolution inhibiting compound is 3000 or less, preferably 300 to 3000 and more preferably 500 to 2500.

When the composition of the present invention comprises the dissolution inhibiting compound, the content of the dissolution inhibiting compound based on the total solids of the composition is preferably in the range of 0.0001 to 20 mass %, more preferably 0.5 to 10 mass %.

Specific examples of the dissolution inhibiting compound will be shown below, which however in no way limit the scope of the present invention.

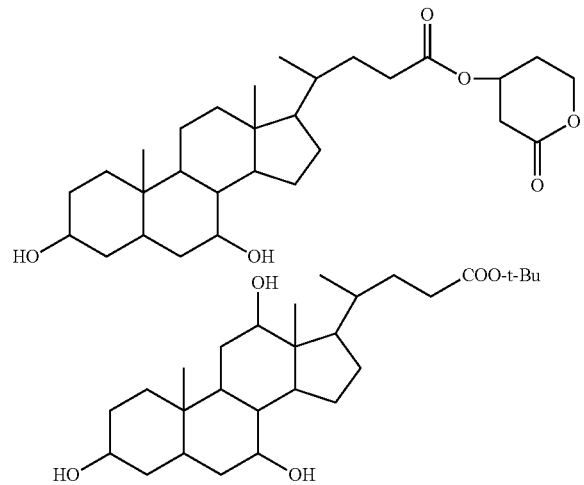

-continued

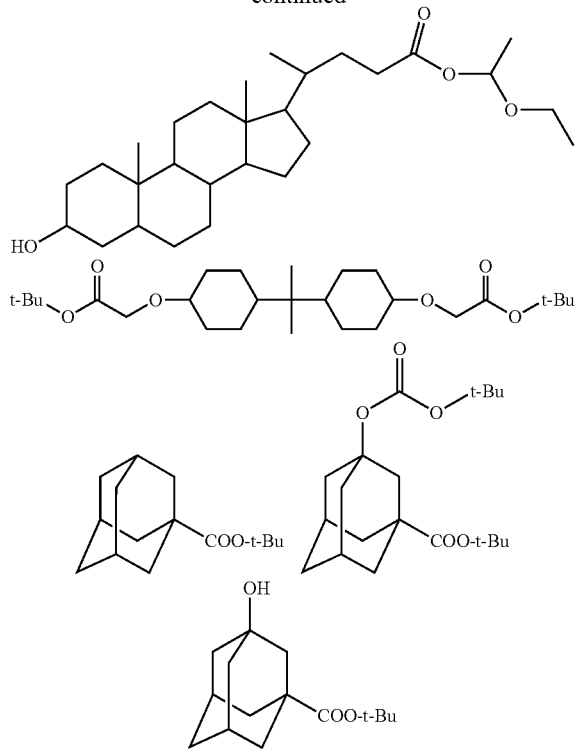

[8] Other Additive

According to necessity, the composition of the present invention may further contain, for example, a dye, a plasticizer, a photosensitizer, a light absorber, a compound capable of accelerating the dissolution in a developer (hereinafter also referred to as a dissolution accelerating compound), etc. Furthermore, appropriate use can be made of compounds containing a functional group with proton acceptor properties as described in, for example, JP-A's 2006-208781 and 2007-286574.

The above dissolution accelerating compound is, for example, a low-molecular compound of 1000 or less molecular weight containing two or more phenolic hydroxyl groups or one or more carboxyl groups. When a carboxyl group is contained, it is preferred for the dissolution accelerating compound to be an alicyclic or aliphatic compound is preferred.

The amount of dissolution accelerating compound added, based on the mass of the compound (P), is preferably in the range of 0 to 50 mass %, more preferably 5 to 30 mass %. It is preferred for the amount to be up to 50 mass % from the viewpoint of the suppression of any development residue and the prevention of any pattern distortion at development.

The above dissolution accelerating compound can be easily synthesized while consulting the processes described in, for example, JP-A's H4-122938 and H2-28531, U.S. Pat. No. 4,916,210 and European Patent 219294.

[9] Method of Forming Pattern

The composition of the present invention is typically used in the following manner. In particular, the composition of the present invention is typically applied onto a support, such as a substrate, thereby forming a film. The thickness of the film is preferably in the range of 0.02 to 0.1 μm. The method of application onto a substrate is preferably spin coating. The spin coating is preferably performed at a rotating speed of 1000 to 3000 rpm.

For example, the composition is applied onto any of substrates (e.g., silicon/silicon dioxide coating, silicon nitride, chromium-vapor-deposited quartz substrate, etc.) for use in the production of precision integrated circuit devices, etc. by appropriate application means, such as a spinner or a coater. The thus applied composition is dried, thereby forming an actinic-ray- or radiation-sensitive film (hereinafter also referred to as a resist film). The application of the composition to the substrate can be preceded by the application of a heretofore known antireflection film.

The resultant resist film is exposed to actinic rays or radiation (preferably electron beams, X-rays or EUV light), preferably baked (generally 80 to 150° C., more preferably 90 to 130° C.), and developed. Thus, a favorable pattern can be obtained. Using this pattern as a mask, appropriate etching treatment, ion injection, etc. are carried out to thereby obtain a semiconductor microcircuit, an imprint mold structure, etc.

With respect to the particulars of the process for fabricating an imprint mold with the use of the composition of the present invention, reference can be made to, for example, Japanese Patent No. 4109085, JP-A-2008-162101, "Fundamentals of nanoimprint and its technology development/application deployment—technology of nanoimprint substrate and its latest technology deployment" edited by Yoshihiko Hirai (published by Frontier Publishing), etc. In particular, with respect to the process for fabricating a mold structure that is suitable for the manufacturing of information recording media, reference can be made to, for example, Japanese Patent No. 4109085 and JPA-2008-162101.

In the developing operation, an alkali developer is generally used. Generally known techniques, such as puddling, dip and dynamic dispense, can be appropriately used in performing the developing operation. A variety of alkali aqueous solutions can be used as the alkali developer. Generally, however, an alkali aqueous solution of tetramethylammonium hydroxide is used. Appropriate amounts of an alcohol and/or a surfactant may be added to the alkali developer.

The concentration of alkali developer is generally in the range of 0.1 to 20 mass %. The pH value of the alkali developer is generally in the range of 10.0 to 15.0.

Moreover, the composition of the present invention can be used in the process comprising, after the operations of coating, film formation and exposure, developing the exposed film with a developer containing an organic solvent as a main component to thereby obtain a negative pattern. As this process, use can be made of, for example, the process described in JP-A-2010-217884.

As the organic developer, use can be made of not only a polar solvent, such as an ester solvent (butyl acetate, ethyl acetate, etc.), a ketone solvent (2-heptanone, cyclohexanone, etc.), an alcohol solvent, an amide solvent or an ether solvent, but also a hydrocarbon solvent. The water content of the organic developer as a whole is preferably below 10 mass %. More preferably, the organic developer contains substantially no water.

In the patterning method of the present invention, the resist film may be formed on a mask blank.

Herein, the mask blank refers to a material for the preparation of a photomask for use in the semiconductor manufacturing process, and generally comprises a transparent substrate (preferably, a glass substrate) and, superimposed thereon, a light shielding film. The method of forming a light shielding film on a transparent substrate is not particularly limited. For example, the formation can be accomplished by performing a chemical vapor deposition of a material constituting a light shielding film on a transparent substrate.

The material constituting the light shielding film comprises, as its main component, a metal such as tantalum, chromium, molybdenum, titanium, zirconium, tin, gallium or aluminum, and appropriate use is made of an oxide, nitride or oxynitride of such a metal element. For example, as the material, there can be mentioned chromium oxide, chromium nitride, chromium, tantalum oxide, tantalum nitride, tantalum, molybdenum silicide oxide, molybdenum silicide nitride, molybdenum silicide oxynitride, molybdenum or the like.

The light shielding film may be in the form of a monolayer, preferably having a multilayer structure comprised of a plurality of materials applied one upon another. In the multilayer structure, the thickness per layer is not particularly limited. Preferably, it is in the range of 5 to 100 nm, more preferably 10 to 80 nm. The thickness of the light shielding film as a whole is not particularly limited. Preferably, it is in the range of 5 to 200 nm, more preferably 10 to 150 nm.

A photomask can be obtained by forming the resist film on the mask blank, exposing the film to light and developing the exposed film.

EXAMPLES

The present invention will be described in greater detail below by way of its examples. However, the gist of the present invention is in no way limited to these examples.

Reference Synthetic Example 1

Synthesis of Modified Polyhydroxystyrene Compound (PHS-M1)

Poly(p-hydroxystyrene) (VP-2500, produced by Nippon Soda Co., Ltd.) as a polyhydroxystyrene compound amounting to 30.0 g was dissolved in 120 g of acetone. Thereafter, 1.32 g of 1-chloromethylnaphthalene, 2.07 g of potassium carbonate (2 equiv. wt. to 1-chloromethylnaphthalene) and 0.56 g of sodium iodide (0.5 equiv. wt. to 1-chloromethylnaphthalene) were added to the solution and refluxed for four hours. About half the amount of acetone was distilled off by means of an evaporator, and 200 ml of ethyl acetate and then 200 ml of 1N hydrochloric acid was added thereto under agitation. The thus obtained mixture was transferred into a separatory funnel, and the water phase was removed. The resultant organic phase was washed with 200 ml of 1N hydrochloric acid and then 200 ml of distilled water. The washed organic phase was concentrated by means of an evaporator. As a result of this sequence of operations, 3% naphthylmethylated poly(p-hydroxystyrene) was obtained.

Reference Synthetic Example 2

Synthesis of Modified Polyhydroxystyrene Compound (PHS-M2)

The same procedure as in Reference Synthetic Example 1 was repeated except that the amount of added 1-chloromethylnaphthalene was changed from 1.32 g to 2.21 g, thereby obtaining 5% naphthylmethylated poly(p-hydroxystyrene).

Reference Synthetic Example 3

Synthesis of Modified Polyhydroxystyrene Compound (PHS-M3)

Poly(p-hydroxystyrene) (VP-2500, produced by Nippon Soda Co., Ltd.) as a polyhydroxystyrene compound amounting to 30.0 g was dissolved in 170 g of acetone. Thereafter, 3.42 g of benzyl bromide and 3.59 g of potassium carbonate (1.3 equiv. wt. to benzyl bromide) were added to the solution and refluxed for four hours. The subsequent operations were the same as in Reference Synthetic Example 1, thereby obtaining 8% benzylated poly(p-hydroxystyrene).

Reference Synthetic Example 4

Synthesis of Modified Polyhydroxystyrene Compound (PHS-M4)

The same procedure as in Reference Synthetic Example 3 was repeated except that VP-2500 was changed to VP-8000 (produced by Nippon Soda Co., Ltd.) and except that the amount of added benzyl bromide was changed from 3.42 g to 2.14 g, thereby obtaining 5% benzylated poly(p-hydroxystyrene).

Reference Synthetic Example 5

Synthesis of Modified Polyhydroxystyrene Compound (PHS-M5)

Poly(p-hydroxystyrene) (VP-2500, produced by Nippon Soda Co., Ltd.) as a polyhydroxystyrene compound amounting to 30.0 g was dissolved in 170 g of tetrahydrofuran (THF). Thereafter, 26.53 g of triethylamine was added to the solution and agitated in an ice water bath. A THF solution of 2.34 g of 1-naphthoyl chloride was dropped into the resultant reaction liquid, and agitated for four hours. Then, distilled water was added to the mixture, thereby terminating the reaction. THF was distilled off in vacuum, and the reaction product was dissolved in ethyl acetate. The thus obtained organic phase was washed with distilled water five times, and the washed organic phase was concentrated by means of an evaporator. As a result of this sequence of operations, 5% naphthoylated poly(p-hydroxystyrene) was obtained.

Reference Synthetic Example 6

Synthesis of Modified Polyhydroxystyrene Compound (PHS-M6)

The same procedure as in Reference Synthetic Example 5 was repeated except that 2.34 g of 1-naphthoyl chloride was changed to 1.50 g of phenyl isocyanate, thereby obtaining 5% phenylcarbamoylated poly(p-hydroxystyrene).

Synthetic Example 1

Synthesis of Compound (P-1)

(Synthesis of Chloroether Compound)

First, 20.0 g of adamantane-1-carboaldehyde, 34.35 g of cyclohexaneethanol, 1.41 g of camphorsulfonic acid and 100 ml of heptane were placed in a 300 ml round bottomed flask equipped with a Dean Stark tube, and refluxed for eight hours. The mixture was cooled to room temperature, and 3.1 g of triethylamine was added thereto and agitated. The thus obtained organic phase was washed with saturated sodium bicarbonate water twice and with distilled water once. Heptane and unreacted cyclohexaneethanol were removed under vacuum hot conditions, thereby obtaining compound 1 shown below as an acetal compound.

Subsequently, 11.47 g of acetyl chloride was added to the whole amount of obtained compound 1, and agitated in a 45°

C. water bath for four hours. The mixture was cooled to room temperature, and unreacted acetyl chloride was removed in vacuum. Thus, a liquid containing compound Cl-1 shown below as a chloroether compound was obtained. By $^1$H-NMR analysis, it was found that the product was a 1.00:0.17:1.26: 0.28 (molar ratio) mixture of compound Cl-1, adamantane-1-carboaldehyde, cyclohexylethyl acetate and cyclohexaneethanol, and that the mass % concentration of compound Cl-1 in the product was 52.8%.

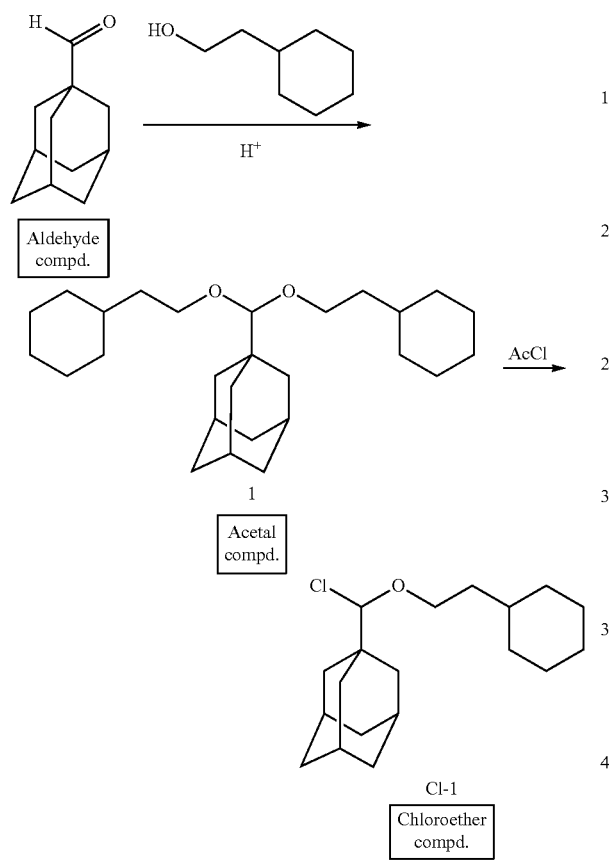

(Synthesis of Compound (P-1))

Poly(p-hydroxystyrene) (VP-2500, produced by Nippon Soda Co., Ltd.) as a polyhydroxystyrene compound amounting to 10.0 g was dissolved in 50 g of tetrahydrofuran (THF). Thereafter, 8.85 g of triethylamine was added to the solution and agitated in an ice water bath. The above obtained liquid mixture (7.84 g) containing compound Cl-1 was dropped into the resultant reaction liquid, and agitated for four hours. A small amount of reaction liquid was sampled and subjected to $^1$H-NMR analysis. It was found that the protection ratio was 14.5%. Thereafter, a procedure comprising further adding a small amount of liquid mixture containing compound Cl-1, agitating the mixture for an hour and performing $^1$H-NMR analysis was repeated. When the protection ratio exceeded the target value of 16.0%, the reaction was terminated by adding distilled water to the mixture. THF was distilled off in vacuum, and the reaction product was dissolved in ethyl acetate. The thus obtained organic phase was washed with distilled water five times, and the washed organic phase was dropped into 1.5 liters of hexane. The thus obtained precipitate was separated by filtration, and washed with a small amount of hexane. The washed precipitate was dissolved in 35 g of propylene glycol monomethyl ether acetate (PG-MEA). Low-boiling-point solvents were removed from the obtained solution by means of an evaporator. Thus, 41.3 g of PGMEA solution of compound (P-1) (23.4 mass %) was obtained.

With respect to the obtained compound (P-1), the component ratio (molar ratio) thereof was calculated by $^1$H-NMR analysis. The $^1$H-NMR analytical method is described below.

($^1$H-NMR Analytical Method)

The PGMEA solution of compound (P-1) amounting to 0.5 g was diluted with 1.5 ml of ethyl acetate and 0.5 ml of triethylamine, and dropped into 50 g of hexane. The thus obtained precipitate was separated by filtration. Then, 75 mg was weighed out therefrom and dissolved in 1.1 g of DMSO-d$^6$. The resultant solution was analyzed by $^1$H-NMR.

The thus obtained $^1$H-NMR chart of compound (P-1) is shown in FIG. 1.

Further, with respect to the compound (P-1), the weight average molecular weight (Mw: polystyrene-equivalent), the number average molecular weight (Mn: polystyrene-equivalent) and the polydispersity index (Mw/Mn, hereinafter also referred to as "PDI") were calculated by GPC analysis (solvent: THF). The thus obtained results together with the chemical formula are indicated below.

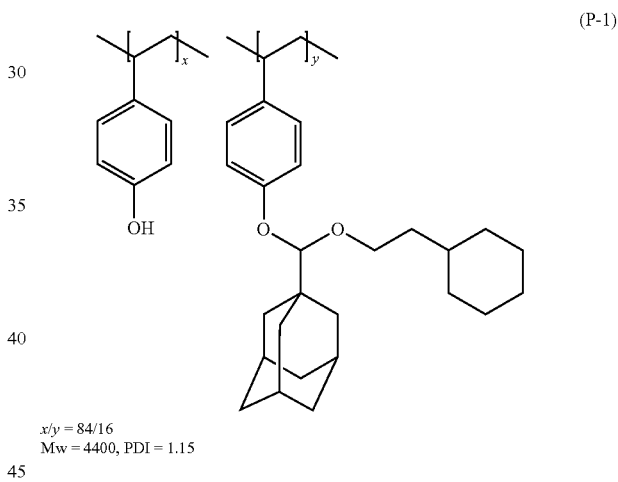

$x/y = 84/16$
Mw = 4400, PDI = 1.15

Synthetic Example 2

Synthesis of Compound (P-4)

(Synthesis of Chloroether Compound)

In a 500 ml round-bottomed flask, 20.0 g of adamantane-1-carboaldehyde, 23.46 g of triethyl orthoformate, 283 mg of camphorsulfonic acid and 100 ml of hexane were placed, and agitated at 25° C. for an hour. Subsequently, 617 mg of triethylamine was added to the mixture and agitated. The resultant organic phase was washed with 150 ml of distilled water thrice. The hexane was removed in vacuum conditions. Thus, 25.9 g of the following compound 2 was obtained as an acetal compound.

Thereafter, 10.70 g of acetyl chloride was added to 25.0 g of obtained compound 2, and agitated in a water bath heated at 45° C. for six hours. The temperature was lowered to room temperature, and unreacted acetyl chloride was removed in vacuum conditions. Thus, 22.07 g of the following compound C$_{1-2}$ was obtained as a chloroether compound.

$^1$H-NMR (CDCl$_3$: ppm) δ: 1.22 (3H, t), 1.45-2.15 (15H, m), 3.40-3.60 (1H, m), 3.90-4.05 (1H, m), 5.22 (1H, s)

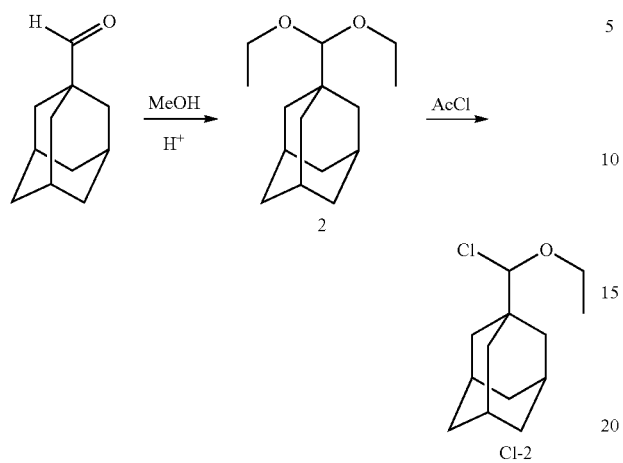

(Synthesis of Compound (P-4))

Poly(p-hydroxystyrene) (VP-2500, produced by Nippon Soda Co., Ltd.) as a polyhydroxystyrene compound amounting to 10.0 g was dissolved in 60 g of tetrahydrofuran (THF). Thereafter, 8.85 g of triethylamine was added to the solution and agitated in an ice water bath. The above obtained compound Cl-2 (4.38 g) was dropped into the resultant reaction liquid, and agitated for four hours. A small amount of reaction liquid was sampled and subjected to $^1$H-NMR analysis. It was found that the protection ratio was 21.2%. Thereafter, a procedure comprising further adding a small amount of compound Cl-2, agitating the mixture for an hour and performing $^1$H-NMR analysis was repeated. When the protection ratio exceeded the target value of 23.0%, the reaction was terminated by adding distilled water to the mixture. THF was distilled off in vacuum, and the reaction product was dissolved in ethyl acetate. The thus obtained organic phase was washed with distilled water five times, and the washed organic phase was dropped into 1.5 liters of hexane. The thus obtained precipitate was separated by filtration, and washed with a small amount of hexane. The washed precipitate was dissolved in 35 g of PGMEA. Low-boiling-point solvents were removed from the obtained solution by means of an evaporator. Thus, 45.3 g of PGMEA solution of compound (P-4) (22.3 mass %) was obtained.

The $^1$H-NMR and GPC analyses of obtained compound (P-4) were performed in the same manner as in Synthetic Example 1.

The $^1$H-NMR chart of obtained compound (P-4) is shown in FIG. 2.

Synthetic Example 3

Synthesis of Compound (P-13)

Polyhydroxystyrene compound (PHS-M3) amounting to 10.0 g was dissolved in 50 g of tetrahydrofuran (THF). Thereafter, 8.85 g of triethylamine was added to the solution and agitated in an ice water bath. The above obtained liquid mixture (7.84 g) containing compound Cl-1 was dropped into the resultant reaction liquid, and agitated for four hours. A small amount of reaction liquid was sampled and subjected to $^1$H-NMR analysis. It was found that the protection ratio was 14.3%. The reaction was terminated by adding distilled water to the mixture. THF was distilled off in vacuum, and the reaction product was dissolved in ethyl acetate. The thus obtained organic phase was washed with distilled water five times, and the washed organic phase was dropped into 1.2 liters of hexane. The thus obtained precipitate was separated by filtration, and washed with a small amount of hexane. The washed precipitate was dissolved in 35 g of PGMEA. Low-boiling-point solvents were removed from the obtained solution by means of an evaporator. Thus, 44.8 g of PGMEA solution of compound (P-13) (22.4 mass %) was obtained.

Figure 3:
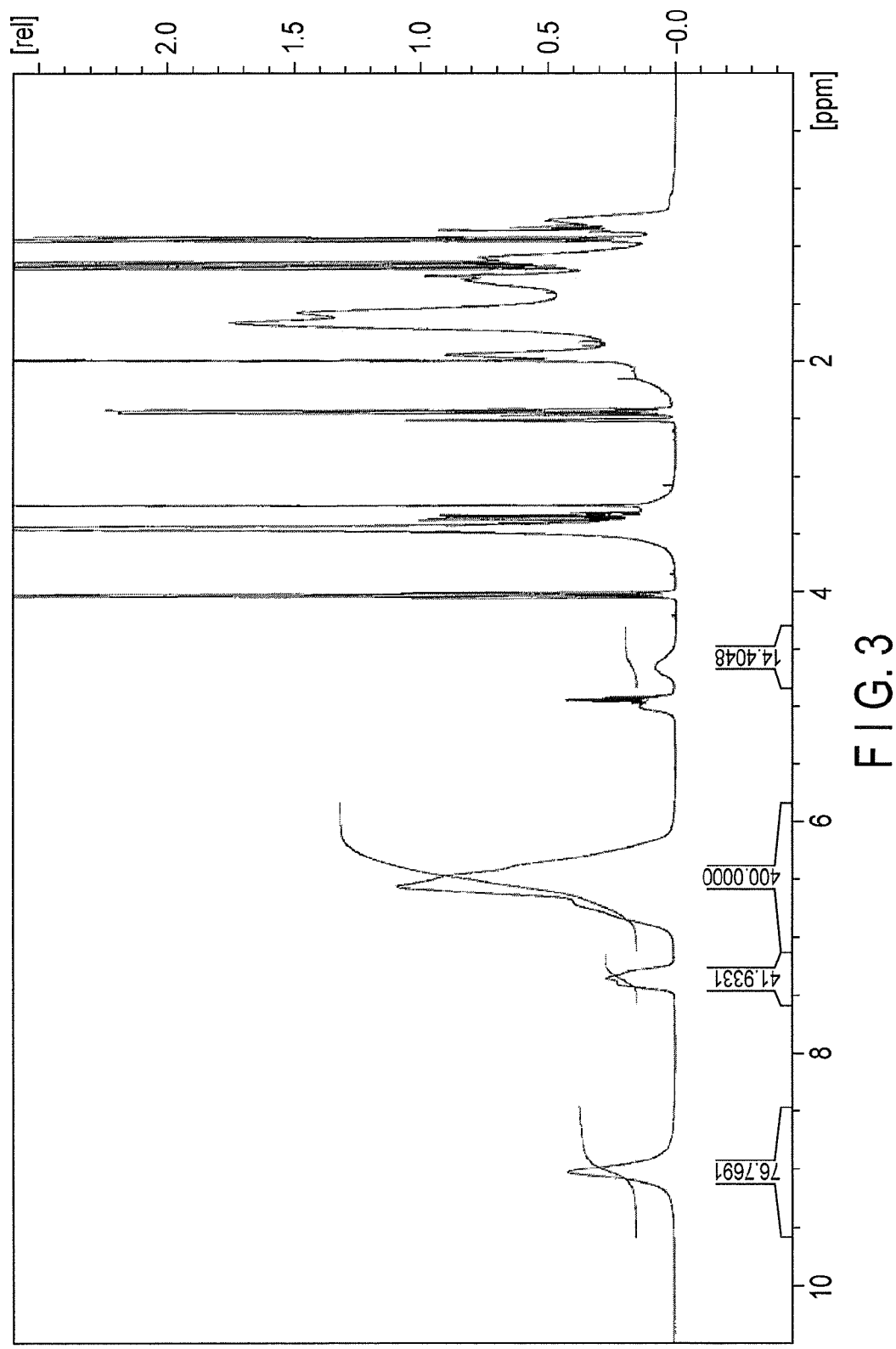
FIG. 3 is a $^1$H-NMR chart of compound (P-13) synthesized in Example.

The $^1$H-NMR and GPC analyses of obtained compound (P-13) were performed in the same manner as in Synthetic Example 1. The $^1$H-NMR chart of compound (P-13) is shown in FIG. 3.

Synthetic Example 4

Synthesis of Compound (P-16)

(Synthesis of Chloroether Compound)

In a 500 ml round-bottomed flask, 20.0 g of adamantane-1-carboaldehyde, 16.8 g of triethyl orthoformate, 283 mg of camphorsulfonic acid and 100 ml of hexane were placed, and agitated at 25° C. for an hour. Subsequently, 617 mg of triethylamine was added to the mixture and agitated. The resultant organic phase was washed with 150 ml of distilled water thrice. The hexane was removed in vacuum conditions. Thus, 24.0 g of the following compound 10 was obtained as an acetal compound.

Thereafter, 8.96 g of acetyl chloride was added to 20.0 g of obtained compound 10, and agitated in a water bath heated at 45° C. for four hours. The temperature was lowered to room temperature, and unreacted acetyl chloride was removed in vacuum conditions. Thus, 20.42 g of the following compound Cl-10 was obtained as a chloroether compound.

$^1$H-NMR (CDCl$_3$: ppm) δ: 1.58-1.83 (12H, m), 2.02 (3H, s), 3.52 (3H, s), 5.08 (1H, s)

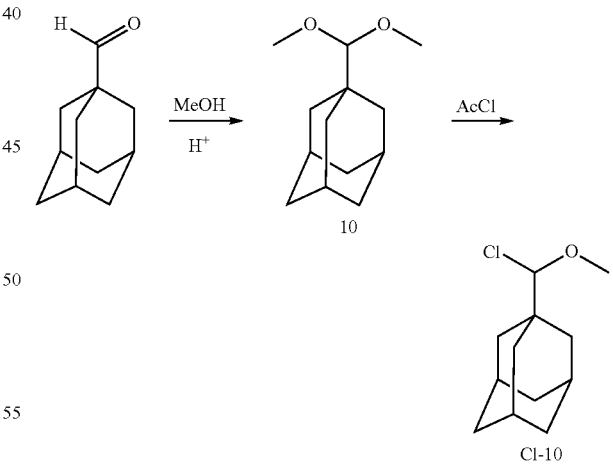

(Synthesis of Compound (P-16))

Poly(p-hydroxystyrene) (VP-2500, produced by Nippon Soda Co., Ltd.) as a polyhydroxystyrene compound amounting to 30.0 g was dissolved in 180 g of tetrahydrofuran (THF). Thereafter, 26.53 g of triethylamine was added to the solution and agitated in an ice water bath. The above obtained compound Cl-10 (14.88 g) was dropped into the resultant reaction liquid, and agitated for four hours. A small amount of reaction liquid was sampled and subjected to $^1$H-NMR analysis. It was found that the protection ratio was 19.2%. Thereafter, a procedure comprising further adding a small amount of compound Cl-10, agitating the mixture for an hour and performing $^1$H-NMR analysis was repeated. When the protection ratio exceeded the target value of 23.0%, the reaction was terminated by adding distilled water to the mixture. THF was distilled off in vacuum, and the reaction product was dissolved in ethyl acetate. The thus obtained organic phase was washed with distilled water five times, and the washed organic phase was dropped into 2.5 liters of hexane. The thus obtained precipitate was separated by filtration, and washed with a small amount of hexane. The washed precipitate was dissolved in 75 g of PGMEA. Low-boiling-point solvents were removed from the obtained solution by means of an evaporator. Thus, 110.2 g of PGMEA solution of compound (P-16) (27.2 mass %) was obtained.

Figure 4:
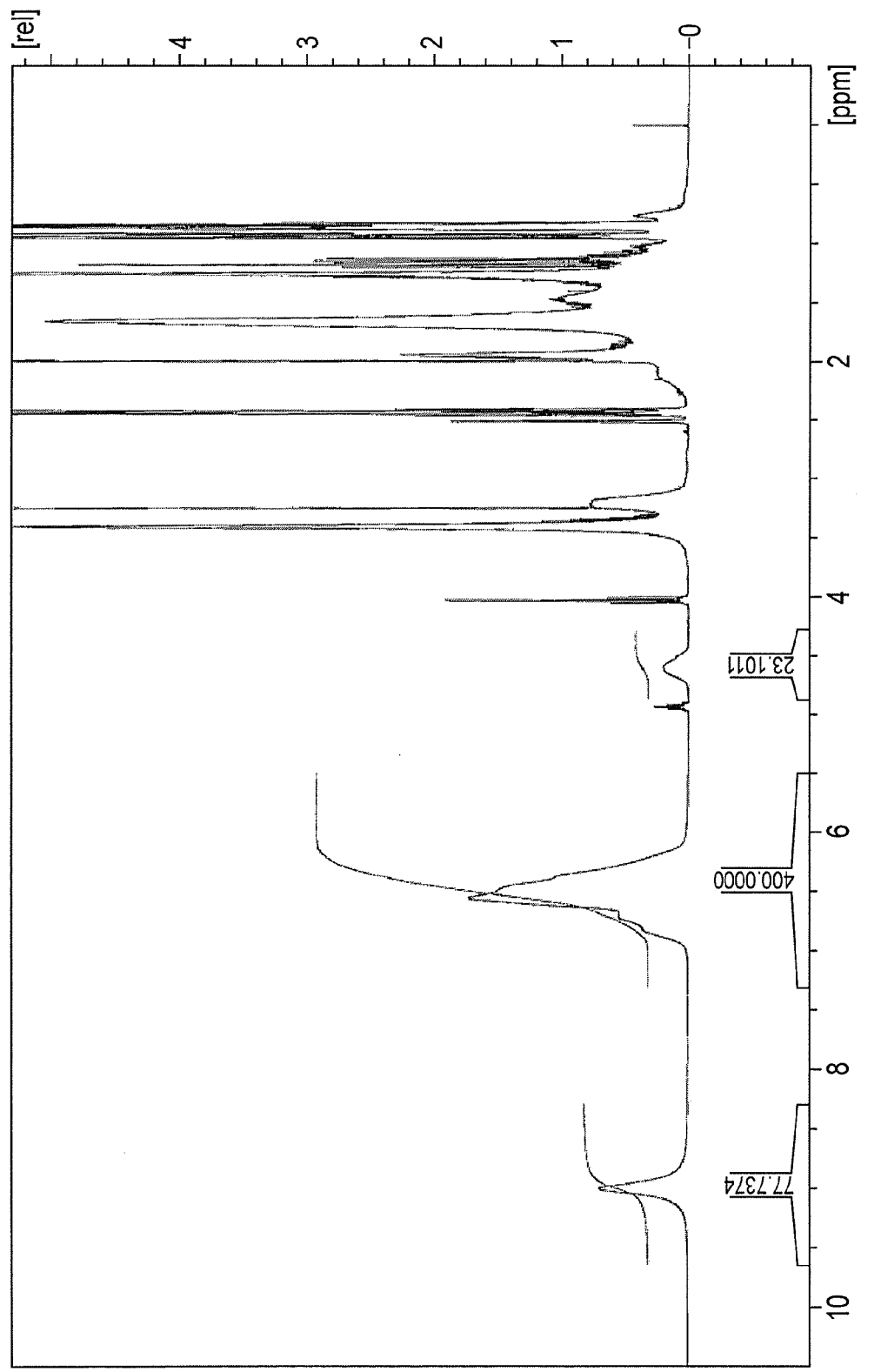
FIG. 4 is a $^1$H-NMR chart of compound (P-16) synthesized in Example.

The $^1$H-NMR and GPC analyses of obtained compound (P-16) were performed in the same manner as in Synthetic Example 1. The $^1$H-NMR chart of compound (P-16) is shown in FIG. 4.

Synthetic Example 5

Synthesis of Compound (P-33)

Polyhydroxystyrene compound (PHS-M2) amounting to 10.0 g was dissolved in 60 g of tetrahydrofuran (THF). Thereafter, 8.84 g of triethylamine was added to the solution and agitated in an ice water bath. The above obtained compound Cl-10 (4.11 g) was dropped into the resultant reaction liquid, and agitated for four hours. A small amount of reaction liquid was sampled and subjected to $^1$H-NMR analysis. It was found that the protection ratio was 18.2%. The reaction was terminated by adding distilled water to the mixture. THF was distilled off in vacuum, and the reaction product was dissolved in ethyl acetate. The thus obtained organic phase was washed with distilled water five times, and the washed organic phase was dropped into 1.5 liters of hexane. The thus obtained precipitate was separated by filtration, and washed with a small amount of hexane. The washed precipitate was dissolved in 35 g of PGMEA. Low-boiling-point solvents were removed from the obtained solution by means of an evaporator. Thus, 45.2 g of PGMEA solution of compound (P-33) (24.4 mass %) was obtained.

Figure 5:
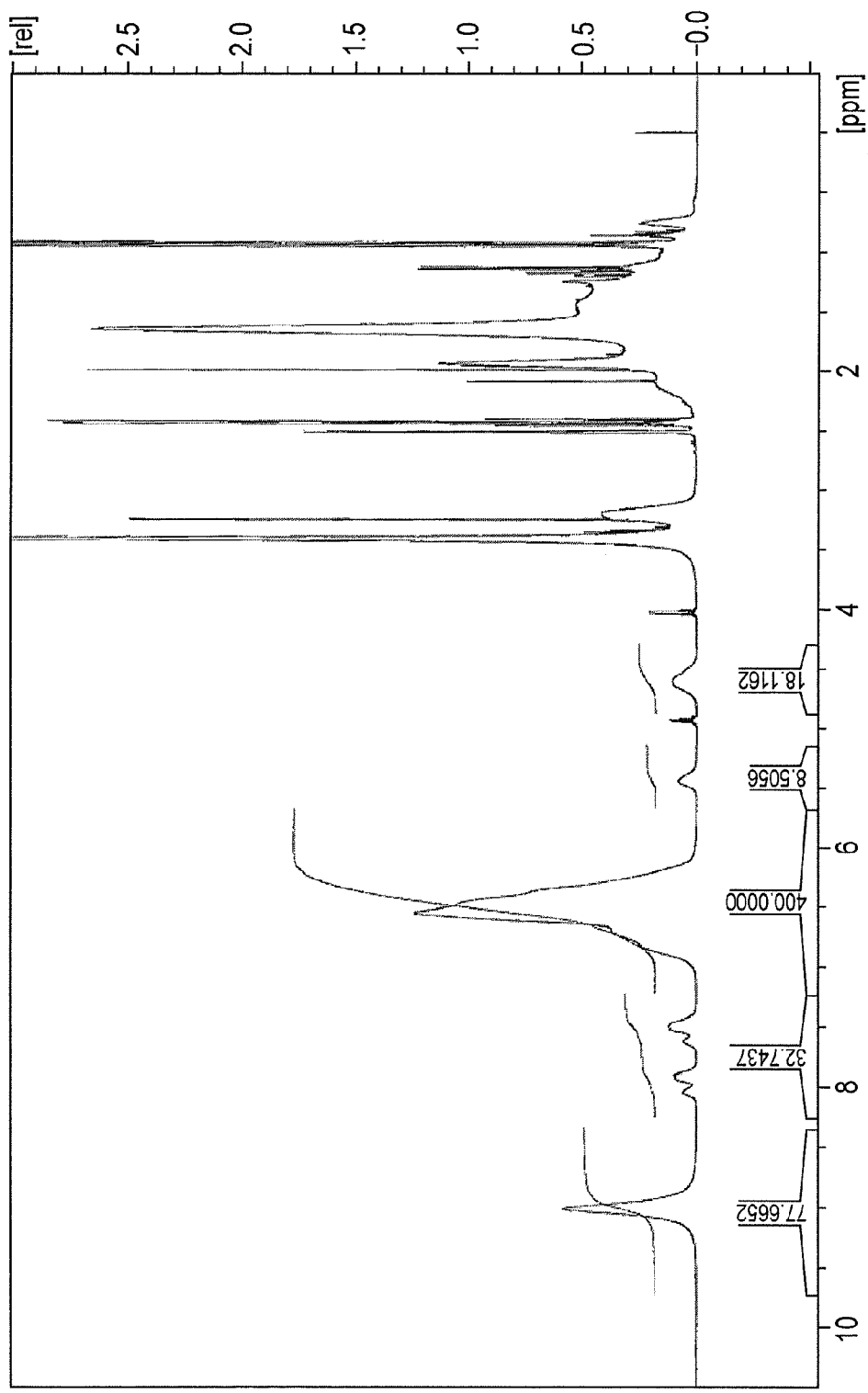
FIG. 5 is a $^1$H-NMR chart of compound (P-33) synthesized in Example.

The $^1$H-NMR and GPC analyses of obtained compound (P-33) were performed in the same manner as in Synthetic Example 1. The $^1$H-NMR chart of compound (P-33) is shown in FIG. 5.

Synthetic Example 6

Synthesis of Compound (P-36)

(Synthesis of Chloroether Compound)

In a 500 ml round-bottomed flask, 20.0 g of adamantane-1-carboaldehyde, 30.12 g of triisopropyl orthoformate, 283 mg of camphorsulfonic acid and 100 ml of hexane were placed, and agitated at 25° C. for an hour. Subsequently, 617 mg of triethylamine was added to the mixture and agitated. The resultant organic phase was washed with 150 ml of distilled water thrice. The hexane was removed in vacuum conditions. Thus, 29.52 g of the following compound 13 was obtained as an acetal compound.

Thereafter, 7.66 g of acetyl chloride was added to 20.0 g of obtained compound 13, and agitated in a water bath heated at 45° C. for four hours. The temperature was lowered to room temperature, and unreacted acetyl chloride was removed in vacuum conditions. Thus, 16.59 g of the following compound Cl-13 was obtained as a chloroether compound.

$^1$H-NMR (CDCl$_3$: ppm) δ: 1.12-1.25 (6H, m), 1.60-1.77 (12H, m), 1.96-2.08 (3H, m), 4.03 (1H, sep), 5.29 (1H, s)

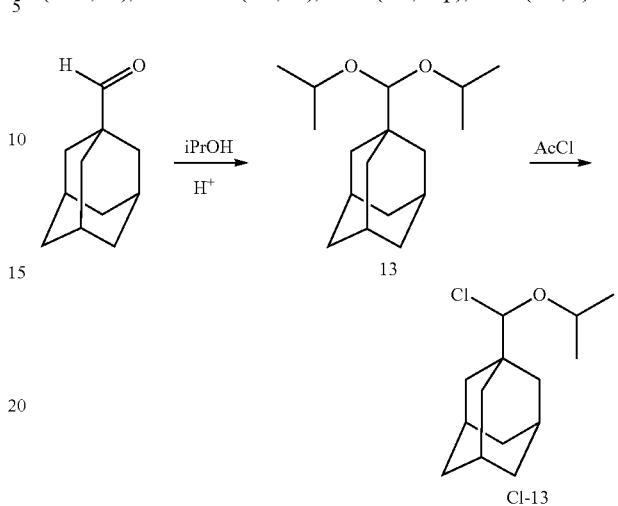

(Synthesis of Compound (P-36))

Poly(p-hydroxystyrene) (VP-2500, produced by Nippon Soda Co., Ltd.) as a polyhydroxystyrene compound amounting to 10.0 g was dissolved in 60 g of tetrahydrofuran (THF). Thereafter, 8.84 g of triethylamine was added to the solution and agitated in an ice water bath. A 10 g THF solution of above obtained compound Cl-13 (10.10 g) was dropped into the resultant reaction liquid, and agitated for four hours. The reaction was terminated by adding distilled water to the mixture. THF was distilled off in vacuum, and the reaction product was dissolved in ethyl acetate. The thus obtained organic phase was washed with distilled water five times, and the washed organic phase was dropped into 800 ml of hexane. The thus obtained precipitate was separated by filtration, and washed with a small amount of hexane. The washed precipitate was dissolved in 35 g of PGMEA. Low-boiling-point solvents were removed from the obtained solution by means of an evaporator. Thus, 54.63 g of PGMEA solution of compound (P-36) (24.7 mass %) was obtained.

Figure 6:
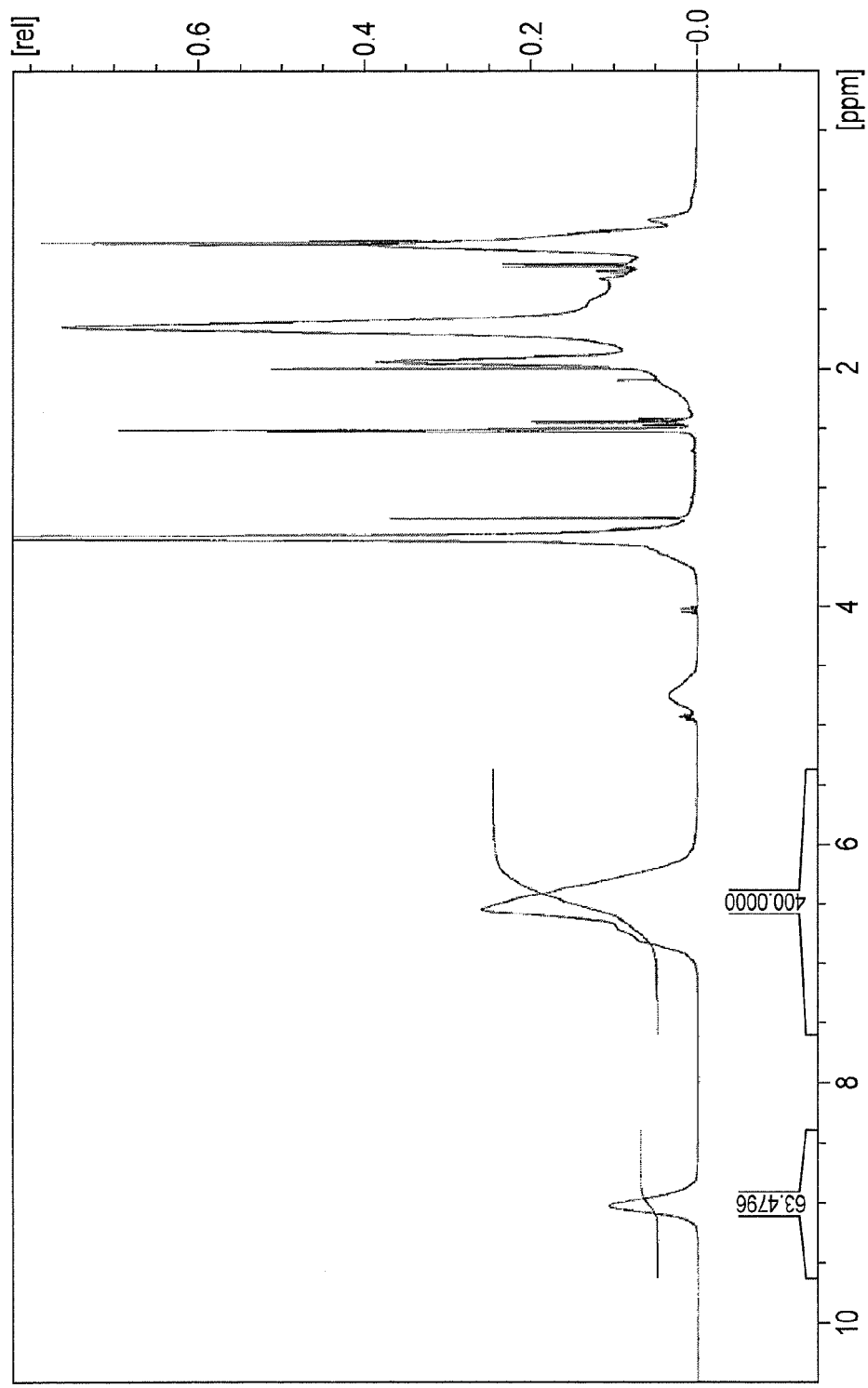
FIG. 6 is a $^1$H-NMR chart of compound (P-36) synthesized in Example.

The $^1$H-NMR and GPC analyses of obtained compound (P-36) were performed in the same manner as in Synthetic Example 1. The $^1$H-NMR chart of compound (P-36) is shown in FIG. 6.

Synthetic Examples 7 to 23

Synthesis of Other Compounds (A)

Compounds (P-2), (P-3), (P-5) to (P-12), (P-14), (P-15), (P-17), (P-34), (P-35), (P-37) and (P-38) were synthesized in the same manner as in Synthetic Example 1 except that the polyhydroxystyrene compound and chloroether compound for use were appropriately changed. The polyhydroxystyrene compounds and chloroether compounds used in the syntheses are listed below. Each of the chloroether compounds for use was synthesized through an acetal compound from a corresponding aldehyde compound as a starting material in the same manner as in Synthetic Example 1.

TABLE 1

| | Synthetic compd. | Polyhydroxystyrene comd. | Chloroether compd. |
|---|---|---|---|
| Synthetic Exam. 2 | P-4 | VP-2500 | Cl-2 |
| Synthetic Exam. 3 | P-13 | PHS-M3 | Cl-1 |
| Synthetic Exam. 4 | P-16 | VP-2500 | Cl-10 |
| Synthetic Exam. 5 | P-33 | PHS-M2 | Cl-10 |
| Synthetic Exam. 6 | P-36 | VP-2500 | Cl-13 |
| Synthetic Exam. 7 | P-2 | VP-2500 | Cl-1 |
| Synthetic Exam. 8 | P-3 | VP-8000 | Cl-1 |
| Synthetic Exam. 9 | P-5 | VP-8000 | Cl-2 |
| Synthetic Exam. 10 | P-6 | VP-2500 | Cl-3 |
| Synthetic Exam. 11 | P-7 | VP-2500 | Cl-4 |
| Synthetic Exam. 12 | P-8 | PHS-M1 | Cl-5 |
| Synthetic Exam. 13 | P-9 | VP-2500 | Cl-6 |
| Synthetic Exam. 14 | P-10 | PHS-M5 | Cl-7 |
| Synthetic Exam. 15 | P-11 | PHS-M3 | Cl-2 |
| Synthetic Exam. 16 | P-12 | PHS-M4 | Cl-2 |
| Synthetic Exam. 17 | P-14 | PHS-M6 | Cl-8 |
| Synthetic Exam. 18 | P-15 | PHS-M2 | Cl-9 |
| Synthetic Exam. 19 | P-17 | VP-2500 | Cl-10 |
| Synthetic Exam. 20 | P-34 | VP-2500 | Cl-11 |
| Synthetic Exam. 21 | P-35 | VP-2500 | Cl-13 |
| Synthetic Exam. 22 | P-37 | VP-2500 | Cl-15 |
| Synthetic Exam. 23 | P-38 | VP-2500 | Cl-16 |

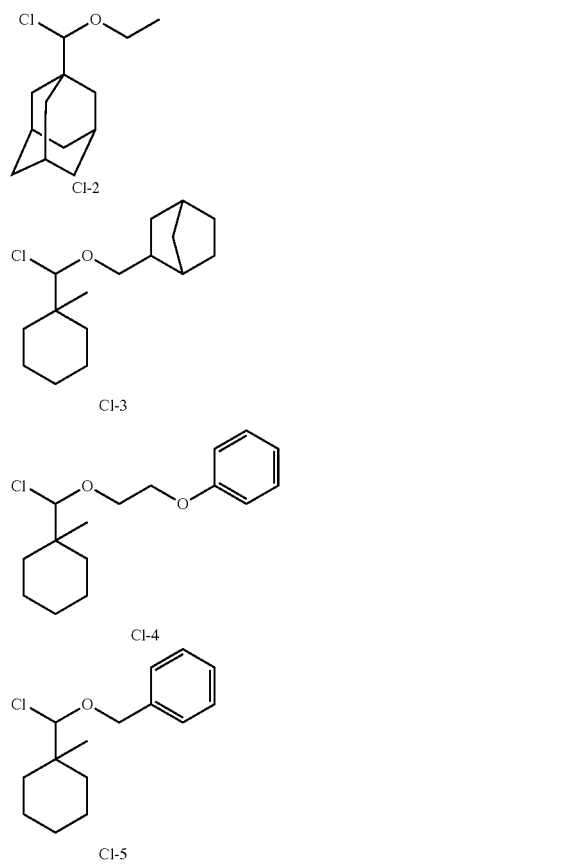

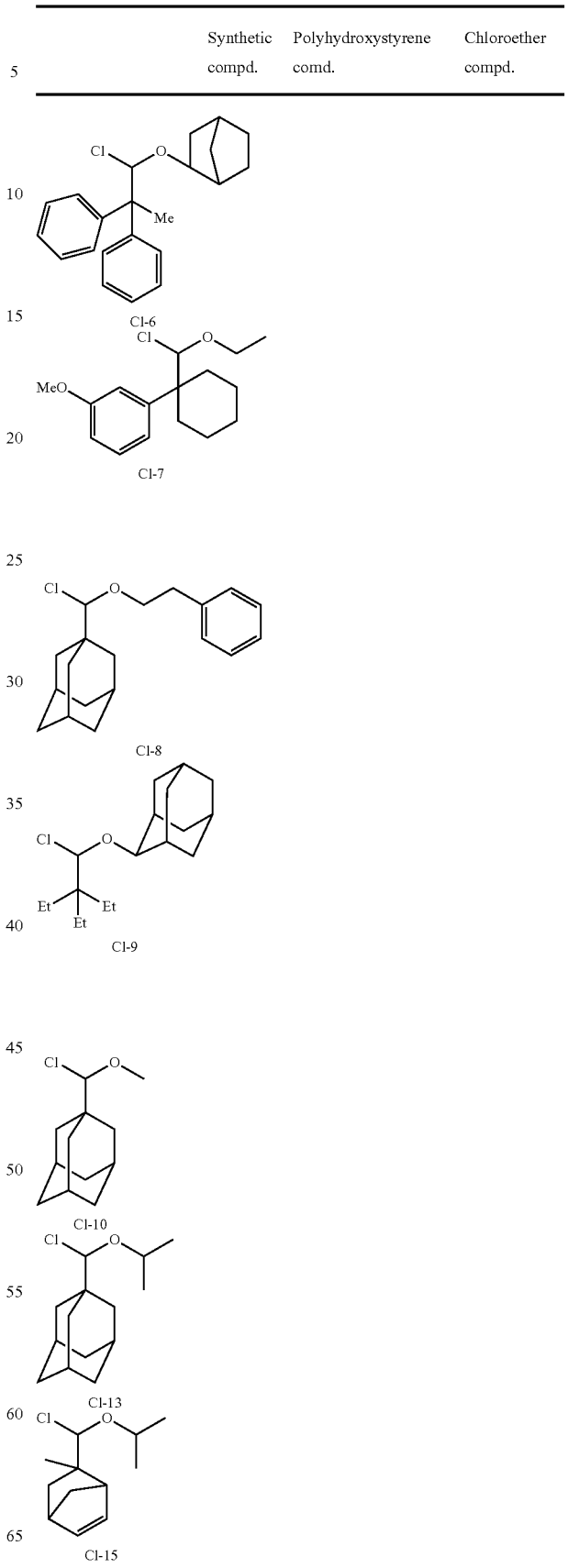

TABLE 1-continued
| Synthetic compd. | Polyhydroxystyrene comd. | Chloroether compd. |
|---|---|---|
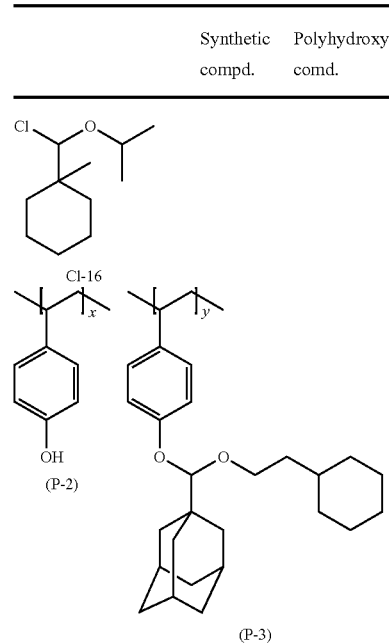
Cl-16
(P-2)
(P-3)
(P-2) x/y = 70/30
Mw = 5100, PDI = 1.12
(P-3) x/y = 88/12
Mw = 12100, PDI = 1.07
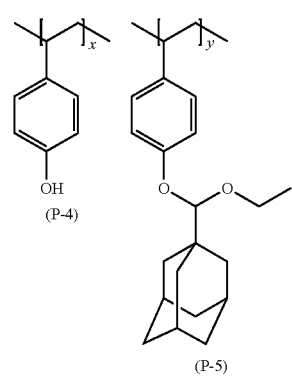
(P-4)
(P-5)
(P-4) x/y = 77/23
Mw = 4600, PDI = 1.12
(P-5) x/y = 83/17
Mw = 12200, PDI = 1.08
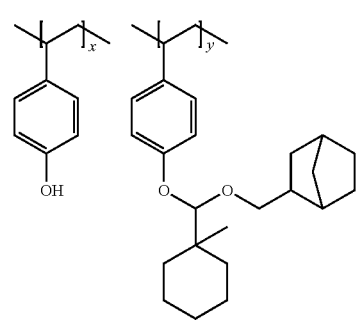
(P-6)
x/y = 82/18
Mw = 4900, PDI = 1.13
TABLE 1-continued
| Synthetic compd. | Polyhydroxystyrene comd. | Chloroether compd. |
|---|---|---|
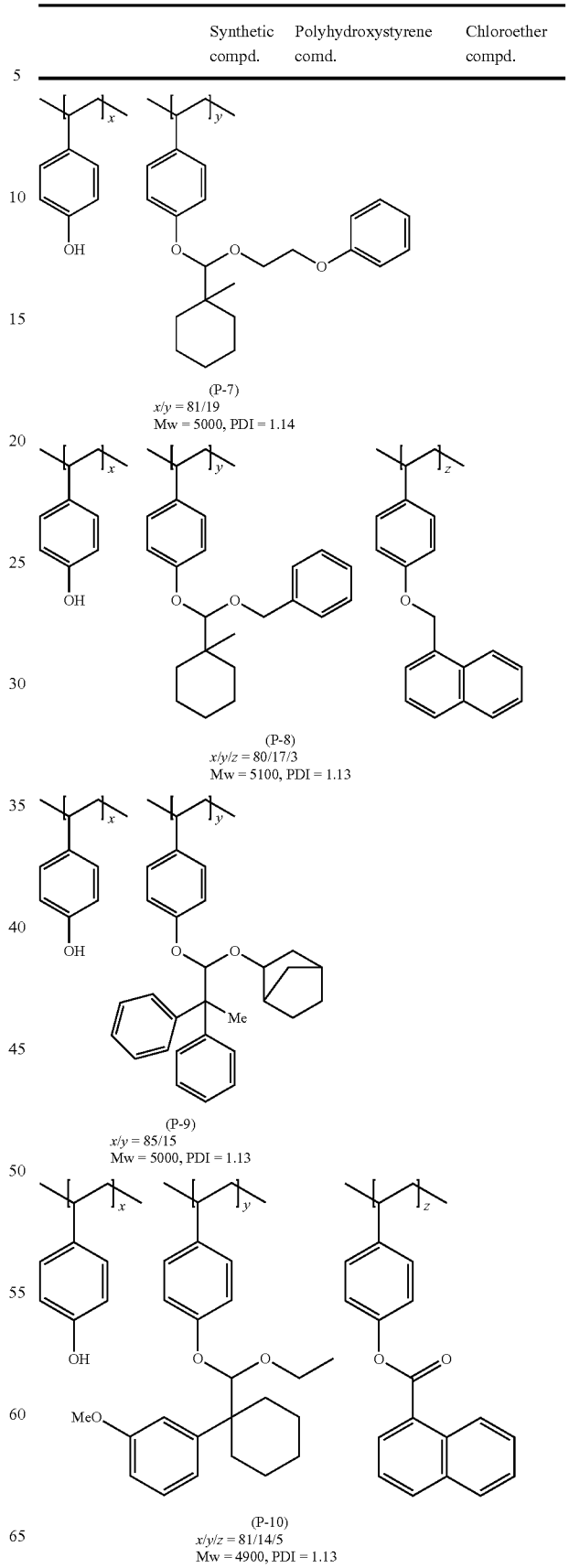
(P-7)
x/y = 81/19
Mw = 5000, PDI = 1.14
(P-8)
x/y/z = 80/17/3
Mw = 5100, PDI = 1.13
(P-9)
x/y = 85/15
Mw = 5000, PDI = 1.13
(P-10)
x/y/z = 81/14/5
Mw = 4900, PDI = 1.13

TABLE 1-continued
| Synthetic compd. | Polyhydroxystyrene comd. | Chloroether compd. |
|---|---|---|
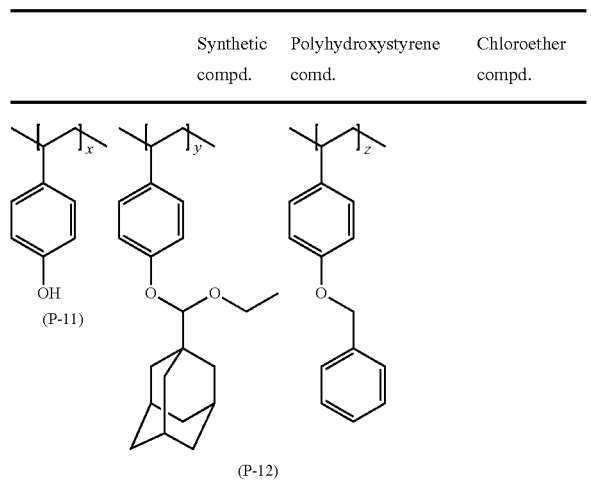
(P-11) x/y/z = 74/18/8
 Mw = 4500, PDI = 1.12
(P-12) x/y/z = 81/14/5
 Mw = 12100, PDI = 1.08
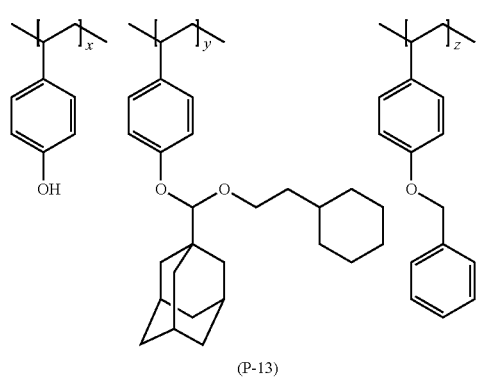
(P-13)
x/y/z = 78/14/8
Mw = 4600, PDI = 1.13
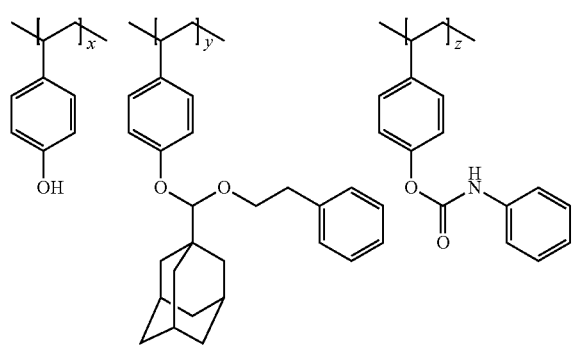
(P-14)
x/y/z = 81/14/5
Mw = 12500, PDI = 1.07
TABLE 1-continued
| Synthetic compd. | Polyhydroxystyrene comd. | Chloroether compd. |
|---|---|---|
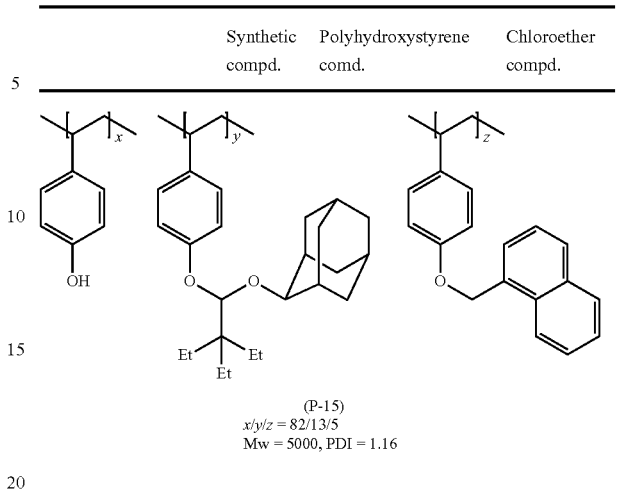
(P-15)
x/y/z = 82/13/5
Mw = 5000, PDI = 1.16
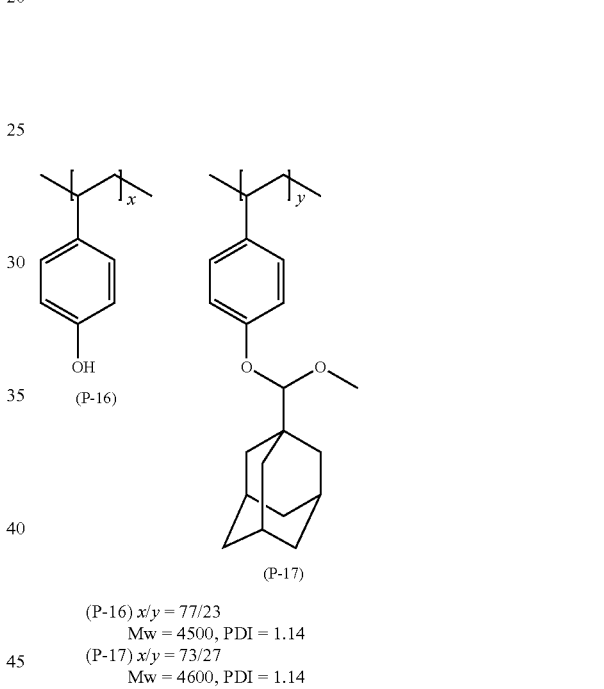
(P-16) x/y = 77/23
 Mw = 4500, PDI = 1.14
(P-17) x/y = 73/27
 Mw = 4600, PDI = 1.14
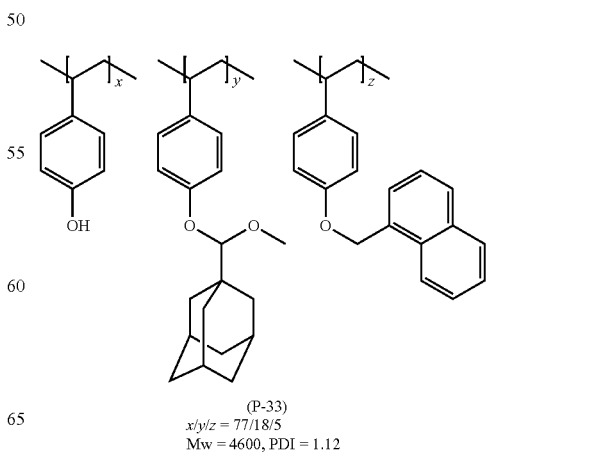
(P-33)
x/y/z = 77/18/5
Mw = 4600, PDI = 1.12

TABLE 1-continued

| Synthetic compd. | Polyhydroxystyrene comd. | Chloroether compd. |
| --- | --- | --- |

(P-34) x/y = 78/22 Mw = 4500, PDI = 1.12

(P-35)

(P-36)

(P-35) x/y = 80/20 Mw = 4500, PDI = 1.14
(P-36) x/y = 63/37 Mw = 6100, PDI = 1.20

(P-37) x/y = 73/27 Mw = 4700, PDI = 1.12

(P-38) x/y = 71/29 Mw = 4700, PDI = 1.12

Synthetic Example 24

Synthesis of Compound (P-18)

In the same manner as in Synthetic Example 1, a 19 mol % reaction was effected using polyhydroxystyrene compound (PHS-M4) (hydroxystyrene unit equivalent to 83.3 mmol) and chloroether compound Cl-2. The reaction was terminated by adding distilled water. THF was distilled off in vacuum, and the obtained reaction product was dissolved in ethyl acetate. The resultant organic phase was washed with distilled water five times, concentrated and dried to solid.

The thus obtained polymer was dissolved in 40 g of N,N-dimethylformamide (DMF), and 6.58 g of pyridine, 0.92 g of 2-sulfobenzoic acid anhydride (hereinafter may be referred to SN-1) as a sulfonating agent and 122 mg of N,N-dimethylaminopyridine were added to the solution. The mixture was agitated at room temperature for five hours. The obtained reaction liquid was transferred into a separatory funnel in which 100 ml of ethyl acetate had been placed. The thus obtained organic phase was washed with 100 ml of saturated aqueous sodium chloride solution five times, and concentrated by means of an evaporator, thereby removing ethyl acetate.

The thus obtained polymer was dissolved in 30 ml of tetrahydrofuran (THF) and 10 ml of methanol, and 1.72 g of triphenylsulfonium bromide (hereinafter may be referred to as PG-1) as a PAG precursor was added to the solution. The mixture was agitated at room temperature for three hours. The obtained reaction liquid was concentrated by means of an evaporator, and re-dissolved in 100 ml of ethyl acetate. The thus obtained organic phase was washed with 100 ml of distilled water five times, and concentrated. The concentrate was dissolved in 50 ml of acetone, and dropped into 700 ml of solution comprised of a 15:1 (vol. ratio) mixture of distilled water and methanol. Any supernatant liquid was removed, and the obtained solid was dissolved in 50 ml of ethyl acetate and dropped into 700 ml of hexane. Any supernatant matter was removed, and the obtained precipitate was dissolved in 32 g of PGMEA. Low-boiling-point solvents were removed from the obtained solution by means of an evaporator. Thus, 45.1 g of PGMEA solution of compound (P-18) (27.2 mass %) was obtained.

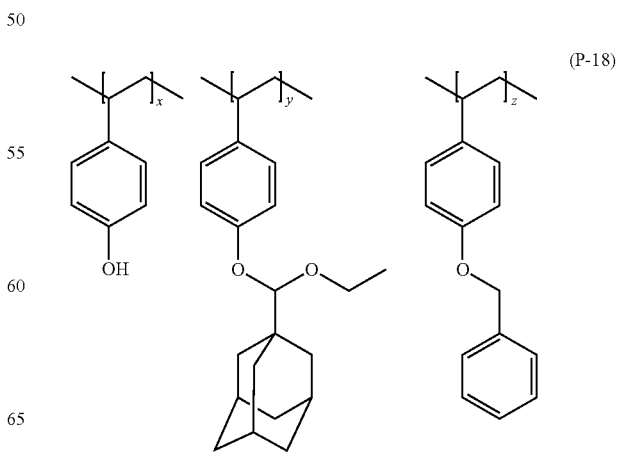

(P-18)

-continued

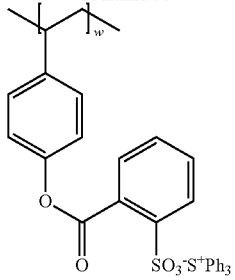

x/y/z/w = 73/19/5/3
Mw = 12800, PDI = 1.09

Synthetic Examples 25 to 30

Synthesis of Compounds (P-19) to (P-24)

The synthesis was performed in the same manner as in Synthetic Example 24 except that the polyhydroxystyrene compound, chloroether compound, sulfonating agent and PAG precursor for use were appropriately changed. The reagents employed in the synthesis are listed below.

TABLE 2

| | Synthetic compd. | Polyhydro-xystyrene comd. | Chloroether compd. | Sulfonating agent | PAG precursor |
|---|---|---|---|---|---|
| Synthetic Exam. 25 | P-19 | VP-2500 | Cl-6 | SN-1 | PG-1 |
| Synthetic Exam. 26 | P-20 | PHS-M5 | Cl-11 | SN-1 | PG-1 |
| Synthetic Exam. 27 | P-21 | VP-2500 | Cl-12 | SN-2 | PG-2 |
| Synthetic Exam. 28 | P-22 | VP-2500 | Cl-7 | SN-3 | PG-1 |
| Synthetic Exam. 29 | P-23 | VP-2500 | Cl-1 | SN-1 | PG-1 |
| Synthetic Exam. 30 | P-24 | PHS-M3 | Cl-10 | SN-1 | PG-1 |

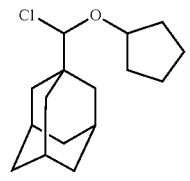

Cl-11

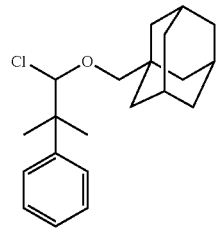

Cl-12

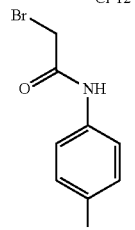

SN-2

TABLE 2-continued

| | Synthetic compd. | Polyhydro-xystyrene comd. | Chloroether compd. | Sulfonating agent | PAG precursor |
|---|---|---|---|---|---|

[Structure of SN-3]

SN-3

[Structure of PG-2]

PG-2

[Structure of P-19]

(P-19)
x/y/w = 82/15/3
Mw = 5200, PDI = 1.14

[Structure of P-20]

(P-20)
x/y/z/w = 74/18/5/3
Mw = 5600, PDI = 1.16

TABLE 2-continued

| Synthetic compd. | Polyhydroxystyrene comd. | Chloroether compd. | Sulfonating agent | PAG precursor |
|---|---|---|---|---|

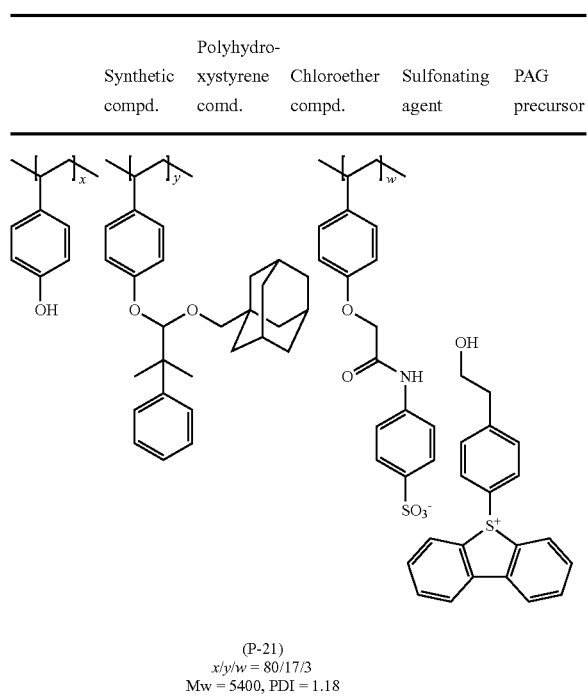

(P-21)
x/y/w = 80/17/3
Mw = 5400, PDI = 1.18

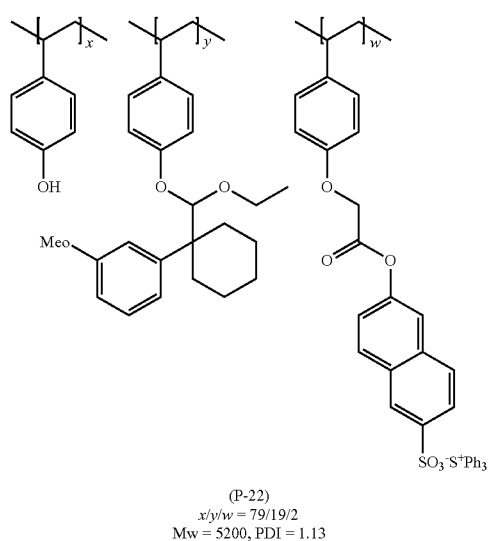

(P-22)
x/y/w = 79/19/2
Mw = 5200, PDI = 1.13

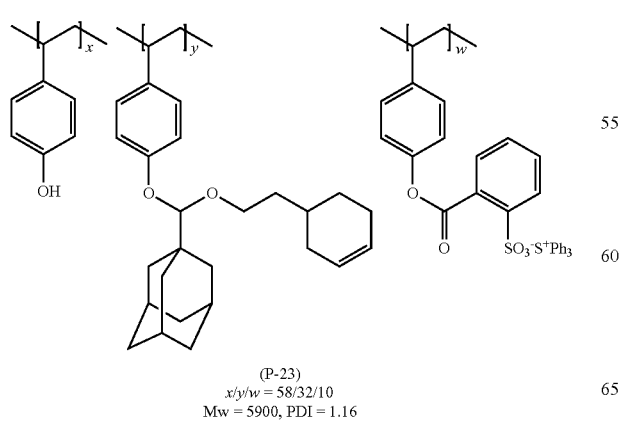

(P-23)
x/y/w = 58/32/10
Mw = 5900, PDI = 1.16

TABLE 2-continued

| Synthetic compd. | Polyhydroxystyrene comd. | Chloroether compd. | Sulfonating agent | PAG precursor |
|---|---|---|---|---|

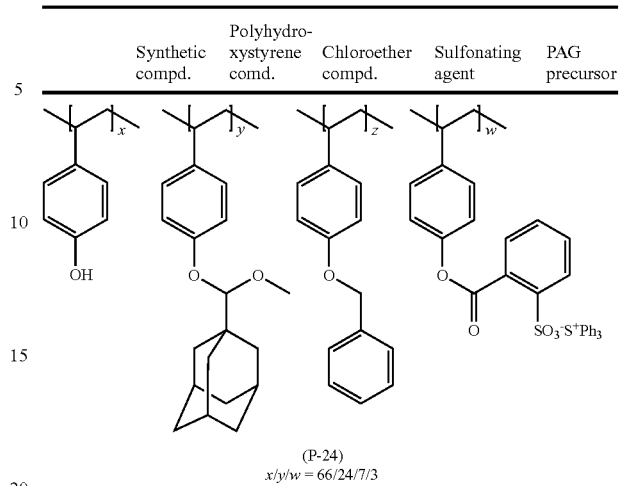

(P-24)
x/y/w = 66/24/7/3
Mw = 5500, PDI = 1.14

Synthetic Example 31

Synthesis of Compound (P-25)

In a nitrogen gas stream, 11.0 g of 1-methoxy-2-propanol was heated at 70° C. While agitating this liquid, a solution comprised of a mixture of 10.0 g of below-shown monomer (M-1), 3.74 g of below-shown monomer (M-2), 43.96 g of 1-methoxy-2-propanol and 2.13 g of dimethyl 2,2'-azobisisobutyrate [V-601, produced by Wako Pure Chemical Industries, Ltd.] was dropped thereinto over a period of two hours. After the completion of the dropping, the mixture was further agitated at 70° C. for four hours. The obtained reaction liquid was allowed to stand still to cool, re-precipitated in a large volume of hexane/ethyl acetate, and dried in vacuum. Thus, 9.21 g of polymeric compound (P-25) according to the present invention was obtained.

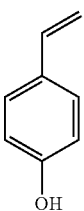

M-1

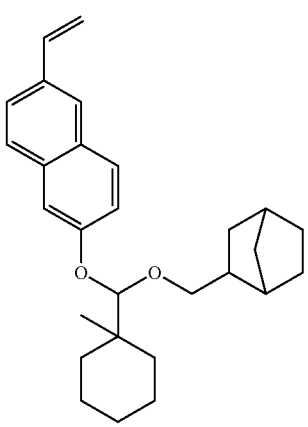

M-2

(P-25)
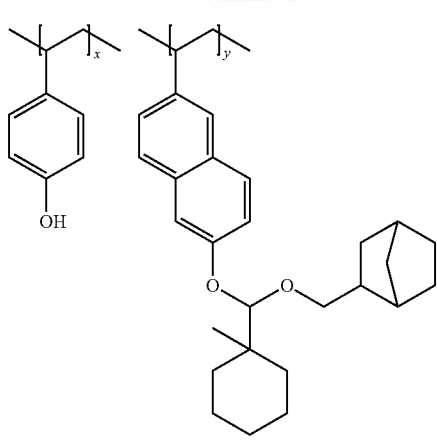
x/y = 88/12
Mw = 5800, PDI = 1.45
Synthetic Examples 32 to 37
Synthesis of Compounds (P-26) to (P-29), (P-39) and (P-40)
Polymeric compounds (P-26) to (P-29), (P-39) and (P-40) according to the present invention were obtained in accordance with Synthetic Example 31 except that the monomer species for use was appropriately changed.
(P-26)
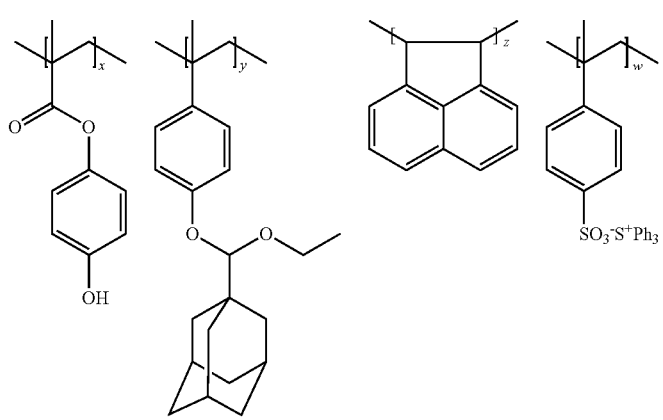
x/y/z/w = 63/22/12/3
Mw = 6200, PDI = 1.27
(P-27)
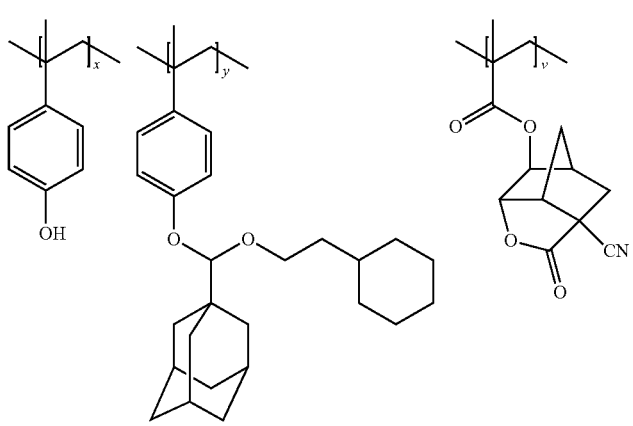
x/y/v = 58/32/10
Mw = 6200, PDI = 1.44

-continued
(P-28)
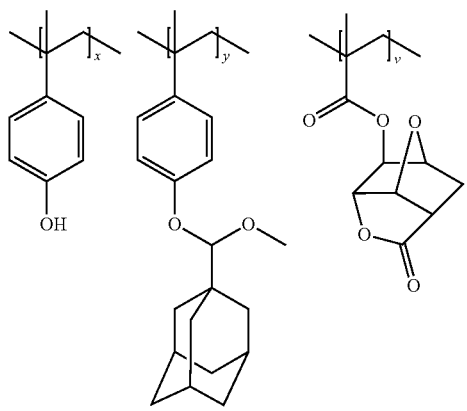
x/y/v = 61/31/8
Mw = 5400, PDI = 1.38
(P-29)
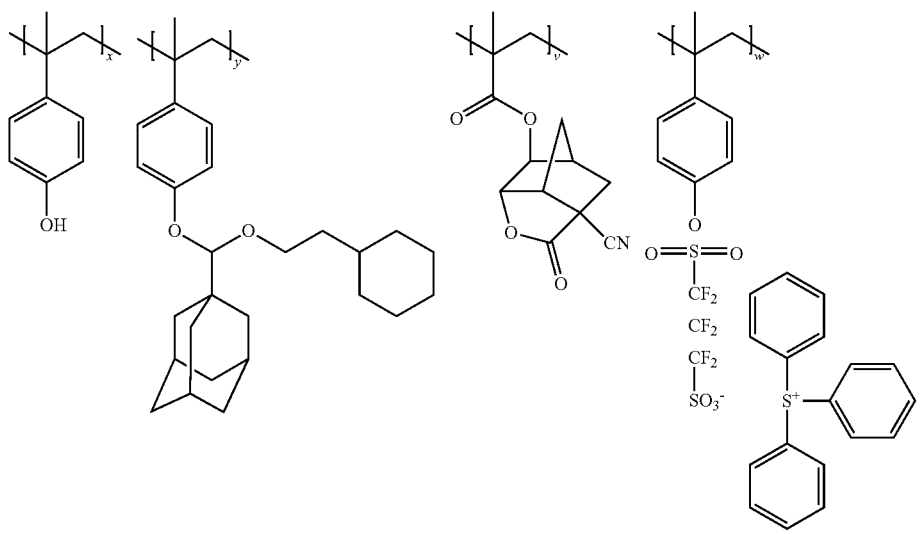
x/y/v/w = 57/29/8/6
Mw = 6400, PDI - 1.40
(P-39)
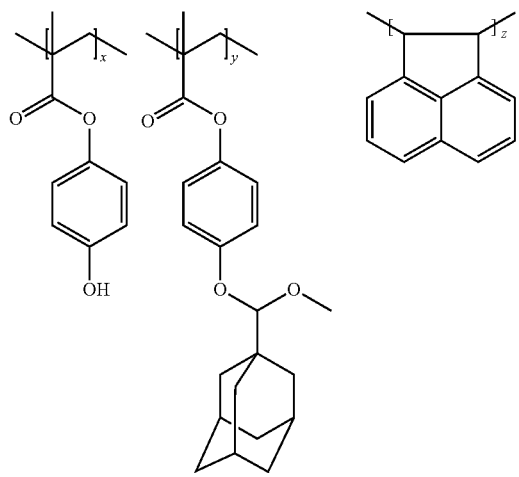
x/y = 76/18/6
Mw = 5100, PDI - 1.24

(P-40)

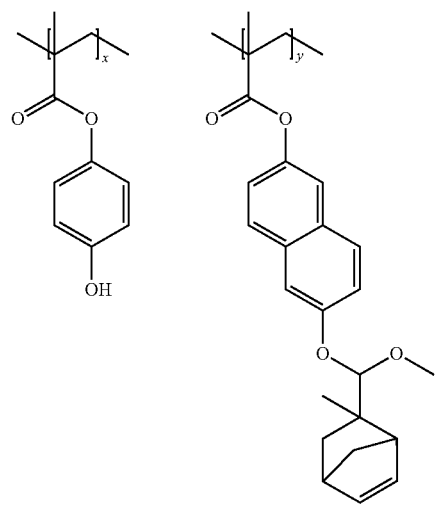

x/y = 79/14/7
Mw = 9600, PDI - 1.31

Synthetic Examples 38 and 39

Synthesis of Compounds (P-30) and (P-31)

Compounds (P-30) and (P-31) according to the present invention were synthesized in the same manner as in Synthetic Example 2 except that the polyhydroxystyrene compound was changed to 4-tert-butylcalix[8]arene in Synthetic Example 38 and to 1,3,5-tri(1',1'-di(4-hydroxyphenyl)ethyl)benzene in Synthetic Example 39.

(P-30)

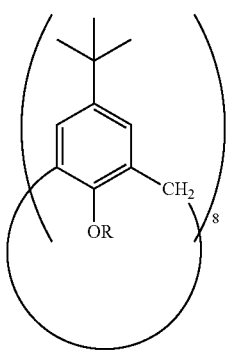

R = H (72%)

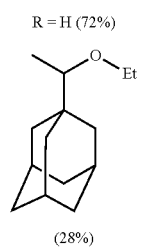

(28%)

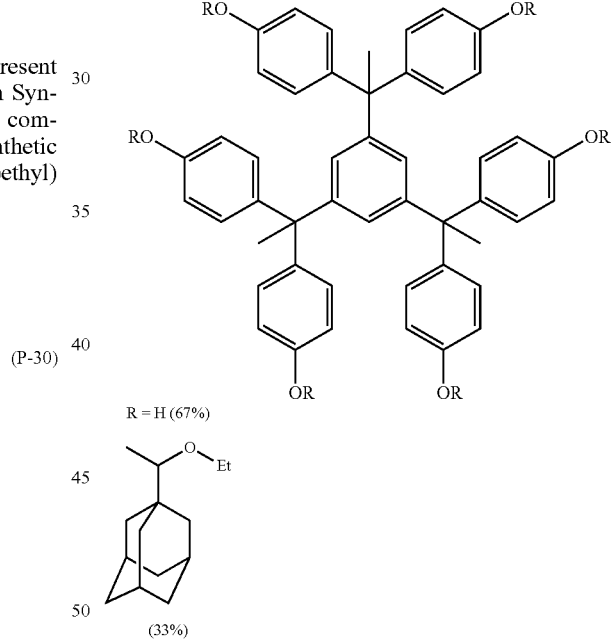

(P-31)

R = H (67%)

(33%)

Synthetic Example 40

Synthesis of Compound (P-32)

Poly(p-hydroxystyrene) (VP-2500, produced by Nippon Soda. Co., Ltd.) as a polyhydroxystyrene compound amounting to 30 g was dissolved in 120 g of PGMEA. Thereafter, 13.82 g of 2,6-diphenylphenyloxyethyl vinyl ether as a vinyl ether compound and 1.45 g of 2 mass % PGMEA solution of camphorsulfonic acid were added to the solution, and agitated at room temperature for two hours. Thereafter, 1.05 g of 10 mass % PGMEA solution of triethylamine was added to the mixture, and agitated for a while. The obtained reaction liquid was transferred into a reparatory funnel in which 165 ml of ethyl acetate had been placed. The obtained organic phase was washed with 200 ml of distilled water three times, and ethyl acetate was removed by means of an evaporator. The resultant reaction liquid was dropped into 2 liters of hexane, and any supernatant matter was removed. The thus obtained product was dissolved in 95 g of PGMEA, and low-boiling-point solvents were removed in vacuum conditions. Thus, 141.3 g of PGMEA solution (27.8 mass %) of compound (P-32) was obtained.

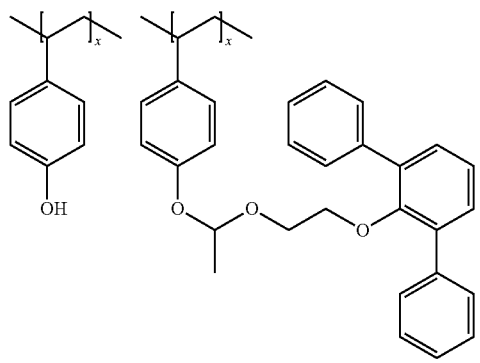

(P-32)

$x/y = 83/17$
Mw = 4700, PDI = 1.14

The following compounds were used for comparative purposes, which are shown below together with the component ratio, weight average molecular weight and polydispersity index.

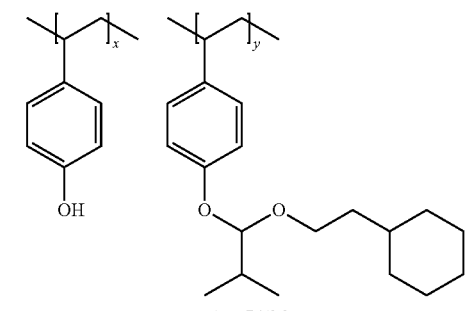

(R-1)

$x/y = 74/26$
Mw = 4600, PDI = 1.17

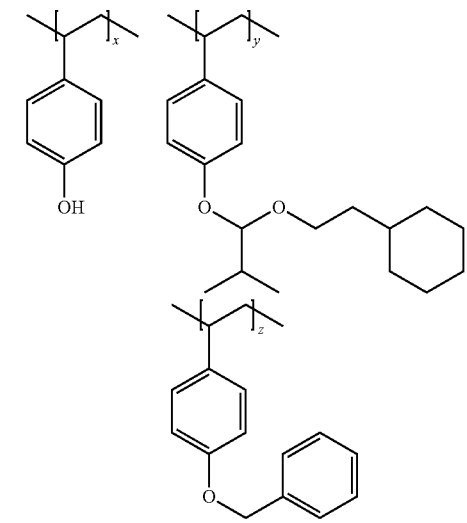

(R-2)

$x/y/z = 76/19/5$
Mw = 4700, PDI = 1.17

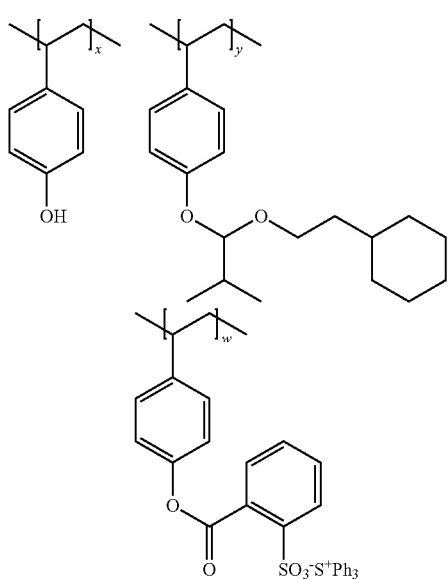

(R-3)

$x/y = 71/26/3$
Mw = 4900, PDI = 1.17

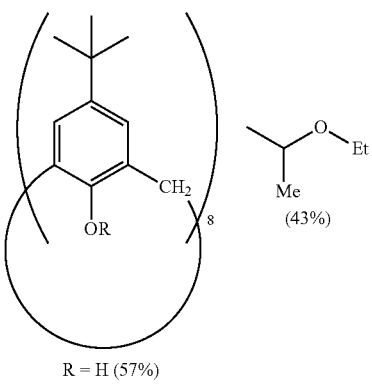

(R-4)

R = H (57%)

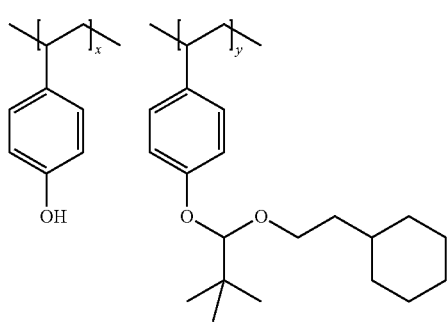

(R-5)

$x/y = 74/24$
Mw = 4500, PDI = 1.16

[Photoacid Generator]

The compounds of formulae shown below were used as photoacid generators.

PAG-1

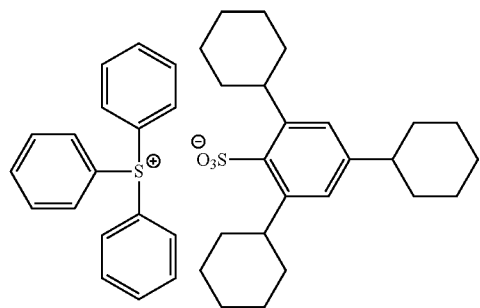

PAG-2

PAG-3

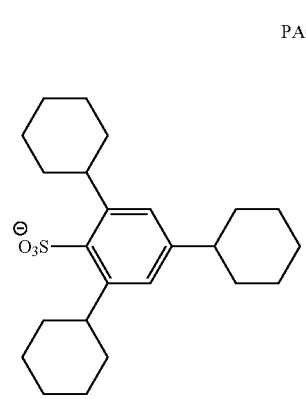

PAG-4

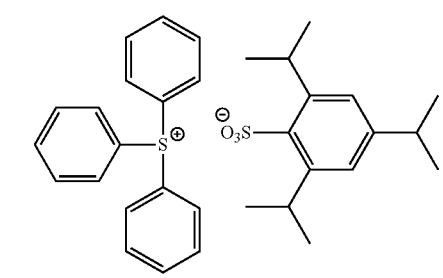

PAG-5

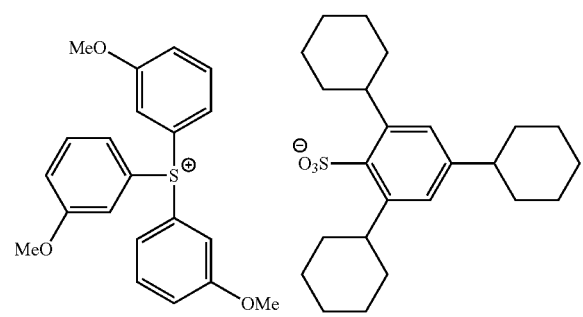

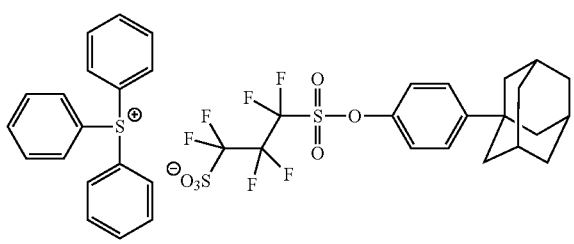

PAG-6

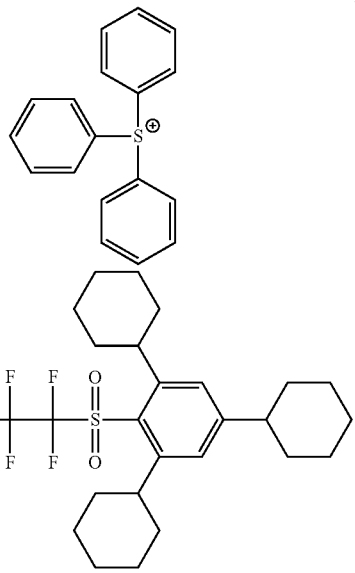

PAG-7

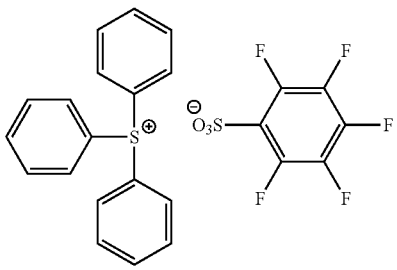

Synthetic Example

PAG-1

(Synthesis of Tricyclohexylbenzene)

First, 6.83 g of aluminum chloride was added to 20.0 g of benzene, and agitated while cooling at 3° C. Then, 40.4 g of cyclohexyl chloride was slowly dropped thereinto. After the completion of the dropping, the mixture was agitated at room temperature for five hours and poured into ice water. The organic phase was extracted with ethyl acetate, and the obtained organic phase was subjected to vacuum distillation at 40° C. Further, vacuum distillation was performed at 170° C., and the product was cooled to room temperature. Thereafter, 50 ml of acetone was placed thereinto, and recrystallization was carried out. The resultant crystal was collected by filtration. Thus, 14 g of tricyclohexylbenzene was obtained.

<Synthesis of Sodium Tricyclohexylbenzenesulfonate>

Tricyclohexylbenzene amounting to 30 g was dissolved in 50 ml of methylene chloride and agitated while cooling at 3° C. Then, 15.2 g of chlorosulfonic acid was slowly dropped into the solution. After the completion of the dropping, the mixture was agitated at room temperature for five hours. Subsequently, 10 g of ice and then 40 g of 50% aqueous sodium hydroxide solution was poured into the mixture. Further, 20 g of ethanol was added and agitated at 50° C. for an hour. Any insoluble matter was removed by filtration, and the product was subjected to vacuum distillation at 40° C. The thus obtained crystal was collected by filtration, and washed with hexane, thereby obtaining 30 g of sodium 1,3,5-tricyclohexylbenzenesulfonate.

<Synthesis of Compound PAG-1>

Triphenylsulfonium bromide amounting to 4.0 g was dissolved in 20 ml of methanol, and 5.0 g of sodium 1,3,5-tricyclohexylbenzenesulfonate dissolved in advance in 20 ml of methanol was added to the solution. The mixture was agitated at room temperature for two hours, and 50 ml of ion-exchanged water was added to the mixture and extracted with chloroform. The thus obtained organic phase was washed with water and subjected to vacuum distillation at 40° C. The thus obtained crystal was recrystallized from methanol/ethyl acetate as a solvent, thereby obtaining 5.0 g of compound PAG-1.

$^1$H-NMR (400 MHz, CDCl$_3$) δ=7.85 (d, 6H), 7.68 (t, 3H), 7.59 (t, 6H), 6.97 (s, 2H), 4.36-4.27 (m, 2H), 2.48-2.38 (m, 1H), 1.97-1.16 (m, 30H)

Compounds PAG-2 to PAG-7 were synthesized in the same manner as described above.

[Basic Compound]

The compounds of formulae shown below were used as basic compounds.

BASE-1

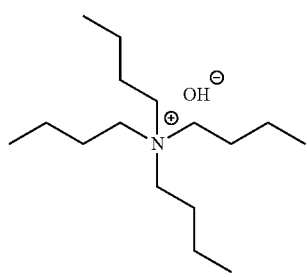

BASE-2

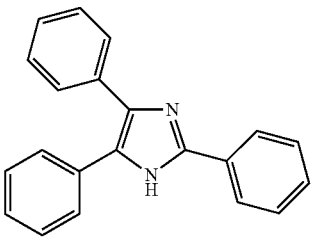

BASE-3

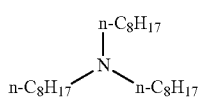

[Surfactant and Solvent]

The following surfactants were used.

W-1: Megafac F176 (produced by Dainippon Ink & Chemicals, Inc.; fluorinated),

W-2: Megafac R08 (produced by Dainippon Ink & Chemicals, Inc.; fluorinated and siliconized), and W-3: PF6320 (produced by OMNOVA SOLUTIONS, INC., fluorinated).

The following solvents were used.

S1: propylene glycol monomethyl ether acetate (PGMEA),

S2: propylene glycol monomethyl ether (PGME),

S3: cyclohexanone, and

S4: ethyl lactate.

Examples 1 to 9 and Comparative Examples 1 to 5

Components of Table 3 below were dissolved in solvents of the same table, and the obtained solutions were each passed through a polytetrafluoroethylene filter of 0.1 μm pore size, thereby obtaining positive resist solutions of the total solid content indicated in Table 3. The concentration of each of the components of Table 3 is a mass concentration based on the mass of total solids.

<Evaluation of Resist>

Each of the prepared positive resist solutions was uniformly applied onto a silicon substrate having undergone a hexamethyldisilazane treatment by means of a spin coater, and dried by heating on a hot plate at 130° C. for 90 seconds. Thus, 100 nm thick resist films were obtained.

Each of the resist films was irradiated with electron beams by means of an electron beam lithography system (model HL750 manufactured by Hitachi, Ltd., acceleration voltage 50 KeV). Immediately after the irradiation, the film was baked on a hot plate at 120° C. for 90 seconds. The baked film was developed with a 2.38 mass % aqueous tetramethylammonium hydroxide solution at 23° C. for 60 seconds. After the development, the film was rinsed with pure water for 30 seconds and dried. Thus, a line and space pattern (line: space=1:1) and an isolated line pattern (line:space=1:>100) were formed. Hereinafter, the line and space pattern may be referred to as L&S, and the isolated line pattern may be referred to as IL.

[Shape]

The shape of cross section of each of the obtained patterns was observed by means of a scanning electron microscope (model S-4800 manufactured by Hitachi, Ltd.). The shape of cross section of 100 nm IL pattern was observed, and the evaluation "Excellent" was given when the shape was close to a rectangle, the evaluation "Good" when the shape was one exhibiting slight film thinning, and the evaluation "Fair" when the shape was a tapering form.

[Resolving Power]

The limiting resolving power (minimum line width permitting the separation and resolution of a line and a space) was denoted as the resolving power (nm).

[Line Edge Roughness (LER)]

At arbitrary 30 points in a 50 μm region in the longitudinal direction of a 100 nm-width line pattern, the distances of actual edges from a reference line on which edges were to be present were measured by means of a scanning electron microscope (model S-4800, manufactured by Hitachi, Ltd.). The standard deviation of measured distances was determined, and 3σ was computed therefrom. The smaller the value thereof, the better the line edge roughness performance.

[Film Retention Ratio (Dry Etching Resistance)]

A 100 nm thick positive resist film was formed on a wafer having undergone a hexamethyldisilazane treatment. Plasma etching of the film was carried out using a mixed gas comprised of CF$_4$ (10 ml/min), O$_2$ (20 ml/min) and Ar (1000 ml/min) at 23° C. for 30 seconds. Thereafter, the thickness of the resist film after the plasma etching was measured. The film retention ratio (%) was defined as 100 times the quotient of the film thickness after the etching divided by the film thickness before the etching. The larger the film retention ratio, the higher the dry etching resistance.

TABLE 3

| | Compd. (P) (mass %) | Photoacid generator (mass %) | Basic compd. (mass %) | Solvent (mass ratio) | Surfactant (mass %) | Total solid concentration (mass %) | L&S resolving power (nm) | IL resolving power (nm) | IL shape | LER (nm) | Film retention ratio (%) |
|---|---|---|---|---|---|---|---|---|---|---|---|
| Ex. 1 | P-1 (93.85) | PAG-1 (5.5) | BASE-1 (0.6) | S1/S2 (80/20) | W-3 (0.05) | 4 | 37.5 | 37.5 | Excellent | 4.6 | 94.2 |
| Ex. 2 | P-1 (93.50) | PAG-2 (5.85) | BASE-1 (0.6) | S1/S2 (80/20) | W-3 (0.05) | 4 | 37.5 | 37.5 | Excellent | 4.8 | 94.0 |
| Ex. 3 | P-1 (94.35) | PAG-1 (2.75) PAG-3 (2.25) | BASE-1 (0.6) | S1/S2 (80/20) | W-3 (0.05) | 4 | 37.5 | 37.5 | Excellent | 5.0 | 94.1 |
| Ex. 4 | P-3 (93.85) | PAG-1 (5.5) | BASE-1 (0.6) | S1/S2 (80/20) | W-3 (0.05) | 4 | 37.5 | 37.5 | Excellent | 5.1 | 97.6 |
| Ex. 5 | P-4 (93.85) | PAG-1 (5.5) | BASE-1 (0.6) | S1/S2 (80/20) | W-3 (0.05) | 4 | 37.5 | 37.5 | Excellent | 4.2 | 93.9 |
| Ex. 6 | P-6 (93.90) | PAG-1 (5.5) | BASE-1 (0.6) | S1/S2 (80/20) | — | 4 | 37.5 | 37.5 | Excellent | 5.4 | 93.0 |
| Ex. 7 | P-12 (93.85) | PAG-1 (5.5) | BASE-1 (0.6) | S1/S2 (80/20) | W-3 (0.05) | 4 | 37.5 | 37.5 | Excellent | 4.4 | 97.7 |
| Ex. 8 | P-30 (93.10) | PAG-4 (6.25) | BASE-1 (0.6) | S1/S2 (80/20) | W-3 (0.05) | 4 | 37.5 | 37.5 | Excellent | 3.9 | 93.7 |
| Ex. 9 | P-18 (99.35) | — | BASE-1 (0.6) | S1/S2 (60/40) | W-3 (0.05) | 4 | 25.0 | 37.5 | Excellent | 3.6 | 97.2 |
| Comp. Ex. 1 | R-1 (93.85) | PAG-1 (5.5) | BASE-1 (0.6) | S1/S2 (80/20) | W-3 (0.05) | 4 | 37.5 | 50 | Fair | 6.6 | 92.1 |
| Comp. Ex. 2 | R-2 (93.85) | PAG-1 (5.5) | BASE-1 (0.6) | S1/S2 (80/20) | W-3 (0.05) | 4 | 37.5 | 50 | Fair | 6.2 | 92.9 |
| Comp. Ex. 3 | R-3 (99.35) | — | BASE-1 (0.6) | S1/S2 (70/30) | W-3 (0.05) | 4 | 37.5 | 37.5 | Good | 5.3 | 92.2 |
| Comp. Ex. 4 | R-4 (93.85) | PAG-1 (5.5) | BASE-1 (0.6) | S1/S2 (80/20) | W-3 (0.05) | 4 | 37.5 | 50 | Fair | 4.9 | 87.4 |
| Comp. Ex. 5 | R-5 (93.85) | PAG-1 (5.5) | BASE-1 (0.6) | S1/S2 (80/20) | W-3 (0.05) | 4 | 37.5 | 50 | Good | 5.2 | 91.4 |

As apparent from Table 3, the compositions of Examples 1 to 9 excelled the compositions of Comparative Examples 1 to 5 in the IL resolution/IL pattern shape and LER.

Examples 10 to 44 and Comparative Examples 6 to 9

For examining the performance of resist films on a mask blank, positive resist solutions were prepared, resist films were formed and resist evaluations were carried out in the same manner as in Examples 1 to 9 except that (1) the silicon substrate having undergone a hexamethyldisilazane treatment was changed to a glass substrate provided with a 100 nm thick chromium oxide film (light shielding film) by chemical vapor deposition; (2) the heating conditions after the application of resist solutions were changed from 130° C. 90 seconds to 130° C. 600 seconds; and (3) the heating conditions after the irradiation with electron beams were changed from 120° C. 90 seconds to 120° C. 600 seconds. The obtained results are given in Table 4.

TABLE 4

| | Compd. (P) (mass %) | Photoacid generator (mass %) | Basic compd. (mass %) | Solvent (mass ratio) | Surfactant (mass %) | Total solid concentration (mass %) | L&S resolving power (nm) | IL resolving power (nm) | IL shape | LER (nm) | Film retention ratio (%) |
|---|---|---|---|---|---|---|---|---|---|---|---|
| Ex. 10 | P-1 (90.75) | PAG-1 (8.3) | BASE-1 (0.9) | S1/S2 (80/20) | W-3 (0.05) | 4 | 37.5 | 37.5 | Excellent | 4.1 | 94.5 |
| Ex. 11 | P-3 (93.85) | PAG-1 (5.5) | BASE-1 (0.6) | S1/S2 (80/20) | W-3 (0.05) | 4 | 37.5 | 37.5 | Excellent | 5.2 | 98.0 |
| Ex. 12 | P-4 (93.85) | PAG-1 (5.5) | BASE-1 (0.6) | S1/S2 (80/20) | W-3 (0.05) | 4 | 37.5 | 37.5 | Excellent: | 4.3 | 94.1 |
| Ex. 13 | P-5 (93.85) | PAG-1 (5.5) | BASE-1 (0.6) | S1/S2 (80/20) | W-3 (0.05) | 4 | 37.5 | 37.5 | Excellent | 4.9 | 97.5 |
| Ex. 14 | P-6 (93.85) | PAG-1 (5.5) | BASE-1 (0.6) | S1/S2 (80/20) | W-3 (0.05) | 4 | 50.0 | 37.5 | Excellent | 5.3 | 93.3 |
| Ex. 15 | P-7 (93.35) | PAG-1 (5.5) | BASE-2 (1.1) | S1/S2 (80/20) | W-3 (0.05) | 4 | 37.5 | 37.5 | Good | 4.6 | 94.8 |
| Ex. 16 | P-8 (91.95) | PAG-6 (7.4) | BASE-1 (0.6) | S1/S2 (80/20) | W-2 (0.05) | 4 | 37.5 | 37.5 | Excellent | 4.2 | 97.2 |
| Ex. 17 | P-9 (93.55) | PAG-1 (5.5) | BASE-3 (0.9) | S1/S2 (80/20) | W-1 (0.05) | 4 | 50.0 | 37.5 | Good | 3.9 | 98.4 |
| Ex. 18 | P-10 (92.75) | PAG-5 (6.6) | BASE-1 (0.6) | S1/S2 (80/20) | W-3 (0.05) | 4 | 37.5 | 50 | Excellent | 4.2 | 96.8 |

TABLE 4-continued

| | Compd. (P) (mass %) | Photoacied generator (mass %) | Basic compd. (mass %) | Solvent (mass ratio) | Surfactant (mass %) | Total solid concentration (mass %) | L&S resolving power (nm) | IL resolving power (nm) | IL shape | LER (nm) | Film retention ratio (%) |
|---|---|---|---|---|---|---|---|---|---|---|---|
| Ex. 19 | P-11 (93.85) | PAG-1 (5.5) | BASE-1 (0.6) | S1/S2 (80/20) | W-3 (0.05) | 4 | 37.5 | 37.5 | Excellent | 3.8 | 97.3 |
| Ex. 20 | P-12 (93.85) | PAG-1 (5.5) | BASE-1 (0.6) | S1/S2 (80/20) | W-3 (0.05) | 4 | 37.5 | 37.5 | Excellent | 4.8 | 98.1 |
| Ex. 21 | P-13 (93.85) | PAG-1 (5.5) | BASE-1 (0.6) | S1/S2 (80/20) | W-3 (0.05) | 4 | 37.5 | 37.5 | Excellent | 4.4 | 96.6 |
| Ex. 22 | P-14 (92.95) | PAG-4 (6.4) | BASE-1 (0.6) | S1/S2 (80/20) | W-3 (0.05) | 4 | 37.5 | 37.5 | Excellent | 4.1 | 97.3 |
| Ex. 23 | P-15 (93.85) | PAG-1 (5.5) | BASE-1 (0.6) | S1/S2 (80/20) | W-3 (0.05) | 4 | 50.0 | 37.5 | Excellent | 3.7 | 97.5 |
| Ex. 24 | P-18 (99.35) | — | BASE-1 (0.6) | S1/S2 (70/30) | W-3 (0.05) | 4 | 37.5 | 37.5 | Excellent | 3.5 | 96.5 |
| Ex. 25 | P-19 (99.35) | — | BASE-1 (0.6) | S1/S2 (70/30) | W-3 (0.05) | 4 | 37.5 | 37.5 | Excellent | 3.9 | 96.8 |
| Ex. 26 | P-20 (99.35) | — | BASE-1 (0.6) | S1/S2 (70/30) | W-3 (0.05) | 4 | 37.5 | 37.5 | Excellent | 3.9 | 97.0 |
| Ex. 27 | P-21 (99.35) | — | BASE-1 (0.6) | S1/S2 (70/30) | W-3 (0.05) | 4 | 37.5 | 37.5 | Excellent | 3.8 | 97.5 |
| Ex. 28 | P-22 (99.35) | — | BASE-1 (0.6) | S1/S2 (70/30) | W-3 (0.05) | 4 | 37.5 | 50 | Excellent | 4.0 | 96.8 |
| Ex. 29 | P-24 (99.35) | — | BASE-1 (0.6) | S1/S2 (60/40) | W-3 (0.05) | 4 | 37.5 | 37.5 | Excellent | 3.8 | 96.2 |
| Ex. 30 | P-25 (92.95) | PAG-4 (6.4) | BASE-1 (0.6) | S1/S2 (80/20) | W-3 (0.05) | 4 | 37.5 | 50 | Excellent | 4.7 | 97.1 |
| Ex. 31 | P-26 (99.35) | — | BASE-1 (0.6) | S1/S2 (70/30) | W-3 (0.05) | 4 | 37.5 | 37.5 | Excellent | 4.0 | 93.2 |
| Ex. 32 | P-27 (93.85) | PAG-1 (5.5) | BASE-1 (0.6) | S1/S2 (60/40) | W-3 (0.05) | 4 | 37.5 | 37.5 | Excellent | 4.2 | 94.1 |
| Ex. 33 | P-30 (93.85) | PAG-1 (5.5) | BASE-1 (0.6) | S1/S2 (60/40) | W-3 (0.05) | 4 | 37.5 | 37.5 | Excellent | 3.7 | 94.3 |
| Ex. 34 | P-31 (93.85) | PAG-1 (5.5) | BASE-1 (0.6) | S1/S2 (80/20) | W-3 (0.05) | 4 | 37.5 | 37.5 | Excellent | 3.8 | 96.6 |
| Ex. 35 | P-12 (63.85) P-32 (30.00) | PAG-1 (5.5) | BASE-1 (0.6) | S1/S2 (80/20) | W-3 (0.05) | 4 | 37.5 | 37.5 | Excellent | 4.2 | 97.7 |
| Ex. 36 | P-16 (46.95) P-17 (46.90) | PAG-1 (5.5) | BASE-1 (0.6) | S1/S2 (80/20) | W-3 (0.05) | 4 | 37.5 | 37.5 | Excellent | 3.9 | 94.6 |
| Ex. 37 | P-33 (93.85) | PAG-1 (5.5) | BASE-1 (0.6) | S1/S2 (80/20) | W-3 (0.05) | 4 | 37.5 | 37.5 | Excellent | 3.8 | 97.5 |
| Ex. 38 | P-34 (93.85) | PAG-1 (5.5) | BASE-1 (0.6) | S1/S2 (80/20) | W-3 (0.05) | 4 | 37.5 | 37.5 | Excellent | 4.0 | 97.2 |
| Ex. 39 | P-35 (93.85) | PAG-1 (5.5) | BASE-1 (0.6) | S1/S2 (80/20) | W-3 (0.05) | 4 | 37.5 | 37.5 | Excellent | 4.4 | 96.9 |
| Ex. 40 | P-39 (93.85) | PAG-1 (5.5) | BASE-1 (0.6) | S1/S2/S3 (60/20/20) | W-3 (0.05) | 4 | 37.5 | 37.5 | Excellent | 4.8 | 93.6 |
| Ex. 41 | P-40 (93.85) | PAG-1 (5.5) | BASE-1 (0.6) | S1/S2/S4 (60/20/20) | W-3 (0.05) | 4 | 37.5 | 37.5 | Excellent | 4.3 | 95.3 |
| Ex. 42 | P-16 (94.35) | PAG-1 (2.75) PAG-3 (2.25) | BASE-1 (0.6) | S1/S2 (80/20) | W-3 (0.05) | 4 | 37.5 | 37.5 | Excellent | 3.7 | 95.1 |
| Ex. 43 | P-16 (91.59) | PAG-1 (4.13) PAG-3 (3.38) | BASE-1 (0.9) | S1/S2 (80/20) | — | 4 | 37.5 | 37.5 | Excellent | 3.5 | 95.0 |
| Ex. 44 | P-33 (88.80) | PAG-1 (5.5) PAG-3 (4.5) | BASE-1 (1.2) | S1/S2 (80/20) | — | 4 | 37.5 | 37.5 | Excellent | 3.5 | 97.3 |
| Comp. Ex. 6 | R-2 (93.85) | PAG-1 (5.5) | BASE-1 (0.6) | S1/S2 (80/20) | W-3 (0.05) | 4 | 37.5 | 50 | Fair | 5.4 | 93.0 |
| Comp. Ex. 7 | R-3 (99.35) | — | BASE-1 (0.6) | S1/S2 (70/30) | W-3 (0.05) | 4 | 37.5 | 50 | Good | 4.9 | 92.8 |
| Comp. Ex. 8 | R-4 (93.85) | PAG-1 (5.5) | BASE-1 (0.6) | S1/S2 (80/20) | W-3 (0.05) | 4 | 37.5 | 50 | Fair | 4.6 | 90.2 |
| Comp. Ex. 9 | R-5 (93.85) | PAG-1 (5.5) | BASE-1 (0.6) | S1/S2 (80/20) | W-3 (0.05) | 4 | 37.5 | 50 | Good | 5.3 | 91.7 |

As apparent from Table 4, the compositions of Examples 10 to 44 excelled the compositions of Comparative Examples 6 to 9 in the IL resolution/IL pattern shape and LER. Photomasks that can be appropriately used in semiconductor production can be obtained by exposing the mask blanks provided with the resist films formed from these compositions of the present invention to light and developing the exposed mask blanks.

Examples 45 to 50 and Comparative Examples 10 to 13

Components of Table 5 below were dissolved in solvents of the same table, and the obtained solutions were each passed through a polytetrafluoroethylene filter of 0.1 μm pore size, thereby obtaining positive resist solutions of the total solid content indicated in Table 5. The concentration of each of the components of Table 5 is a mass concentration based on the mass of total solids.

<Evaluation of Resist>

Each of the prepared positive resist solutions was uniformly applied onto a silicon substrate having undergone a hexamethyldisilazane treatment by means of a spin coater, and dried by heating on a hot plate at 130° C. for 90 seconds. Thus, 30 nm thick resist films were obtained.

Each of the resist films was irradiated with electron beams by means of an electron beam lithography system (model JBX6000 manufactured by JEOL Ltd., acceleration voltage 50 KeV) while changing the irradiation amount so as to form a pattern of 20 to 30 nm-wide lines (lengthwise 0.5 mm, 40 drawn lines) drawn at 2.5 nm intervals. Immediately after the irradiation, the film was baked on a hot plate at 110° C. for 90 seconds. The baked film was developed with a 0.8 mass % aqueous tetramethylammonium hydroxide solution at 23° C. for 180 seconds. After the development, the film was rinsed with pure water for 30 seconds and dried. Thus, a line and space pattern (line:space=1:1) was formed. Hereinafter, the line and space pattern may be referred to as LS pattern.

[Shape]

The shape of cross section of each of the obtained patterns was observed by means of a scanning electron microscope (model S-9220 manufactured by Hitachi, Ltd.). The shape of cross section of each 30 nm LS pattern was observed. The evaluation "Excellent" was given when the shape was close to a rectangle, and the evaluations "Good" "Fair" and "Insufficient" were given in the order of closeness to a rectangle. Comments regarding the shape were added.

[Resolving Power]

The limiting resolving power (minimum line width permitting the separation and resolution of a line and a space) was denoted as the resolving power (nm).

[Line Edge Roughness (LER)]

At arbitrary 30 points in a 50 μm region in the longitudinal direction of a 30 nm-width line pattern, the distances of actual edges from a reference line on which edges were to be present were measured by means of a scanning electron microscope (model S-9220, manufactured by Hitachi, Ltd.). The standard deviation of measured distances was determined, and 3σ was computed therefrom. The smaller the value thereof, the better the line edge roughness performance.

TABLE 5

| | Compd. (P) (mass %) | Photoacied generator (mass %) | Basic compd. (mass %) | Solvent (mass ratio) | Surfactant (mass %) | Total solid concentration (mass %) | L&S resolving power (nm) | LER (nm) | Shape |
|---|---|---|---|---|---|---|---|---|---|
| Ex. 45 | P-6 (69.95) | PAG-4 (28.00) | BASE-1 (2.00) | S1/S2 (80/20) | W-3 (0.05) | 1.3 | 22.5 | 4.1 | Good (inverted taper) |
| Ex. 46 | P-20 (99.25) | — | BASE-1 (0.70) | S1/S2 (60/40) | W-3 (0.05) | 1.3 | 22.5 | 3.8 | Excellent |
| Ex. 47 | P-35 (69.95) | PAG-4 (28.00) | BASE-1 (2.00) | S1/S2 (80/20) | W-3 (0.05) | 1.3 | 22.5 | 4.1 | Excellent |
| Ex. 48 | P-35 (72.95) | PAG-1 (25.00) | BASE-1 (2.00) | S1/S2/S4 (40/40/20) | W-3 (0.05) | 1.3 | 20.0 | 3.9 | Excellent |
| Ex. 49 | P-37 (72.95) | PAG-1 (25.00) | BASE-1 (2.00) | S1/S2/S4 (40/40/20) | W-3 (0.05) | 1.3 | 20.0 | 3.8 | Excellent |
| Ex. 50 | P-38 (72.95) | PAG-1 (25.00) | BASE-1 (2.00) | S1/S2/S4 (40/40/20) | W-3 (0.05) | 1.3 | 20.0 | 3.9 | Excellent |
| Comp. Ex. 10 | R-1 (69.95) | PAG-4 (28.00) | BASE-1 (2.00) | S1/S2 (80/20) | W-3 (0.05) | 1.3 | 25.0 | 4.7 | Fair (taper) |
| Comp. Ex. 11 | R-2 (69.95) | PAG-4 (28.00) | BASE-1 (2.00) | S1/S2 (80/20) | W-3 (0.05) | 1.3 | 25.0 | 4.4 | Fair (taper) |
| Comp. Ex. 12 | R-3 (99.25) | — | BASE-1 (0.70) | S1/S2 (60/40) | W-3 (0.05) | 1.3 | 25.0 | 4.2 | Fair (taper) |
| Comp. Ex. 13 | R-4 (69.95) | PAG-4 (28.00) | BASE-1 (2.00) | S1/S2 (80/20) | W-3 (0.05) | 1.3 | 27.5 | 4.8 | Insufficient (film thinning) |

As apparent from Table 5, the compositions of Examples 45 to 50 excelled the compositions of Comparative Examples 10 to 13 in the LS resolution, LER and pattern shape.

Examples 51 to 53 and Comparative Example 14

For examining the performance of resist films upon large-area exposure, positive resist films were formed and resist evaluations were carried out in the same manner as in Examples 45 to 50 except that the number of drawn lines was changed from 40 to 500. The obtained results are given in Table 6.

TABLE 6

| | Compd. (P) (mass %) | Photoacied generator (mass %) | Basic compd. (mass %) | Solvent (mass ratio) | Surfactant (mass %) | Total solid concentration (mass %) | L&S resolving power (nm) | LER (nm) | Shape |
|---|---|---|---|---|---|---|---|---|---|
| Ex. 51 | P-35 (72.95) | PAG-1 (25.00) | BASE-1 (2.00) | S1/S2/S4 (40/40/20) | W-3 (0.05) | 1.3 | 22.5 | 4.2 | Excellent |
| Ex. 52 | P-37 (72.95) | PAG-1 (25.00) | BASE-1 (2.00) | S1/S2/S4 (40/40/20) | W-3 (0.05) | 1.3 | 20.0 | 4.3 | Excellent |
| Ex. 53 | P-38 (72.95) | PAG-1 (25.00) | BASE-1 (2.00) | S1/S2/S4 (40/40/20) | W-3 (0.05) | 1.3 | 20.0 | 4.4 | Excellent |
| Comp. Ex. 14 | R-1 (69.95) | PAG-4 (28.00) | BASE-1 (2.00) | S1/S2 (80/20) | W-3 (0.05) | 1.3 | 25.0 | 5.1 | Insufficient (film thinning) |

As apparent from Table 6, the compositions of Examples 51 to 53 excelled the composition of Comparative Example 14 in the LS resolution, LER and pattern shape. From the results of Tables 5 and 6, it is apparent that the method of forming a resist pattern according to the present invention is applicable to the manufacturing of nanoimprint molds.

Examples 54 to 64 and Comparative Example 15

For examining the performance of resist films upon exposure to EUV, positive resist films were formed in the same manner as in Examples 1 to 9 except that the thickness of each of the resist films was changed from 100 nm to 50 nm.

Each of the resist films was exposed to EUV light by means of an EUV exposure apparatus (wavelength=13.5 nm, NA=0.3). Immediately after the exposure, the film was baked on a hot plate at 110° C. for 90 seconds. The baked film was developed with a 2.38 mass % aqueous tetramethylammonium hydroxide solution at 23° C. for 30 seconds. After the development, the film was rinsed with pure water for 30 seconds and dried. Thus, a line and space pattern (line:space=1:1) was formed.

(Sensitivity)

The shape of cross section of obtained line and space pattern was observed by means of a scanning electron microscope (model S-9380 manufactured by Hitachi, Ltd.). The sensitivity (Eopt) was defined as an exposure amount in which a line of 35 nm width (line:space=1:1) was resolved.

(Shape of Pattern)

With respect to the 35 nm line pattern (line:space=1:1) realized in the exposure amount exhibiting the above sensitivity, the shape of cross section thereof was observed by means of a scanning electron microscope (model S-4800 manufactured by Hitachi, Ltd.). The observed shape was evaluated in three grades, namely, rectangle, inverted taper and taper.

(Roughness Characteristic; LWR)

The above-mentioned 35 nm line pattern (line:space=1:1) was observed by means of a scanning electron microscope (model S-9380, manufactured by Hitachi, Ltd.). The distance between actual edge and a reference line on which edges were to be present was measured at 50 points of equal intervals within 2 μm in the longitudinal direction of the pattern. The standard deviation of measured distances was determined, and 3σ was computed therefrom. This 3σ was denoted as "LWR (nm)." The smaller the value of LWR, the better the roughness performance.

The obtained evaluation results are given in Table 7 below.

TABLE 7

| | Compd. (P) (mass %) | Photoacied generator (mass %) | Basic compd. (mass %) | Solvent (mass ratio) | Surfactant (mass %) | Total solid concentration (mass %) | Sensitivity (mJ/cm$^2$) | Pattern shape | LWR (nm) |
|---|---|---|---|---|---|---|---|---|---|
| Ex. 54 | P-2 (85.95) | PAG-4 (12.8) | BASE-1 (1.2) | S1/S2 (80/20) | W-3 (0.05) | 4 | 22.2 | Rectangle | 4.7 |
| Ex. 55 | P-2 (85.55) | PAG-2 (13.2) | BASE-1 (1.2) | S1/S2 (80/20) | W-3 (0.05) | 4 | 21.9 | Rectangle | 5.4 |
| Ex. 56 | P-2 (85.25) | PAG-4 (12.8) | BASE-2 (1.9) | S1/S2 (80/20) | W-3 (0.05) | 4 | 22.7 | Rectangle | 4.8 |
| Ex. 57 | P-2 (84.85) | PAG-4 (12.8) | BASE-3 (2.3) | S1/S2 (80/20) | W-3 (0.05) | 4 | 23.4 | Rectangle | 5.1 |
| Ex. 58 | P-2 (89.05) | PAG-7 (8.6) | BASE-3 (2.3) | S1/S2 (80/20) | W-3 (0.05) | 4 | 23.4 | Rectangle | 5.1 |
| Ex. 59 | P-23 (97.65) | — | BASE-3 (2.3) | S1/S2 (50/50) | W-3 (0.05) | 4 | 23.0 | Rectangle | 4.5 |
| Ex. 60 | P-27 (77.25) | PAG-4 (19.2) | BASE-3 (3.5) | S1/S2 (80/20) | W-3 (0.05) | 4 | 24.2 | Rectangle | 4.6 |
| Ex. 61 | P-28 (84.85) | PAG-4 (12.8) | BASE-3 (2.3) | S1/S2 (80/20) | W-3 (0.05) | 4 | 24.7 | Rectangle | 5.1 |
| Ex. 62 | P-29 (97.65) | — | BASE-3 (2.3) | S1/S2 (60/40) | W-3 (0.05) | 4 | 22.1 | Rectangle | 4.9 |
| Ex. 63 | P-30 (84.85) | PAG-4 (12.8) | BASE-3 (2.3) | S1/S2 (80/20) | W-3 (0.05) | 4 | 23.8 | Rectangle | 4.6 |
| Ex. 64 | P-36 (84.85) | PAG-4 (12.8) | BASE-3 (2.3) | S1/S2 (80/20) | W-3 (0.05) | 4 | 22.7 | Rectangle | 4.8 |
| Comp. Ex. 15 | R-1 (84.85) | PAG-4 (12.8) | BASE-3 (2.3) | S1/S2 (80/20) | W-3 (0.05) | 4 | 26.2 | Taper | 6.7 |

As apparent from Table 7, the compositions of these Examples excelled the composition of the Comparative Example in the sensitivity, pattern shape and LWR.

What is claimed is:

1. An actinic-ray- or radiation-sensitive resin composition comprising a compound (P) containing at least one phenolic hydroxyl group and at least one group with a phenolic hydroxyl group whose hydrogen atom is replaced by any of groups of general formula (1) below,

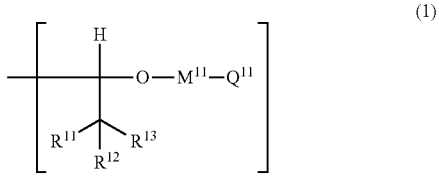

in which
each of $R^{11}$, $R^{12}$ and $R^{13}$ independently represents an organic group with a carbon atom as an atom bonded to C of $-(CR^{11}R^{12}R^{13})$, provided that the organic groups represented by $R^{11}$, $R^{12}$ and $R^{13}$ contain carbon atoms totaling 4 or greater and that at least two of $R^{11}$, $R^{12}$ and $R^{13}$ may be bonded to each other to thereby form a ring,
$M^{11}$ represents a single bond or a bivalent connecting group, and
$Q^{11}$ represents an alkyl group, a cycloalkyl group or an aryl group.

2. The composition according to claim 1, wherein the compound (P) is a polymeric compound comprising any of repeating units of general formula (2) below or general formula (7) below,

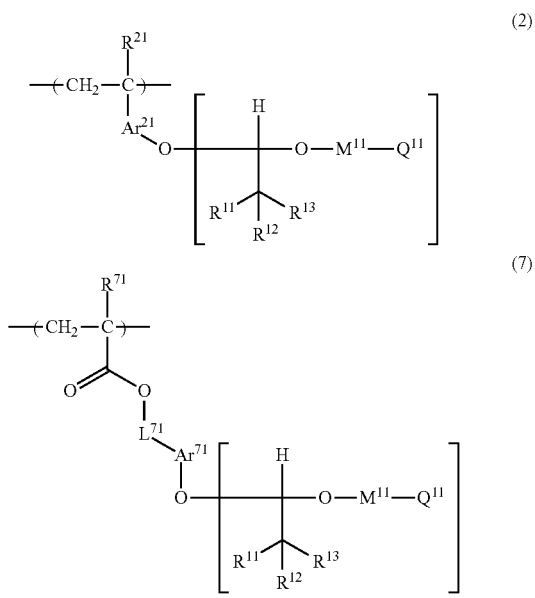

in general formula (2)
$R^{21}$ represents a hydrogen atom or a methyl group,
$Ar^{21}$ represents an arylene group,
each of $R^{11}$, $R^{12}$ and $R^{13}$ independently represents an organic group with a carbon atom as an atom bonded to C of $-(CR^{11}R^{12}R^{13})$, provided that the organic groups represented by $R^{11}$, $R^{12}$ and $R^{13}$ contain carbon atoms totaling 4 or greater and that at least two of $R^{11}$, $R^{12}$ and $R^{13}$ may be bonded to each other to thereby form a ring,
$M^{11}$ represents a single bond or a bivalent connecting group, and
$Q^{11}$ represents an alkyl group, a cycloalkyl group or an aryl group, and
in general formula (7)
$R^{71}$ represents a hydrogen atom or a methyl group,
$L^{71}$ represents a single bond or an alkylene group,
$Ar^{71}$ represents an arylene group,
each of $R^{11}$, $R^{12}$ and $R^{13}$ independently represents an organic group with a carbon atom as an atom bonded to C of $-(CR^{11}R^{12}R^{13})$, provided that the organic groups represented by $R^{11}$, $R^{12}$ and $R^{13}$ contain carbon atoms $R^{12}$ totaling 4 or greater and that at least two of $R^{11}$, $R^{12}$ and $R^{13}$ may be bonded to each other to thereby form a ring,
$M^{11}$ represents a single bond or a bivalent connecting group, and
$Q^{11}$ represents an alkyl group, a cycloalkyl group or an aryl ring group.

3. The composition according to claim 2, wherein $Ar^{21}$ and $Ar^{71}$ are phenylene groups.

4. The composition according to claim 1, wherein at least one of $R^{11}$, $R^{12}$ and $R^{13}$ has at least one cyclic structure.

5. The composition according to claim 1, wherein at least two of $R^{11}$, $R^{12}$ and $R^{13}$ are bonded to each other to thereby form a polycycle.

6. The composition according to claim 1, wherein $-M^{11}-Q^{11}$ represents a group selected from among an alkyl group, a cycloalkyl-substituted alkyl group, a cycloalkyl group, an aralkyl group or an aryloxyalkyl group.

7. The composition according to claim 2, wherein the compound (P) comprises any of repeating units of general formula (5) below,

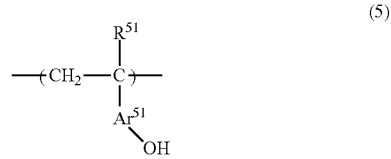

in which
$R^{51}$ represents a hydrogen atom or a methyl group, and
$Ar^{51}$ represents an arylene group.

8. The composition according to claim 2, wherein the compound (P) further comprises any of non-decomposable repeating units of general formula (3) below,

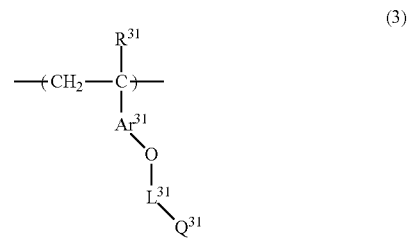

in which
$R^{31}$ represents a hydrogen atom or a methyl group,
$Ar^{31}$ represents an arylene group, $L^{31}$ represents a single bond or a bivalent connecting group, and $Q^{31}$ represents a cycloalkyl group or an aryl group.

9. The composition according to claim 2, wherein the compound (P) further comprises any of repeating units of general formula (4) below,

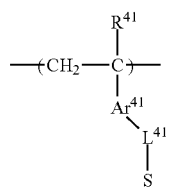
(4)

in which $R^{41}$ represents a hydrogen atom or a methyl group, $Ar^{41}$ represents an arylene group, $L^{41}$ represents a single bond or a bivalent connecting group, and S represents a structural moiety that when exposed to actinic rays or radiation, is decomposed to thereby generate an acid in a side chain.

10. An actinic-ray- or radiation-sensitive film formed from the composition according to claim 1.

11. A mask blank provided with the actinic-ray- or radiation-sensitive film according to claim 10.

12. A mask for semiconductor manufacturing produced by exposing the mask blank according to claim 11 to light and developing the exposed mask blank.

13. A method of forming a pattern, comprising:
exposing the film according to claim 10 to light, and developing the exposed film.

14. A method of forming a pattern, comprising:
exposing the mask blank according to claim 11 to light, and developing the exposed mask blank.

15. The method according to claim 13, wherein the exposure is performed by means of electron beams, X-rays or EUV light.

16. The method according to claim 14, wherein the exposure is performed by means of electron beams, X-rays or EUV light.

17. A polymeric compound comprising any of repeating units of general formula (2) below,

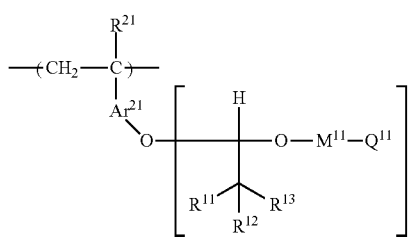
(2)

in which $R^{21}$ represents a hydrogen atom or a methyl group, $Ar^{21}$ represents an arylene group, each of $R^{11}$, $R^{12}$ and $R^{13}$ independently represents an organic group with a carbon atom as an atom bonded to C of $-(CR^{11}R^{12}R^{13})$, provided that the organic groups represented by $R^{11}$, $R^{12}$ and $R^{13}$ contain carbon atoms $R^{12}$ totaling 4 or greater and that at least two of $R^{11}$, and $R^{13}$ may be bonded to each other to thereby form a ring, $M^{11}$ represents a single bond or a bivalent connecting group, and $Q^{11}$ represents an alkyl group, a cycloalkyl group or an aryl group.

18. A process for producing a polymeric compound according to claim 17, comprising a reaction between a polymeric compound comprising any of repeating units of general formula (5) below and any of compounds of general formula (A) below,

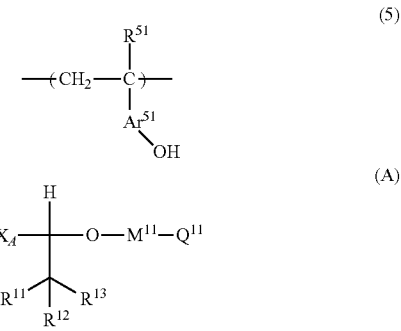
(5)

(A)

in general formula (5)

$R^{51}$ represents a hydrogen atom or a methyl group, and $Ar^{51}$ represents an arylene group, and in general formula (A)

$X_A$ represents a chlorine atom, a bromine atom or an iodine atom, each of $R^{11}$, $R^{12}$ and $R^{13}$ independently represents an organic group with a carbon atom as an atom bonded to C of $-(CR^{11}R^{12}R^{13})$, provided that the organic groups represented by $R^{11}$, $R^{12}$ and $R^{13}$ contain carbon atoms totaling 4 or greater and that at least two of $R^{11}$, $R^{12}$ and $R^{13}$ may be bonded to each other to thereby form a ring, $M^{11}$ represents a single bond or a bivalent connecting group, and $Q^{11}$ represents an alkyl group, a cycloalkyl group or an aryl group.

19. A process for producing a polymeric compound according to claim 17, comprising polymerizing any of compounds of general formula (B) below,

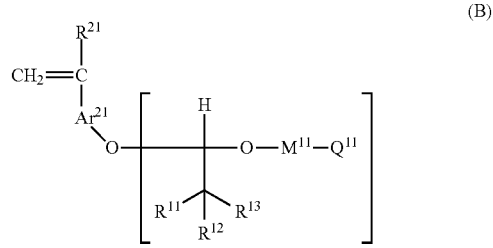
(B)

in which $R^{21}$ represents a hydrogen atom or a methyl group, $Ar^{21}$ represents an arylene group, each of $R^{11}$, $R^{12}$ and $R^{13}$ independently represents an organic group with a carbon atom as an atom bonded to C of $-(CR^{11}R^{12}R^{13})$, provided that the organic groups represented by $R^{11}$, $R^{12}$ and $R^{13}$ contain carbon atoms $R^{12}$ totaling 4 or greater and that at least two of $R^{11}$, and $R^{13}$ may be bonded to each other to thereby form a ring, $M^{11}$ represents a single bond or a bivalent connecting group, and $Q^{11}$ represents an alkyl group, a cycloalkyl group or an aryl group.

* * * * *